(12) United States Patent
Jung et al.

(10) Patent No.: US 12,428,597 B2
(45) Date of Patent: Sep. 30, 2025

(54) LIGHT EMITTING ELEMENT

(71) Applicant: Samsung Display Co., Ltd., Yongin-si (KR)

(72) Inventors: Minjung Jung, Hongcheon-gun (KR); Taeil Kim, Hwaseong-si (KR); Sun Young Pak, Suwon-si (KR); Junha Park, Gwacheon-si (KR); Jang Yeol Baek, Yongin-si (KR); Kyoung Sunwoo, Hwaseong-si (KR); Mun-Ki Sim, Seoul (KR); Chanseok Oh, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 804 days.

(21) Appl. No.: 17/584,240

(22) Filed: Jan. 25, 2022

(65) Prior Publication Data
US 2022/0344592 A1     Oct. 27, 2022

(30) Foreign Application Priority Data

Apr. 7, 2021 (KR) .......................... 10-2021-0044916

(51) Int. Cl.
| | | |
|---|---|---|
| *H01L 51/54* | (2006.01) | |
| *C09K 11/06* | (2006.01) | |
| *H10K 85/30* | (2023.01) | |
| *H10K 85/60* | (2023.01) | |
| *H10K 50/11* | (2023.01) | |
| *H10K 50/15* | (2023.01) | |
| *H10K 59/12* | (2023.01) | |
| *H10K 101/10* | (2023.01) | |
| *H10K 101/20* | (2023.01) | |

(52) U.S. Cl.
CPC ............ *C09K 11/06* (2013.01); *H10K 85/322* (2023.02); *H10K 85/633* (2023.02); *H10K 85/636* (2023.02); *H10K 85/658* (2023.02); *C09K 2211/1018* (2013.01); *H10K 50/11* (2023.02); *H10K 50/15* (2023.02); *H10K 59/12* (2023.02); *H10K 85/6572* (2023.02); *H10K 2101/10* (2023.02); *H10K 2101/20* (2023.02)

(58) Field of Classification Search
None
See application file for complete search history.

(56) References Cited

U.S. PATENT DOCUMENTS

| | | |
|---|---|---|
| 10,374,166 B2 | 8/2019 | Hatakeyama et al. |
| 2019/0058124 A1* | 2/2019 | Hatakeyama ........ H10K 85/322 |
| 2019/0207112 A1* | 7/2019 | Hatakeyama ........ H10K 85/636 |
| 2020/0190115 A1 | 6/2020 | Hatakeyama et al. |

FOREIGN PATENT DOCUMENTS

| | | |
|---|---|---|
| KR | 10-2013-0096334 A | 8/2013 |
| KR | 10-2016-0119683 A | 10/2016 |
| KR | 10-2016-0134881 A | 11/2016 |
| KR | 10-2020-0011383 A | 2/2020 |
| KR | 10-2020-0107848 A | 9/2020 |
| KR | 10-2020-0140744 A | 12/2020 |
| WO | WO 2018/212169 A1 | 11/2018 |

OTHER PUBLICATIONS

Pershin, Anton et al., (2019), "Highly emissive excitons with reduced exchange energy in thermally activated delayed fluorescent molecules", Nature Communications. 10(597), (5 pages).
Kondo, Yasuhiro et al., (2019), "Narrowband deep-blue organic light-emitting diode featuring an organoboron-based emitter", Nature Photonics, 13, 678-682 (6 pages); https://doi.org/10.1038/s41566-019-0476-5.

* cited by examiner

*Primary Examiner* — Andrew K Bohaty
(74) *Attorney, Agent, or Firm* — Womble Bond Dickinson (US) LLP

(57) ABSTRACT

A light emitting element of one or more embodiments includes a first electrode, a second electrode, and a polycyclic compound represented by Formula 1 below in an emission layer disposed between the first electrode and the second electrode, thereby showing high emission efficiency properties:

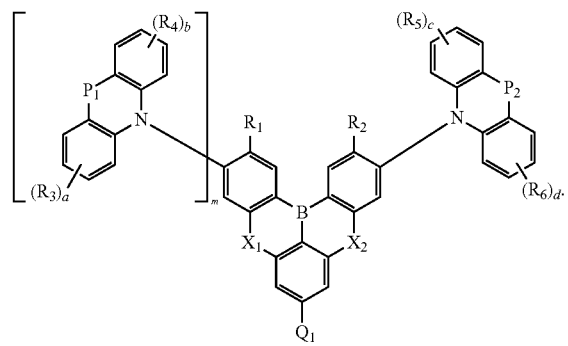

The polycyclic compound is of a DABNA structure includes one heteroaryl group substituted at a para position to boron, and two bulky substituents substituted at meta positions to the boron.

20 Claims, 6 Drawing Sheets

LIGHT EMITTING ELEMENT

CROSS-REFERENCE TO RELATED APPLICATION

This application claims priority to and the benefit of Korean Patent Application No. 10-2021-0044916, filed on Apr. 7, 2021, the entire content of which is hereby incorporated by reference.

BACKGROUND

One or more embodiments of the present disclosure herein relate to a light emitting element, and particularly, to a light emitting element including a polycyclic compound in an emission layer.

Recently, the development of an organic electroluminescence display as an image display is being actively conducted. The organic electroluminescence display is different from a liquid crystal display and is a self-luminescent display in which holes and electrons injected from a first electrode and a second electrode recombine in an emission layer so that a light emitting material including an organic compound in the emission layer emits light to achieve display of images.

In the application of a light emitting element to a display, the decrease of a driving voltage and the increase of emission efficiency and life of the light emitting element are desired, and development of materials for a light emitting element capable of suitably achieving these characteristics is being continuously desired.

SUMMARY

One or more aspects of embodiments of the present disclosure are directed toward a light emitting element hiving high emission efficiency.

One or more embodiments of the present disclosure provide a light emitting element including a first electrode, a second electrode disposed (e.g., provided) on the first electrode, and an emission layer disposed between the first electrode and the second electrode and including a polycyclic compound represented by Formula 1 below, wherein the first electrode and the second electrode each independently include at least one selected from among Ag, Mg, Cu, Al, Pt, Pd, Au, Ni, Nd, Ir, Cr, Li, Ca, LiF, Mo, Ti, W, In, Sn, Zn, compounds of two or more thereof, mixtures of two or more thereof, and oxides thereof.

Formula 1

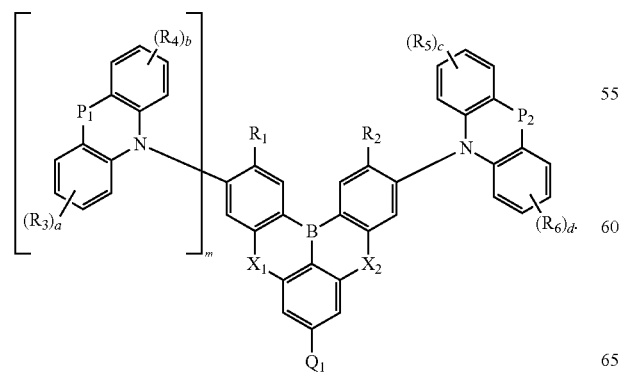

In Formula 1, "a" to "d" may be each independently an integer of 0 to 4, "m" is 0 or 1, $X_1$ and $X_2$ may be each independently O, S, Se, or NRa, $P_1$ and $P_2$ may be each independently a direct linkage, O, S, Se, NRb, or CRcRd, at least one selected from among $R_1$ and $R_2$ may be a substituted or unsubstituted phenyl group, or a substituted or unsubstituted t-butyl group, and the remainder may be a substituted or unsubstituted alkyl group of 1 to 6 carbon atoms, a substituted or unsubstituted aryl group of 6 to 20 ring-forming carbon atoms, or a substituted or unsubstituted heteroaryl group of 2 to 15 ring-forming carbon atoms, $R_3$ to $R_6$ and Ra to Rd may be each independently a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring, and $Q_1$ may be a hydrogen atom, a deuterium atom, a substituted or unsubstituted amine group, a substituted or unsubstituted oxy group, a substituted or unsubstituted alkyl group of 1 to 6 carbon atoms, or a substituted or unsubstituted alkenyl group of 2 to 6 ring-forming carbon atoms, and/or combined with an adjacent group to form a ring.

In one or more embodiments, Formula 1 may be represented by Formula 2-1 or Formula 2-2 below.

Formula 2-1

Formula 2-2

In Formula 2-1, "a", "b", $P_1$, $R_1$ to $R_4$, $X_1$, $X_2$, and $Q_1$ are the same as defined in Formula 1, and in Formula 2-2, "a" to "d", $P_1$, $P_2$, $R_1$ to $R_6$, $X_1$, $X_2$, and $Q_1$ are the same as defined in Formula 1.

In one or more embodiments, Formula 2-2 may be represented by any one selected from among Formula 2A-1 to Formula 2A-6 below.
Formula 2A-1
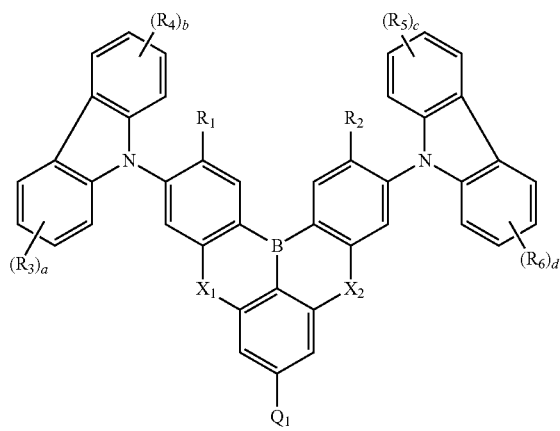
Formula 2A-2
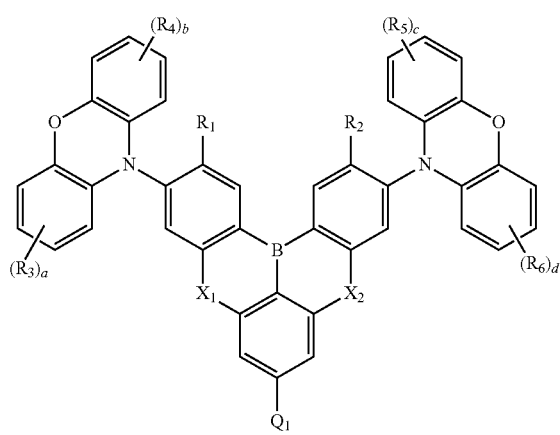
Formula 2A-3
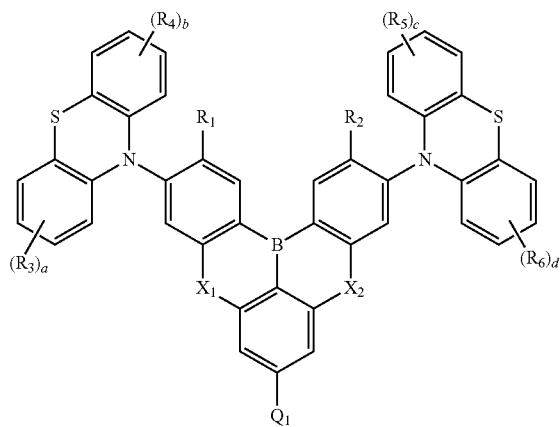
Formula 2A-4
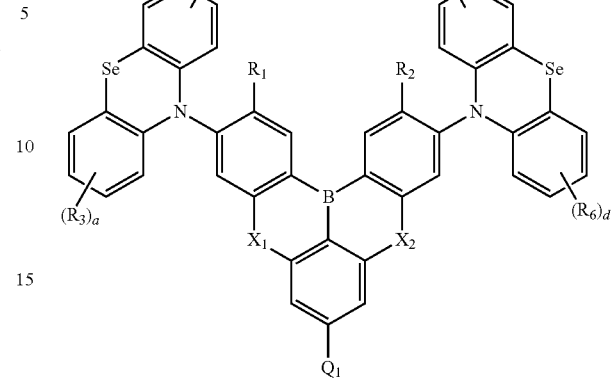
Formula 2A-5
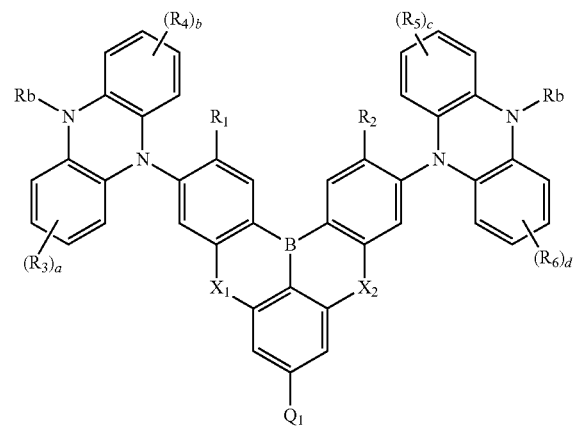
Formula 2A-6
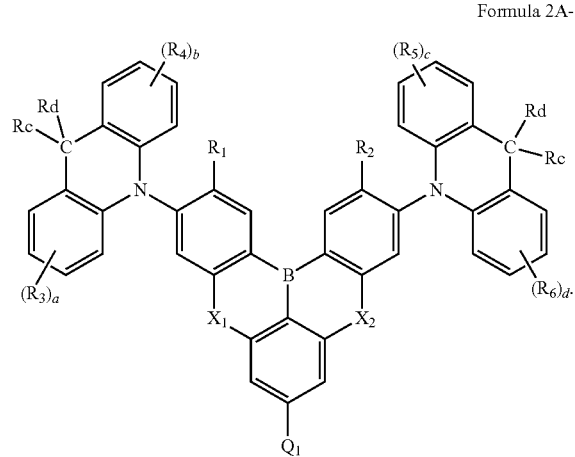
In Formulae 2A-1 to 2A-6, "a" to "d", $R_1$ to $R_6$, $X_1$, $X_2$, Rb to Rd, and $Q_1$ are the same as defined in Formula 1.

In one or more embodiments, Formula 2-2 may be represented by any one selected from among Formula 2B-1 to Formula 2B-15 below.
Formula 2B-1
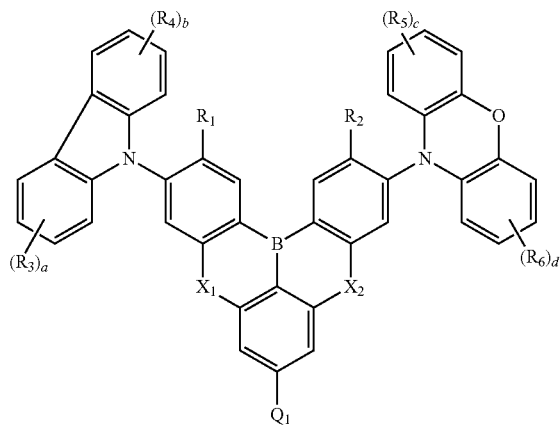
Formula 2B-2
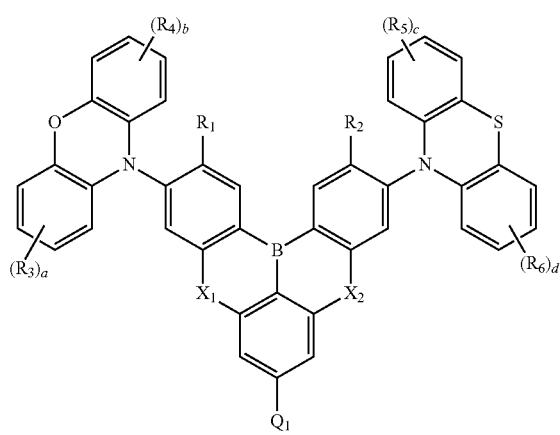
Formula 2B-3
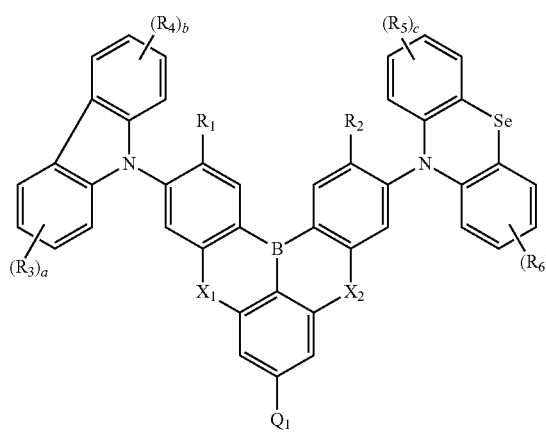
Formula 2B-4
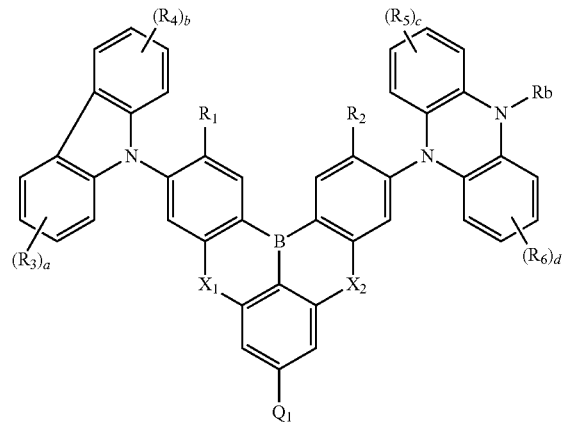
Formula 2B-5
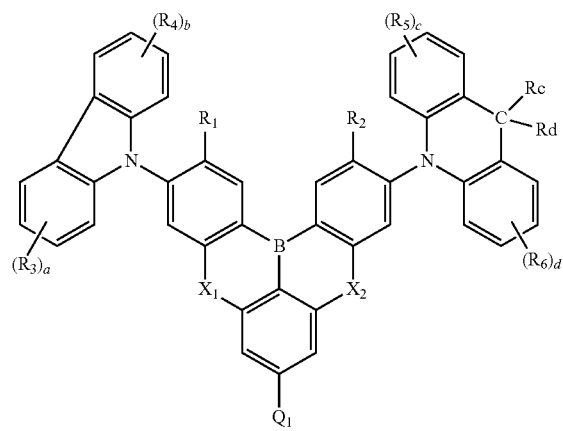
Formula 2B-6
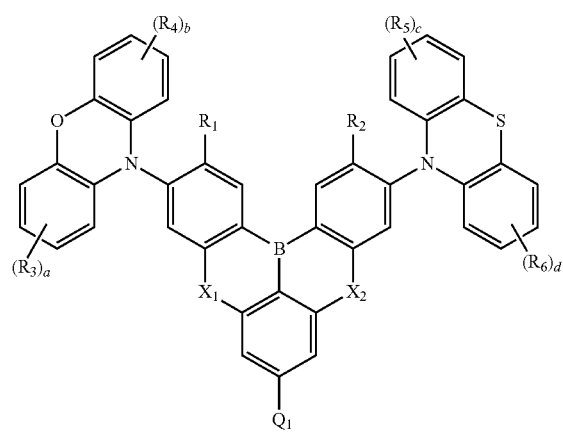

Formula 2B-7
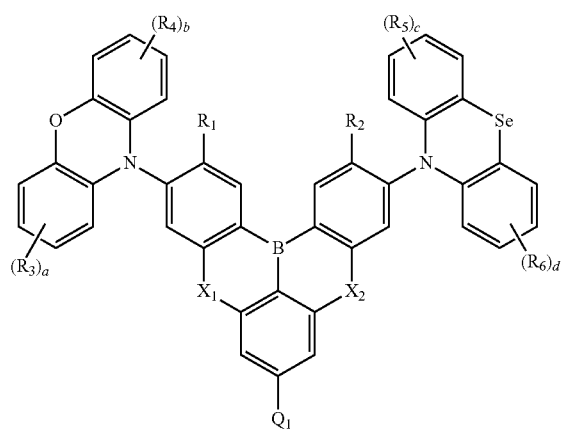
Formula 2B-10
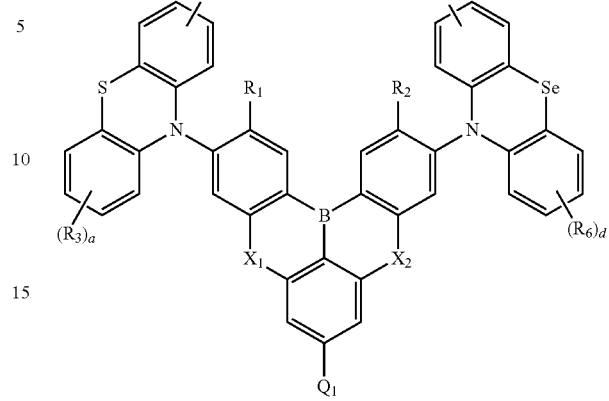
Formula 2B-8
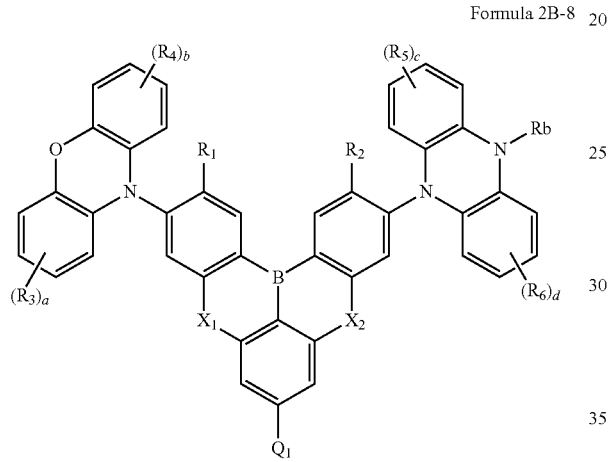
Formula 2B-11
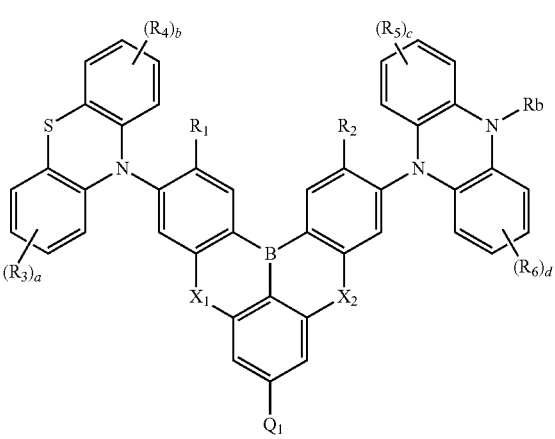
Formula 2B-9
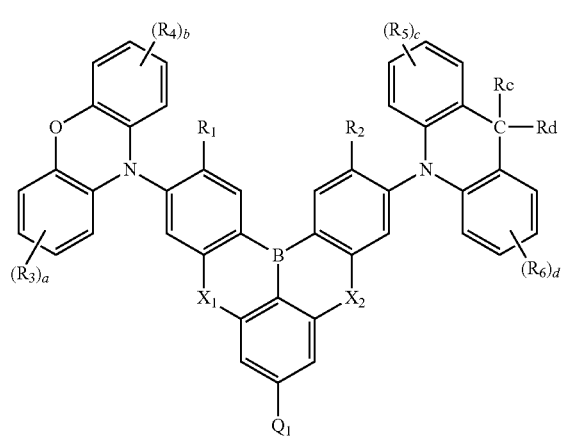
Formula 2B-12
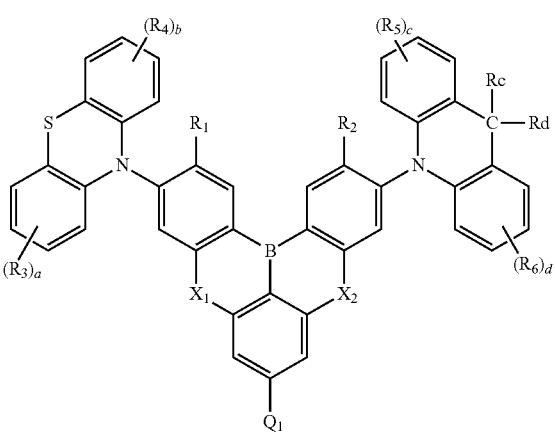

Formula 2B-13
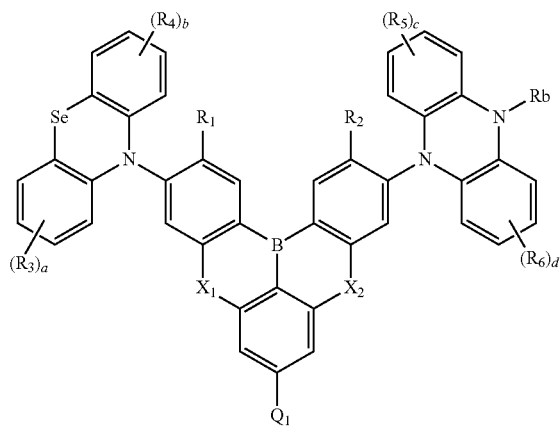
Formula 2B-14
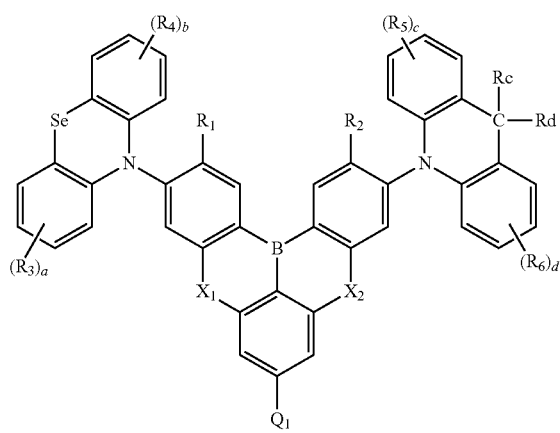
Formula 2B-15
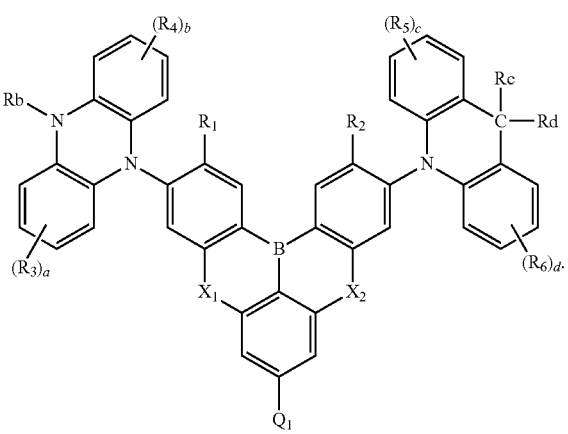
In Formulae 2B-1 to 2B-15, "a" to "d", $R_1$ to $R_6$, $X_1$, $X_2$, $Q_1$, and Rb to Rd are the same as defined in Formula 1.
In one or more embodiments, Formula 1 may be represented by Formula 3-1 to Formula 3-4 below.
Formula 3-1
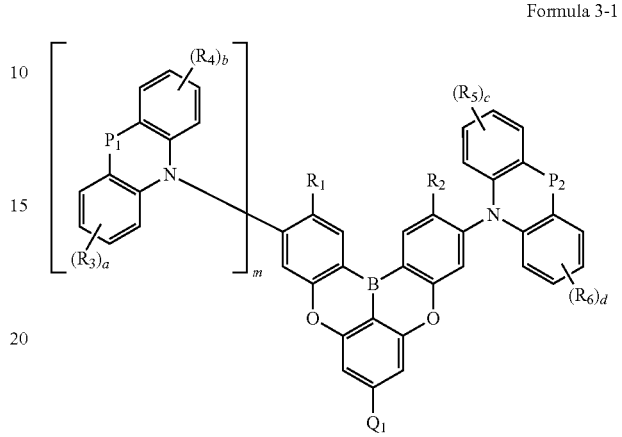
Formula 3-2
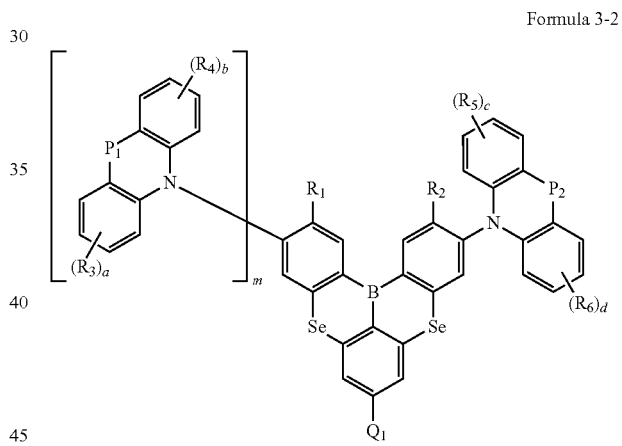
Formula 3-3
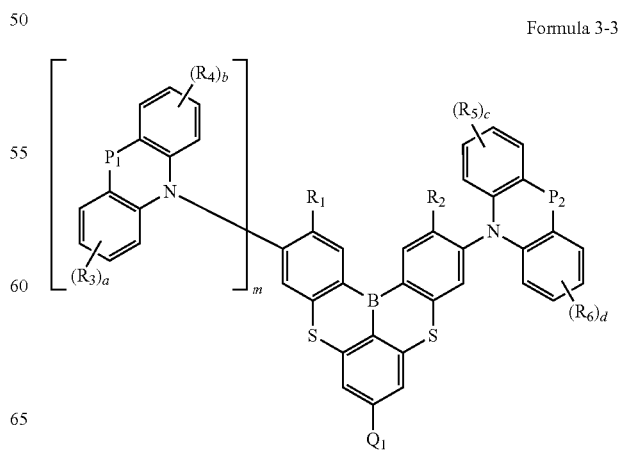

Formula 3-4

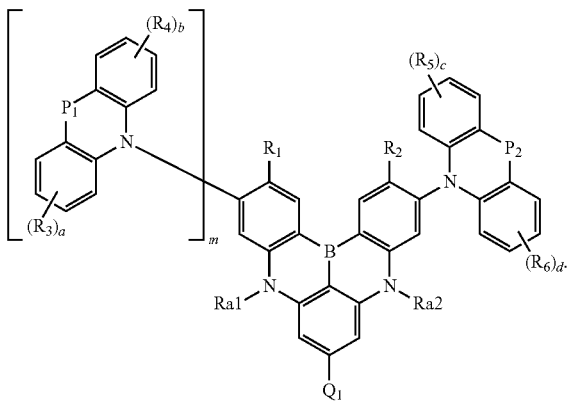

Formula 4-2

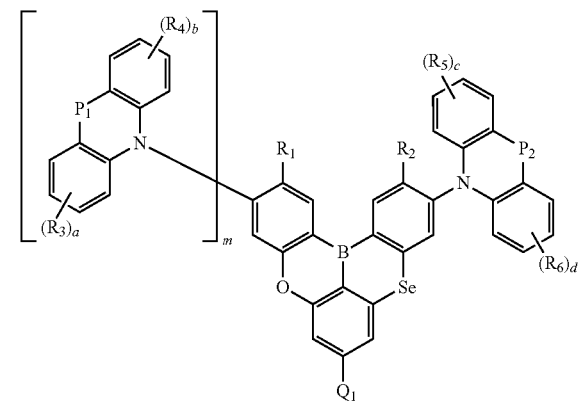

In Formula 3-4, Ra1 and Ra2 may be each independently a hydrogen atom, a deuterium atom, a cyano group, a substituted or unsubstituted alkyl group of 1 to 6 carbon atoms, a substituted or unsubstituted aryl group of 6 to 20 ring-forming carbon atoms, a substituted or unsubstituted alkenyl group of 2 to 6 carbon atoms, a substituted or unsubstituted heteroaryl group of 2 to 15 ring-forming carbon atoms, or a substituted or unsubstituted amine group, and/or combined with an adjacent group to form a ring, and in Formula 3-1 to Formula 3-4, "a" to "d", "m", $P_1$, $P_2$, $R_1$ to $R_6$, and $Q_1$ are the same as defined in Formula 1.

In one or more embodiments, Formula 1 may be represented by any one selected from among Formula 4-1 to Formula 4-6 below.

Formula 4-3

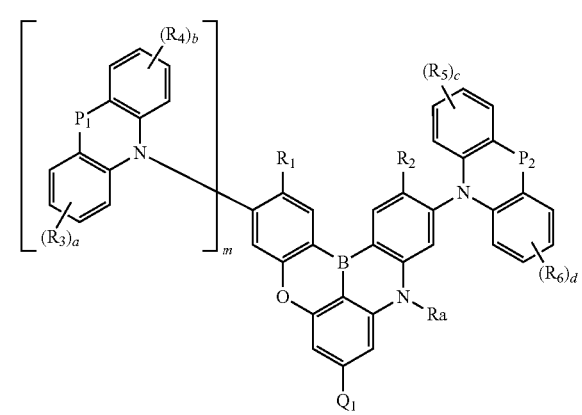

Formula 4-1

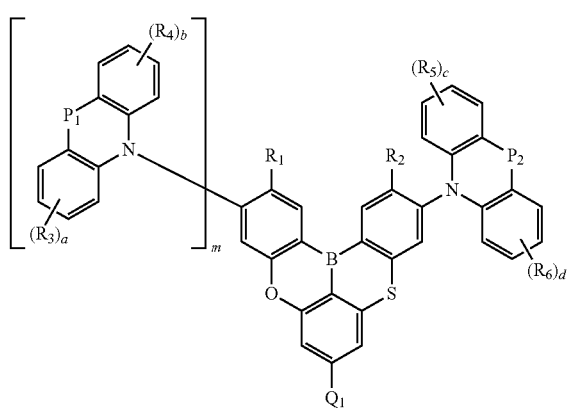

Formula 4-4

Formula 4-5

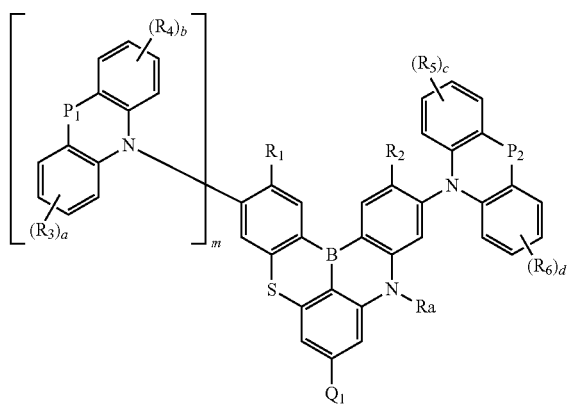

Formula 5-2

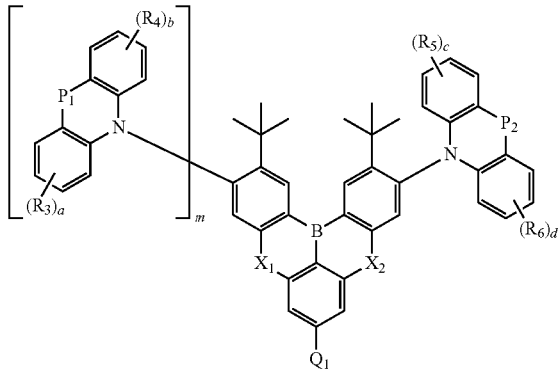

Formula 4-6

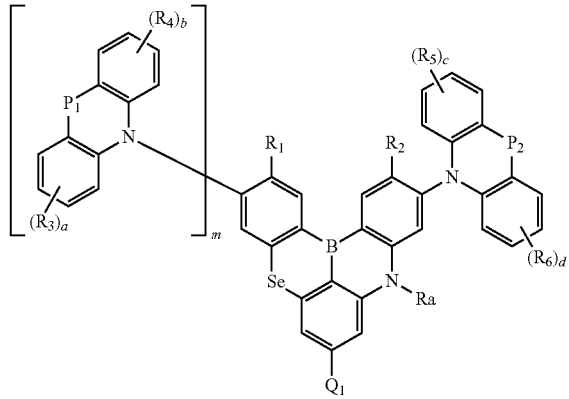

Formula 5-3

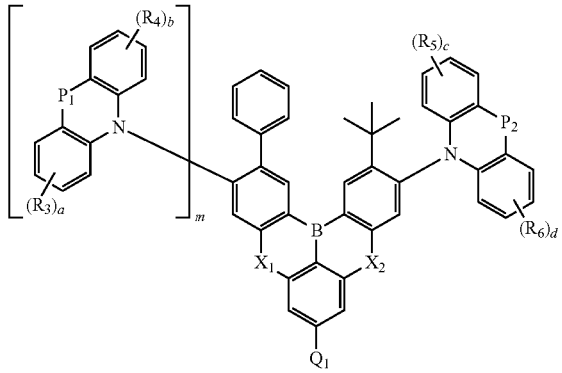

In Formula 4-1 to Formula 4-6, "a" to "d", "m", $P_1$, $P_2$, $R_1$ to $R_6$, $Q_1$, and Ra are the same as defined in Formula 1.

In one or more embodiments, Formula 1 may be represented by any one selected from among Formula 5-1 to Formula 5-4 below.

Formula 5-4

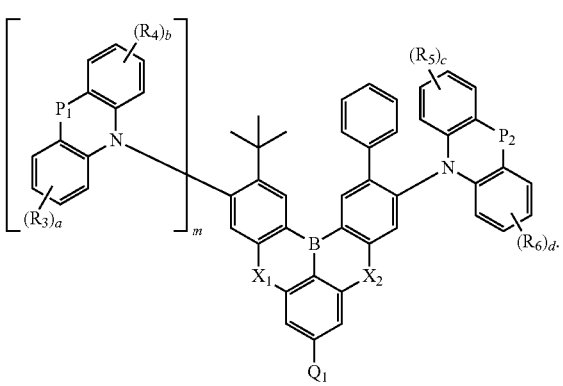

Formula 5-1

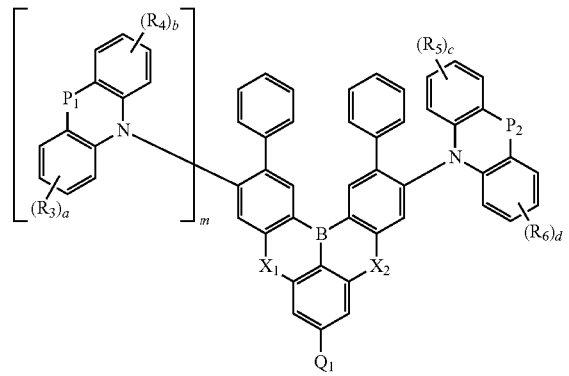

In Formula 5-1 to Formula 5-4, "a" to "d", "m", $P_1$, $P_2$, $R_3$ to $R_6$, $X_1$, $X_2$, and $Q_1$ are the same as defined in Formula 1.

In one or more embodiments, Formula 1 may be represented by any one selected from among Formula 6-1 to Formula 6-6 below.

Formula 6-1
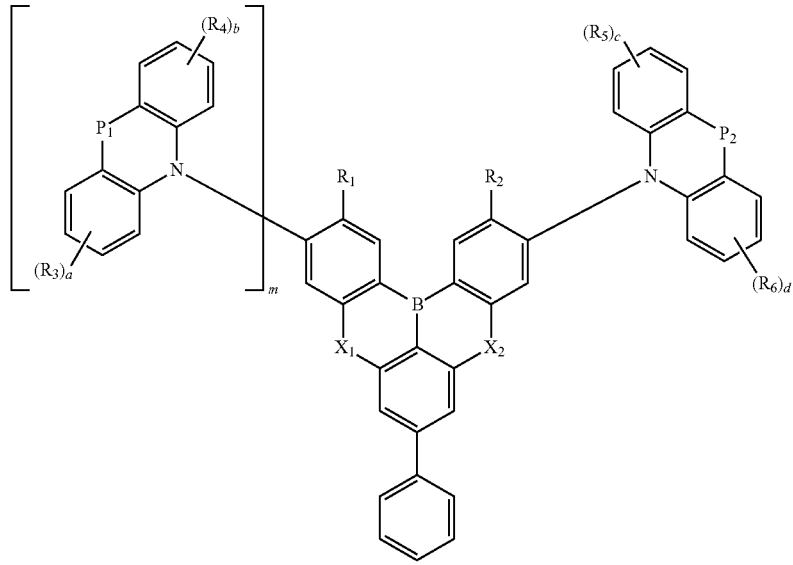
Formula 6-2
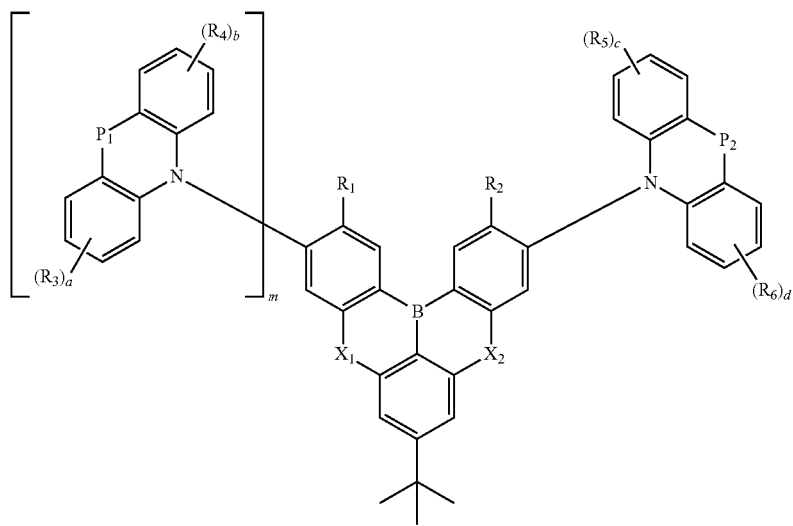
Formula 6-3
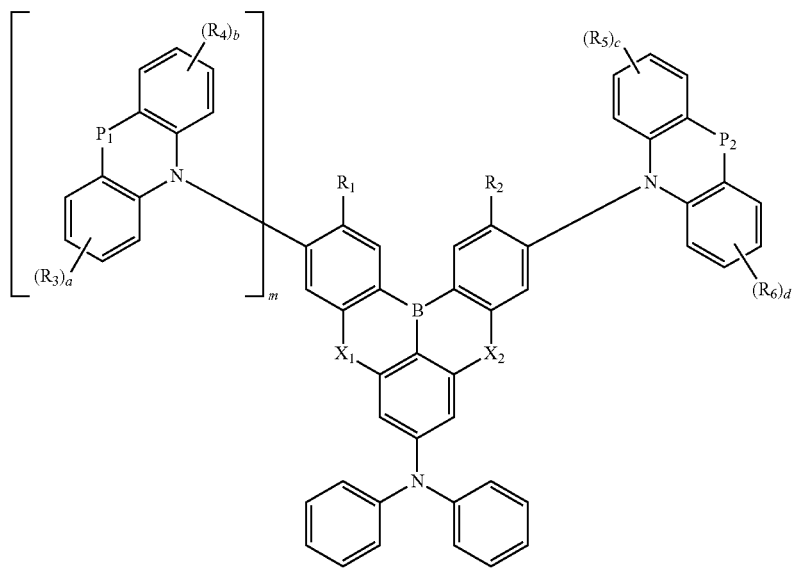

-continued
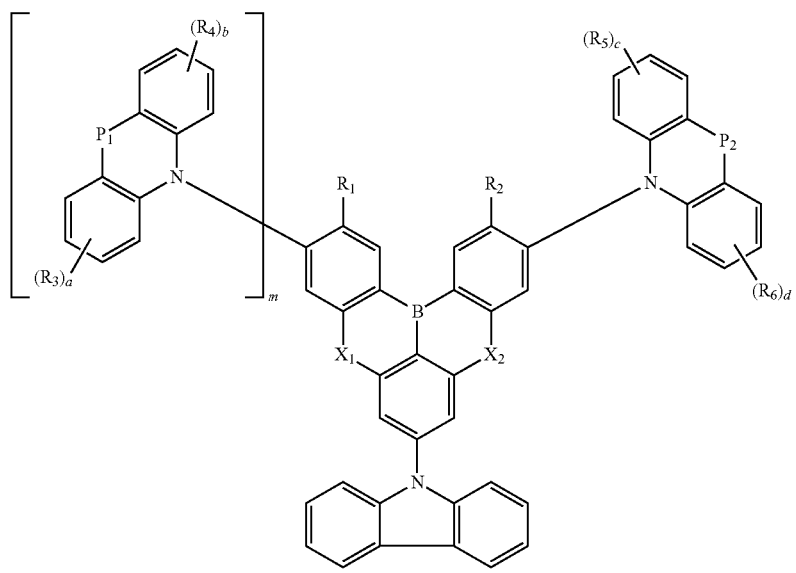
Formula 6-4
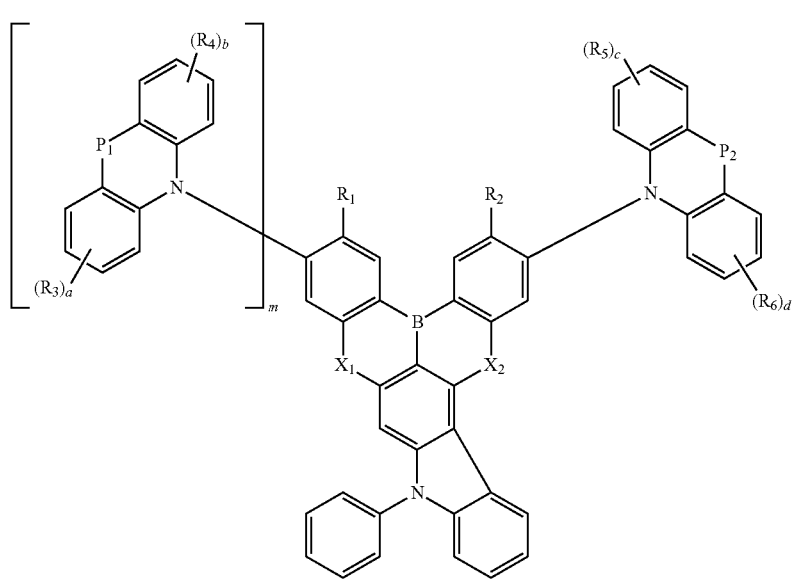
Formula 6-5

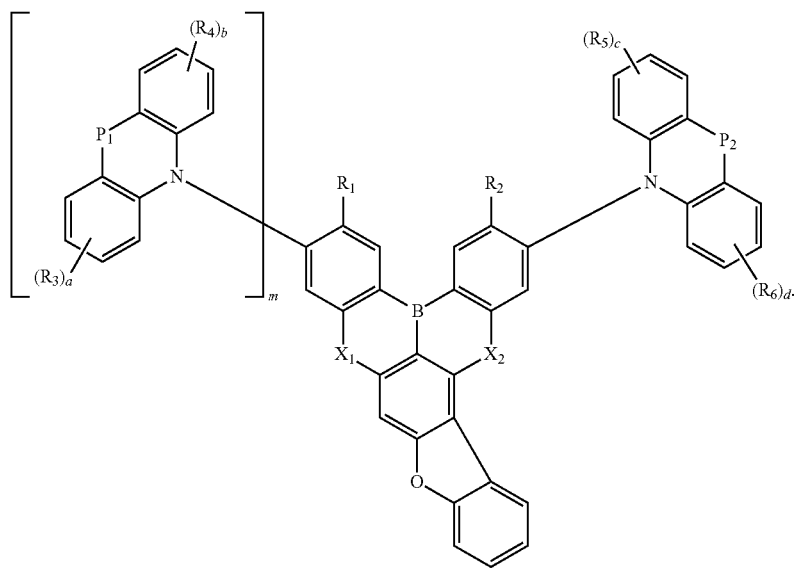

Formula 6-6

In Formula 6-1 to Formula 6-6, "a" to "d", "m", $P_1$, $P_2$, $R_1$ to $R_6$, $X_1$, and $X_2$ are the same as defined in Formula 1.

In one or more embodiments, in Formula 1, at least one selected from among $X_1$ and $X_2$ may be NRa, and Ra may be an unsubstituted biphenyl group, or an unsubstituted terphenyl group.

In one or more embodiments, the polycyclic compound may be represented by any one selected from among polycyclic compounds in Compound Group 1 below.

Compound Group 1

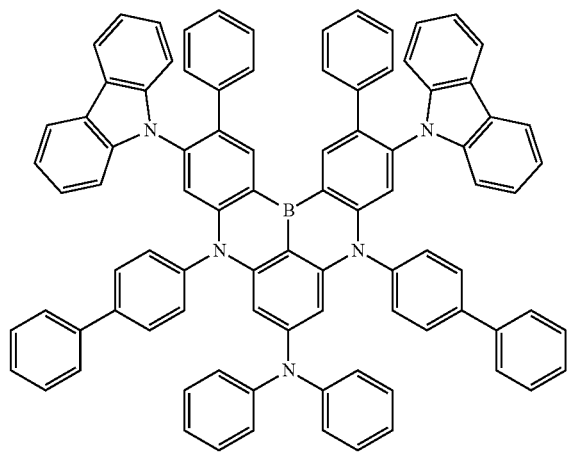

1

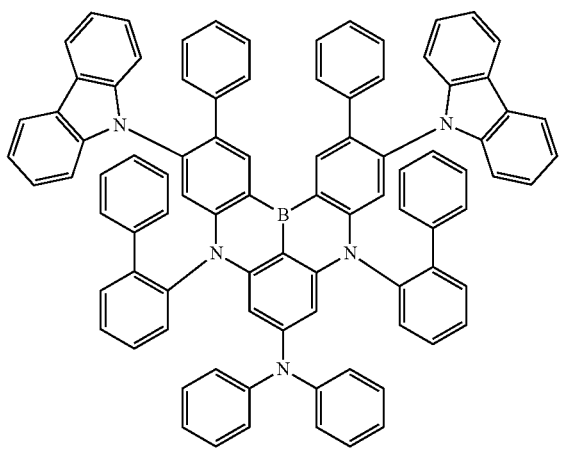

2

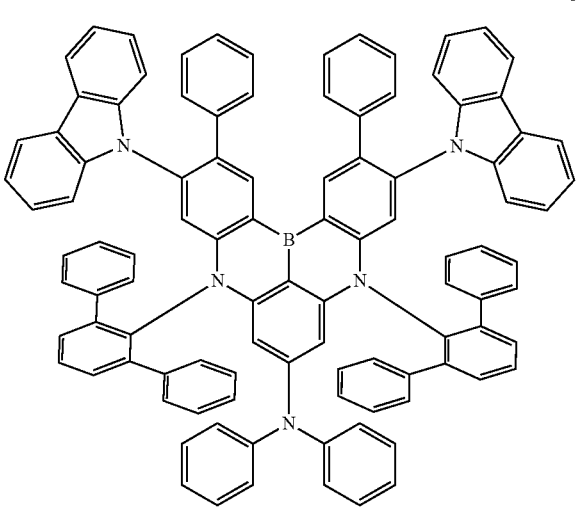

3

-continued
4
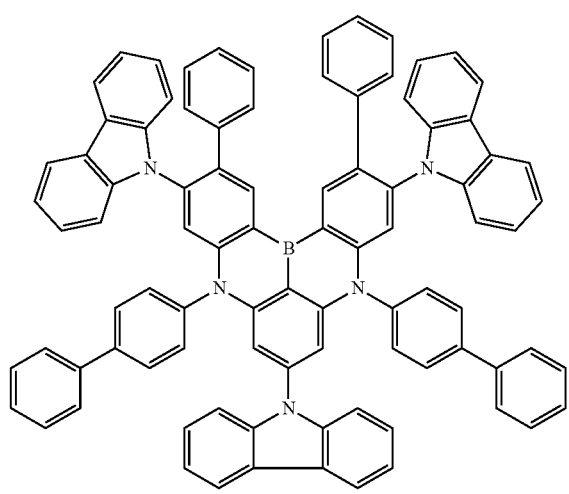
5
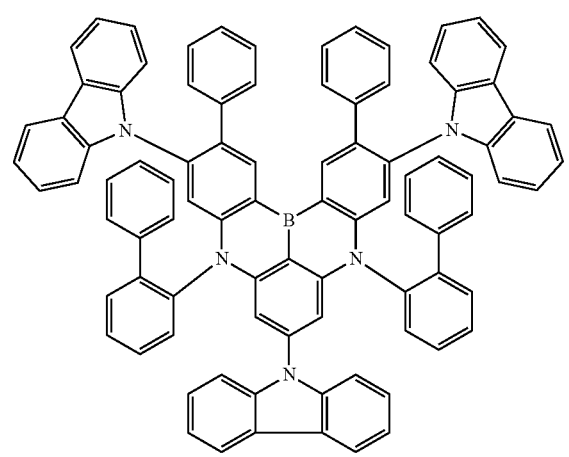
6
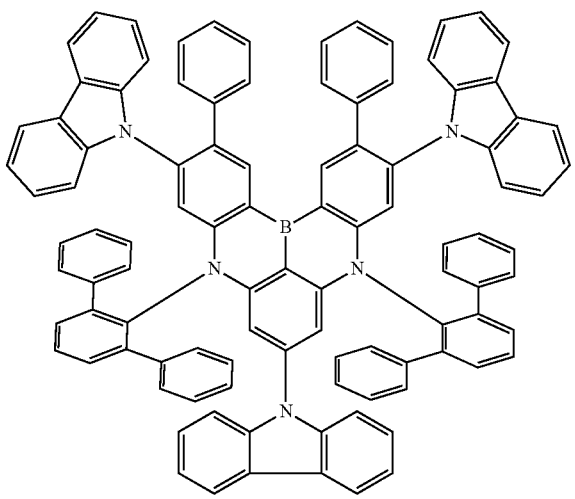
-continued
7
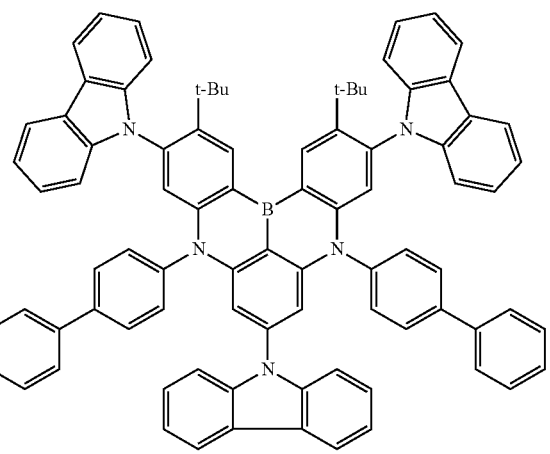
8
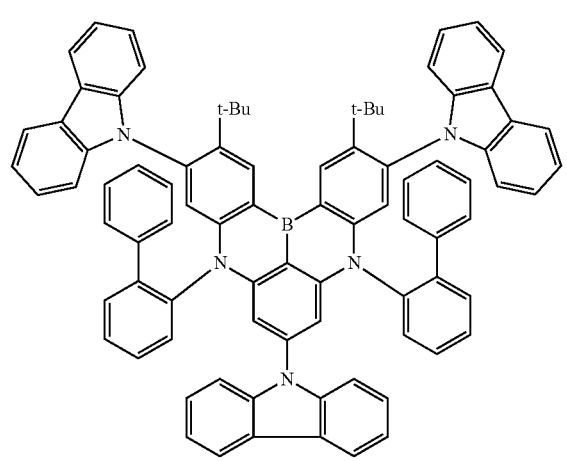
9
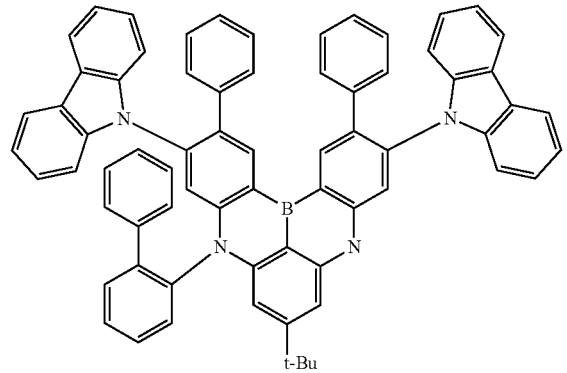

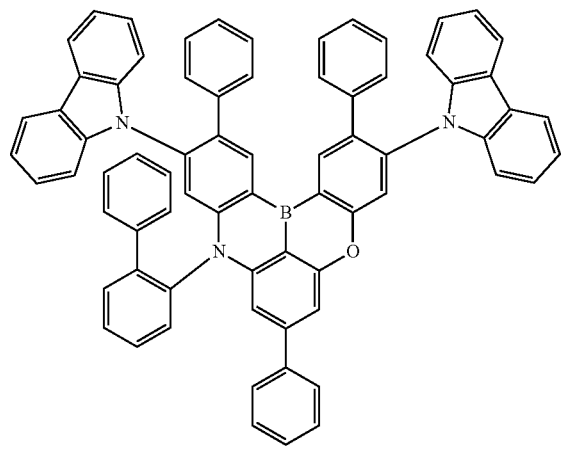
10
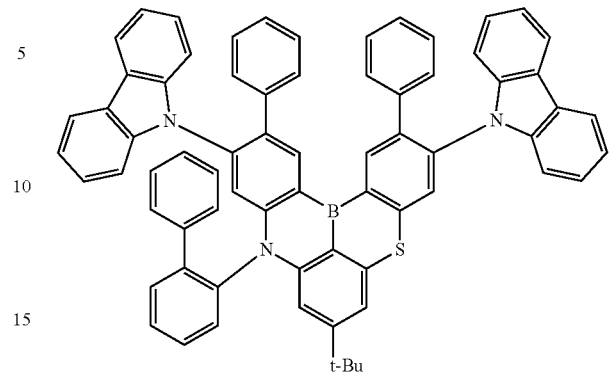
13
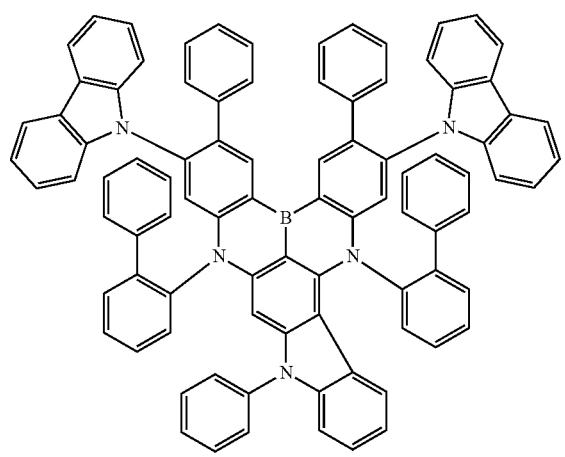
11
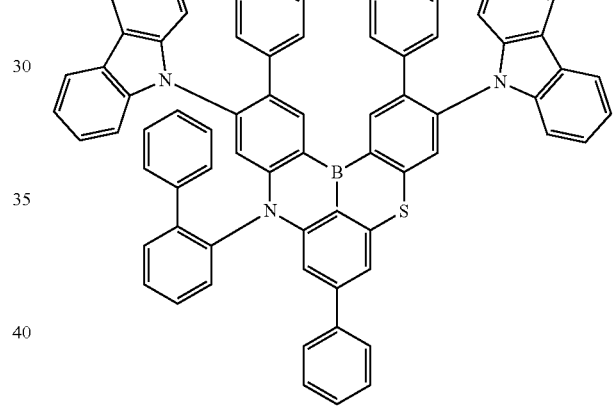
14
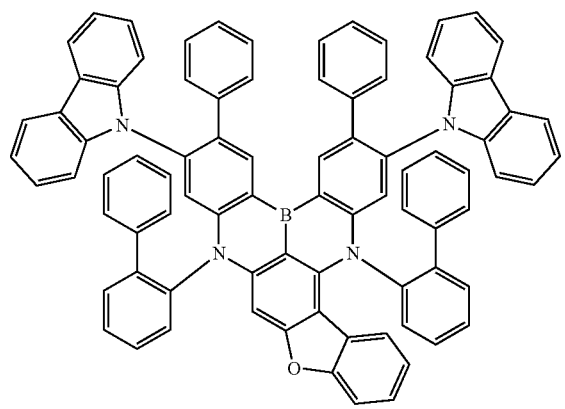
12
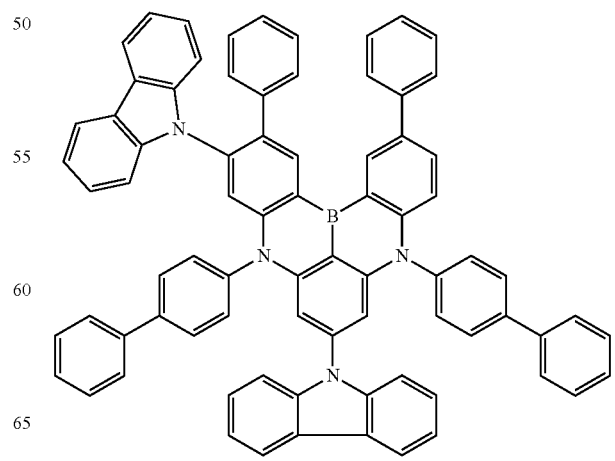
15

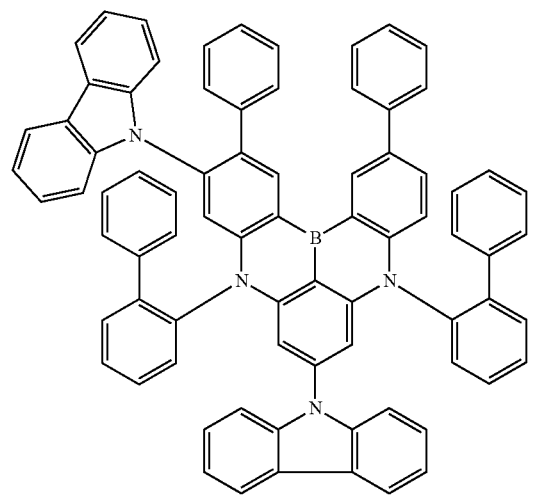

16

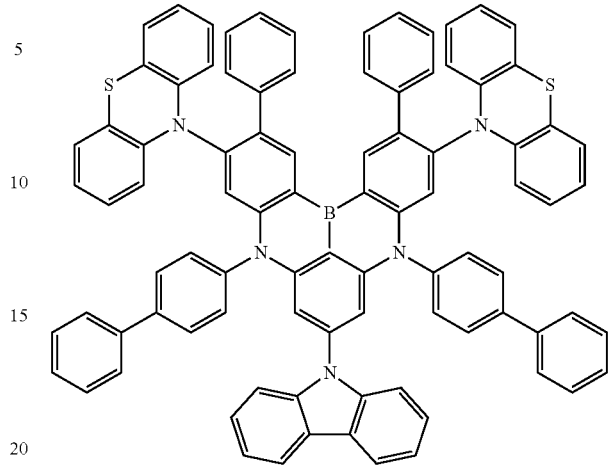

19

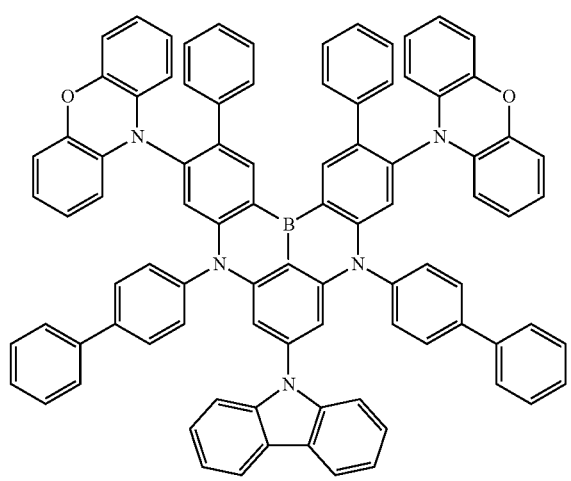

17

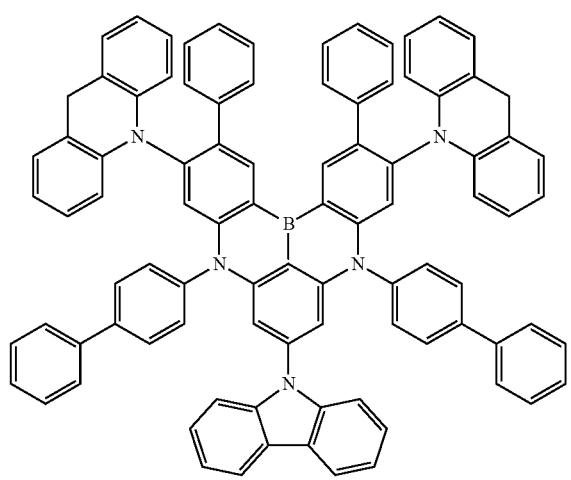

18

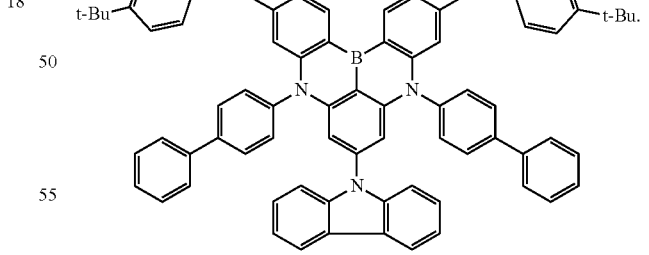

21

According to one or more embodiments, there is provided a light emitting element including a first electrode, a second electrode disposed (e.g., positioned and/or provided) on the first electrode, an emission layer disposed between the first electrode and the second electrode and including a polycyclic compound represented by Formula 1 below, and a hole transport region disposed between the first electrode and the emission layer and including Compound H-1-1 below.

Compound H-1-1

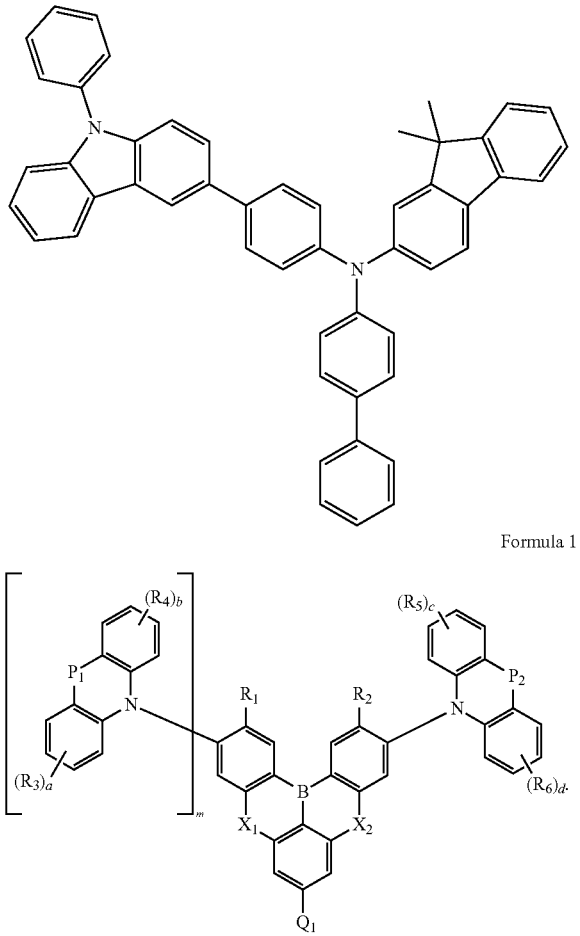

Formula 1

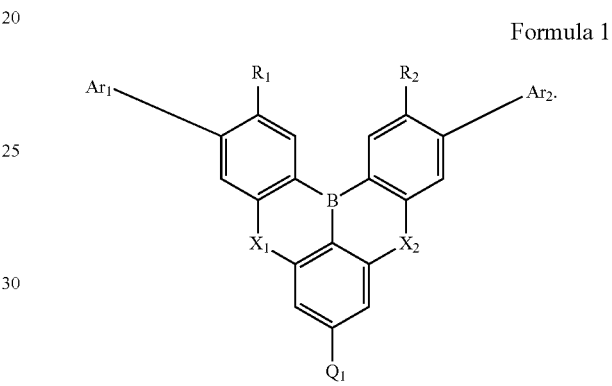

Formula 1

In Formula 1, "a" to "d" may be each independently an integer of 0 to 4, "m" may be 0 or 1, $X_1$ and $X_2$ may be each independently O, S, Se, or NRa, $P_1$ and $P_2$ may be each independently a direct linkage, O, S, Se, NRb, or CRcRd, $R_1$ and $R_2$ may be each independently a substituted or unsubstituted phenyl group, or a substituted or unsubstituted t-butyl group, $R_3$ to $R_6$ and Ra to Rd may be each independently a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring, and $Q_1$ may be a hydrogen atom, a deuterium atom, a substituted or unsubstituted amine group, a substituted or unsubstituted oxy group, a substituted or unsubstituted alkyl group of 1 to 6 carbon atoms, or a substituted or unsubstituted alkenyl group of 2 to 6 ring-forming carbon atoms, and/or combined with an adjacent group to form a ring.

In one or more embodiments, the hole transport region may include a hole injection layer disposed on the first electrode, and a hole transport layer disposed between the hole injection layer and the emission layer and including Compound H-1-1 above.

In one or more embodiments, the emission layer may emit blue light.

In one or more embodiments, the emission layer may emit thermally activated delayed fluorescence.

In one or more embodiments, the emission layer may include a dopant and a host, and the dopant may include the polycyclic compound.

According to one or more embodiments, there is provided a light emitting element including a first electrode, a second electrode disposed on the first electrode, and an emission layer disposed between the first electrode and the second electrode and including a polycyclic compound represented by Formula 1 below, wherein the first electrode and the second electrode each independently include at least one selected from among Ag, Mg, Cu, Al, Pt, Pd, Au, Ni, Nd, Ir, Cr, Li, Ca, LiF, Mo, Ti, W, In, Sn, Zn, compounds of two or more thereof, mixtures of two or more thereof, and oxides thereof.

In Formula 1, $X_1$ and $X_2$ may be each independently O, S, Se, or NRa, at least one selected from among $R_1$ and $R_2$ may be a substituted or unsubstituted phenyl group, or a substituted or unsubstituted t-butyl group, and the remainder may be a substituted or unsubstituted alkyl group of 1 to 6 carbon atoms, a substituted or unsubstituted aryl group of 6 to 20 ring-forming carbon atoms, or a substituted or unsubstituted heteroaryl group of 2 to 15 ring-forming carbon atoms, Ra may be a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring, $Q_1$ may be a hydrogen atom, a deuterium atom, a substituted or unsubstituted amine group, a substituted or unsubstituted oxy group, a substituted or unsubstituted alkyl group of 1 to 6 carbon atoms, or a substituted or unsubstituted alkenyl group of 2 to 6 ring-forming carbon atoms, and/or combined with an adjacent group to form a ring, and at least one selected from among $Ar_1$ and $Ar_2$ may be represented by Formula A below, and the remainder may be a hydrogen atom, a deuterium atom, a substituted or unsubstituted amine group, a substituted or unsubstituted oxy group, or a substituted or unsubstituted alkyl group of 1 to 6 carbon atoms.

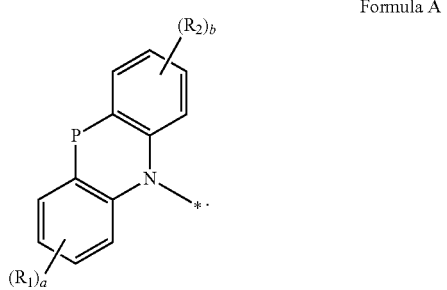

Formula A

In Formula A, "a" and "b" may be each independently an integer of 0 to 4, P may be a direct linkage, O, S, Se, NRb, or CReRd, and $R_1$ to $R_2$, and Rb to Rd may be each independently a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring.

In one or more embodiments, in Formula 1, $Ar_1$ and $Ar_2$ may be different from each other.

In one or more embodiments, in Formula 1, $Ar_1$ and $Ar_2$ may be the same.

BRIEF DESCRIPTION OF THE FIGURES

The accompanying drawings are included to provide a further understanding of the present disclosure and are incorporated in and constitute a part of this specification. The drawings illustrate embodiments of the present disclosure and, together with the description, serve to explain principles of the present disclosure. In the drawings.

DETAILED DESCRIPTION

Figure 1:
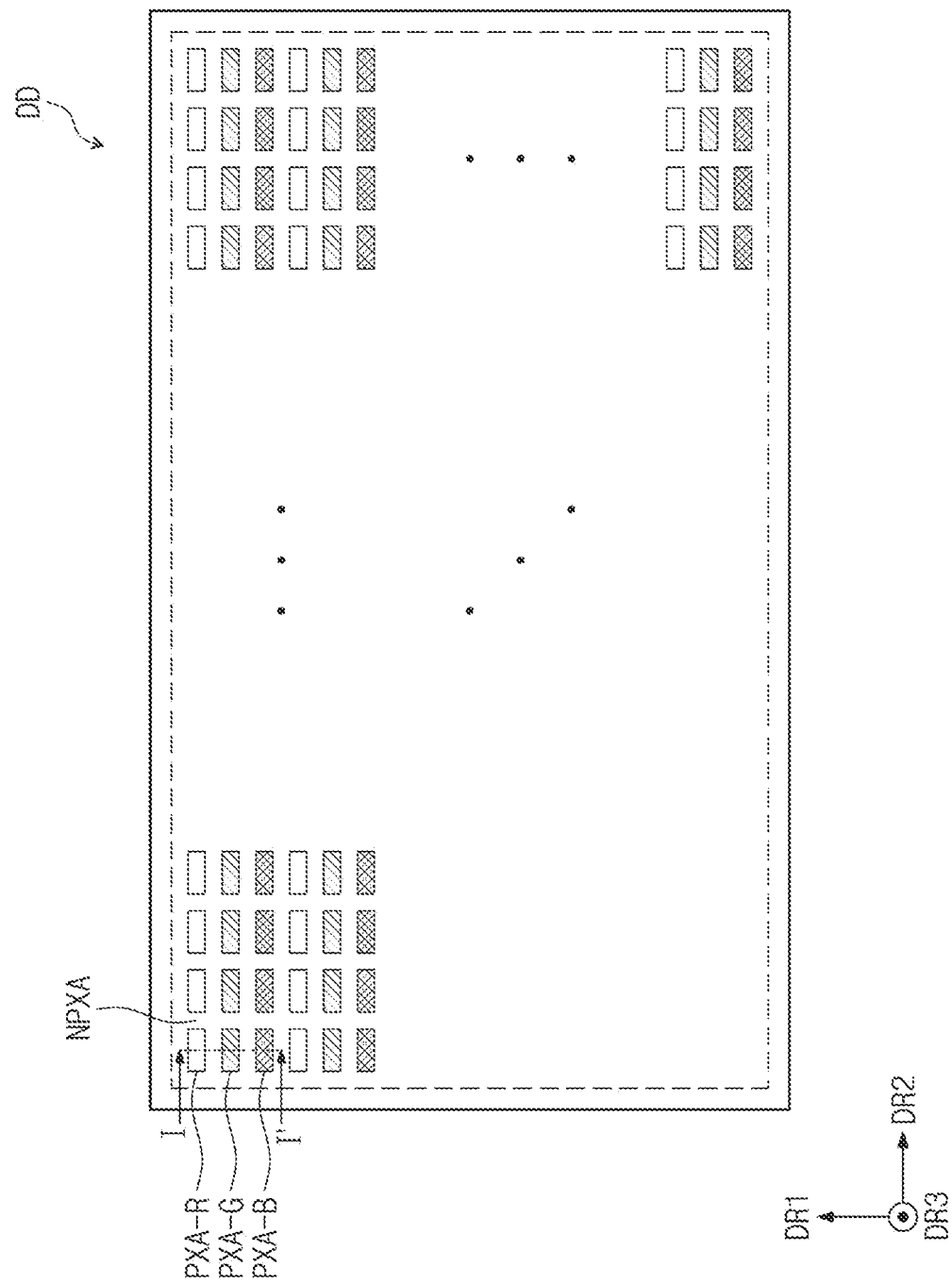
FIG. 1 is a plan view of a display apparatus according to one or more embodiments.

The present disclosure may have various modifications and may be embodied in different forms, and embodiments of the present disclosure will be explained in more detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In the description, it will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the description, when a layer, a film, a region, a plate, etc. is referred to as being "on" or "above" another part, it can be "directly on" the other part (e.g., without any intervening layers therebetween), or intervening layers may also be present. When a layer, a film, a region, a plate, etc. is referred to as being "under" or "below" another part, it can be "directly under" the other part (e.g., without any intervening layers therebetween), or intervening layers may also be present. Also, when an element is referred to as being disposed "on" another element, it can be disposed under the other element.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items. Further, the use of "may" when describing embodiments of the present disclosure refers to "one or more embodiments of the present disclosure"

In the description, the term "substituted or unsubstituted" corresponds to a group that is unsubstituted or that is substituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may each independently be monocycles or polycycles.

In addition, the ring formed via the combination with an adjacent group may be combined with another ring to form a spiro structure.

In the description, the term "adjacent group" may mean a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. In addition, in 4,5-dimethylphenanthrene, two methyl groups may be interpreted as "adjacent groups" to each other.

In the description, the halogen atom may be a fluorine atom, a chlorine atom, a bromine atom and/or an iodine atom.

In the description, the alkyl group may be a linear, branched or cyclic alkyl group. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, a hydrocarbon ring group means an optional functional group or substituent derived from an aliphatic hydrocarbon ring. The hydrocarbon ring group may be a saturated hydrocarbon ring group of 5 to 20 ring-forming carbon atoms.

In the description, an aryl group means an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, a fluorenyl group may be substituted, and two substituents may be combined with each other to form a spiro structure. Examples of a substituted fluorenyl group may be as follows, but embodiments of the present disclosure are not limited thereto:

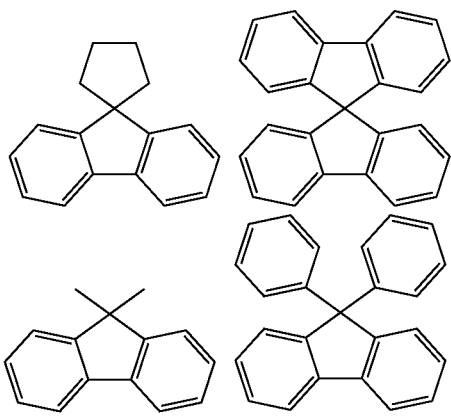

In the description, a heterocyclic group means an optional functional group or substituent derived from a heterocycle in which one or more rings include one or more selected from among B, O, N, P, Si and S as heteroatoms. The heterocyclic group includes an aliphatic heterocyclic group and an aromatic heterocyclic group. The aromatic heterocyclic group may be a heteroaryl group. The aliphatic heterocyclic group and the aromatic heterocyclic group may each independently be a monocycle or a polycycle.

In the description, the heterocyclic group may include one or more selected from among B, O, N, P, Si and S as heteroatoms. If the heterocyclic group includes two or more heteroatoms, two or more heteroatoms may be the same or different. The heterocyclic group may be a monocyclic heterocyclic group or a polycyclic heterocyclic group, and has the concept including a heteroaryl group. The carbon number for forming rings of the heteroaryl group may be 2 to 30, 2 to 20, and 2 to 10.

In the description, an aliphatic heterocyclic group may include one or more selected from among B, O, N, P, Si and S as heteroatoms. The number of ring-forming carbon atoms of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, a heteroaryl group may include one or more selected from among B, O, N, P, Si and S as heteroatoms. If the heteroaryl group includes two or more heteroatoms, two or more heteroatoms may be the same or different. The heteroaryl group may be a monocyclic heterocyclic group or polycyclic heterocyclic group. The carbon number for forming rings of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the explanation of the aryl group may be applied to an arylene group except that the arylene group is a divalent group. The explanation of the heteroaryl group may be applied to a heteroarylene group except that the heteroarylene group is a divalent group.

In the description, a silyl group includes an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the carbon number of an amino group is not specifically limited, but may be 1 to 30. The amino group may include an alkyl amino group, an aryl amino group, and/or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., without limitation.

In the description, the carbon number of a carbonyl group is not specifically limited, but the carbon number may be 1 to 40, 1 to 30, or 1 to 20. For example, the carbonyl group may have the structures below, but is not limited thereto:

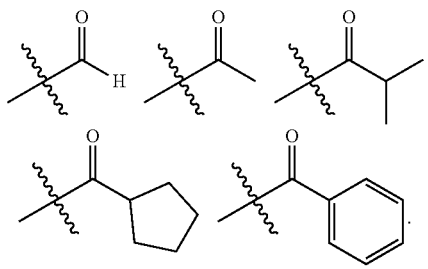

In the description, the carbon number of a sulfinyl group and sulfonyl group is not specifically limited, but may be 1 to 30. The sulfinyl group may include an alkyl sulfinyl group and an aryl sulfinyl group. The sulfonyl group may include an alkyl sulfonyl group and an aryl sulfonyl group.

In the description, a thio group may include an alkyl thio group and an aryl thio group. The thio group may mean the above-defined alkyl group or aryl group combined with a sulfur atom. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, an oxy group may mean the above-defined alkyl group or aryl group which is combined with an oxygen atom. The oxy group may include an alkoxy group and an aryl oxy group. The alkoxy group may be a linear, branched or cyclic chain. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, one or more embodiments of the present disclosure are not limited thereto.

In the description, a boron group may mean the above-defined alkyl group or aryl group which is combined with a boron atom. The boron group includes an alkyl boron group and an aryl boron group. Examples of the boron group may include a trimethylboron group, a triethylboron group, a t-butyldimethylboron group, a triphenylboron group, a diphenylboron group, a phenylboron group, etc., without limitation.

In the description, an alkenyl group may be a linear chain or a branched chain. The carbon number is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the carbon number of an amine group is not specifically limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methylanthracenylamine group, etc., without limitation.

In the description, the alkyl group in the alkylthio group, alkylsulfoxy group, alkylaryl group, alkylamino group, alkylboron group, alkyl silyl group, and alkyl amine group may be the same as the examples of the above-described alkyl group.

In the description, the aryl group in the aryloxy group, arylthio group, arylsulfoxy group, aryl amino group, arylboron group, and aryl silyl group may be the same as the examples of the above-described aryl group.

In the description, a direct linkage may mean a single bond.

Meanwhile, in the description,

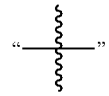

and "----- *" mean positions to be connected (e.g., binding sites).

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, embodiments of the present disclosure will be explained referring to the drawings.

Figure 2:
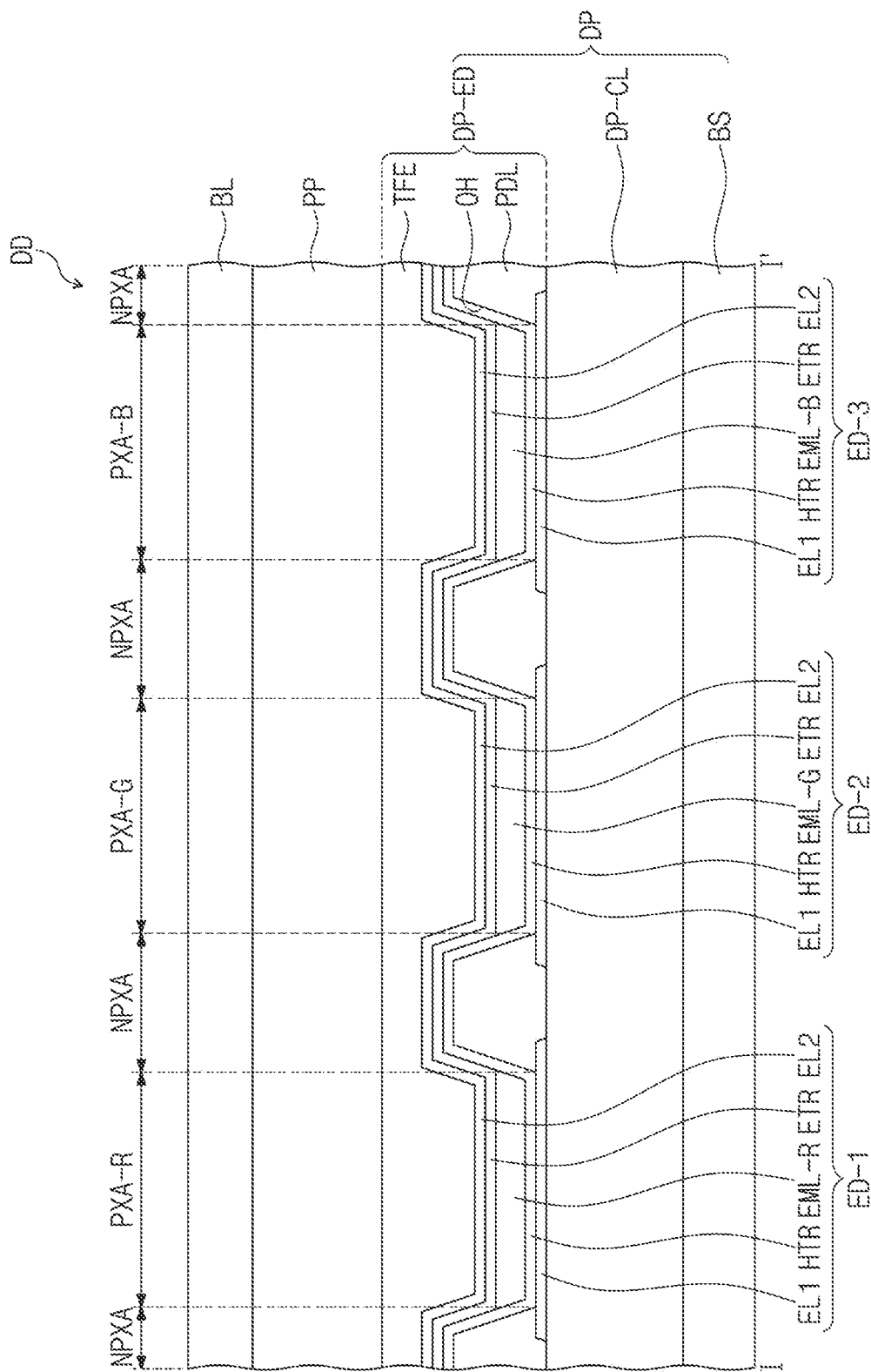
FIG. 2 is a cross-sectional view of a display apparatus according to one or more embodiments.

FIG. 1 is a plan view showing one or more embodiments of a display apparatus DD. FIG. 2 is a cross-sectional view of a display apparatus DD of one or more embodiments. FIG. 2 is a cross-sectional view showing a part corresponding to line I-I' in FIG. 1.

The display apparatus DD may include a display panel DP and an optical layer PP disposed on the display panel DP. The display panel DP includes light emitting elements ED-1, ED-2 and ED-3. The display apparatus DD may include multiple light emitting elements ED-1, ED-2 and ED-3. The optical layer PP may be disposed on the display panel DP and may control reflected light by external light at the display panel DP. The optical layer PP may include, for example, a polarization layer and/or a color filter layer. In one or more embodiments, the optical layer PP may be omitted in the display apparatus DD of one or more embodiments.

On the optical layer PP, a base substrate BL may be disposed. The base substrate BL may be a member providing a base surface where the optical layer PP is disposed. The base substrate BL may be a glass substrate, a metal substrate, a plastic substrate, etc. However, one or more embodiments of the present disclosure are not limited thereto, and the base substrate BL may be an inorganic layer, an organic layer, or a composite material layer (e.g., including an organic material and an inorganic material). In one or more embodiments, the base substrate BL may be omitted.

The display apparatus DD according to one or more embodiments may further include a plugging layer. The plugging layer may be disposed between a display device layer DP-ED and a base substrate BL. The plugging layer may be an organic layer. The plugging layer may include at least one selected from among an acrylic resin, a silicon-based resin and an epoxy-based resin.

The display panel DP may include a base layer BS, a circuit layer DP-CL provided on the base layer BS and a display device layer DP-ED. The display device layer DP-ED may include a pixel definition layer PDL, light emitting elements ED-1, ED-2 and ED-3 disposed in the pixel definition layer PDL, and an encapsulating layer TFE disposed on the light emitting elements ED-1, ED-2 and ED-3.

The base layer BS may be a member providing a base surface where the display device layer DP-ED is disposed. The base layer BS may be a glass substrate, a metal substrate, a plastic substrate, etc. However, one or more embodiments of the present disclosure are not limited thereto, and the base layer BS may be an inorganic layer, an organic layer, or a composite material layer.

In one or more embodiments, the circuit layer DP-CL is disposed on the base layer BS, and the circuit layer DP-CL may include multiple transistors. Each of the transistors may include a control electrode, an input electrode, and an output electrode. For example, the circuit layer DP-CL may include switching transistors and driving transistors for driving the light emitting elements ED-1, ED-2 and ED-3 of the display device layer DP-ED.

Each of the light emitting elements ED-1, ED-2 and ED-3 may have the structures of light emitting elements ED of embodiments according to FIG. 3 to FIG. 6, which will be explained herein below. Each of the light emitting elements ED-1, ED-2 and ED-3 may include a first electrode EL1, a hole transport region HTR, emission layers EML-R, EML-G and EML-B, an electron transport region ETR, and a second electrode EL2.

In FIG. 2, shown is an embodiment where the emission layers EML-R, EML-G and EML-B of light emitting elements ED-1, ED-2 and ED-3, which are in opening portions OH defined in a pixel definition layer PDL, are disposed, and a hole transport region HTR, an electron transport region ETR and a second electrode EL2 are provided as common layers in all light emitting elements ED-1, ED-2 and ED-3. However, one or more embodiments of the present disclosure are not limited thereto. In one or more embodiments, the hole transport region HTR and the electron transport region ETR may be patterned and provided in the opening portions OH defined in the pixel definition layer PDL. For example, in one or more embodiments, the hole transport region HTR, the emission layers EML-R, EML-G and EML-B, and the electron transport region ETR of the light emitting elements ED-1, ED-2 and ED-3 may be patterned by an ink jet printing method and provided in the opening portions OH.

An encapsulating layer TFE may cover the light emitting elements ED-1, ED-2 and ED-3. The encapsulating layer TFE may encapsulate the display device layer DP-ED. The encapsulating layer TFE may be a thin film encapsulating layer. The encapsulating layer TFE may be one layer or a stacked layer of multiple layers. The encapsulating layer TFE includes at least one insulating layer. The encapsulating layer TFE according to one or more embodiments may include at least one inorganic layer (hereinafter, encapsulating inorganic layer). In some embodiments, the encapsulating layer TFE according to one or more embodiments may include at least one organic layer (hereinafter, encapsulating organic layer) and at least one encapsulating inorganic layer.

The encapsulating inorganic layer protects the display device layer DP-ED from moisture/oxygen, and the encapsulating organic layer protects the display device layer DP-ED from foreign materials such as dust particles. The encapsulating inorganic layer may include silicon nitride, silicon oxy nitride, silicon oxide, titanium oxide, and/or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed while filling the opening portion OH.

Referring to FIG. 1 and FIG. 2, the display apparatus DD may include a non-luminous area NPXA and luminous areas PXA-R, PXA-G and PXA-B. The luminous areas PXA-R, PXA-G and PXA-B may be areas emitting (e.g., to emit) light produced from the light emitting elements ED-1, ED-2 and ED-3, respectively. The luminous areas PXA-R, PXA-G and PXA-B may be separated from each other on a plane (e.g., in plan view).

The luminous areas PXA-R, PXA-G and PXA-B may be areas separated by the pixel definition layer PDL. The non-luminous areas NPXA may be areas between neighboring luminous areas PXA-R, PXA-G and PXA-B and may be areas corresponding to the pixel definition layer PDL. In one or more embodiments, in the disclosure, each of the luminous areas PXA-R, PXA-G and PXA-B may correspond to each pixel. The pixel definition layer PDL may divide the light emitting elements ED-1, ED-2 and ED-3. The emission layers EML-R, EML-G and EML-B of the light emitting elements ED-1, ED-2 and ED-3 may be disposed and divided in the opening portions OH defined in the pixel definition layer PDL.

The luminous areas PXA-R, PXA-G and PXA-B may be divided into multiple groups according to the color of light produced from the light emitting elements ED-1, ED-2 and ED-3. In the display apparatus DD of one or more embodiments, shown in FIG. 1 and FIG. 2, three luminous areas PXA-R, PXA-G and PXA-B emitting red light, green light and blue light are illustrated. For example, the display apparatus DD of one or more embodiments may include a red luminous area PXA-R, a green luminous area PXA-G and a blue luminous area PXA-B, which are separated from each other.

In the display apparatus DD according to one or more embodiments, multiple light emitting elements ED-1, ED-2 and ED-3 may emit light having different wavelength regions. For example, in one or more embodiments, the display apparatus DD may include a first light emitting element ED-1 emitting (e.g., to emit) red light, a second light emitting element ED-2 emitting (e.g., to emit) green light, and a third light emitting element ED-3 emitting (e.g., to emit) blue light. For example, the red luminous area PXA-R, the green luminous area PXA-G, and the blue luminous area PXA-B of the display apparatus DD may correspond to the first light emitting element ED-1, the second light emitting element ED-2, and the third light emitting element ED-3, respectively.

However, one or more embodiments of the present disclosure are not limited thereto, and the first to third light emitting elements ED-1, ED-2 and ED-3 may emit light in the same wavelength region, or at least one thereof may emit light in a different wavelength region. For example, all the first to third light emitting elements ED-1, ED-2 and ED-3 may emit blue light.

The luminous areas PXA-R, PXA-G and PXA-B in the display apparatus DD according to one or more embodiments may be arranged in a stripe shape or pattern. Referring to FIG. 1, multiple red luminous areas PXA-R may be arranged with each other along a second directional axis DR2, multiple green luminous areas PXA-G may be arranged with each other along a second directional axis DR2, and multiple blue luminous areas PXA-B may be arranged with each other along a second directional axis DR2. In addition, the red luminous area PXA-R, the green luminous area PXA-G and the blue luminous area PXA-B may be arranged alternatingly (e.g., by turns) with each other along a first directional axis DR1.

In FIG. 1 and FIG. 2, the areas of the luminous areas PXA-R, PXA-G and PXA-B are shown to be similar, but one or more embodiments of the present disclosure are not limited thereto. The areas of the luminous areas PXA-R, PXA-G and PXA-B may be different from each other according to the wavelength region of light emitted. In one or more embodiments, the areas of the luminous areas PXA-R, PXA-G and PXA-B may refer to areas thereof on a plane defined by the first directional axis DR1 and the second directional axis DR2.

The arrangement of the luminous areas PXA-R, PXA-G and PXA-B is not limited to the configuration shown in FIG. 1, and the arrangement order of the red luminous areas PXA-R, the green luminous areas PXA-G and the blue luminous areas PXA-B may be provided in various suitable combinations according to the properties of display quality required (or desired) for the display apparatus DD. For example, the arrangement of the luminous areas PXA-R, PXA-G and PXA-B may be a PenTile®/PENTILE® arrangement, or a diamond arrangement. PENTILE® is a registered trademark owned by Samsung Display Co., Ltd.

In one or more embodiments, the areas of the luminous areas PXA-R, PXA-G and PXA-B may be different from each other. For example, in one or more embodiments, the area of the green luminous area PXA-G may be smaller than the area of the blue luminous area PXA-B, but one or more embodiments of the present disclosure are not limited thereto.

FIG. 3 to FIG. 6 are cross-sectional views schematically showing light emitting elements according to embodiments of the present disclosure. The light emitting element ED according to one or more embodiments may include a first electrode EL1, a hole transport region HTR, an emission layer EML, an electron transport region ETR, and a second electrode EL2 stacked in the stated order.

Figure 3:
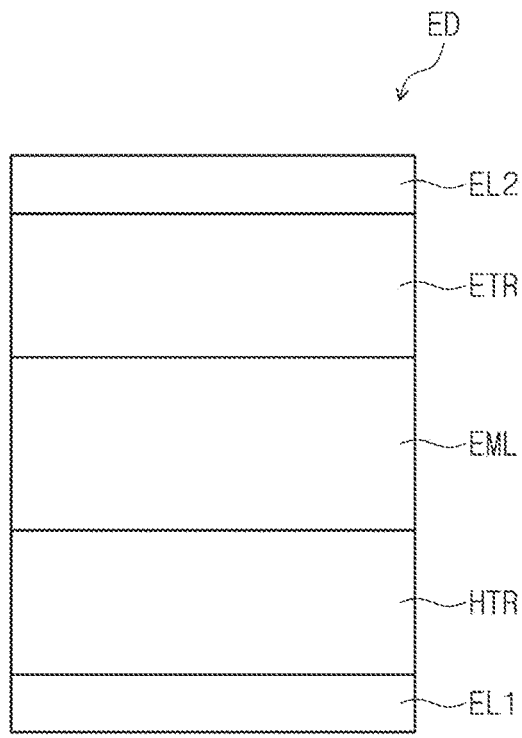
FIG. 3 is a cross-sectional view schematically showing a light emitting element according to one or more embodiments.
Figure 4:
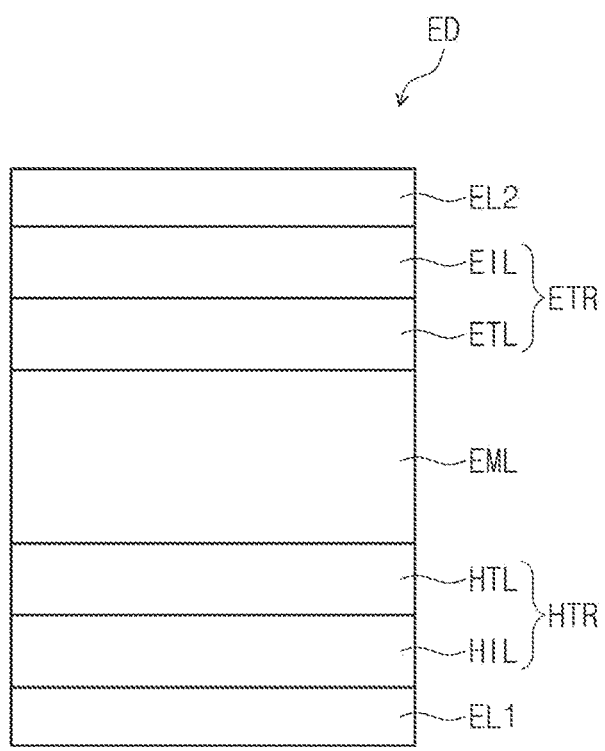
FIG. 4 is a cross-sectional view schematically showing a light emitting element according to one or more embodiments.
Figure 5:
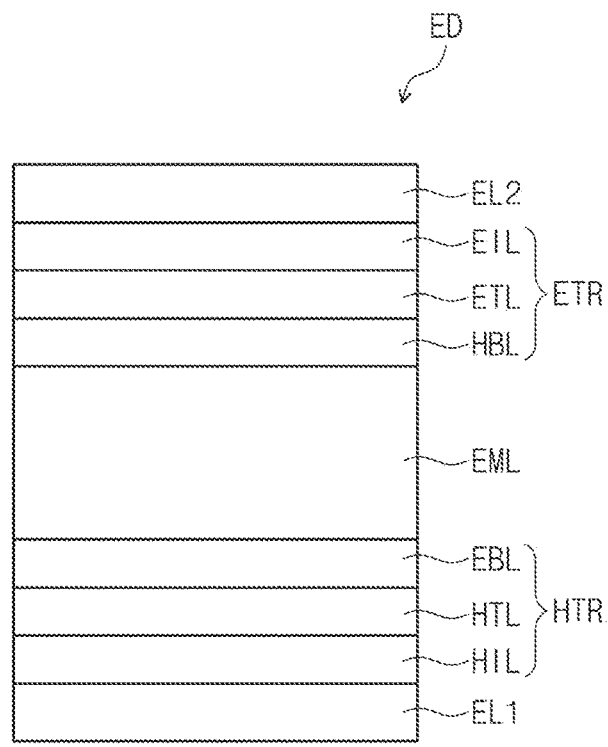
FIG. 5 is a cross-sectional view schematically showing a light emitting element according to one or more embodiments.
Figure 6:
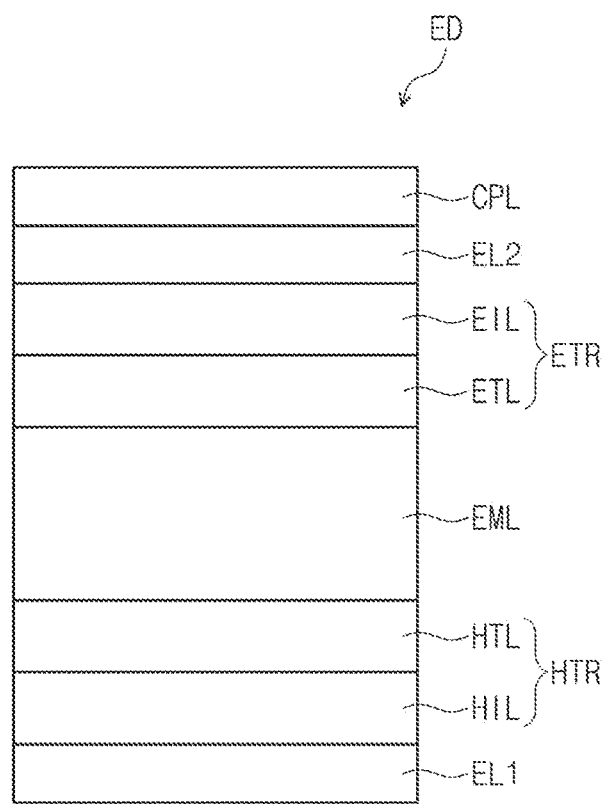
FIG. 6 is a cross-sectional view schematically showing a light emitting element according to one or more embodiments.

When compared with FIG. 3, FIG. 4 shows the cross-sectional view of a light emitting element ED of one or more embodiments, wherein a hole transport region HTR includes a hole injection layer HIL and a hole transport layer HTL, and an electron transport region ETR includes an electron injection layer EIL and an electron transport layer ETL. In addition, when compared with FIG. 3, FIG. 5 shows the cross-sectional view of a light emitting element ED of one or more embodiments, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 4, FIG. 6 shows the cross-sectional view of a light emitting element ED of one or more embodiments, including a capping layer CPL disposed on the second electrode EL2.

The first electrode EL1 has conductivity. The first electrode EL1 may be formed using a metal material, a metal alloy or any suitable conductive compound. The first electrode EL1 may be an anode or a cathode. However, one or more embodiments of the present disclosure are not limited thereto. In one or more embodiments, the first electrode EL1 may be a pixel electrode. The first electrode EL1 may be a transmissive electrode, a transflective electrode, or a reflective electrode. If the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, and/or mixtures thereof (for example, a mixture of Ag and Mg). Also, the first electrode EL1 may have a structure including multiple layers including a reflective layer or a transflective layer formed using any of the above materials, and a transmissive conductive layer formed using ITO, IZO, ZnO, and/or ITZO. For example, the first electrode EL1 may include a three-layer structure of ITO/Ag/ITO. However, one or more embodiments of the present disclosure are not limited thereto. The first electrode EL1 may include the above-described metal materials, combinations of two or more metal materials selected from among the above-described metal materials and oxides of the above-described metal materials. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer (or an emission auxiliary layer), or an electron blocking layer EBL. The thickness of the hole transport region HTR may be from about 50 Å to about 15,000 Å.

The hole transport region HTR may have a single layer formed using a single material, a single layer formed using multiple different materials, or a multilayer structure including multiple layers formed using multiple different materials.

For example, the hole transport region HTR may have the structure of a single layer of a hole injection layer HIL or a hole transport layer HTL, and may have a structure of a single layer formed using a hole injection material and a hole transport material. In one or more embodiments, the hole transport region HTR may have a structure of a single layer formed using multiple different materials, or a structure stacked from the first electrode EL1 of hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL, without limitation.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below:

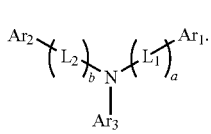

Formula H-1

In Formula H-1 above, $L_1$ and $L_2$ may be each independently a direct linkage, a substituted or unsubstituted arylene group of 6 to 30 ring-forming carbon atoms, or a substituted or unsubstituted heteroarylene group of 2 to 30 ring-forming carbon atoms. "a" and "b" may be each independently an integer of 0 to 10. In one or more embodiments, if "a" or "b" is an integer of 2 or more, multiple $L_1$ and $L_2$ may be each independently a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may be each independently a substituted or unsubstituted aryl group of 6 to 30 ring-forming carbon atoms, or a substituted or unsubstituted heteroaryl group of 2 to 30 ring-forming carbon atoms. In some embodiments, in Formula H-1, $Ar_3$ may be a substituted or unsubstituted aryl group of 6 to 30 ring-forming carbon atoms.

The compound represented by Formula H-1 may be a monoamine compound. In some embodiments, the compound represented by Formula H-1 may be a diamine compound in which at least one selected from among $Ar_1$ to $Ar_3$ includes an amine group as a substituent. In some embodiments, the compound represented by Formula H-1 may be a carbazole-based compound in which at least one selected from among $Ar_1$ to $Ar_3$ includes a substituted or unsubstituted carbazole group, and/or a fluorene-based compound in which at least one selected from among $Ar_1$ to $Ar_3$ includes a substituted or unsubstituted fluorene group.

The compound represented by Formula H-1 may be represented by any one selected from among the compounds in Compound Group H below. However, the compounds shown in Compound Group H are only illustrations, and the compound represented by Formula H-1 is not limited to the compounds represented in Compound Group H below.

Compound Group H

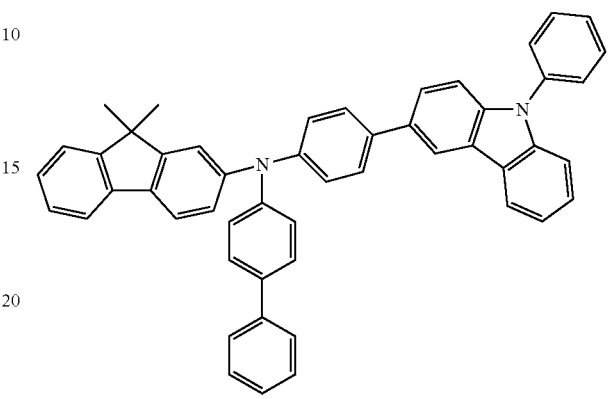

H-1-1

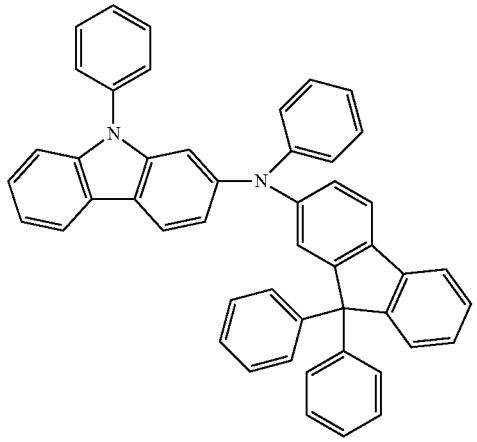

H-1-2

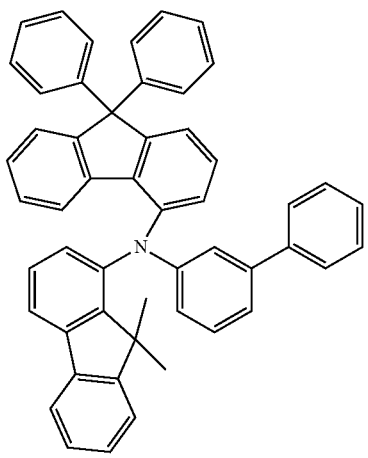

H-1-3

H-1-4
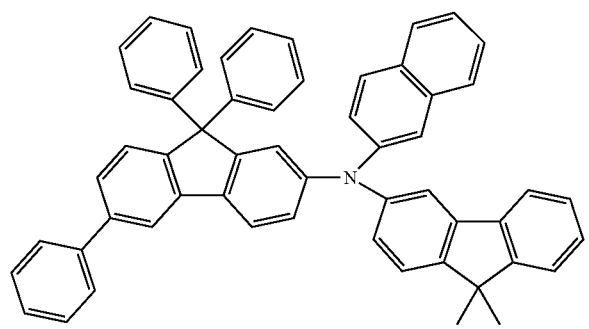
H-1-7
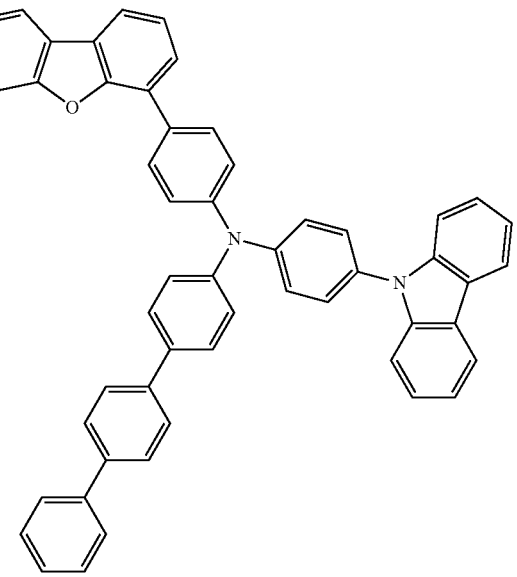
H-1-5
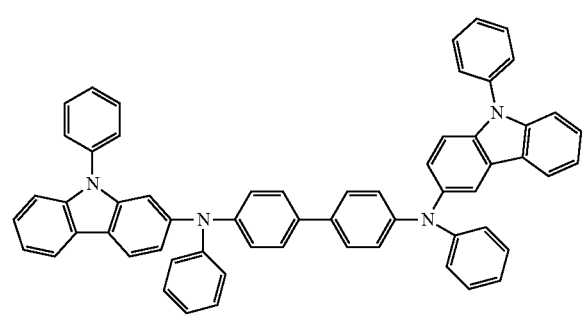
H-1-8
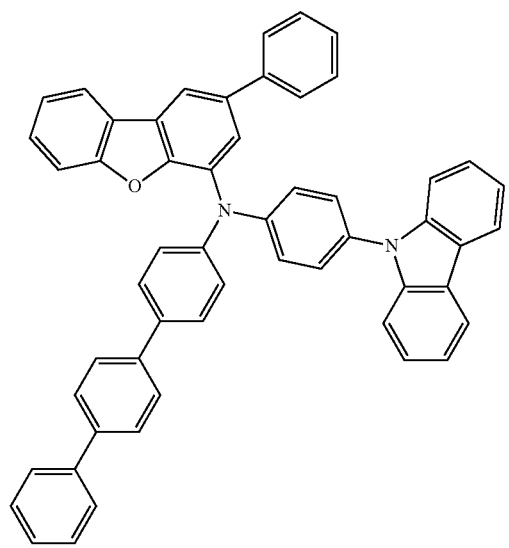
H-1-6
H-1-9
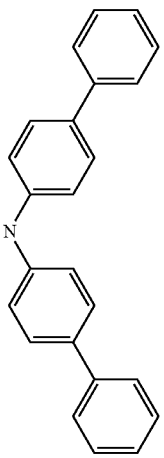

H-1-10
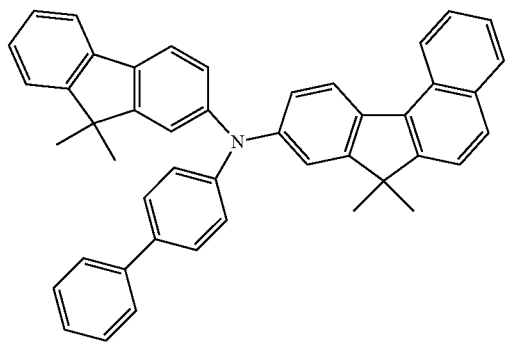
H-1-11
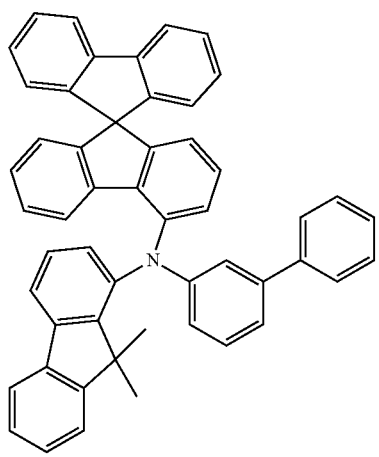
H-1-12
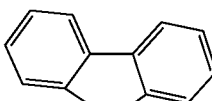
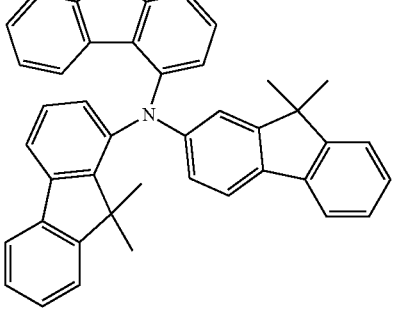
H-1-13
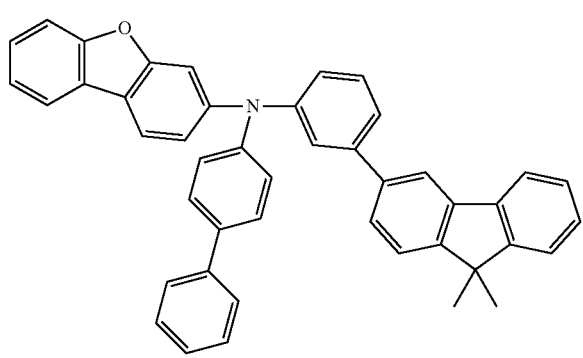
H-1-14
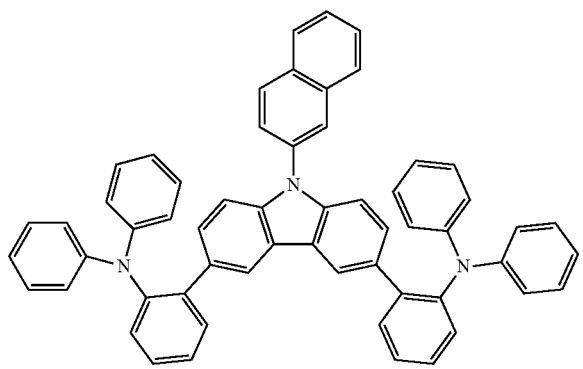
H-1-15
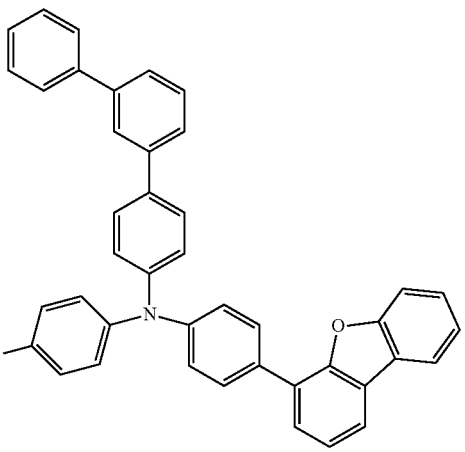
H-1-16

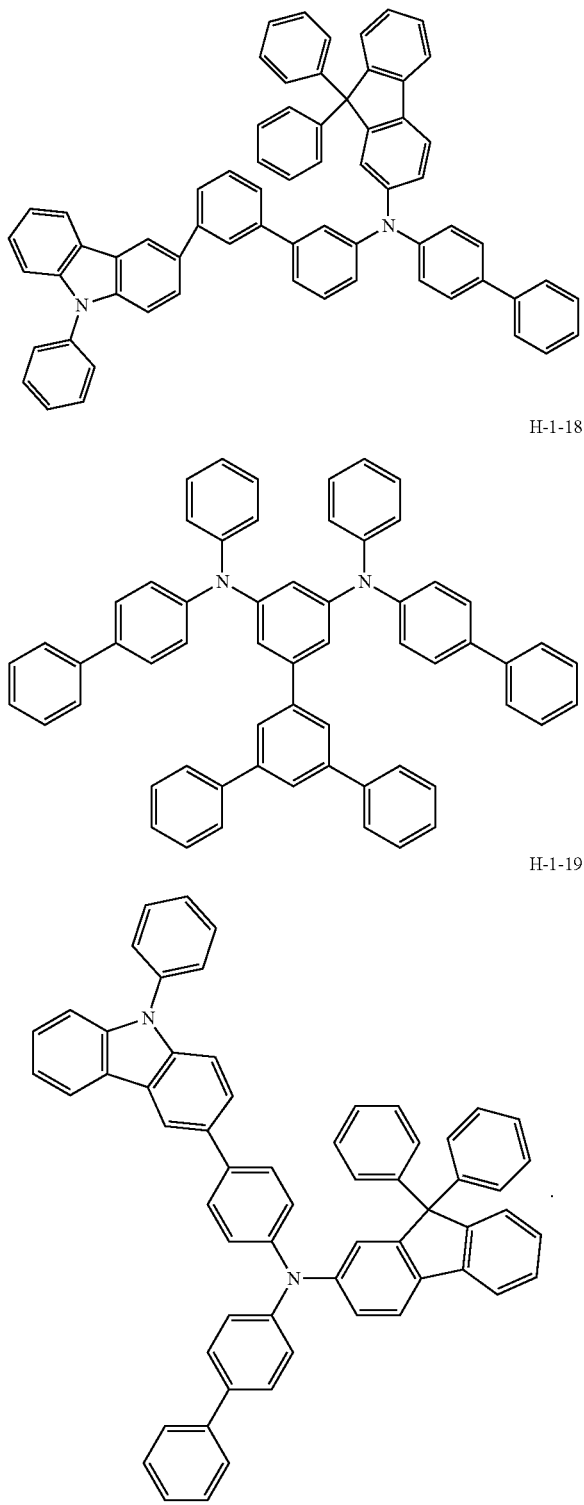

The hole transport region HTR may include a phthalocyanine compound (such as copper phthalocyanine), $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4''-[tris(3-methylphenyl)phenylamino] triphenylamine (m-MTDATA), 4,4',4''-tris(N,N-diphenylamino)triphenylamine (TDATA), 4,4',4''-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenylbenzidine (NPB), triphenylamine-containing polyetherketone (TPAPEK), 4-isopropyl-4'-methyldiphenyliodonium [tetrakis(pentafluorophenyl)borate], and/or dipyrazino[2,3-f:2',3'-h] quinoxaline-2,3,6,7,10,11-hexacarbonitrile (HAT-CN).

The hole transport region HTR may include carbazole derivatives (such as N-phenyl carbazole and/or polyvinyl carbazole), fluorene-based derivatives, N,N'-bis(3-methylphenyl)-N,N'-diphenyl-[1,1'-biphenyl]-4,4'-diamine (TPD), triphenylamine-based derivatives (such as 4,4',4''-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), etc.

In one or more embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one selected from among the hole injection layer HIL, the hole transport layer HTL, and the electron blocking layer EBL.

The thickness of the hole transport region HTR may be from about 100 Å to about 10,000 Å, for example, from about 100 Å to about 5,000 Å. In one or more embodiments where the hole transport region HTR includes a hole injection layer HIL, the thickness of the hole injection region HIL may be, for example, from about 30 Å to about 1,000 Å. In one or more embodiments where the hole transport region HTR includes a hole transport layer HTL, the thickness of the hole transport layer HTL may be from about 30 Å to about 1,000 Å. For example, in one or more embodiments where the hole transport region HTR includes an electron blocking layer, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy their respective above-described ranges, satisfactory (or suitable) hole transport properties may be achieved without substantial increase of a driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. The p-dopant may include at least one selected from among metal halide compounds, quinone derivatives, metal oxides, and cyano group-containing compounds, without limitation. For example, the p-dopant may include metal halide compounds (such as CuI and/or RbI), quinone derivatives (such as tetracyanoquinodimethane (TCNQ) and/or 2,3,5,6-tetrafluoro-7,7',8,8-tetracyanoquinodimethane (F4-TCNQ)), metal oxides (such as tungsten oxide and/or molybdenum oxide), cyano group-containing compounds (such as dipyrazino[2,3-f: 2',3'-h] quinoxaline-2,3,6,7,10,11-hexacarbonitrile (HATCN) and/or 4-[[2,3-bis[cyano-(4-cyano-2,3,5,6-tetrafluorophenyl)

methylidene]cyclopropylidene]-cyanomethyl]-2,3,5,6-tetrafluorobenzonitrile (NDP9)), etc., without limitation.

In one or more embodiments, the hole transport region HTR may further include at least one selected from among a buffer layer and an electron blocking layer EBL, in addition to the hole injection layer HIL and the hole transport layer HTL. The buffer layer may compensate resonance distance according to the wavelength of light emitted from an emission layer EML and may increase emission efficiency. As materials included in the buffer layer, any of the materials which may be included in the hole transport region HTR may be used. The electron blocking layer EBL is a layer playing the role of blocking or reducing the injection of electrons from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed using a single material, a single layer formed using multiple different materials, or a multilayer structure having multiple layers formed using multiple different materials.

In the light emitting element ED according to one or more embodiments, the emission layer EML may include a polycyclic compound according to one or more embodiments. The polycyclic compound of one or more embodiments may be represented by Formula 1 below.

Formula 1

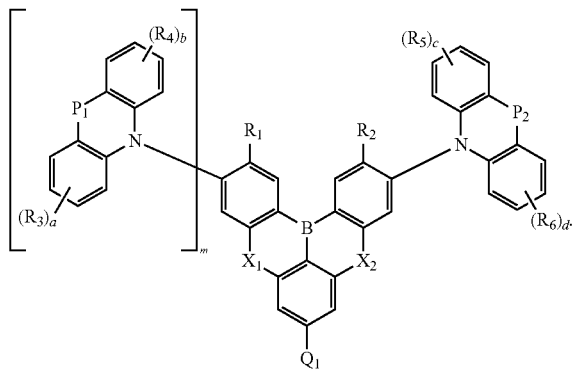

In Formula 1, $X_1$ and $X_2$ are each independently O, S, Se, or NRa. In one or more embodiments, $X_1$ and $X_2$ may be the same or different. For example, $X_1$ may be N, and $X_2$ may be S, Se, or NRa; $X_1$ may be O, and $X_2$ may be S, Se, or NRa; or $X_1$ may be Se, and $X_2$ may be NRa. However, these are only illustrations, and embodiments of the present disclosure are not limited thereto.

In Formula 1, "m" may be 0 or 1. "a" to "d" may be each independently an integer of 0 to 4. If "a" is an integer of 2 or more, multiple $R_3$ groups may be the same, or at least one thereof may be different. If each of "b" to "d" is an integer of 2 or more, each of multiple $R_4$ to $R_6$ groups may be the same, or at least one thereof may be different from remaining $R_4$ to $R_6$.

In Formula 1, $P_1$ and $P_2$ may be each independently a direct linkage, O, S, Se, NRb, or CRcRd. In Formula 1, $P_1$ and $P_2$ may be the same or different from each other. For example, both $P_1$ and $P_2$ may be direct linkages, O, S, Se, NRb, or CRcRd; or $P_1$ may be a direct linkage, and $P_2$ may be S, Se, NRb, or CRcRd. However, these are only illustrations, and embodiments of the present disclosure are not limited thereto.

In Formula 1, at least one selected from among $R_1$ and $R_2$ may be a substituted or unsubstituted phenyl group, or a substituted or unsubstituted t-butyl group, and the remainder may be a substituted or unsubstituted alkyl group of 1 to 6 carbon atoms, a substituted or unsubstituted aryl group of 6 to 20 ring-forming carbon atoms, or a substituted or unsubstituted heteroaryl group of 2 to 15 ring-forming carbon atoms. For example, $R_1$ may be a substituted or unsubstituted phenyl group, or a substituted or unsubstituted t-butyl group, and $R_2$ may be a substituted or unsubstituted alkyl group of 1 to 6 carbon atoms, a substituted or unsubstituted aryl group of 6 to 20 ring-forming carbon atoms, or a substituted or unsubstituted heteroaryl group of 2 to 15 ring-forming carbon atoms, or both $R_1$ and $R_2$ may be substituted or unsubstituted phenyl groups, or substituted or unsubstituted t-butyl groups.

In Formula 1, $R_3$ to $R_6$ may be each independently a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring. For example, $R_3$ to $R_6$ may be all t-butyl groups.

Ra to Rd may be each independently a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring. For example, Ra to Rd may be all t-butyl groups. For example, Ra may be an unsubstituted phenyl group, or an unsubstituted terphenyl group. However, these are only illustrations, and embodiments of the present disclosure are not limited thereto.

In Formula 1, $Q_1$ may be a hydrogen atom, a deuterium atom, a substituted or unsubstituted amine group, a substituted or unsubstituted oxy group, a substituted or unsubstituted alkyl group of 1 to 6 carbon atoms, or a substituted or unsubstituted alkenyl group of 2 to 6 ring-forming carbon atoms, and/or combined with an adjacent group to form a ring. For example, $Q_1$ may be a substituted or unsubstituted carbazole group, a substituted or unsubstituted amine group, a substituted or unsubstituted t-butyl group, or a substituted or unsubstituted phenyl group. However, these are only illustrations, and embodiments of the present disclosure are not limited thereto.

Formula 1 may be represented by Formula 2-1 or Formula 2-2 below.

Formula 2-1

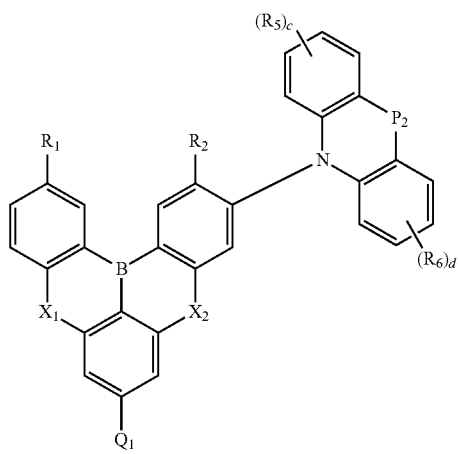

Formula 2A-2

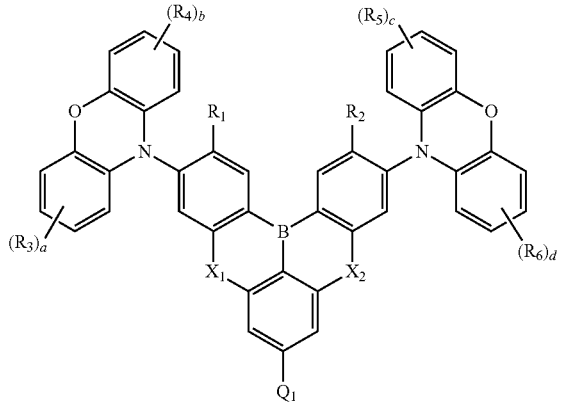

Formula 2-2

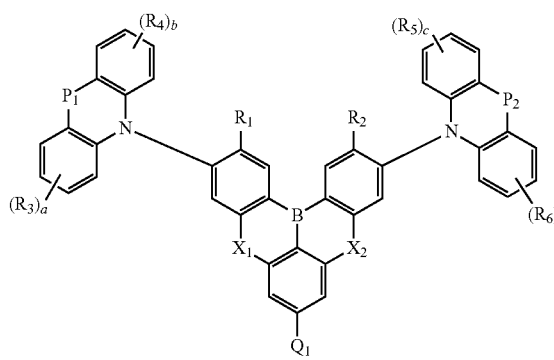

Formula 2A-3

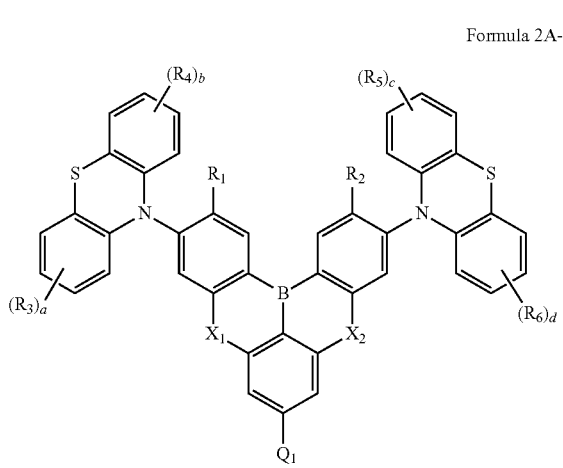

Formula 2-1 corresponds to a case where "m" is 0 in Formula 1, and Formula 2-2 corresponds to a case where "m" is 1 in Formula 1. In Formula 2-1, the same explanations for "a", "b", $P_1$, $R_1$ to $R_4$, $X_1$, $X_2$, and $Q_1$ as those provided referring to Formula 1 may be applied. In Formula 2-2, the same explanations for "a" to "d", $P_1$, $P_2$, $R_1$ to $R_6$, $X_1$, $X_2$, and $Q_1$ as those provided referring to Formula 1 may be applied.

Formula 2-2 may be represented by any one selected from among Formula 2A-1 to Formula 2A-6 below.

Formula 2A-1

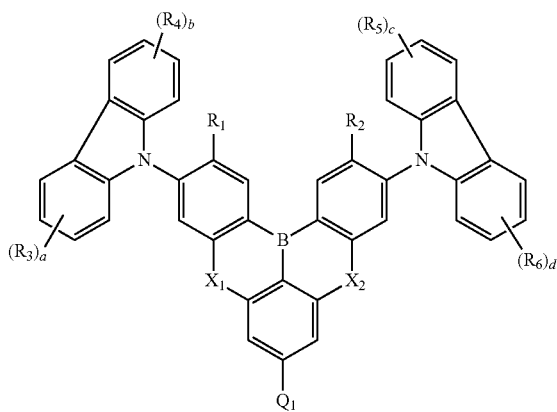

Formula 2A-4

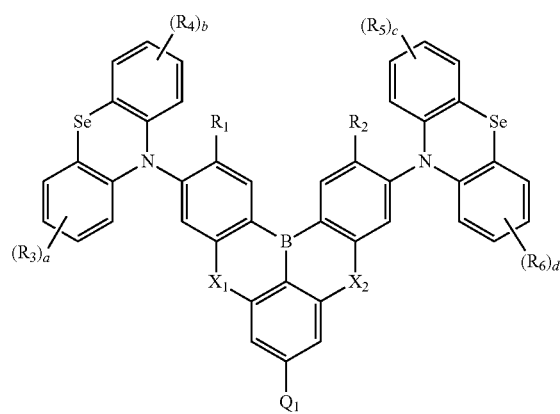

Formula 2A-5

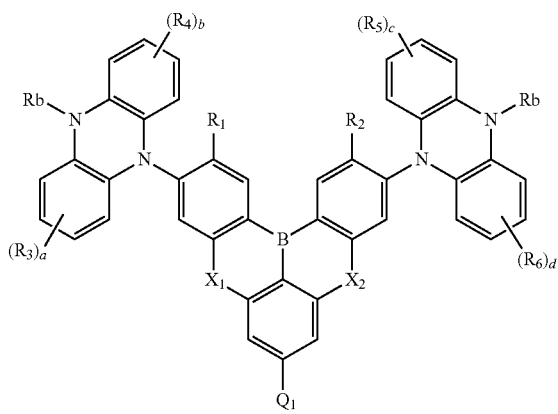

Formula 2A-6

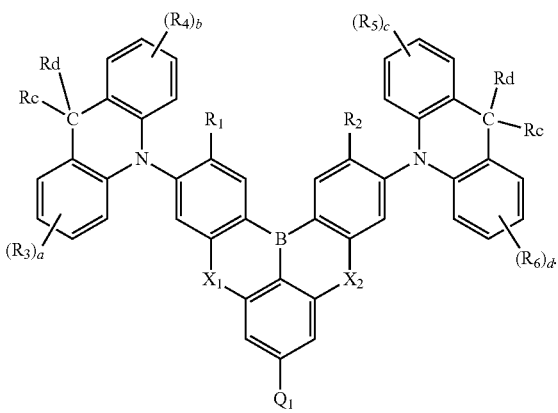

Formula 2A-1 to Formula 2A-6 are cases where heteroaryl groups at para positions to boron are the same in Formula 2. In Formulae 2A-1 to 2A-6, the same explanations for "a" to "d", $R_1$ to $R_6$, $X_1$, $X_2$, Rb to Rd, and $Q_1$ as those provided referring to Formula 1 may be applied.

Formula 2-2 may be represented by any one selected from among Formula 2B-1 to Formula 2B-15 below.

Formula 2B-1

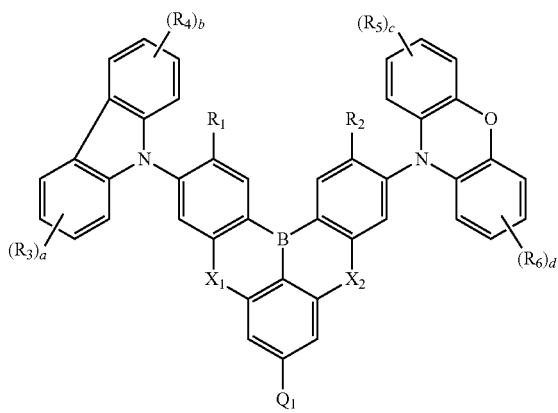

Formula 2B-2

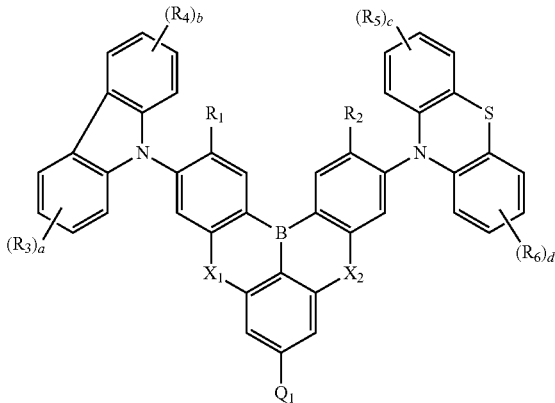

Formula 2B-3

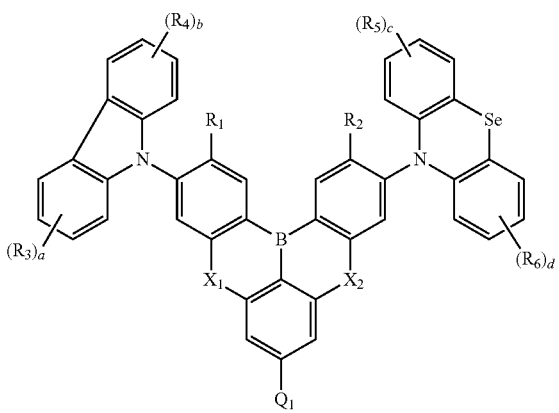

Formula 2B-4

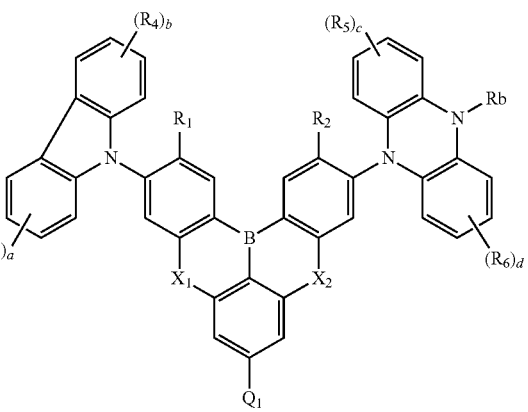

Formula 2B-5
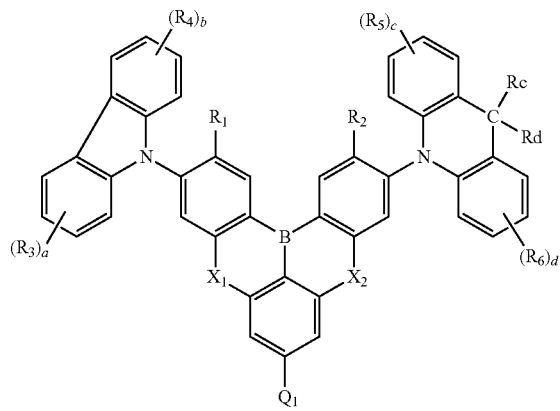
Formula 2B-6
Formula 2B-7
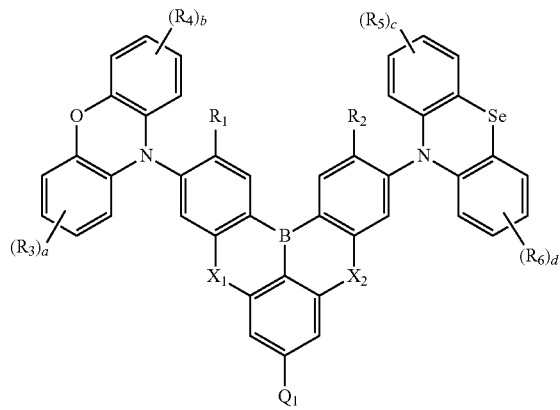
Formula 2B-8
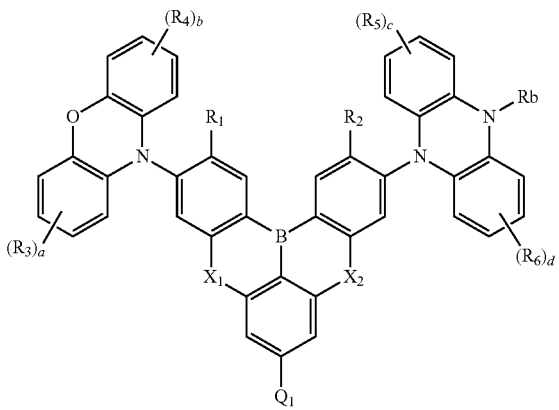
Formula 2B-9
Formula 2B-10
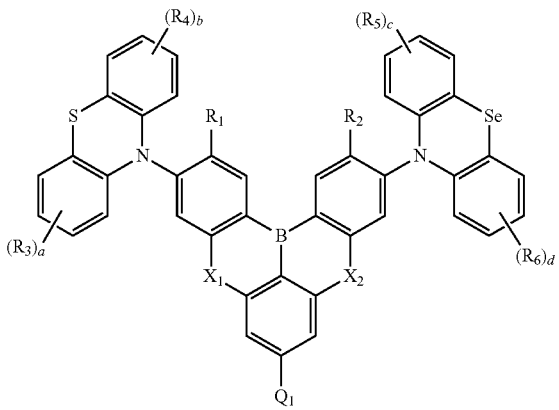

Formula 2B-11
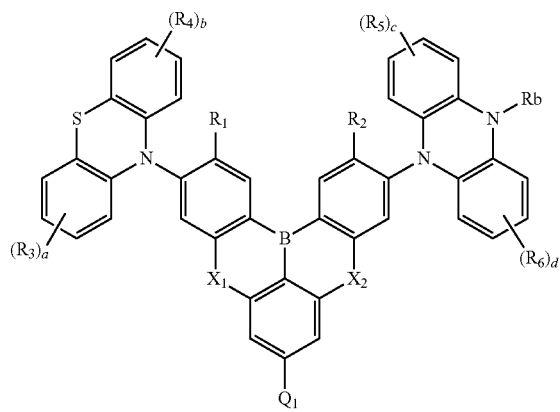
Formula 2B-12
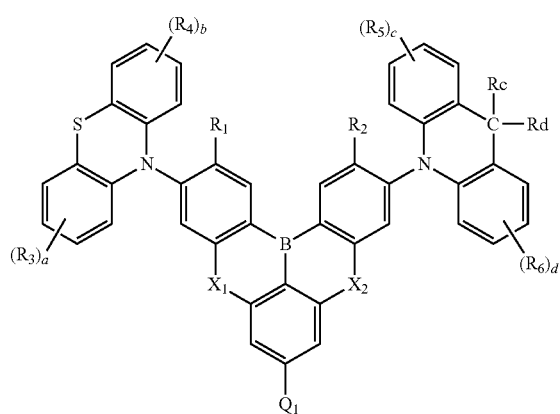
Formula 2B-13
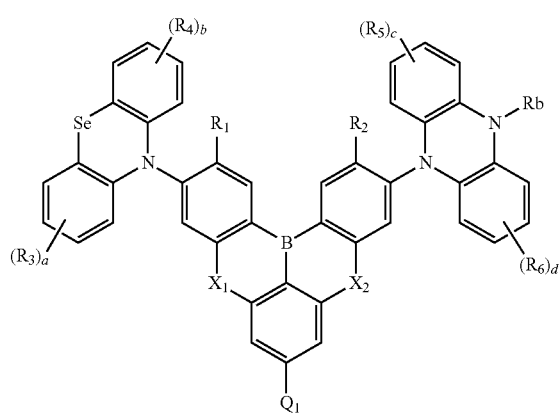
Formula 2B-14
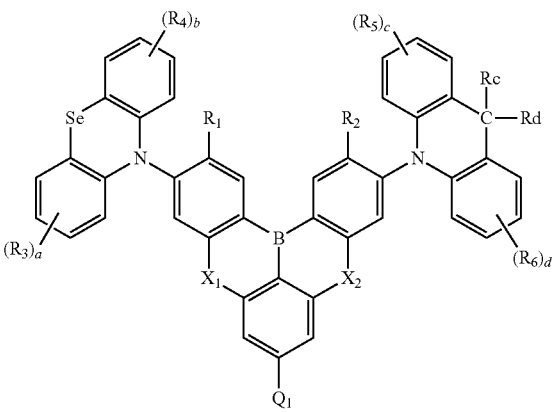
Formula 2B-15
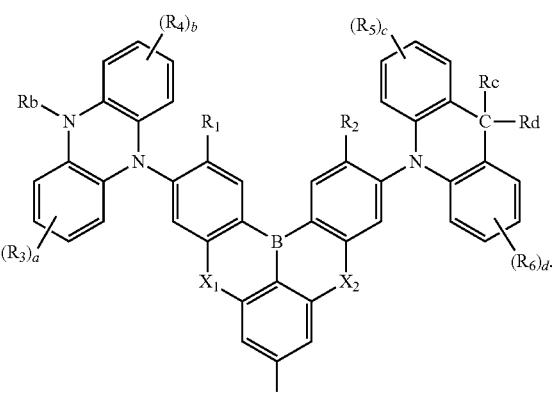
Formula 2B-1 to Formula 2B-15 correspond to cases where heteroaryl groups at para positions to boron are different from each other in Formula 2. In Formulae 2B-1 to 2B-15, the same explanations for "a" to "d", $R_1$ to $R_6$, $X_1$, $X_2$, $Q_1$, and Rb to Rd as those provided referring to Formula 1 may be applied.

Formula 1 may be represented by Formula 3-1 to Formula 3-4 below.
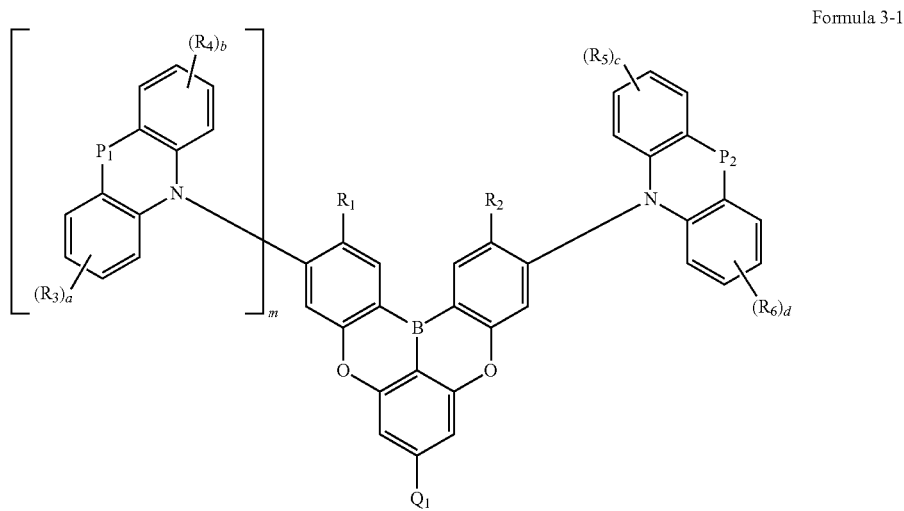
Formula 3-1
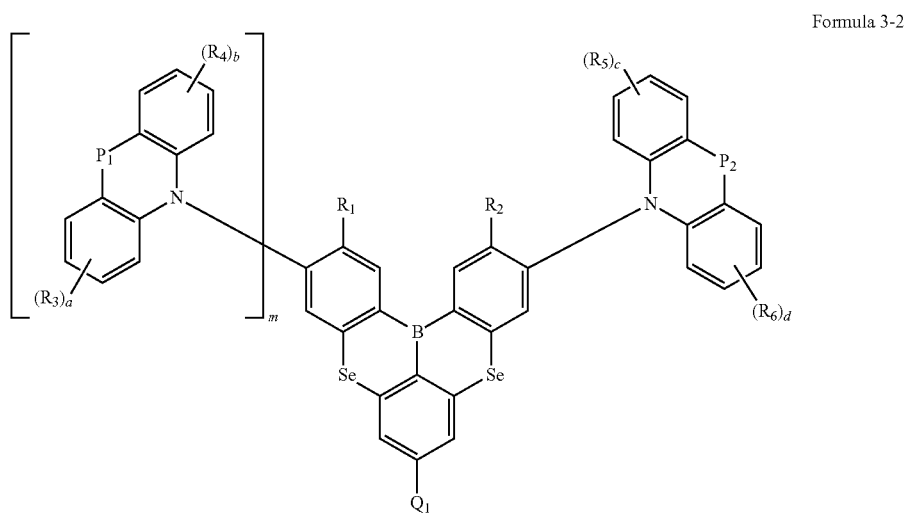
Formula 3-2
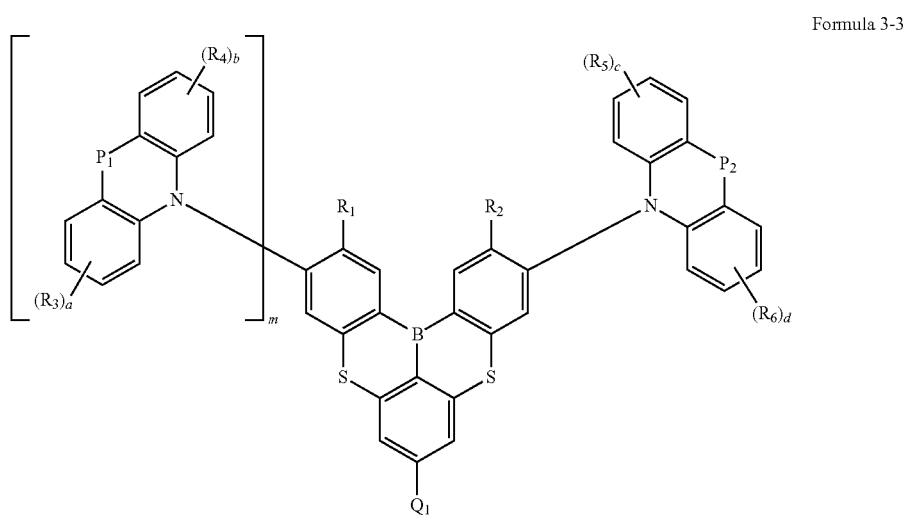
Formula 3-3

Formula 3-4

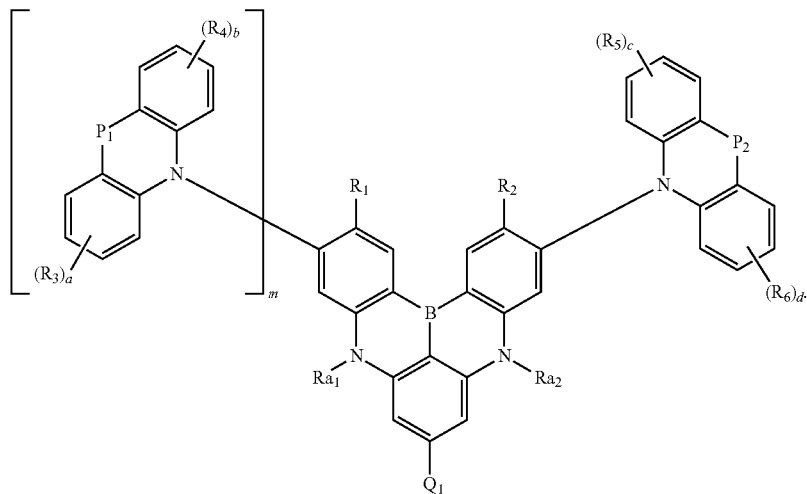

In Formula 3-4, Ra1 and Ra2 are a hydrogen atom, a deuterium atom, a cyano group, a substituted or unsubstituted alkyl group of 1 to 6 carbon atoms, a substituted or unsubstituted aryl group of 6 to 20 ring-forming carbon atoms, a substituted or unsubstituted alkenyl group of 2 to 6 carbon atoms, a substituted or unsubstituted heteroaryl group of 2 to 15 ring-forming carbon atoms, or a substituted or unsubstituted amine group, and/or combined with an adjacent group to form a ring Formula 3-1 to Formula 3-4 are cases where $X_1$ and $X_2$ are the same in Formula 1. In Formulae 3-1 to 3-4, the same explanations for "a" to "d", "m", $P_1$, $P_2$, $R_1$ to $R_6$, and $Q_1$ as those provided referring to Formula 1 may be applied.

Formula 1 may be represented by any one selected from among Formula 4-1 to Formula 4-6 below.

Formula 4-1

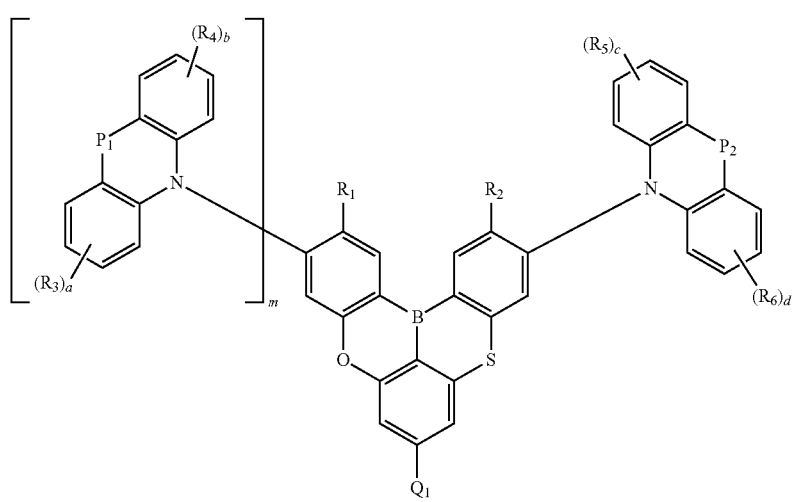

-continued
Formula 4-2
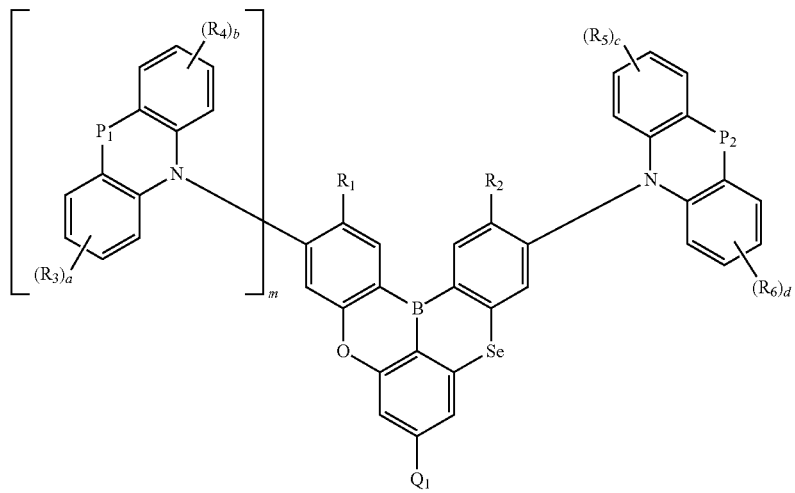
Formula 4-3
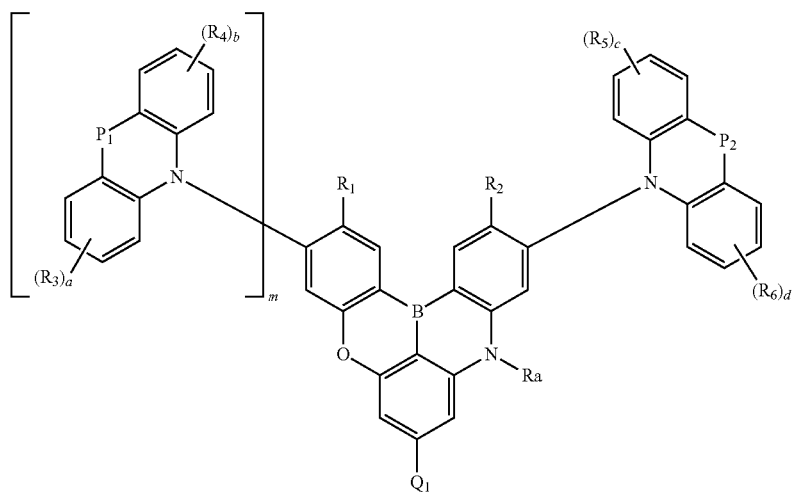
Formula 4-4
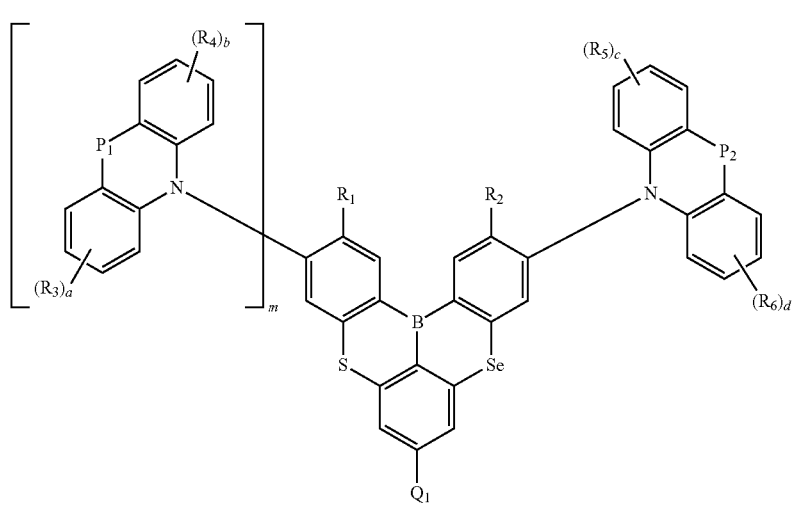

Formula 4-5
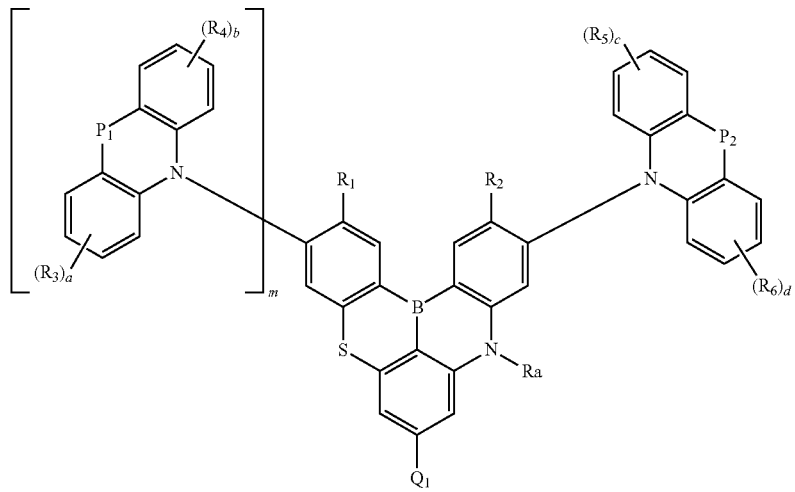
Formula 4-6
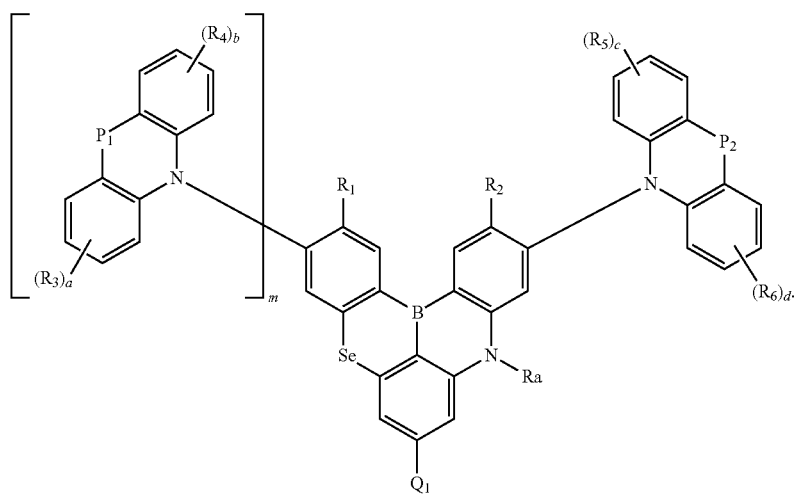
Formula 4-1 to Formula 4-6 are cases where $X_1$ and $X_2$ are different from each other in Formula 1. In Formula 4-1 to Formula 4-6, the same explanations for "a" to "d", "m", $P_1$, $P_2$, $R_1$ to $R_6$, $Q_1$, and Ra as those provided referring to Formula 1 may be applied.

Formula 1 may be represented by any one selected from among Formula 5-1 to Formula 5-4 below.
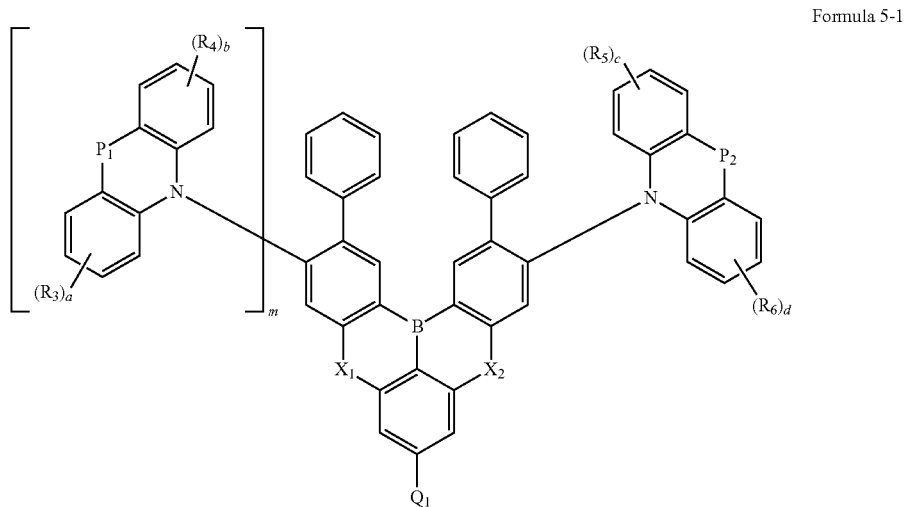
Formula 5-1
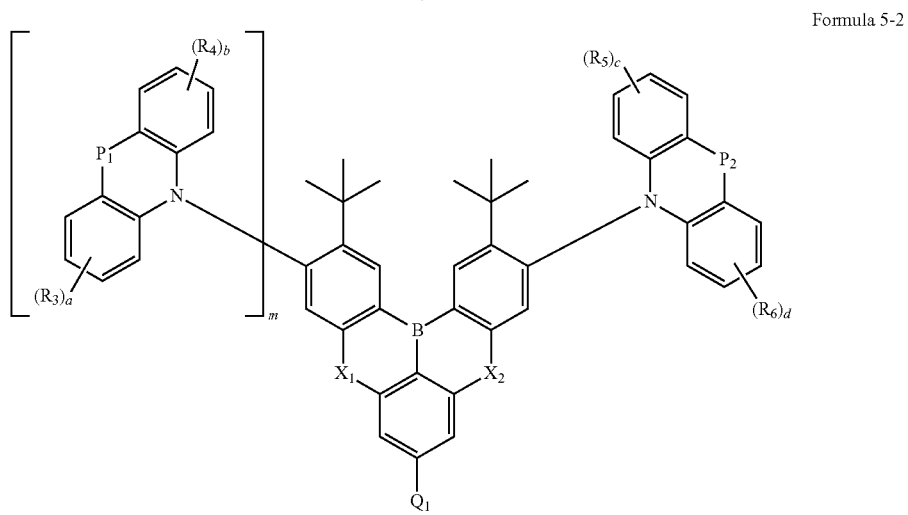
Formula 5-2
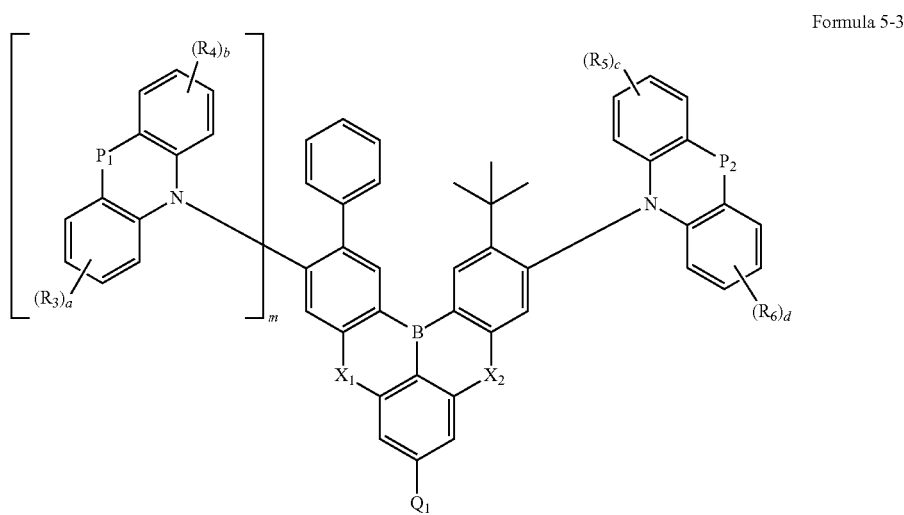
Formula 5-3

-continued

Formula 5-4

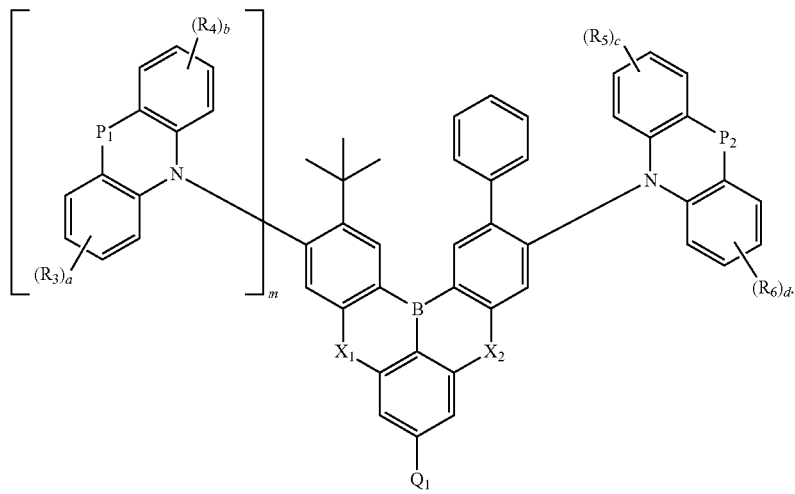

Formula 5-1 to Formula 5-4 correspond to cases where $R_1$ and $R_2$ are each independently an unsubstituted t-butyl group, or an unsubstituted phenyl group. In Formula 5-1 to Formula 5-4, the same explanations for "a" to "d", "m", $P_1$, $P_2$, $R_3$ to $R_6$, $X_1$, $X_2$, and $Q_1$ as those provided referring to Formula 1 may be applied.

Formula 1 may be represented by any one selected from among Formula 6-1 to Formula 6-6 below.

Formula 6-1

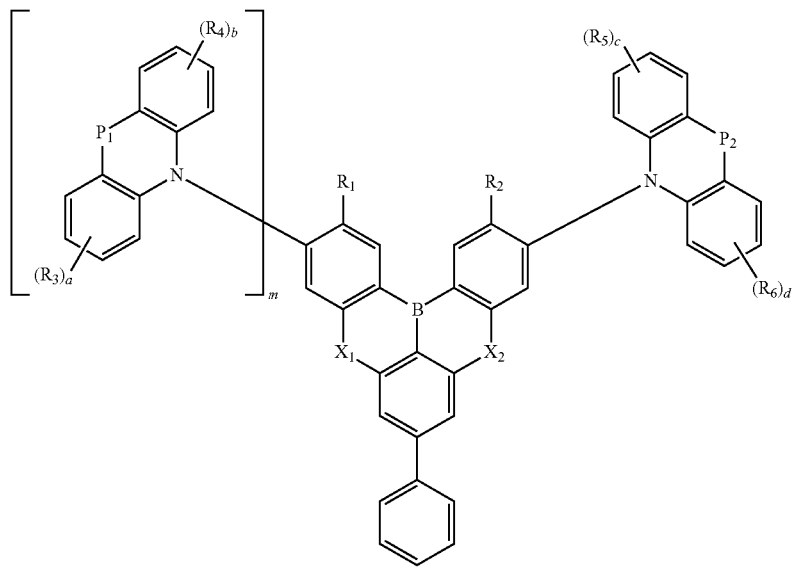

-continued
Formula 6-2
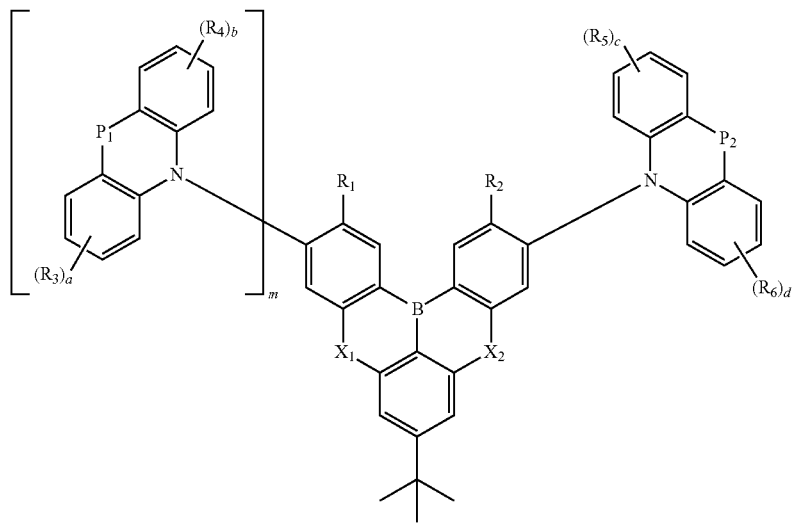
Formula 6-3
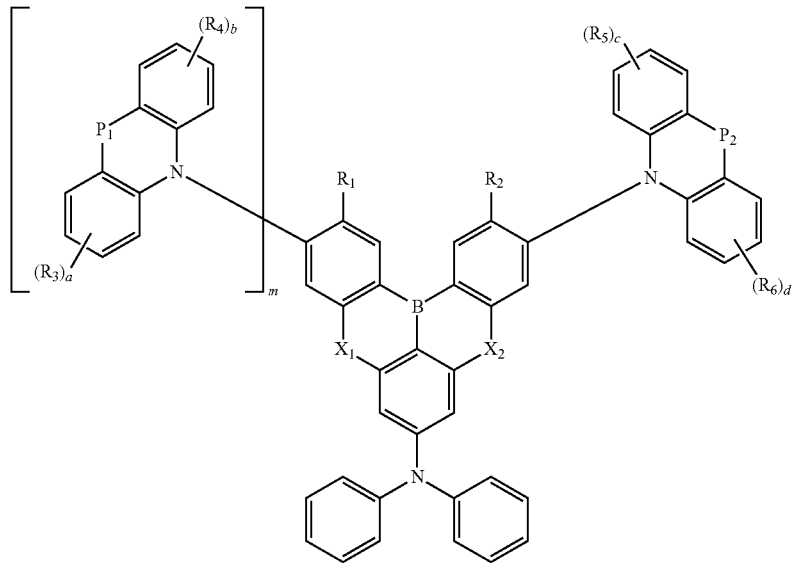
Formula 6-4
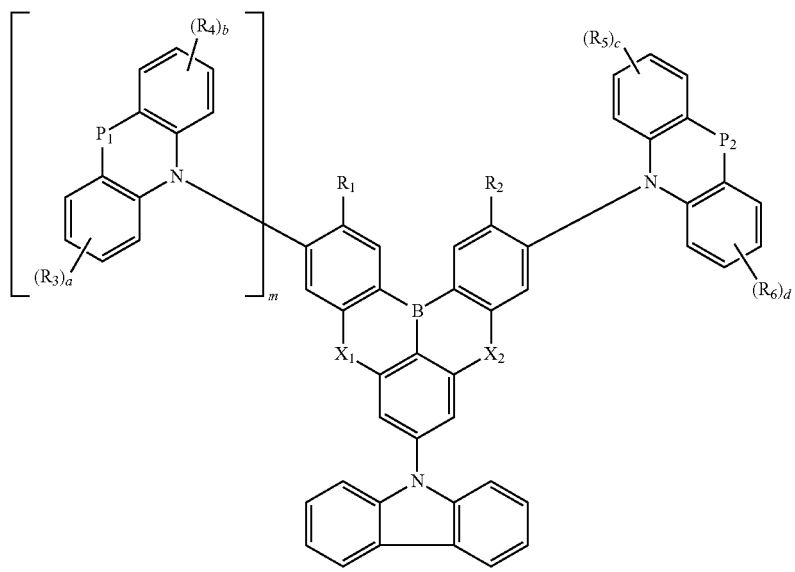

Formula 6-5
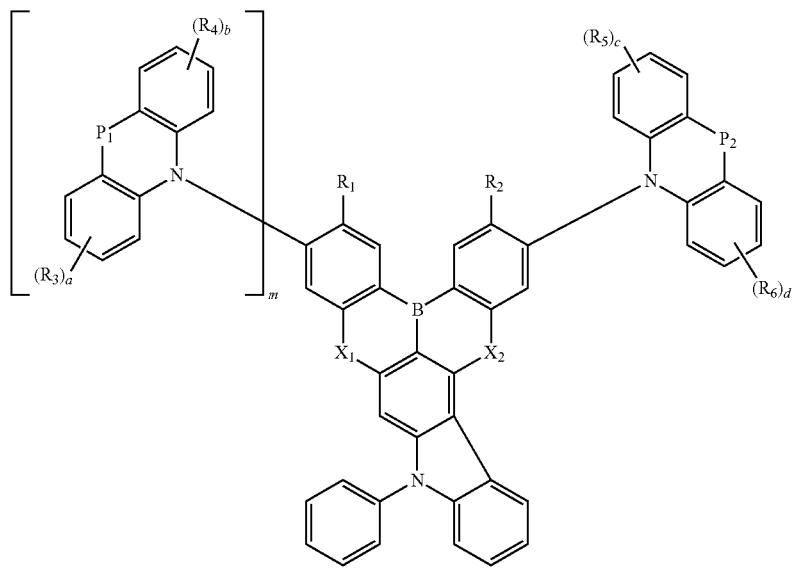
Formula 6-6
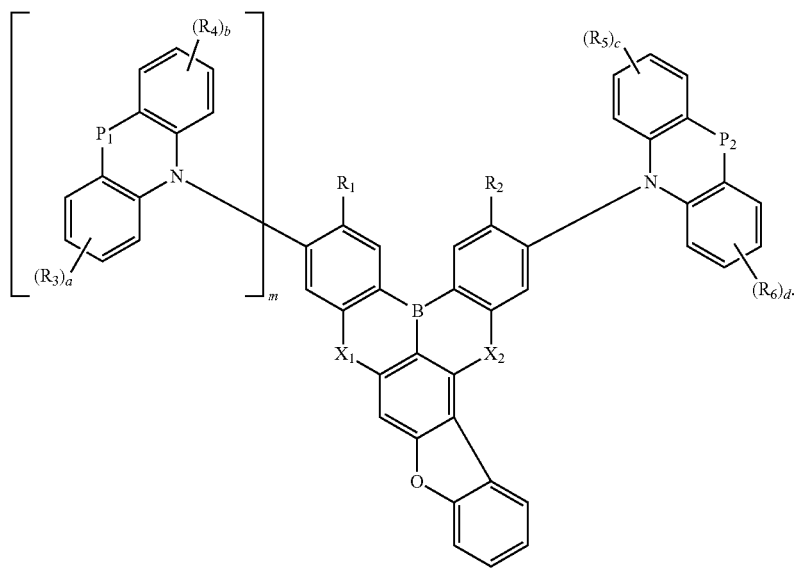

In Formula 6-1 to Formula 6-6, the same explanations for "a" to "d", "m", $P_1$, $P_2$, $R_1$ to $R_6$, $X_1$, and $X_2$ as those provided referring to Formula 1 may be applied.

In one or more embodiments, the polycyclic compound may be represented by Formula 1 below.

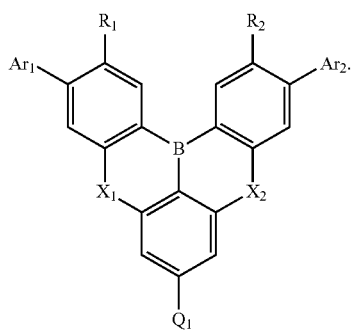

Formula 1

In Formula 1, $X_1$ and $X_2$ are each independently O, S, Se, or NRa. In one or more embodiments, $X_1$ and $X_2$ may be the same or different. For example, $X_1$ may be N, and $X_2$ may be S, Se, or NRa; $X_1$ may be O, and $X_2$ may be S, Se, or NRa; or $X_1$ may be Se, and $X_2$ may be NRa.

In Formula 1, at least one selected from among $R_1$ and $R_2$ may be a substituted or unsubstituted phenyl group, or a substituted or unsubstituted t-butyl group, and the remainder may be a substituted or unsubstituted alkyl group of 1 to 6 carbon atoms, a substituted or unsubstituted aryl group of 6 to 20 ring-forming carbon atoms, or a substituted or unsubstituted heteroaryl group of 2 to 15 ring-forming carbon atoms. For example, $R_1$ may be a substituted or unsubstituted phenyl group, or a substituted or unsubstituted t-butyl group, and $R_2$ may be a substituted or unsubstituted alkyl group of 1 to 6 carbon atoms, a substituted or unsubstituted aryl group of 6 to 20 ring-forming carbon atoms, or a substituted or unsubstituted heteroaryl group of 2 to 15 carbon atoms; or $R_1$ and $R_2$ may be all substituted or unsubstituted phenyl groups or substituted or unsubstituted t-butyl groups.

In Formula 1, Ra may be a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring.

In Formula 1, $Q_1$ may be a hydrogen atom, a deuterium atom, a substituted or unsubstituted amine group, a substituted or unsubstituted oxy group, a substituted or unsubstituted alkyl group of 1 to 6 carbon atoms, or a substituted or unsubstituted alkenyl group of 2 to 6 ring-forming carbon atoms, and/or combined with an adjacent group to form a ring. For example, $Q_1$ may be an unsubstituted carbazole group, a diphenyl amine group, an unsubstituted t-butyl group, or an unsubstituted phenyl group. However, these are only illustrations, and embodiments of the present disclosure are not limited thereto.

In Formula 1, at least one selected from among $Ar_1$ and $Ar_2$ may be represented by Formula A below, and the remainder may be a hydrogen atom, a deuterium atom, a substituted or unsubstituted amine group, a substituted or unsubstituted oxy group, or a substituted or unsubstituted alkyl group of 1 to 6 carbon atoms. $Ar_1$ and $Ar_2$ may be the same or different from each other.

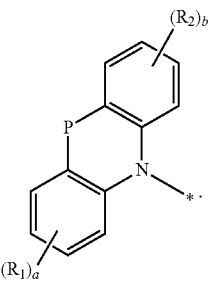

Formula A

In Formula A, "a" and "b" may be each independently an integer of 0 to 4. If "a" is an integer of 2 or more, multiple $R_3$ groups may be the same, or at least one thereof may be different from the remainder. In one or more embodiments, if each of "b" to "d" is an integer of 2 or more, respective multiple groups of $R_4$ to $R_6$ may be the same, or at least one thereof may be different from the remaining of $R_4$ to $R_6$ groups.

P may be a direct linkage, O, S, Se, NRb, or CReRd.

$R_1$ to $R_2$, and Rb to Rd may be each independently a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring.

In one or more embodiments, the polycyclic compound may be represented by any one selected from among the polycyclic compounds in Compound Group 1 below.

Compound Group 1

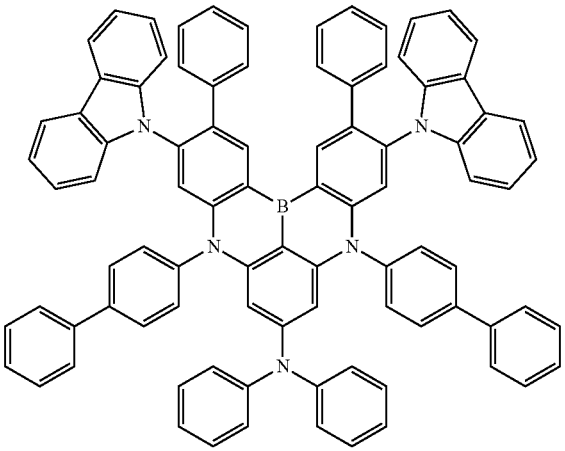

1

75
-continued
2
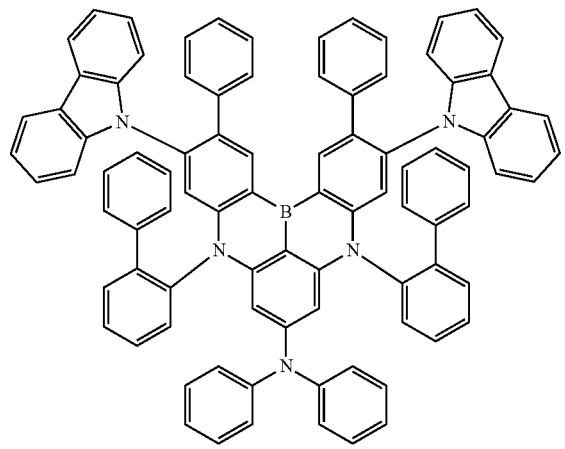
3
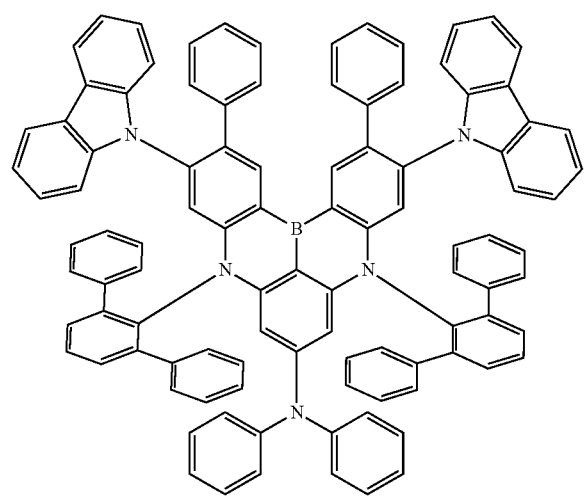
4
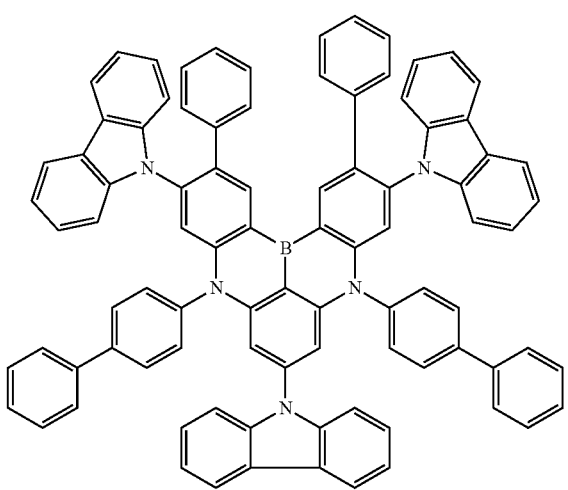
76
-continued
5
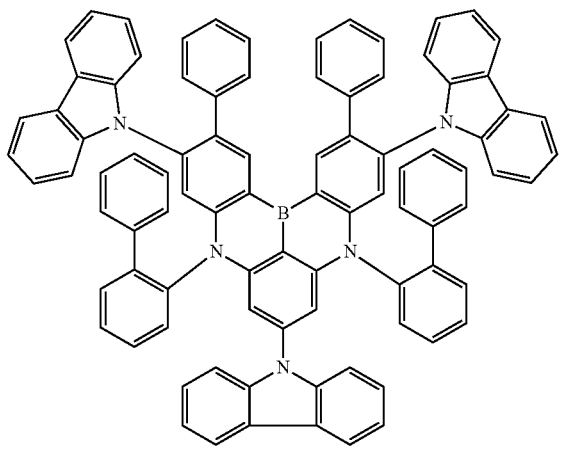
6
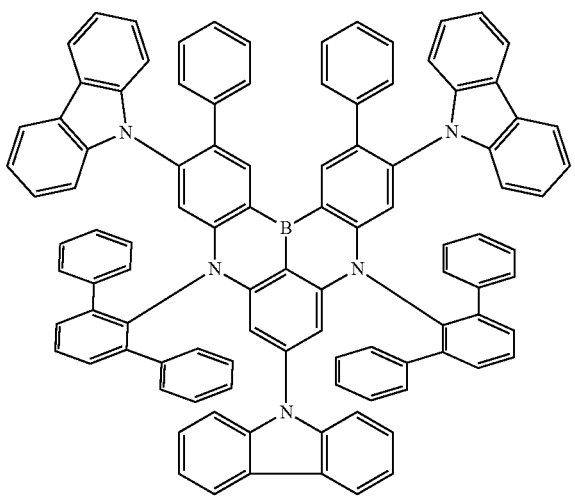
7
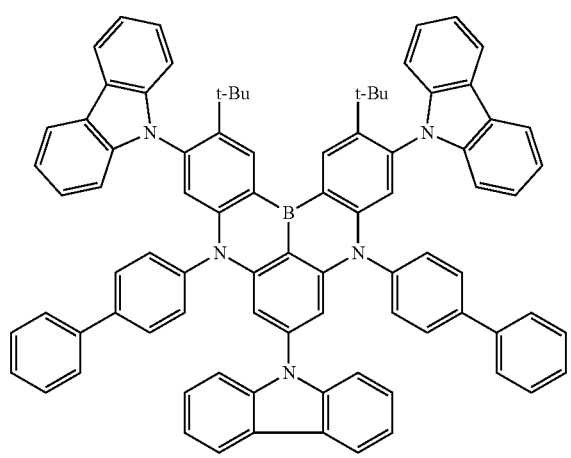

8
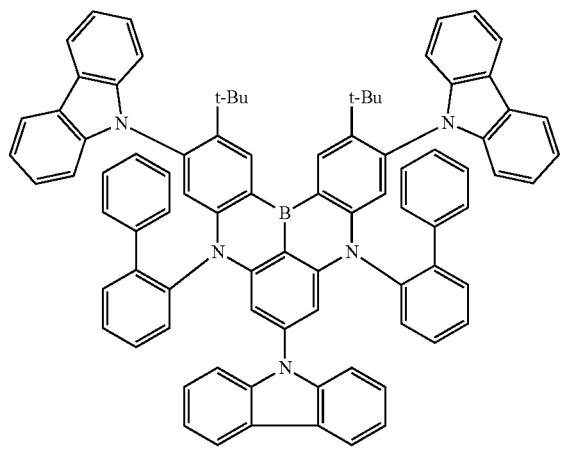
9
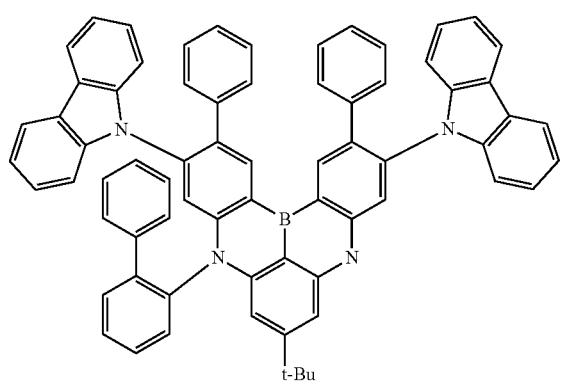
10
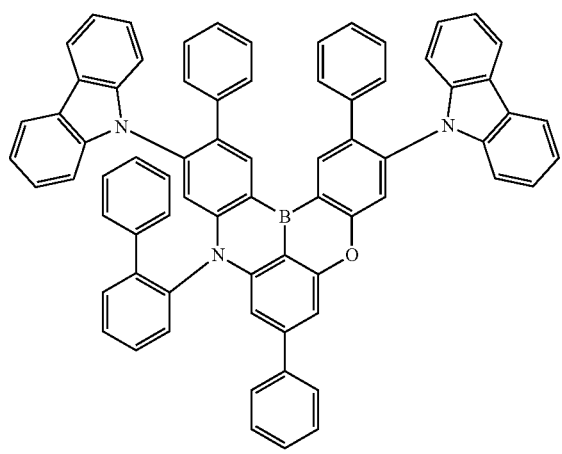
11
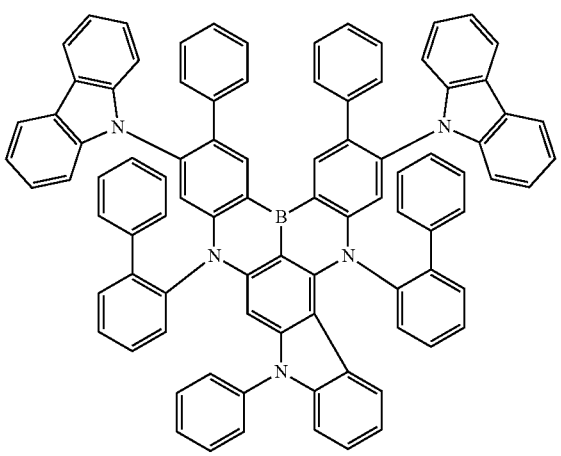
12
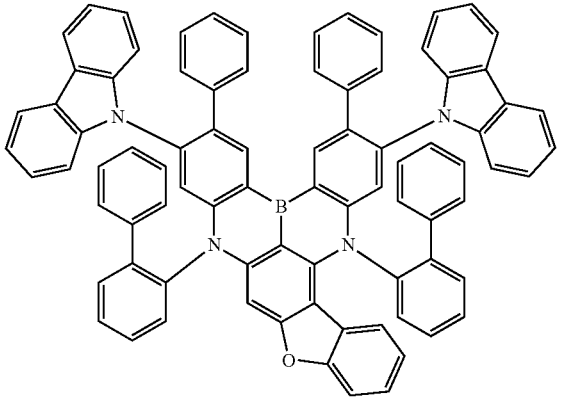
13
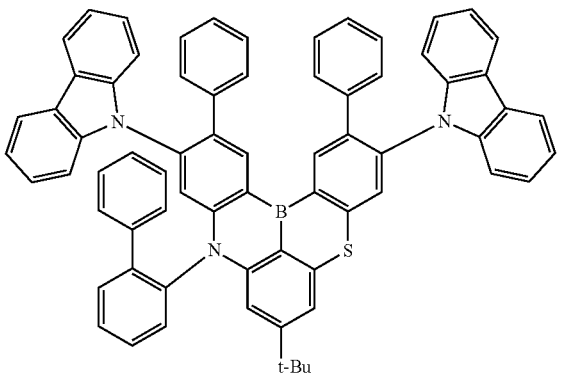

14
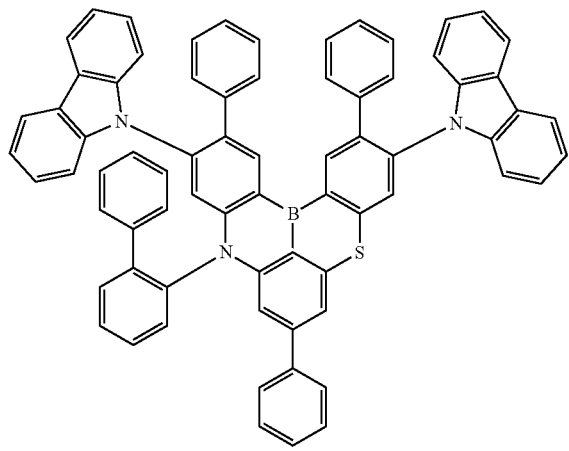
15
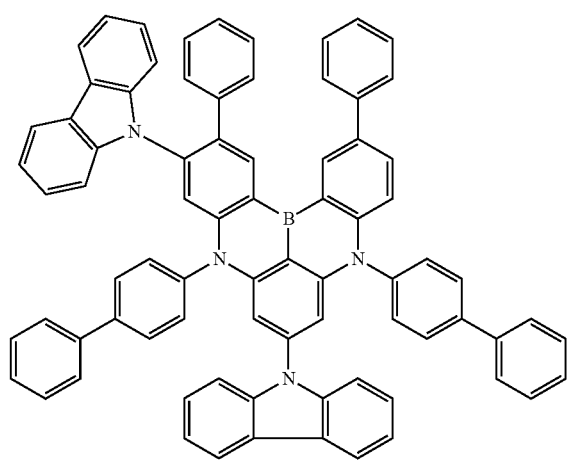
16
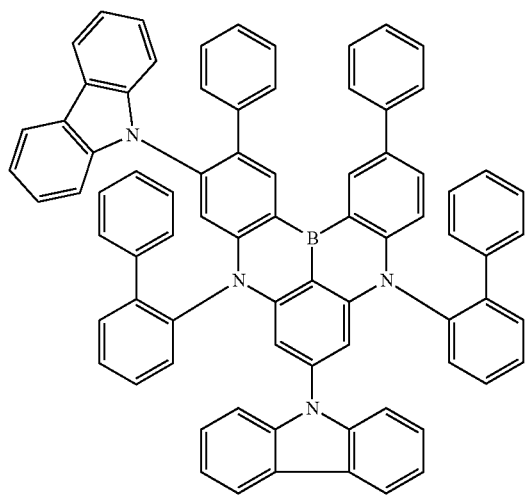
17
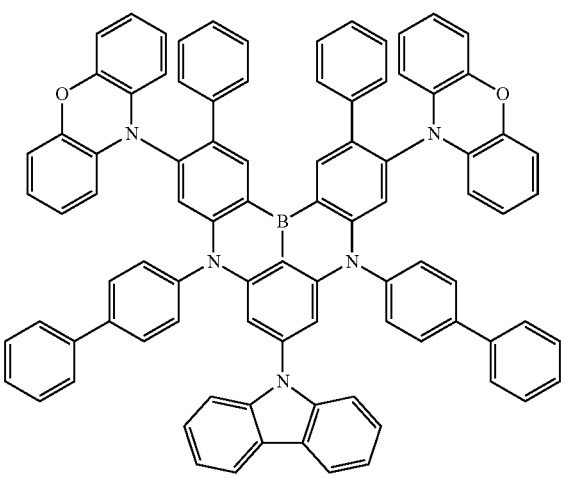
18
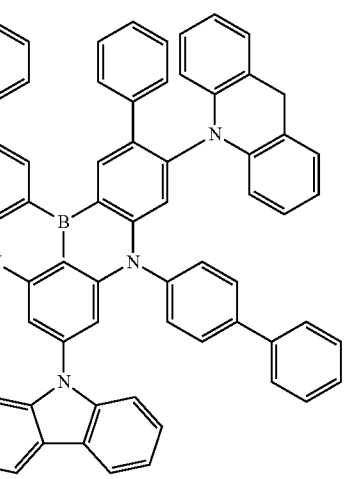
19
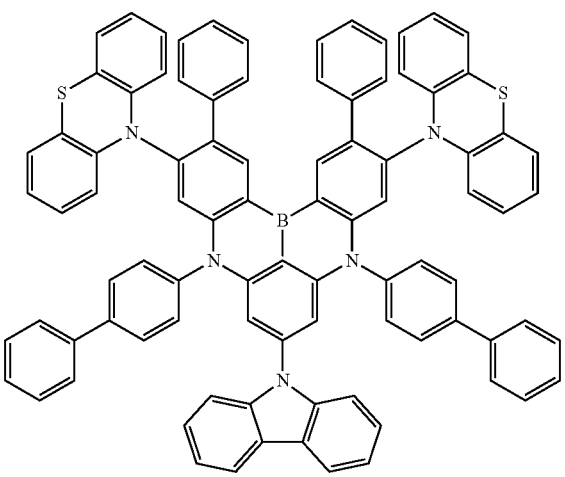

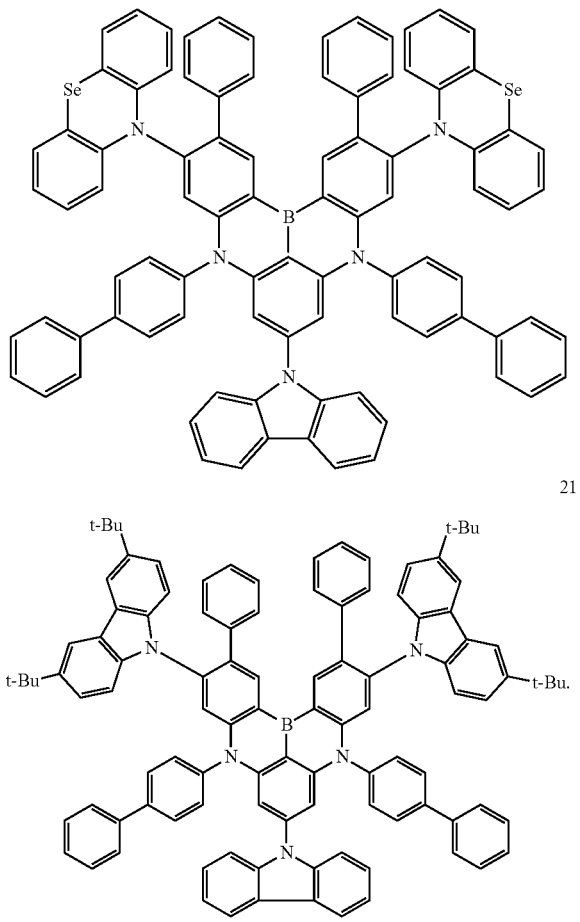

The polycyclic compound of one or more embodiments, represented by Formula 1, may be used as a material for thermally activated delayed fluorescence (TADF). For example, the polycyclic compound of one or more embodiments may be used as a TADF dopant material. The polycyclic compound of one or more embodiments may be a light emitting material having an emission central wavelength ($\lambda_{max}$) in a wavelength region of about 490 nm or less. For example, the polycyclic compound of one or more embodiments, represented by Formula 1, may be a light emitting material having an emission central wavelength in a wavelength region of about 450 nm to about 470 nm. For example, the polycyclic compound of one or more embodiments may be a blue thermally activated fluorescence dopant. However, embodiments of the present disclosure are not limited thereto.

In the light emitting elements ED of the present embodiments, shown in FIG. 3 to FIG. 6, the emission layer EML may include a host and a dopant, and the emission layer EML may include the polycyclic compound of one or more embodiments as a dopant.

The polycyclic compound of one or more embodiments, represented by Formula 1, includes a DABNA-based polycyclic core and additionally introduces a heteroaryl group at a para position to boron, and may have an advantageous structure for multiple resonance. In addition, a bulky substituent is included at a meta position to boron, and the boron atom (B) may be protected from a nucleophile (e.g., from a nucleophilic attack) to achieve structural stability.

In addition, through the introduction of a substituent, the length around the DABNA-based polycyclic core is increased, and intermolecular distance from other adjacent molecules may be increased. If the intermolecular distance from other molecules is increased, the deterioration of life due to efficiency roll-off and/or hot excitons due to triplet-triplet annihilation may be prevented or reduced. Accordingly, the light emitting element ED of one or more embodiments, including the polycyclic compound of one or more embodiments in an emission layer EML may have high efficiency properties.

The light emitting element ED of one or more embodiments may further include a material for an emission layer in addition to the polycyclic compound of one or more embodiments. In the light emitting element ED of one or more embodiments, the emission layer EML may include one or more selected from among anthracene derivatives, pyrene derivatives, fluoranthene derivatives, chrysene derivatives, dihydrobenzanthracene derivatives, and triphenylene derivatives. For example, the emission layer EML may include anthracene derivative(s) and/or pyrene derivative(s).

In the light emitting elements ED of embodiments, shown in FIG. 3 to FIG. 6, the emission layer EML may include a host and a dopant, and the emission layer EML may include a compound represented by Formula E-1 below. The compound represented by Formula E-1 below may be used as a fluorescence host material.

Formula E-1

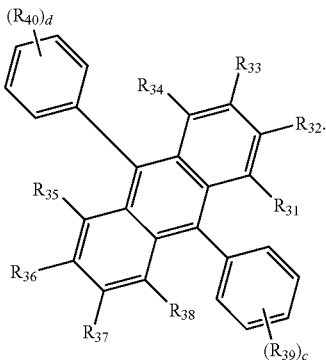

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In one or more embodiments, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, "c" and "d" may be each independently an integer of 0 to 5.

Formula E-1 may be represented by any one selected from among Compound E1 to Compound E19 below.

E1
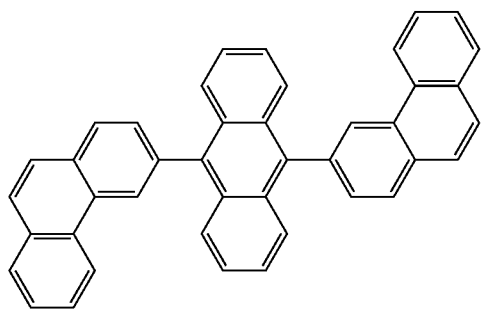
E2
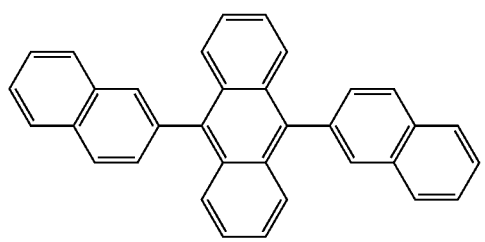
E3
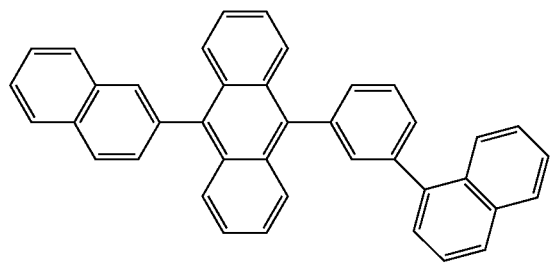
E4
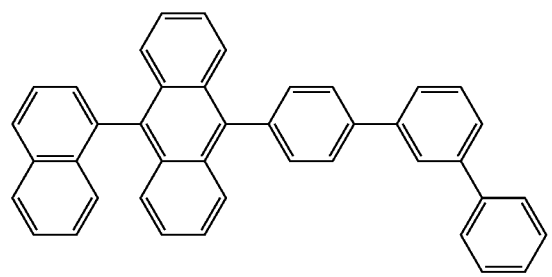
E5
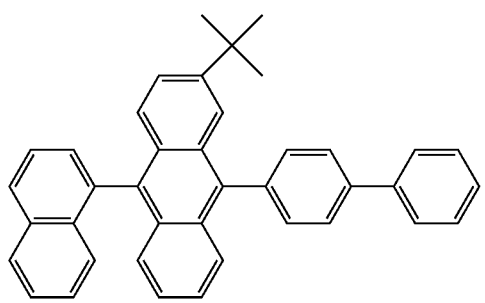
E6
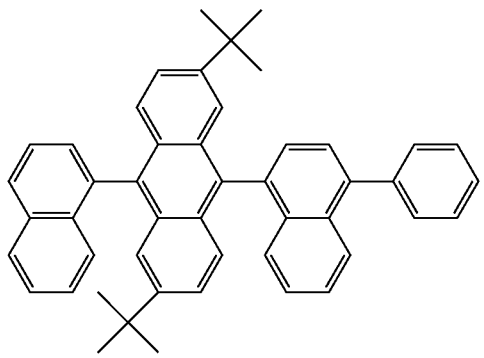
E7
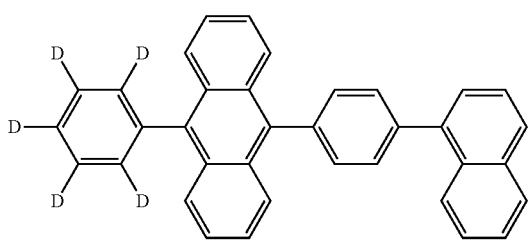
E8
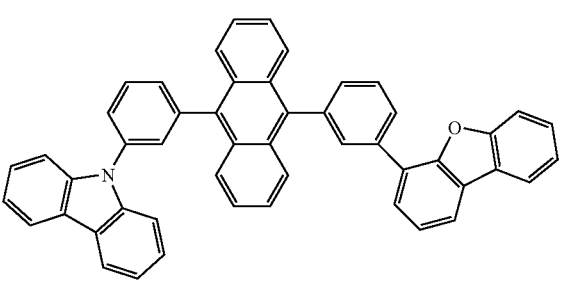
E9
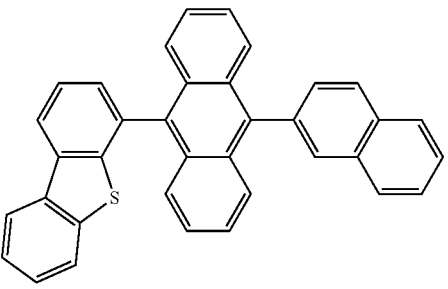
E10
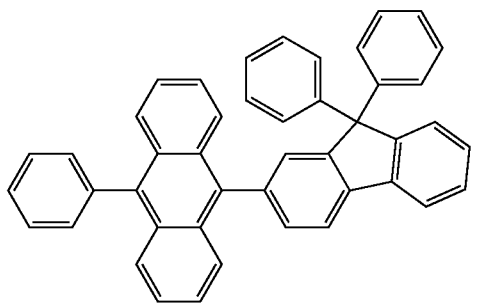

-continued
E11
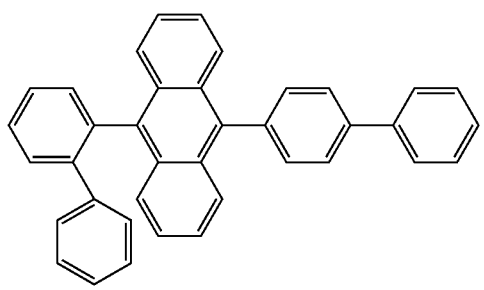
E12
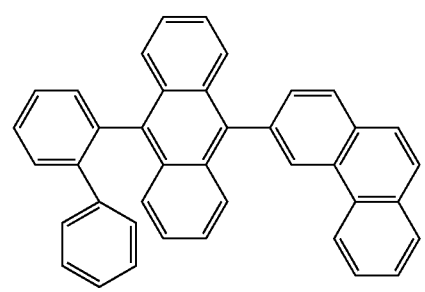
E13
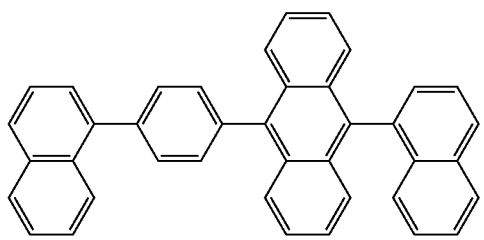
E14
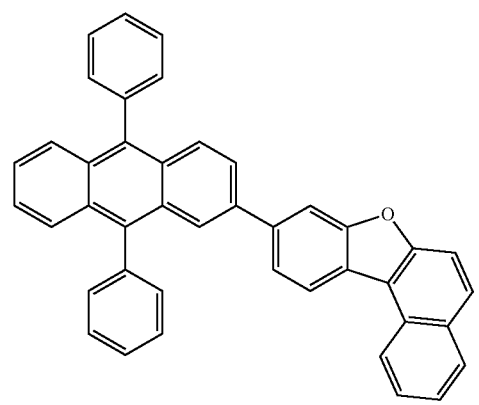
-continued
E15
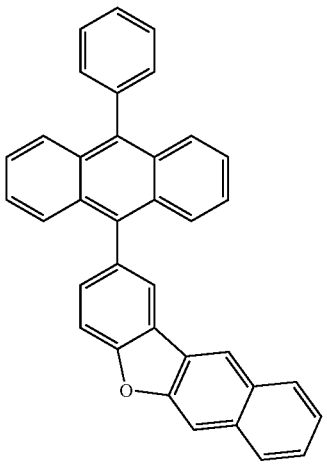
E16
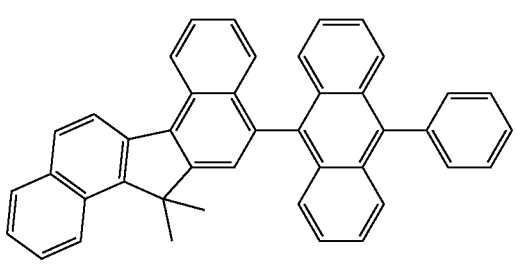
E17
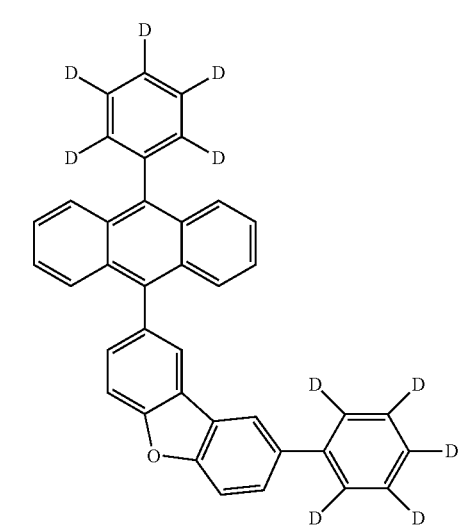
E18
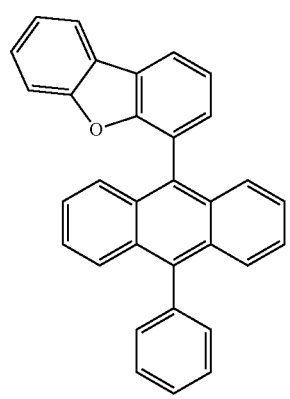

-continued

E19

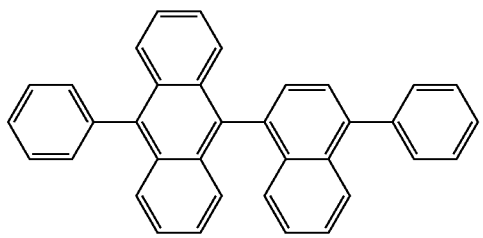

In one or more embodiments, the emission layer EML may include a compound represented by Formula E-2a or Formula E-2b below. The compound represented by Formula E-2a or Formula E-2b below may be used as a phosphorescence host material.

Formula E-2a

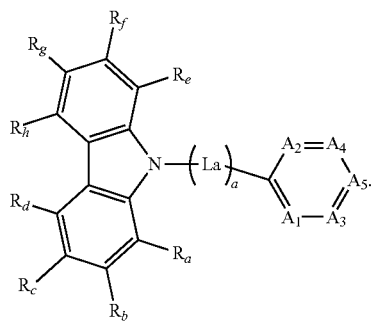

In Formula E-2b, "a" may be an integer of 0 to 10, $L_a$ may be a direct linkage, a substituted or unsubstituted arylene group of 6 to 30 ring-forming carbon atoms, or a substituted or unsubstituted heteroarylene group of 2 to 30 ring-forming carbon atoms. In one or more embodiments, if "a" is an integer of 2 or more, multiple $L_a$ may be each independently a substituted or unsubstituted arylene group of 6 to 30 ring-forming carbon atoms, or a substituted or unsubstituted heteroarylene group of 2 to 30 ring-forming carbon atoms.

In addition, in Formula E-2a, $A_1$ to $A_5$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. $R_a$ to $R_i$ may be combined with an adjacent group to form a hydrocarbon ring or a heterocycle including N, O, S, etc. as a ring-forming atom.

In one or more embodiments, in Formula E-2a, two or three selected from among $A_1$ to $A_5$ may be N, and the remainder may be $CR_i$.

Formula E-2b $(Cbz1)\!\!-\!\!(L_b)_b\!\!-\!\!(Cbz2)$.

In Formula E-2b, Cbz1 and Cbz2 may be each independently an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. "b" is an integer of 0 to 10, and if "b" is an integer of 2 or more, multiple $L_b$ may be each independently a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one selected from among the compounds in Compound Group E-2 below. However, the compounds shown in Compound Group E-2 below are only illustrations, and the compound represented by Formula E-2a or Formula E-2b is not limited to the compounds represented in Compound Group E-2 below.

Compound Group E-2

E-2-1

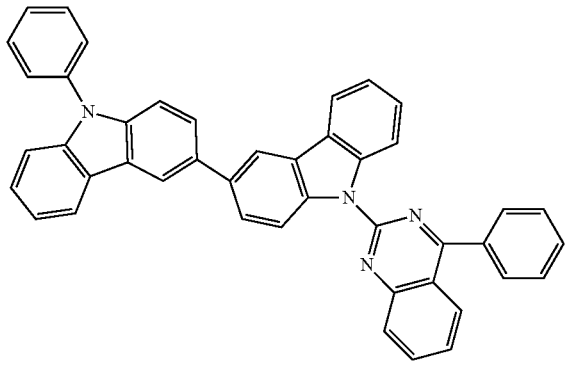

E-2-2

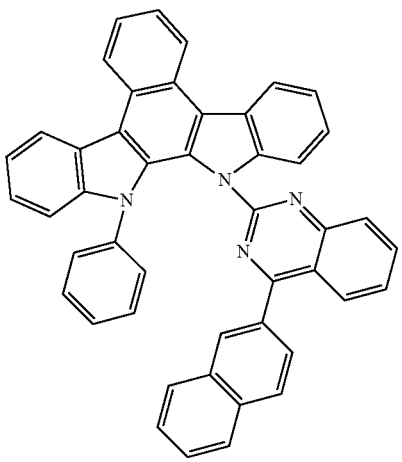

-continued
E-2-3
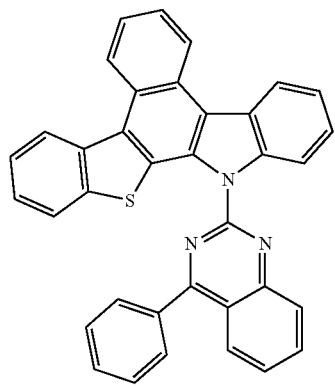
E-2-4
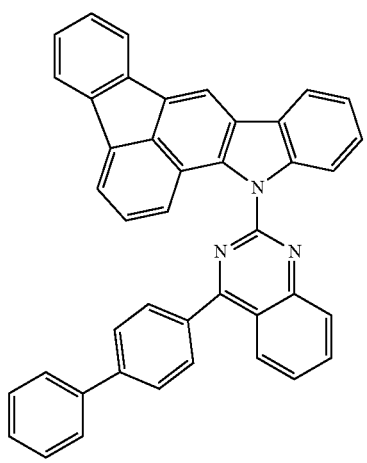
E-2-5
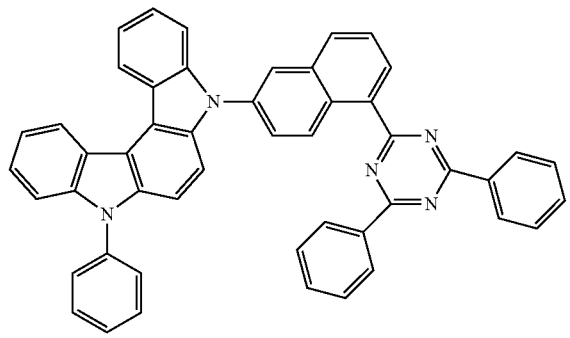
E-2-6
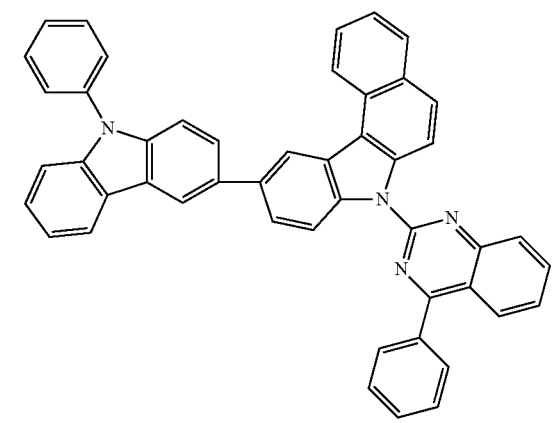
-continued
E-2-7
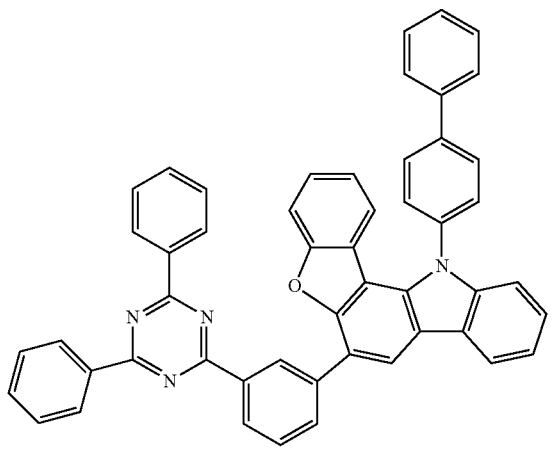
E-2-8
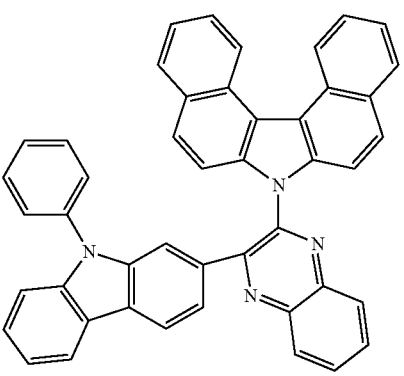
E-2-9
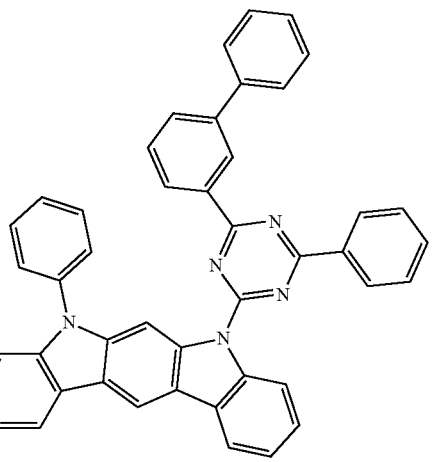

E-2-10
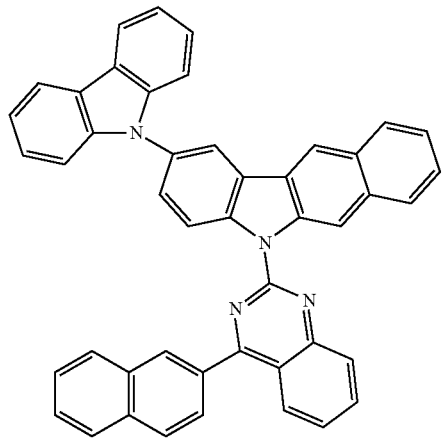
E-2-11
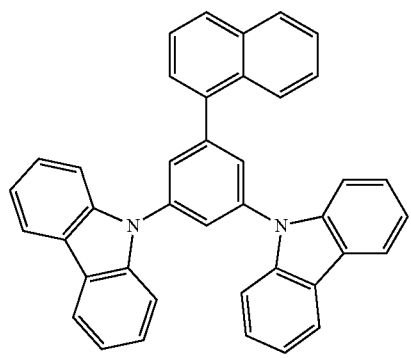
E-2-13
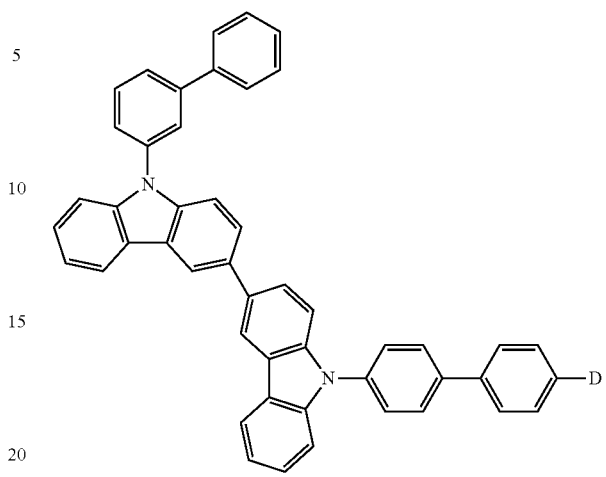
E-2-14
E-2-12
E-2-15
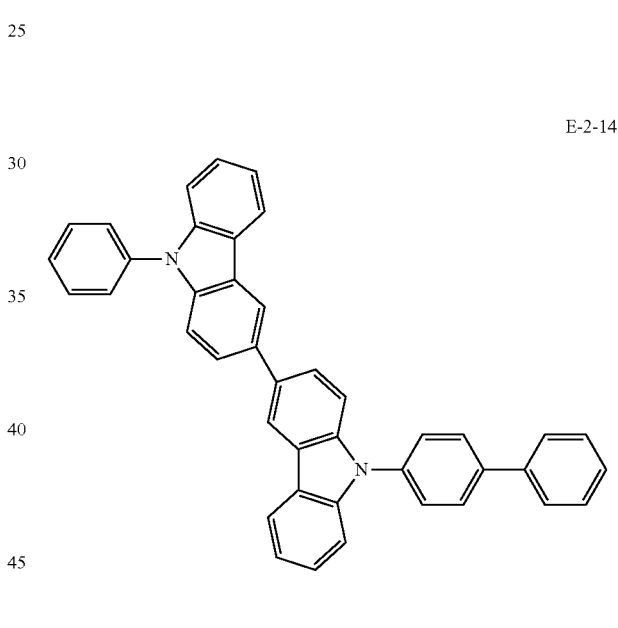
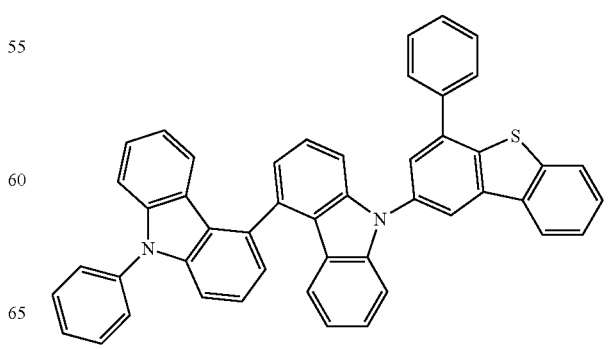

E-2-16
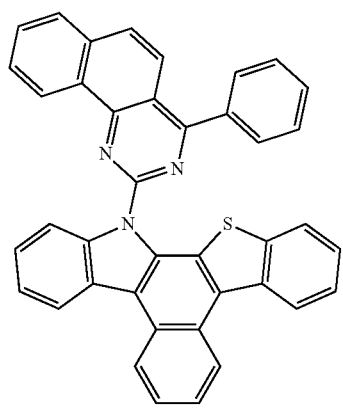
E-2-17
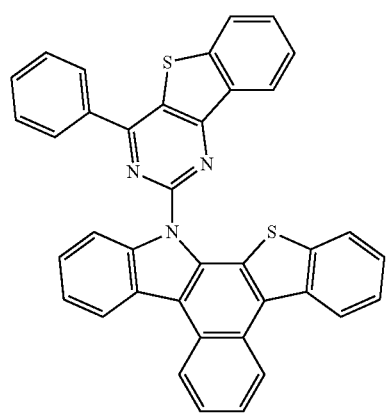
E-2-18
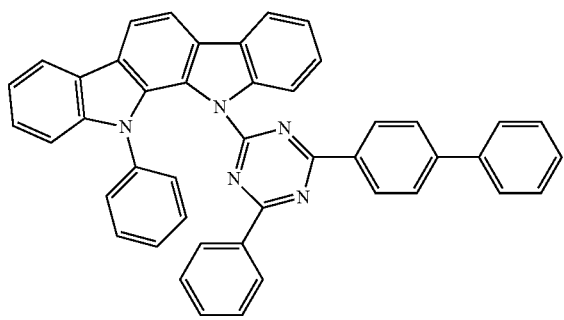
E-2-19
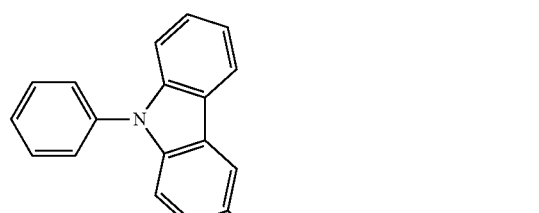
E-2-20
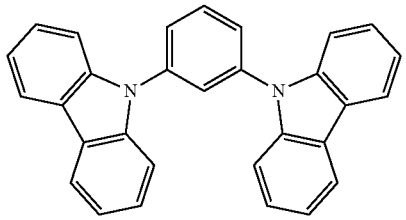
E-2-21
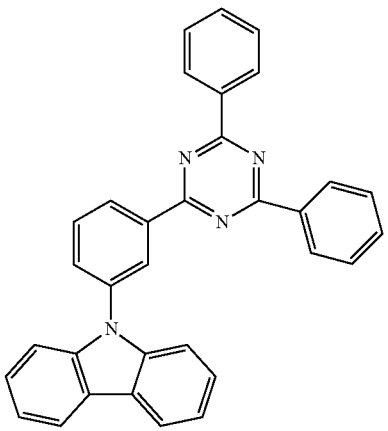
E-2-22
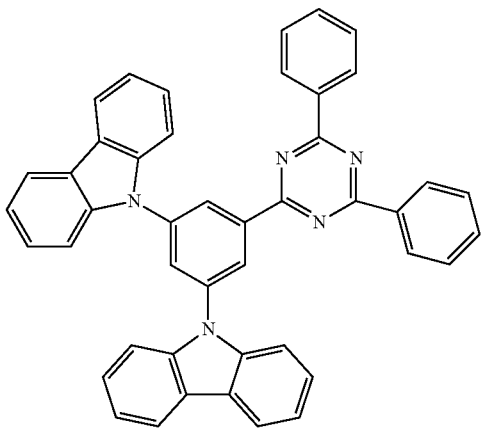
E-2-23
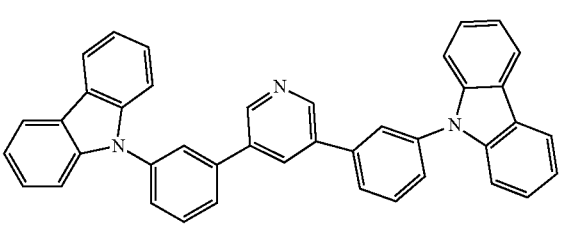

-continued

E-2-24

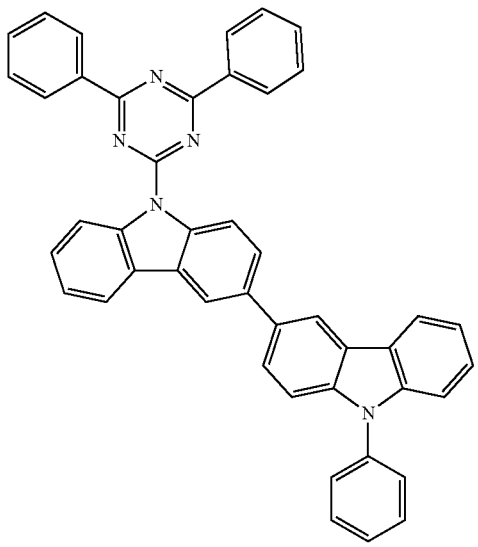

The emission layer EML may further include a suitable host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments of the present disclosure are not limited thereto. For example, tris(8-hydroxyquinolino) aluminum (Alq$_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), etc. may be used as the host material.

The emission layer EML may include a compound represented by Formula M-a or Formula M-b below. The compound represented by Formula M-a or Formula M-b may be used as a phosphorescence dopant material.

Formula M-a

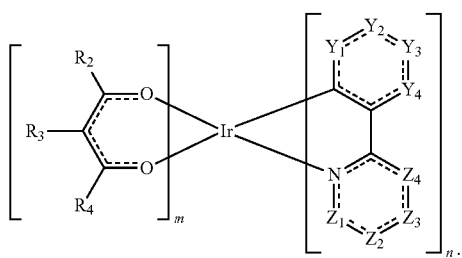

In Formula M-a, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In Formula M-a, "m" is 0 or 1, and "n" is 2 or 3. In Formula M-a, if "m" is 0, "n" is 3, and if "m" is 1, "n" is 2.

The compound represented by Formula M-a may be used as a phosphorescence dopant.

The compound represented by Formula M-a may be represented by any one selected from among Compounds M-a1 to M-a25 below. However, Compounds M-a1 to M-a25 below are illustrations, and the compound represented by Formula M-a is not limited to the compounds represented by Compounds M-a1 to M-a25 below.

M-a1

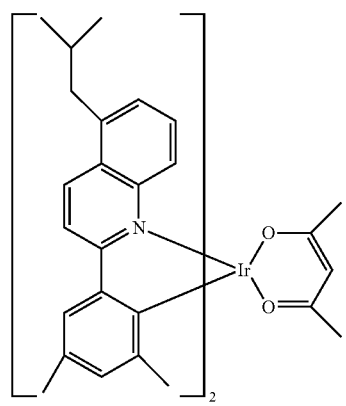

M-a2

-continued
M-a3
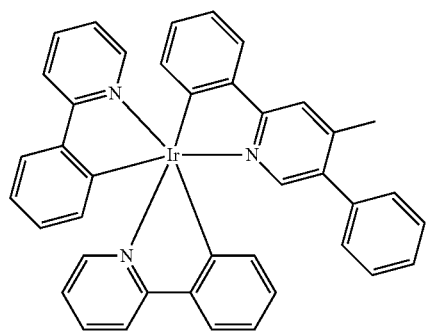
M-a4
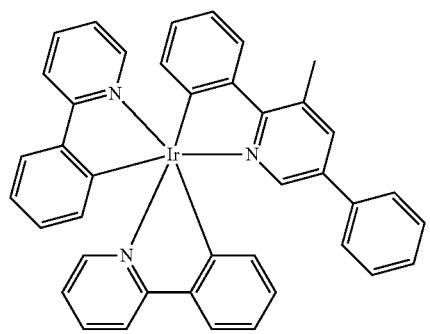
M-a5
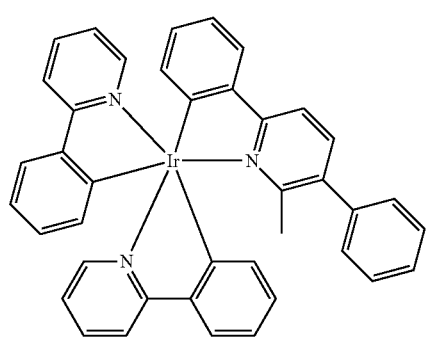
M-a6
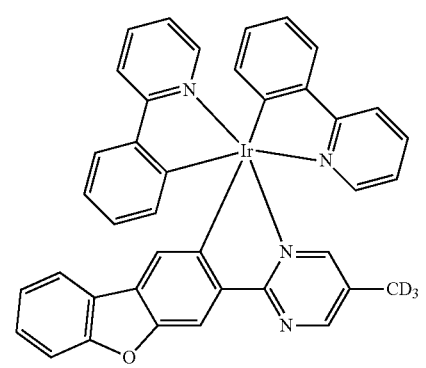
-continued
M-a7
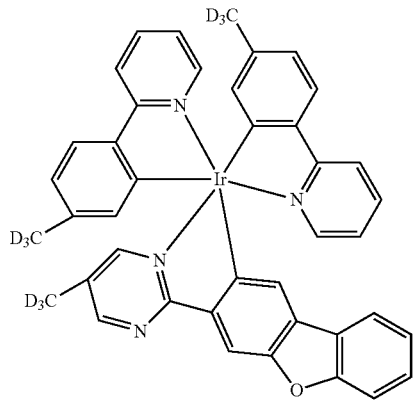
M-a8
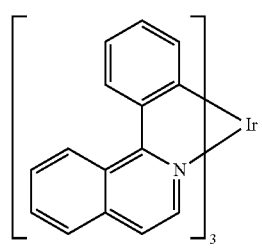
M-a9
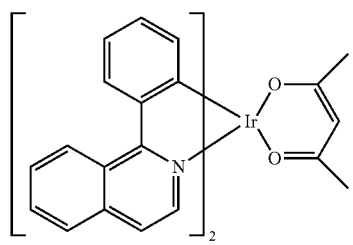
M-a10
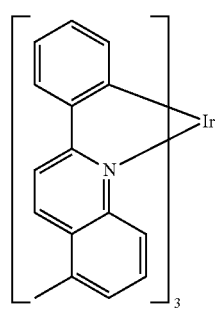
M-a11
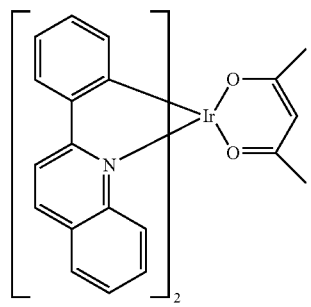

M-a12
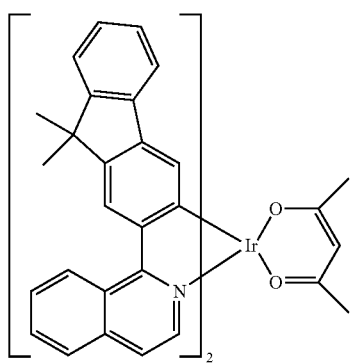
M-a13
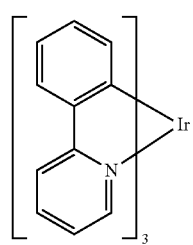
M-a14
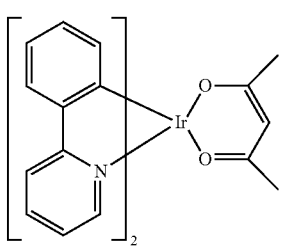
M-a15
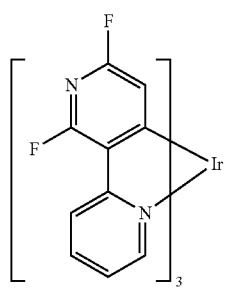
M-a16
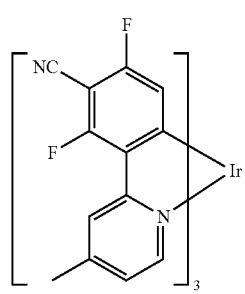
M-a17
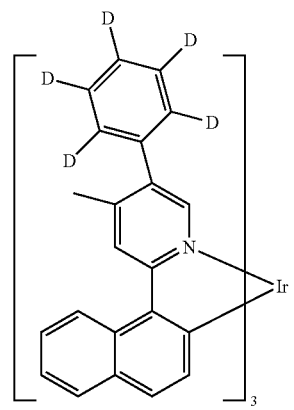
M-a18
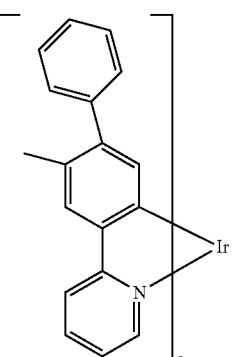
M-a19
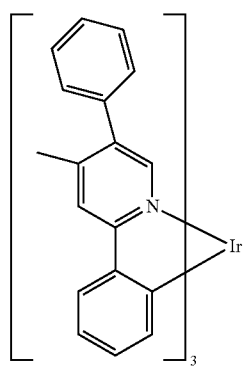
M-a20
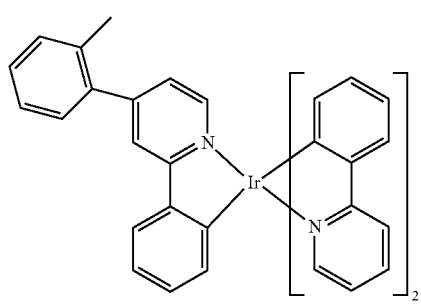

-continued

M-a21
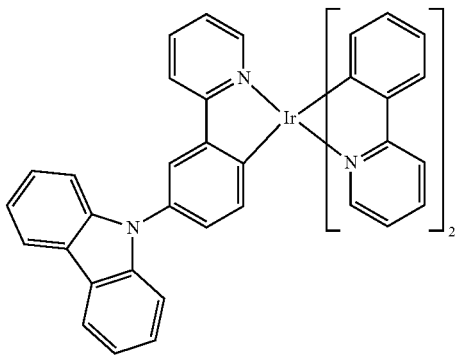

M-a22
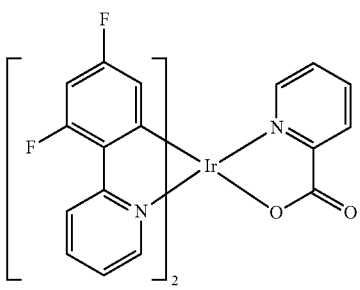

M-a23
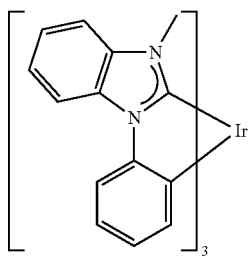

M-a24
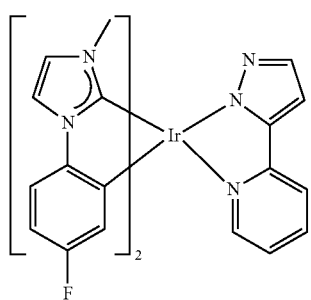

M-a25
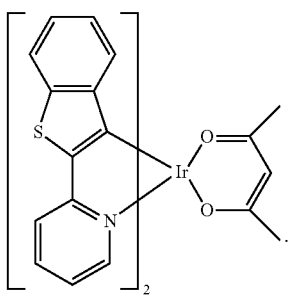

Compound M-a1 and Compound M-a2 may be used as red dopant materials, and Compound M-a3 to Compound M-a7 may be used as green dopant materials.

Formula M-b

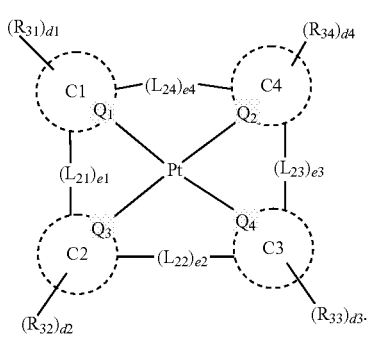

In Formula M-b, $Q_1$ to $Q_4$ are each independently C or N, C1 to C4 are each independently a substituted or unsubstituted hydrocarbon ring of 5 to 30 ring-forming carbon atoms, or a substituted or unsubstituted heterocycle of 2 to 30 ring-forming carbon atoms. L21 to L24 are each independently a direct linkage,

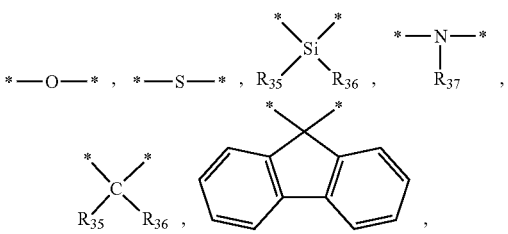

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and d1 to d4 are each independently an integer of 0 to 4.

The compound represented by Formula M-b may be used as a blue phosphorescence dopant or a green phosphorescence dopant.

The compound represented by Formula M-b may be represented by any one selected from among the compounds below. However, the compounds below are illustrations, and the compound represented by Formula M-b is not limited to the compounds represented below.

M-b-1
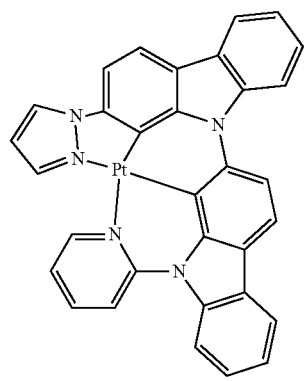
M-b-2
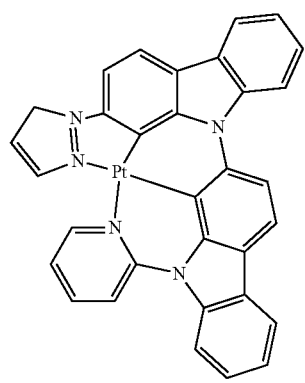
M-b-3
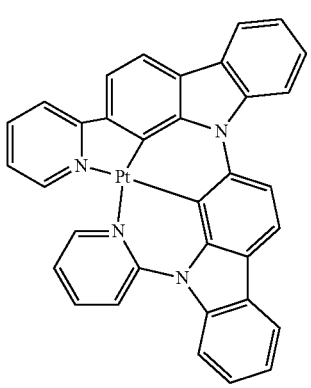
M-b-4
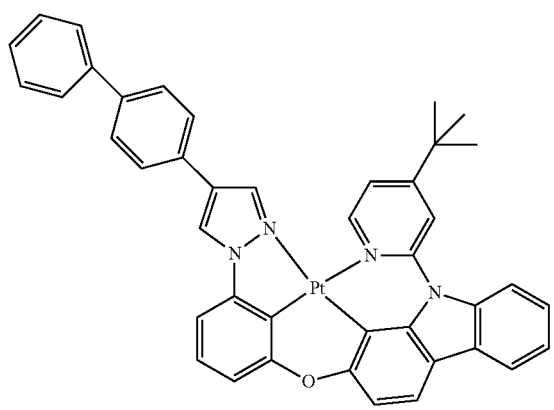
M-b-5
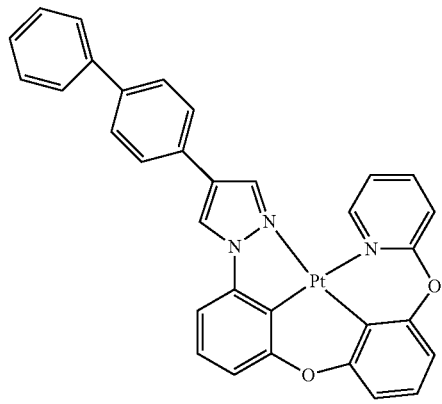
M-b-6
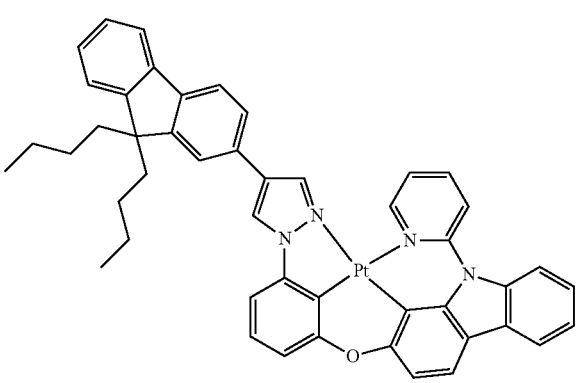
M-b-7
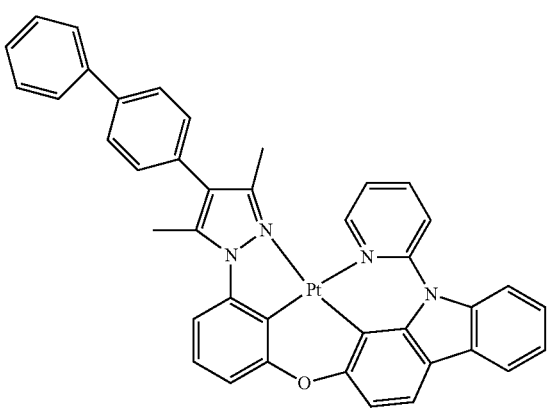
M-b-8
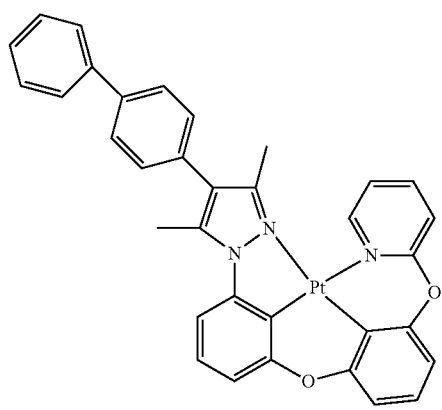

M-b-9

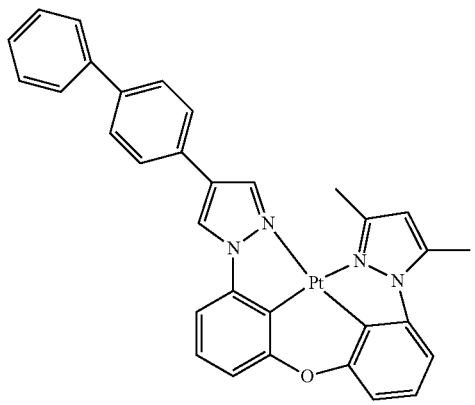

M-b-10

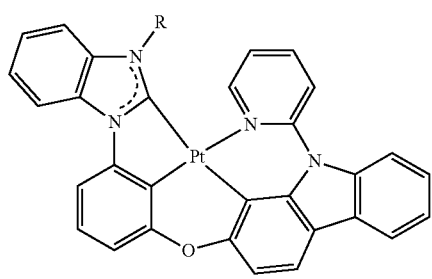

M-b-11

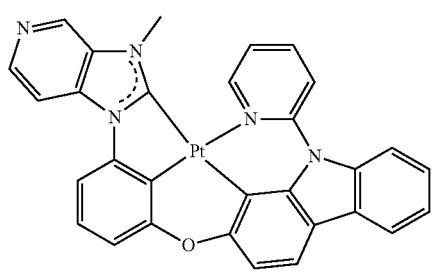

M-b-12

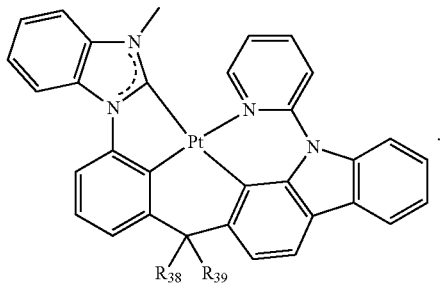

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include any one selected from among Formula F-a to Formula F-c below. The compounds represented by Formula F-a to Formula F-c below may be used as fluorescence dopant materials.

Formula F-a

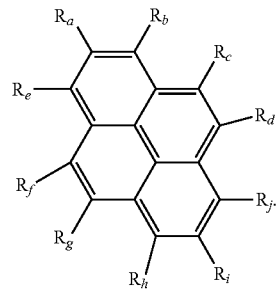

In Formula F-a, two selected from among $R_a$ to $R_j$ may be each independently substituted with *―― $NAr_1Ar_2$. The remainder not substituted with *―― $NAr_1Ar_2$ selected from among $R_a$ to $R_j$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In *―― $NAr_1Ar_2$, $Ar_1$ and $Ar_2$ may be each independenyly a substituted or unsubstituted aryl group of 6 to 30 ring-forming carbon atoms, or a substituted or unsubstituted heteroaryl group of 2 to 30 ring-forming carbon atoms. For example, at least one selected from among $Ar_1$ and $Ar_2$ may be a heteroaryl group including O or S as a ring-forming atom.

Formula F-b

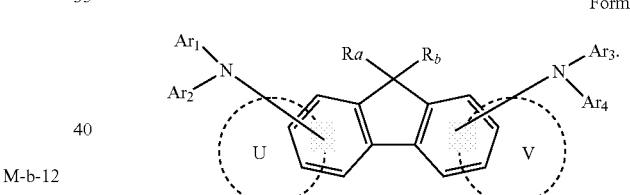

In Formula F-b, $R_a$ and $R_b$ may be each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formula F-b, U and V may be each independently a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may be each independently 0 or 1. For example, in Formula F-b, if the number of U or V is 1, one ring forms a fused ring at the corresponding designated part by U or V, and if the number of U or V is 0, a ring is not present at the corresponding designated part by U or V. For example, if the number of U is 0, and the number of V is 1, or if the number of U is 1, and the number of V is 0, a fused ring having the fluorene core of Formula F-b may be a ring compound with four rings. If the number of both U and V is 0, the fused ring of Formula F-b may be a ring compound with three rings. If the number of both U and V is 1, a fused ring having the fluorene core of Formula F-b may be a ring compound with five rings.

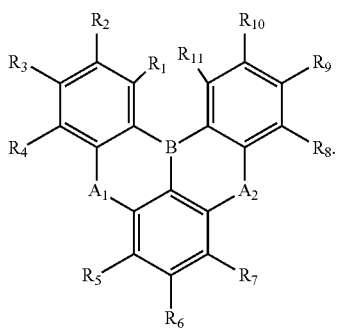

Formula F-c

In Formula F-c, $A_1$ and $A_2$ may be each independently O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring.

In Formula F-c, $A_1$ and $A_2$ may be each independently combined with the substituents of an adjacent ring to form a fused ring. For example, if $A_1$ and $A_2$ are each independently $NR_m$, $A_1$ may be combined with $R_4$ or $R_5$ to form a ring. In some embodiments, $A_2$ may be combined with $R_7$ or $R_8$ to form a ring.

In one or more embodiments, the emission layer EML may include, as a dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and/or 4,4'-bis[2-(4-(N,N-diphenylamino)phenyl)vinyl]biphenyl (DPAVBi)), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene, and/or 1,4-bis(N,N-diphenylamino)pyrene), etc.

The emission layer EML may include a suitable phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) and/or thulium (Tm). For example, iridium(III) bis(4,6-difluorophenylpyridinato-N,C2')picolinate (FIrpic), bis(2,4-difluorophenylpyridinato)-tetrakis(1-pyrazolyl)borate iridium(III) (Fir6), and/or platinum octaethyl porphyrin (PtOEP) may be used as the phosphorescence dopant. However, embodiments of the present disclosure are not limited thereto.

The emission layer EML may include a quantum dot material. The core of the quantum dot may be selected from among a II-VI group compound, a III-VI group compound, a group compound, a III-V group compound, a III-II-V group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-V group compound may include a binary compound such as $In_2S_3$ and/or $In_2Se_3$; a ternary compound such as $InGaS_3$ and/or $InGaSe_3$; or optional combinations thereof.

The group compound may be selected from a ternary compound selected from the group consisting of $AgInS$, $AgInS_2$, $CuInS$, $CuInS_2$, $AgGaS_2$, $CuGaS_2$, $CuGaO_2$, $AgGaO_2$, $AgAlO_2$ and mixtures thereof; and a quaternary compound such as $AgInGaS_2$ and/or $CuInGaS_2$.

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In one or more embodiments, the III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

In this case, the binary compound, the ternary compound and/or the quaternary compound may be present at uniform concentration in a particle, or may be present at a partially different concentration distribution state in the same particle. In addition, a core/shell structure in which one quantum dot wraps another quantum dot may be possible. The interface of the core and the shell may have a concentration gradient in which the concentration of an element present in the shell is decreased toward the center.

In some embodiments, the quantum dot may have the above-described core-shell structure including a core including a nanocrystal and a shell wrapping the core. The shell of the quantum dot may play the role of a protection layer for preventing or reducing the chemical deformation of the core to maintain semiconductor properties and/or a charging layer for imparting the quantum dot with electrophoretic properties. The shell may have a single layer or a multilayer. Examples of the shell of the quantum dot may include a metal oxide, a non-metal oxide, a semiconductor compound, and combinations thereof.

For example, the metal oxide or the non-metal oxide may each independently include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO), and/or a ternary compound (such as $MgAl_2O_4$, $CoFe_2O_4$, $NiFe_2O_4$ and/or $CoMn_2O_4$), but embodiments of the present disclosure are not limited thereto.

In one or more embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have a full width of half maximum (FWHM) of emission wavelength spectrum of about 45 nm or less, for example, about 40 nm or less, or about 30 nm or less. Within any of these ranges, color purity and/or color reproducibility may be improved. In addition, light emitted via such quantum dot is emitted in all directions, and light view angle properties may be improved.

The shape of the quantum dot may be any suitable shape in the art, without specific limitation. For example, the shape of spherical, pyramidal, multi-arm, and/or cubic nanoparticle, nanotube, nanowire, nanofiber, nanoplate particle, etc. may be used.

The quantum dot may control the color of light emitted according to the particle size, and accordingly, the quantum dot may have various emission colors such as blue, red and green.

In the light emitting element ED of one or more embodiments, as shown in FIG. 3 to FIG. 6, the electron transport region ETR is provided on the emission layer EML. The electron transport region ETR may include at least one of an electron blocking layer HBL, an electron transport layer ETL, or an electron injection layer EIL. However, embodiments of the present disclosure are not limited thereto.

The electron transport region ETR may have a single layer formed using a single material, a single layer formed using multiple different materials, or a multilayer structure having multiple layers formed using multiple different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure formed using multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using one or more suitable methods selected from among a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1 below.

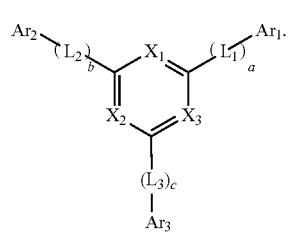

Formula ET-1

In Formula ET-1, at least one selected from among $X_1$ to $X_3$ is N, and the remainder are $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may be each independently a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, "a" to "c" may be each independently an integer of 0 to 10. In Formula ET-1, $L_1$ to $L_3$ may be each independently a direct linkage, a substituted or unsubstituted arylene group of 6 to 30 ring-forming carbon atoms, or a substituted or unsubstituted heteroarylene group of 2 to 30 ring-forming carbon atoms. In one or more embodiments, if "a" to "c" are integers of 2 or more, $L_1$ to $L_3$ may be each independently a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, one or more embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), and/or mixtures thereof, without limitation.

The electron transport region ETR may include at least one selected from among Compounds ET1 to ET36 below.

ET1 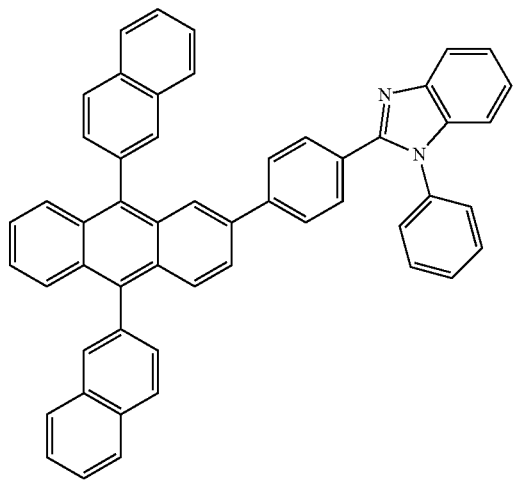
ET4 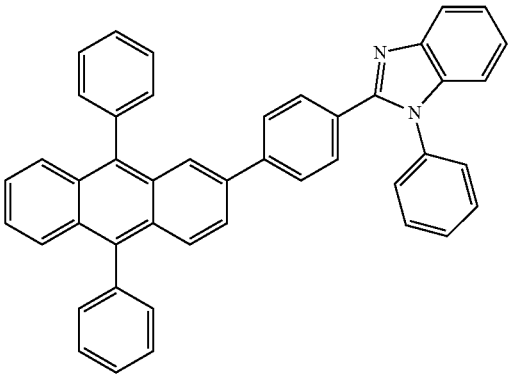
ET2 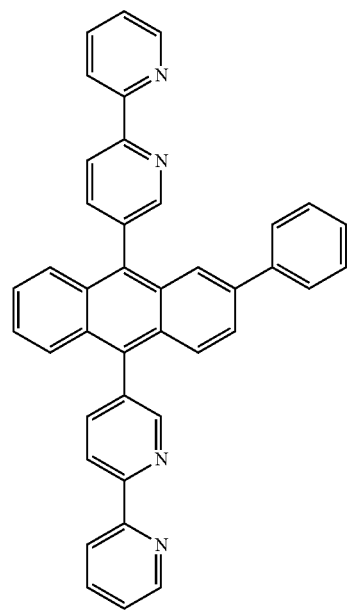
ET5 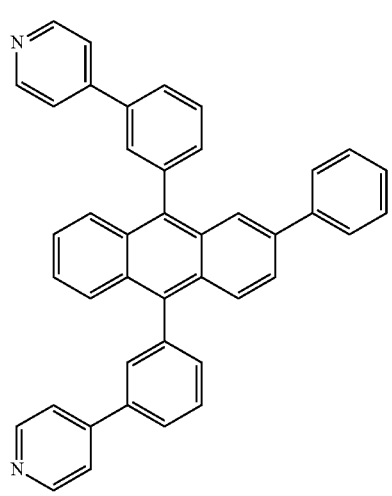
ET3 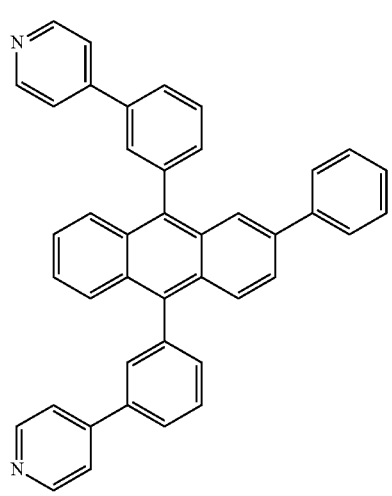
ET6 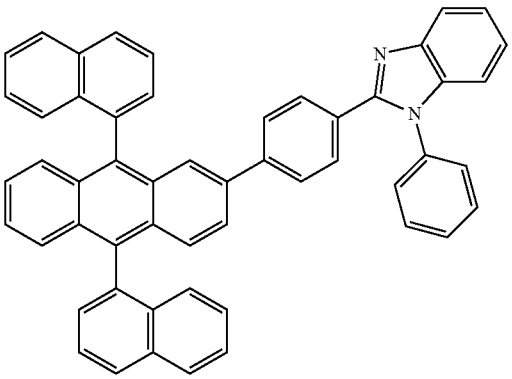

ET7
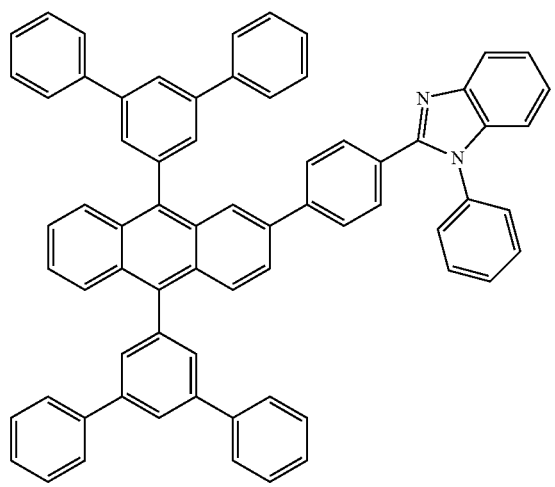
ET8
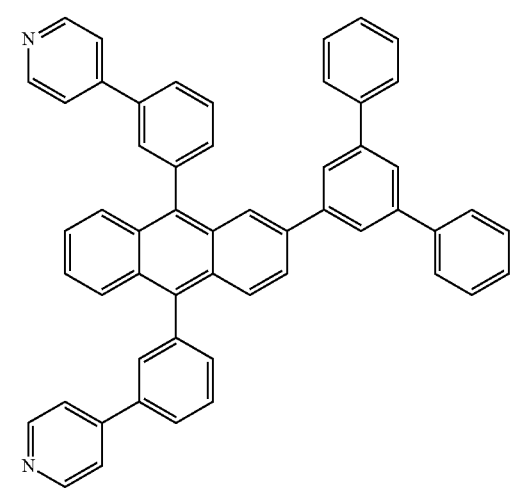
ET9
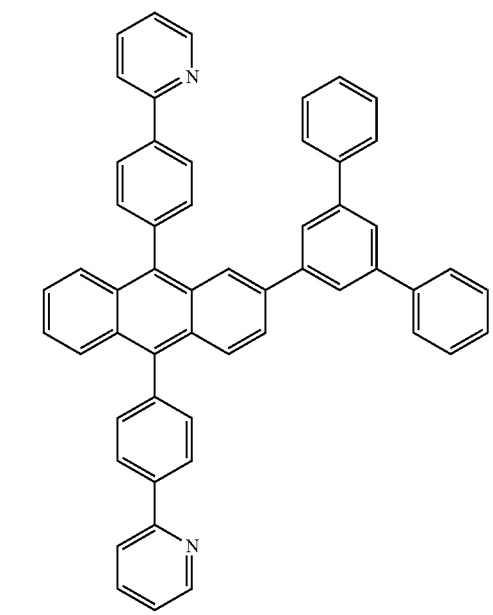
ET10
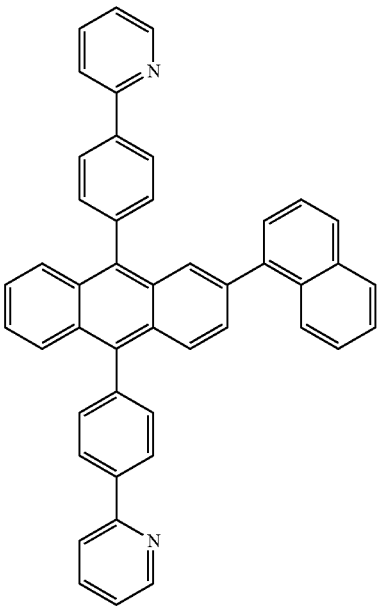
ET11
ET12
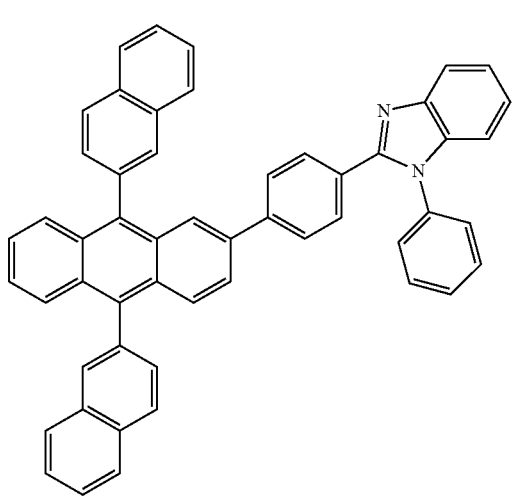

ET13
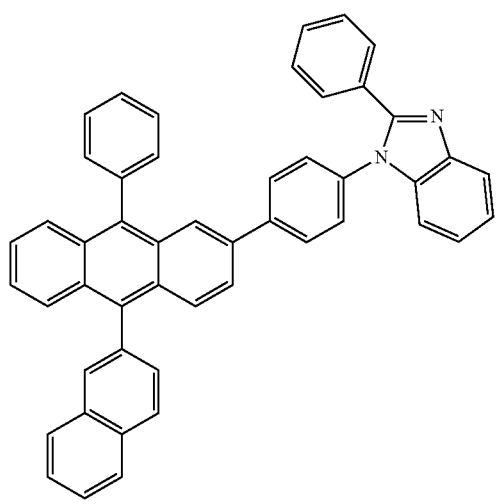
ET16
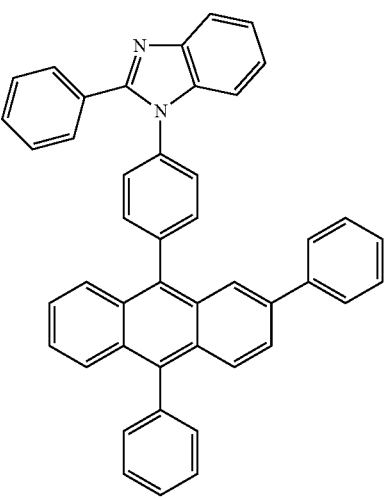
ET14
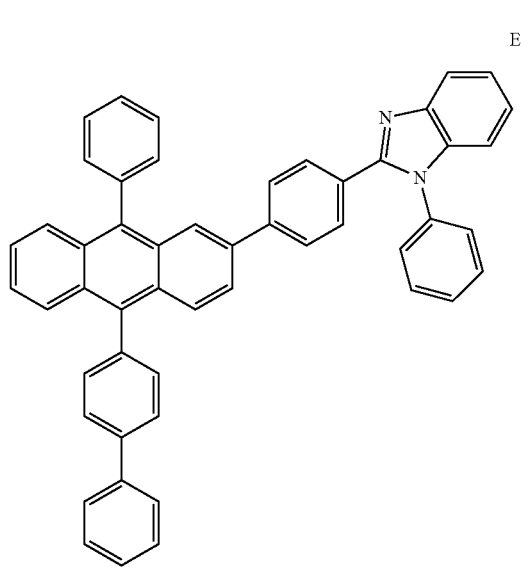
ET17
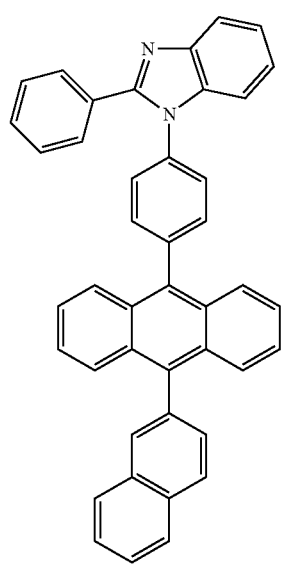
ET15
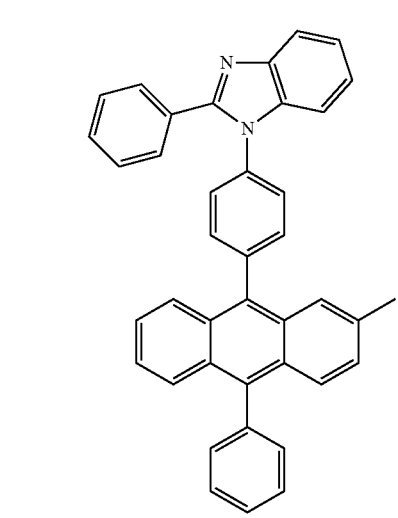
ET18
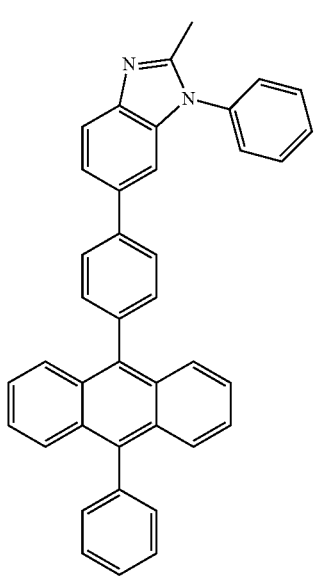

ET19
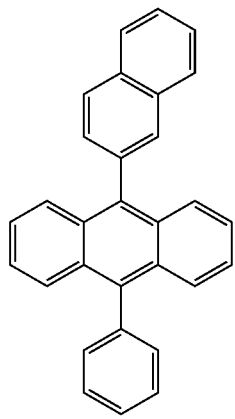
ET20
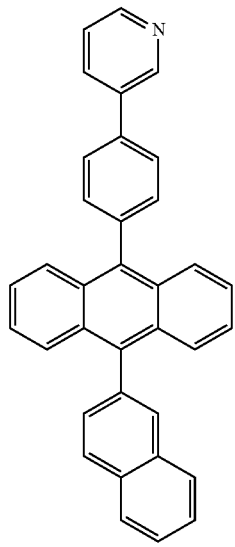
ET21
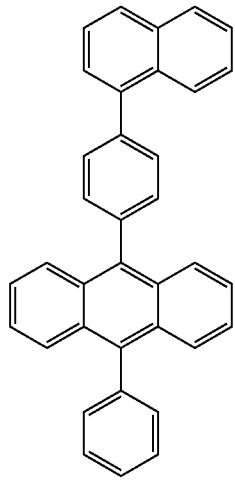
ET22
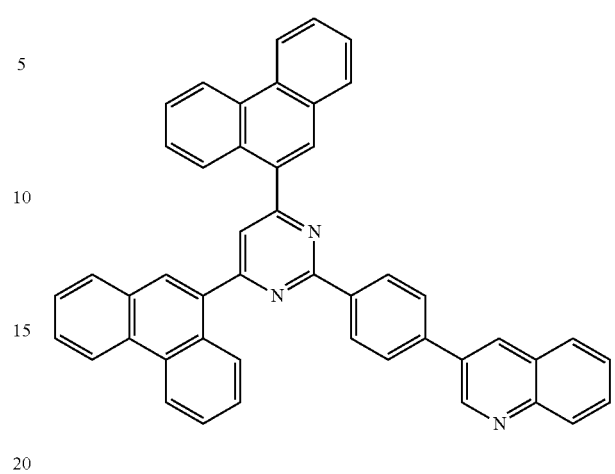
ET23
ET24
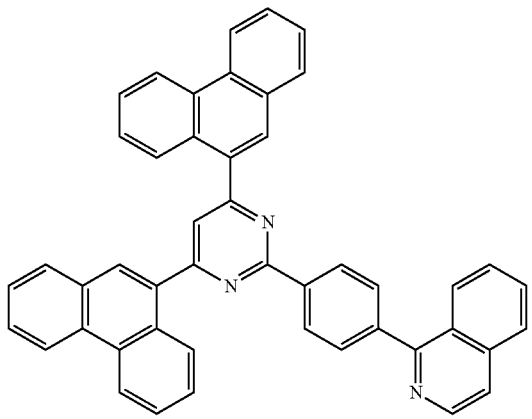

ET25
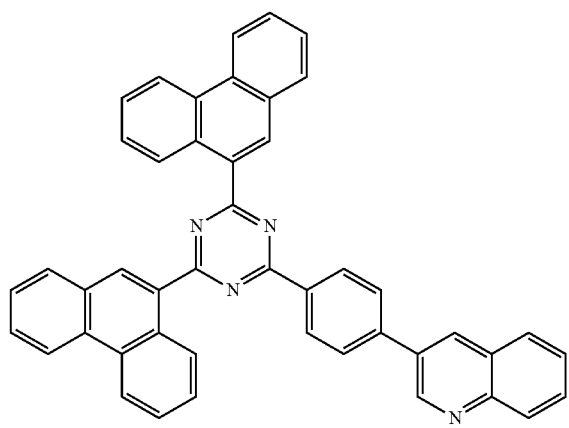
ET26
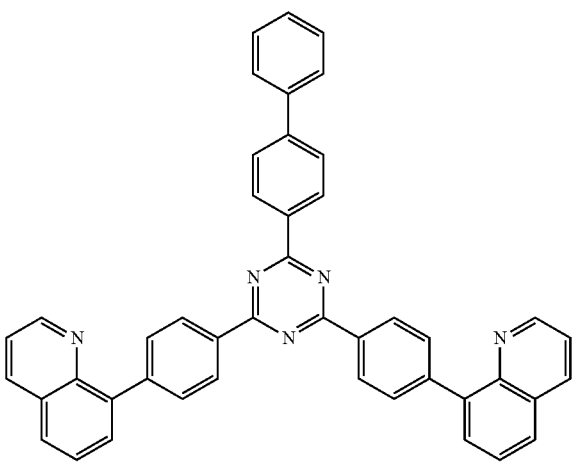
ET27
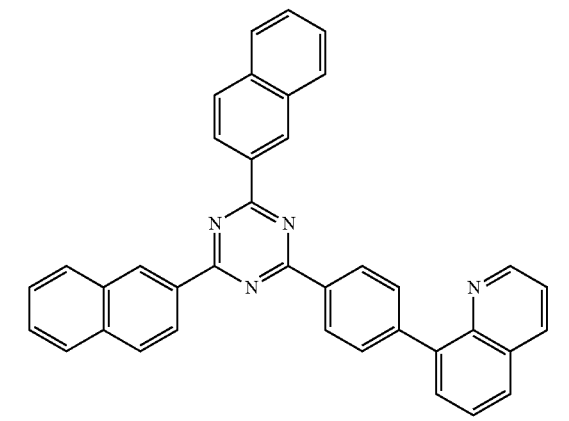
ET28
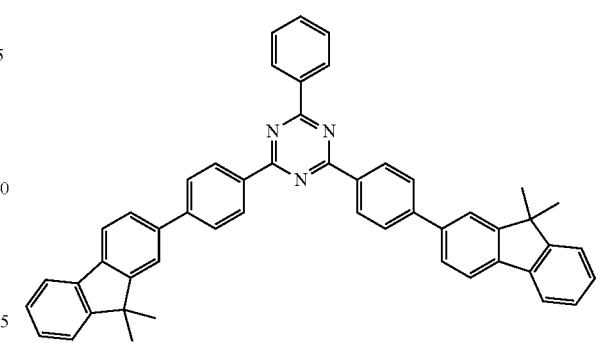
ET29
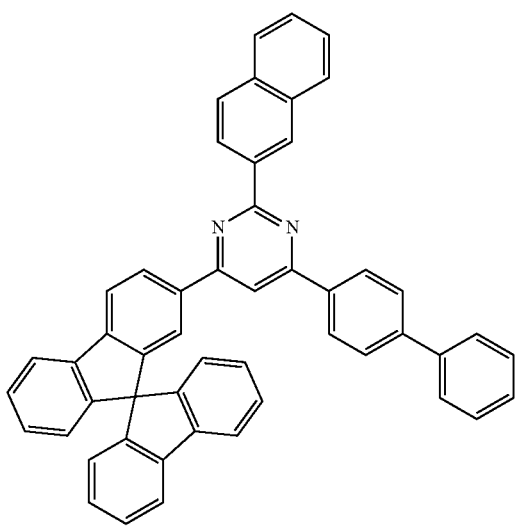
ET30
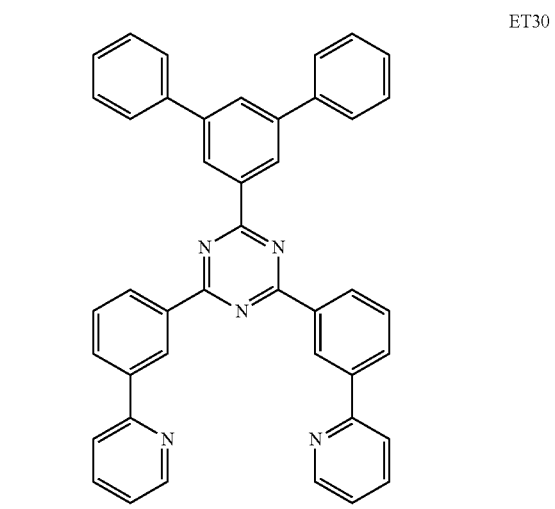

ET31 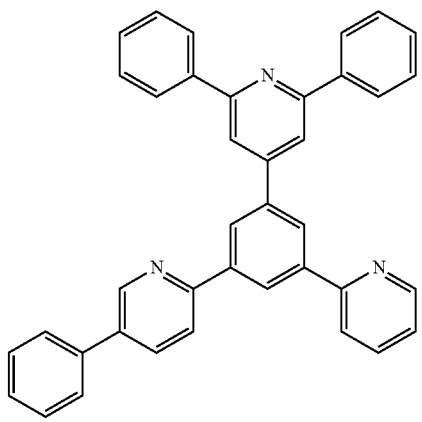

ET32 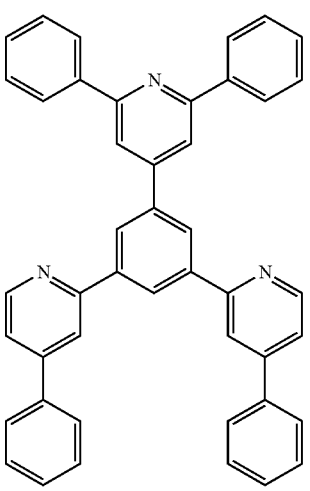

ET33 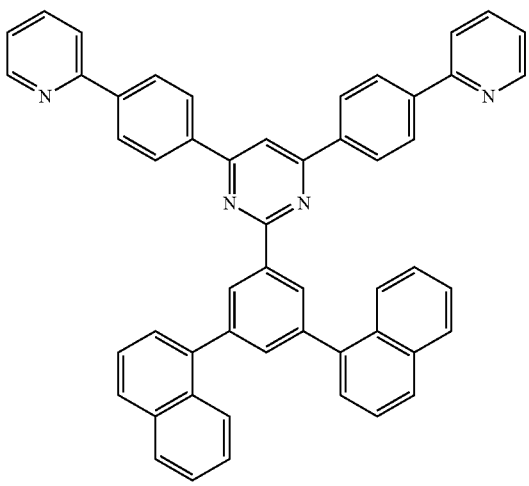

ET34 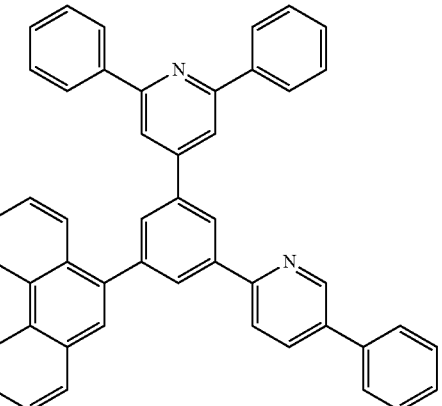

ET35 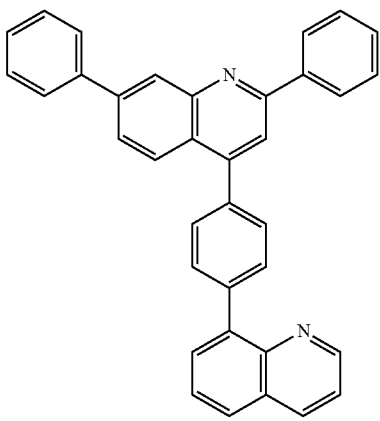

ET36 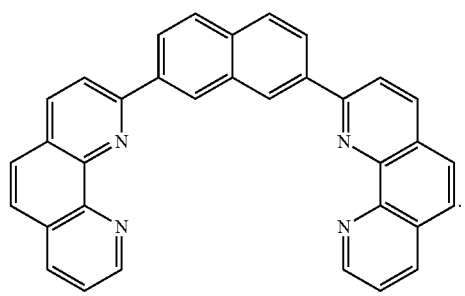

In one or more embodiments, the electron transport region ETR may include a metal halide (such as LiF, NaCl, CsF, RbCl, RbI, CuI and/or KI), a metal in lanthanoides (such as Yb), or a co-depositing material of the metal halide and the metal in lanthanoides. For example, the electron transport region ETR may include KI:Yb, RbI:Yb, etc., as the co-depositing material. In one or more embodiments, the electron transport region ETR may use a metal oxide (such as $Li_2O$ and/or BaO), and/or 8-hydroxy-lithium quinolate (Liq). However, embodiments of the present disclosure are not limited thereto. The electron transport region ETR also may be formed using a mixture material of an electron transport material and an insulating organo metal salt. The organo metal salt may be a material having an energy band gap of about 4 eV or more. In one or more embodiments, the organo metal salt may include, for example, one or more selected from among metal acetates, metal benzoates, metal acetoacetates, metal acetylacetonates, and metal stearates.

The electron transport region ETR may include at least one of 2,9-dimethyl-4,7-diphenyl-1,10-phenanthroline (BCP), or 4,7-diphenyl-1,10-phenanthroline (Bphen), in addition to the aforementioned materials. However, embodiments of the present disclosure are not limited thereto.

The electron transport region ETR may include the compounds of the electron transport region in at least one selected from among an electron injection layer EIL, an electron transport layer ETL, and a hole blocking layer HBL.

If the electron transport region ETR includes the electron transport layer ETL, the thickness of the electron transport layer ETL may be from about 100 Å to about 1,000 Å, for example, from about 150 Å to about 500 Å. If the thickness of the electron transport layer ETL satisfies any of the above-described ranges, satisfactory (or suitable) electron transport properties may be obtained without a substantial increase of a driving voltage. If the electron transport region ETR includes the electron injection layer EIL, the thickness of the electron injection layer EIL may be from about 1 Å to about 100 Å, and from about 3 Å to about 90 Å. If the thickness of the electron injection layer EIL satisfies any of the above described ranges, satisfactory (or suitable) electron injection properties may be obtained without inducing a substantial increase of a driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, and/or mixtures thereof (for example, AgMg, AgYb, and/or MgAg). In one or more embodiments, the second electrode EL2 may have a multilayered structure including a reflective layer or a transflective layer formed using the above-described materials and a transparent conductive layer formed using ITO, IZO, ZnO, ITZO, etc. For example, the second electrode EL2 may include the aforementioned metal materials, combinations of two or more metal materials selected from among the aforementioned metal materials and oxides of the aforementioned metal materials.

In one or more embodiments, the second electrode EL2 may be connected (e.g., physically and/or electrically coupled) with an auxiliary electrode. If the second electrode EL2 is connected with the auxiliary electrode, the resistance of the second electrode EL2 may decrease.

In one or more embodiments, on the second electrode EL2 in the light emitting element ED, a capping layer CPL may be further disposed. The capping layer CPL may include a multilayer or a single layer.

In one or more embodiments, the capping layer CPL may be an organic layer or an inorganic layer. For example, if the capping layer CPL includes an inorganic material, the inorganic material may include an alkali metal compound such as LiF, and/or an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4''-tris(carbazol sol-9-yl) triphenylamine (TCTA), etc., or may include an epoxy resin, and/or acrylate such as methacrylate. In one or more embodiments, a capping layer CPL may include at least one selected from among Compounds P1 to P5 below, but embodiments of the present disclosure are not limited thereto.

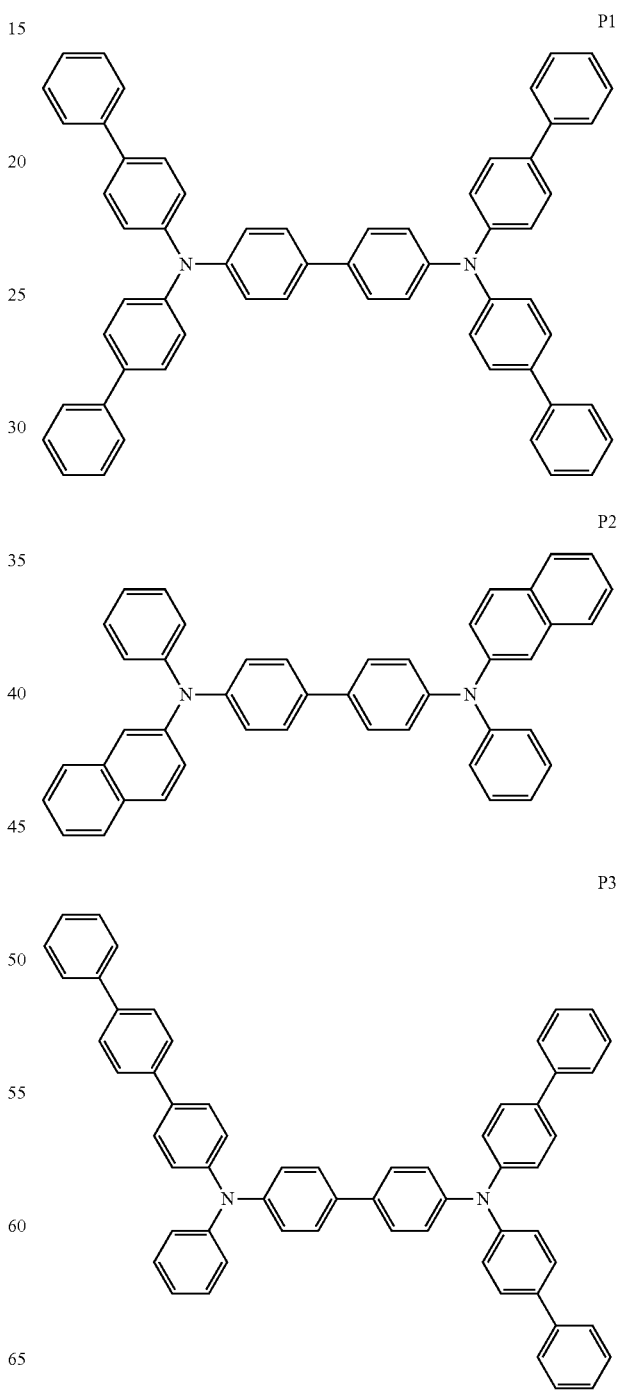

-continued

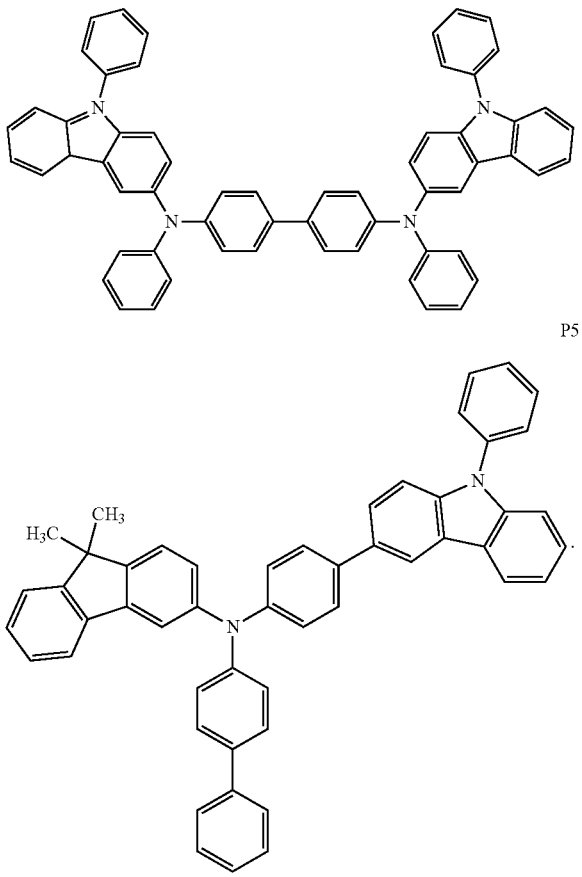

In one or more embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
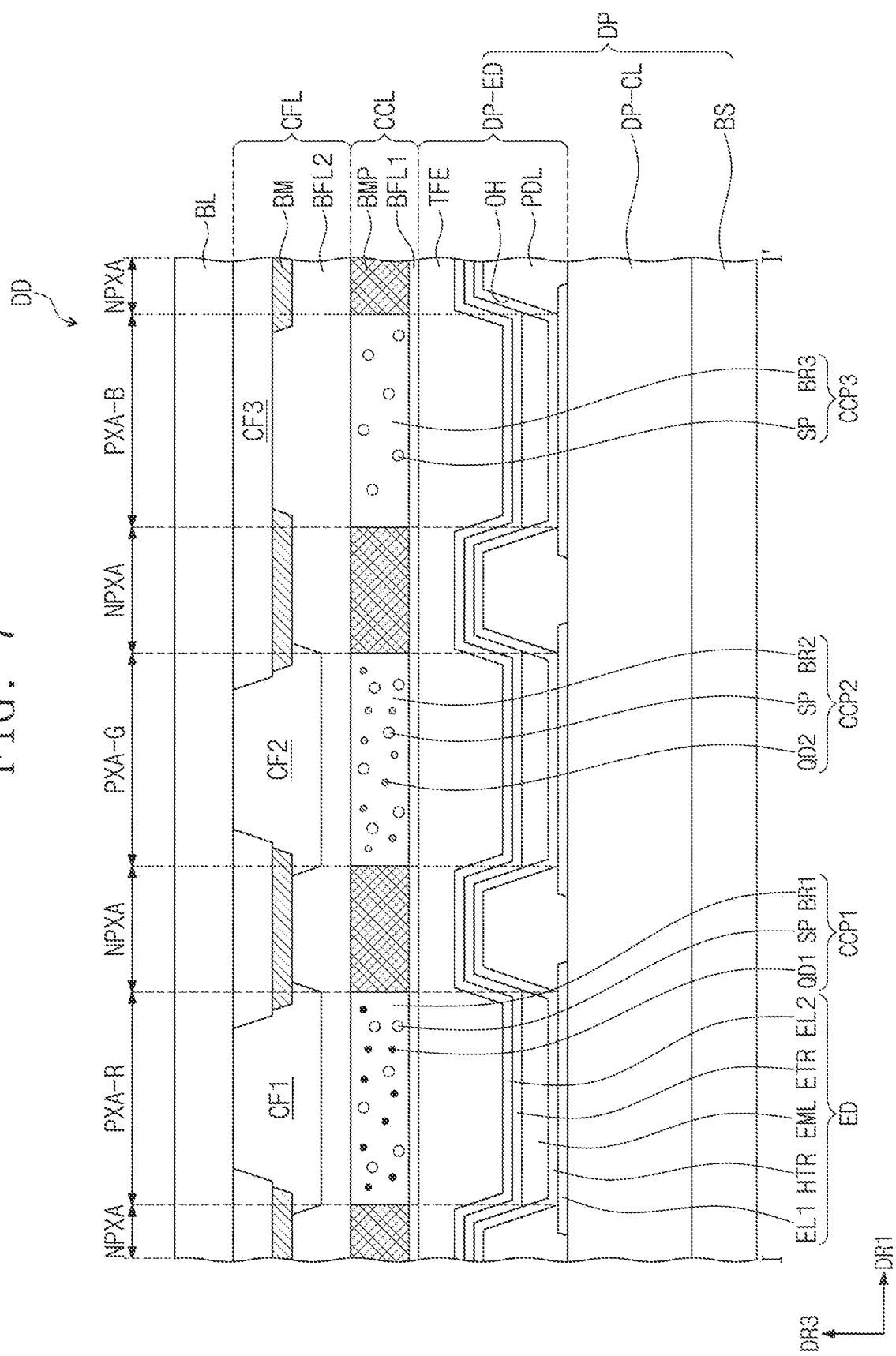
FIG. 7 is a cross-sectional view of a display apparatus according to one or more embodiments.
Figure 8:
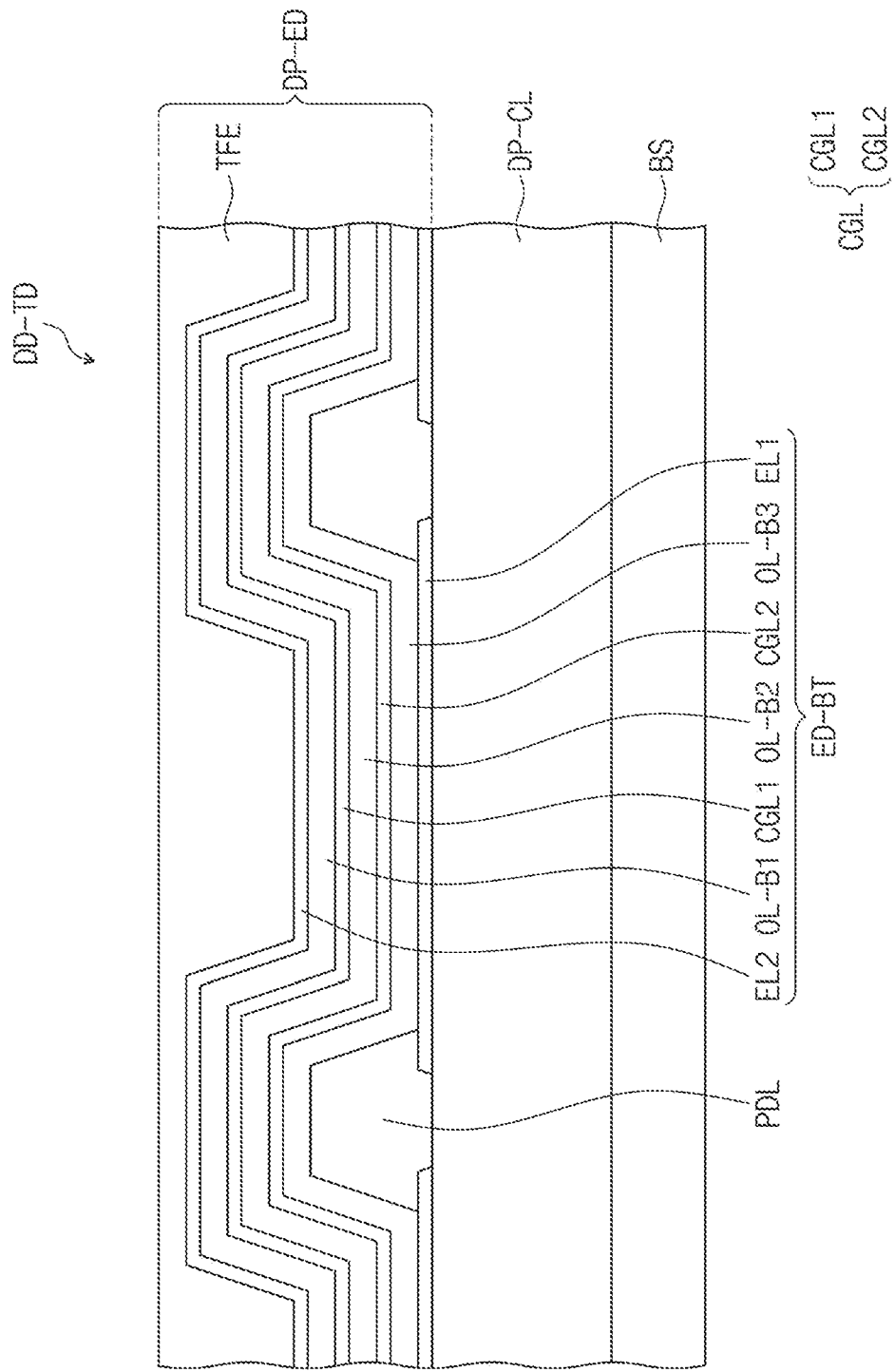
FIG. 8 is a cross-sectional view of a display apparatus according to one or more embodiments.

FIG. 7 and FIG. 8 are cross-sectional views on display apparatuses according to embodiments, respectively. In the explanation on the display apparatuses of embodiments, referring to FIG. 7 and FIG. 8, the overlapping parts for which the explanations have already been provided in connection with FIG. 1 to FIG. 6 will not be explained again, and the different features will be explained chiefly.

Referring to FIG. 7, the display apparatus DD according to one or more embodiments may include a display panel DP including a display device layer DP-ED, a light controlling layer CCL disposed on the display panel DP and a color filter layer CFL.

In one or more embodiments shown in FIG. 7, the display panel DP includes a base layer BS, a circuit layer DP-CL provided on the base layer BS and a display device layer DP-ED, and the display device layer DP-ED may include a light emitting element ED.

The light emitting element ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In one or more embodiments, the description of the structures of the light emitting elements of FIG. 3 to FIG. 6 may be applied to the structure of the light emitting element ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided to each of luminous areas PXA-R, PXA-G and PXA-B may emit light in the same wavelength region. In the display apparatus DD of one or more embodiments, the emission layer EML may emit blue light. In one or more embodiments, the emission layer EML may be provided as a common layer for all luminous areas PXA-R, PXA-G and PXA-B.

The light controlling layer CCL may be disposed on the display panel DP. The light controlling layer CCL may include a light converter. The light converter may be a quantum dot or a phosphor. The light converter may transform the wavelength of light provided and then emit the transformed light. For example, the light controlling layer CCL may be a layer including a quantum dot or a layer including a phosphor.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be disposed between the separated light controlling parts CCP1, CCP2 and CCP3, but embodiments of the present disclosure are not limited thereto. In FIG. 8, the partition pattern BMP is shown not to be overlapped with the light controlling parts CCP1, CCP2 and CCP3, but at least a portion of the edge of the light controlling parts CCP1, CCP2 and CCP3 may be overlapped with the partition pattern BMP.

The light controlling layer CCL may include a first light controlling part CCP1 including a first quantum dot QD1 converting (e.g., to convert) first color light provided from the light emitting element ED into second color light, a second light controlling part CCP2 including a second quantum dot QD2 converting (e.g., to convert) first color light into third color light, and a third light controlling part CCP3 transmitting (e.g., to transmit) first color light.

In one or more embodiments, the first light controlling part CCP1 may provide red light which is the second color light, and the second light controlling part CCP2 may provide green light which is the third color light. The third color controlling part CCP3 may transmit and provide blue light which is the first color light provided from the light emitting element ED. For example, the first quantum dot QD1 may be a red quantum dot, and the second quantum dot QD2 may be a green quantum dot. On the quantum dots QD1 and QD2, the same descriptions as those provided above may be applied.

In one or more embodiments, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one selected from among $TiO_2$, ZnO, $Al_2O_3$, $SiO_2$, and hollow silica. The scatterer SP may include at least one selected from among $TiO_2$, ZnO, $Al_2O_3$, $SiO_2$, and hollow silica, or may be a mixture of two or more materials selected from among $TiO_2$, ZnO, $Al_2O_3$, $SiO_2$, and hollow silica.

The first light controlling part CCP1, the second light controlling part CCP2, and the third light controlling part CCP3 may include base resins BR1, BR2 and BR3, respectively, to disperse the quantum dots QD1 and QD2 and the scatterer SP. In one or more embodiments, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2 and BR3 are mediums in which the quantum dots QD1 and QD2 and the scatterer SP are dispersed, and may be composed of various resin compositions which may be generally referred to as a binder. For example, the base resins BR1, BR2 and BR3 may be acrylic resins, urethane-based resins, silicone-based resins, epoxy-based resins, etc. The base resins BR1, BR2 and BR3 may be transparent resins. In one or more embodiments, the first base resin BR1, the second base resin BR2 and the third base resin BR3 may be the same or different from each other.

The light controlling layer CCL may include a barrier layer BFL1. The barrier layer BFL1 may play the role of blocking or reducing the penetration of moisture and/or oxygen (hereinafter, will be referred to as "humidity/oxygen"). The barrier layer BFL1 may be disposed on the light controlling parts CCP1, CCP2 and CCP3 to block or reduce the exposure of the light controlling parts CCP1, CCP2 and CCP3 to humidity/oxygen. In one or more embodiments, the barrier layer BFL1 may cover the light controlling parts CCP1, CCP2 and CCP3. In one or more embodiments, the barrier layer BFL2 may be provided between a color filter layer CFL and the light controlling parts CCP1, CCP2 and CCP3.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride, and/or a metal thin film securing light transmittance. In one or more embodiments, the barrier layers BFL1 and BFL2 may further include an organic layer. The barrier layers BFL1 and BFL2 may be composed of a single layer or multiple layers.

In the display apparatus DD of one or more embodiments, the color filter layer CFL may be disposed on the light controlling layer CCL. For example, the color filter layer CFL may be disposed directly on the light controlling layer CCL. In this case, the barrier layer BFL2 may be omitted.

The color filter layer CFL may include a light blocking part BM and filters CF-B, CF-G and CF-R. The color filter layer CFL may include a first filter CF1 transmitting (e.g., to transmit) second color light, a second filter CF2 transmitting (e.g., to transmit) third color light, and a third filter CF3 transmitting (e.g., to transmit) first color light. For example, the first filter CF1 may be a red filter, the second filter CF2 may be a green filter, and the third filter CF3 may be a blue filter. Each of the filters CF1, CF2 and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments of the present disclosure are not limited thereto, and the third filter CF3 may not include the pigment or dye. The third filter CF3 may include a polymer photosensitive resin and not include a pigment or dye. The third filter CF3 may be transparent. The third filter CF3 may be formed using a transparent photosensitive resin.

In one or more embodiments, the first filter CF1 and the second filter CF2 may be yellow filters. The first filter CF1 and the second filter CF2 may be provided in one body without distinction.

The light blocking part BM may be a black matrix. The light blocking part BM may be formed by including an organic light blocking material and/or an inorganic light blocking material including a black pigment or black dye. The light blocking part BM may prevent or reduce light leakage phenomenon and divide the boundaries among adjacent filters CF1, CF2 and CF3. In one or more embodiments, the light blocking part BM may be formed as a blue filter.

The first to third filters CF1, CF2 and CF3 may be respectively disposed corresponding to a red luminous area PXA-R, a green luminous area PXA-G, and a blue luminous area PXA-B.

On the color filter layer CFL, a base substrate BL may be disposed. The base substrate BL may be a member providing a base surface on which the color filter layer CFL, the light controlling layer CCL, etc. are disposed. The base substrate BL may be a glass substrate, a metal substrate, a plastic substrate, etc. However, embodiments of the present disclosure are not limited thereto, and the base substrate BL may be an inorganic layer, an organic layer or a composite material layer (e.g., including an organic material and an inorganic material). In one or more embodiments, the base substrate BL may be omitted.

FIG. 8 is a cross-sectional view showing a portion of the display apparatus according to one or more embodiments. In FIG. 8, the cross-sectional view of a portion corresponding to the display panel DP in FIG. 7 is shown. In a display apparatus DD-TD of one or more embodiments, the light emitting element ED-BT may include multiple light emitting structures OL-B1, OL-B2 and OL-B3. The light emitting element ED-BT may include oppositely disposed first electrode EL1 and second electrode EL2, and the multiple light emitting structures OL-B1, OL-B2 and OL-B3 stacked in order in a thickness direction and provided between the first electrode EL1 and the second electrode EL2. Each of the light emitting structures OL-B1, OL-B2 and OL-B3 may include an emission layer EML (FIG. 7), and a hole transport region HTR and an electron transport region ETR disposed with the emission layer EML (FIG. 7) therebetween.

For example, the light emitting element ED-BT included in the display apparatus DD-TD of one or more embodiments may be a light emitting element of a tandem structure including multiple emission layers.

In one or more embodiments shown in FIG. 8, light emitted from the light emitting structures OL-B1, OL-B2 and OL-B3 may be all blue light. However, embodiments of the present disclosure are not limited thereto, and the wavelength regions of light emitted from the light emitting structures OL-B1, OL-B2 and OL-B3 may be different from each other. For example, the light emitting element ED-BT including the multiple light emitting structures OL-B1, OL-B2 and OL-B3 emitting light in different wavelength regions may emit white light.

Between neighboring light emitting structures OL-B1, OL-B2 and OL-B3, a charge generating layer CGL may be disposed. The charge generating layer CGL may include a p-type charge generating layer and/or an n-type charge generating layer.

Hereinafter, the polycyclic compound according to one or more embodiments and the light emitting element of one or more embodiments will be particularly explained referring to embodiments and comparative embodiments. However, the embodiments below are only illustrations to assist the understanding of the present disclosure, and the scope of the present disclosure is not limited thereto.

EXAMPLES

1. Synthesis of Polycyclic Compound

First, the synthetic method of a polycyclic compound according to one or more embodiments will be explained in particular illustrating the synthetic methods of Compound 1, Compound 5, Compound 8, Compound 10, Compound 12, Compound 14, and Compound 16, in Compound Group 1. However, the synthetic methods explained hereinafter are embodiments, and the synthetic method of the polycyclic compound according to one or more embodiments of the present disclosure is not limited to the embodiments below.

(1) Synthesis of Compound 1

Compound 1 according to one or more embodiments may be synthesized, for example, by Reaction 1 below.

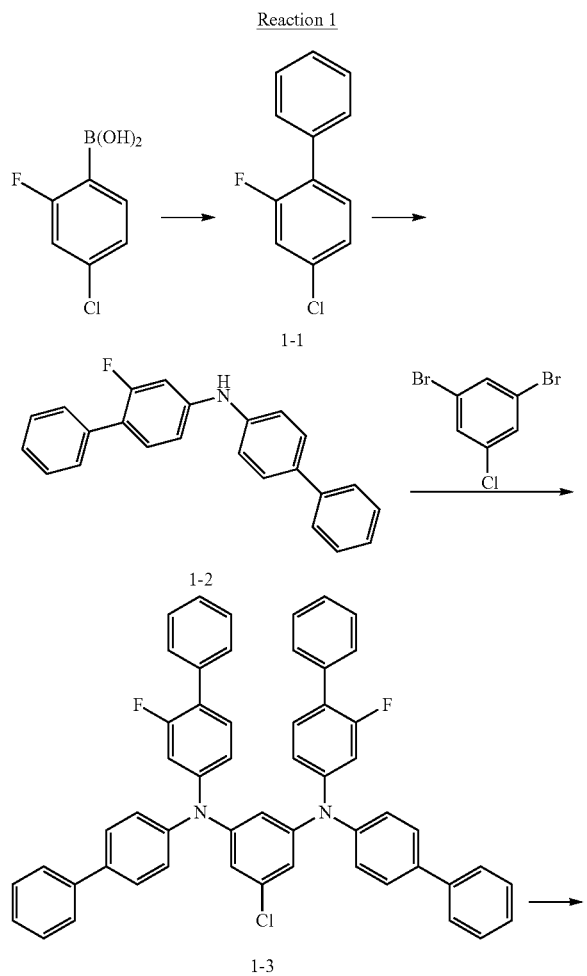

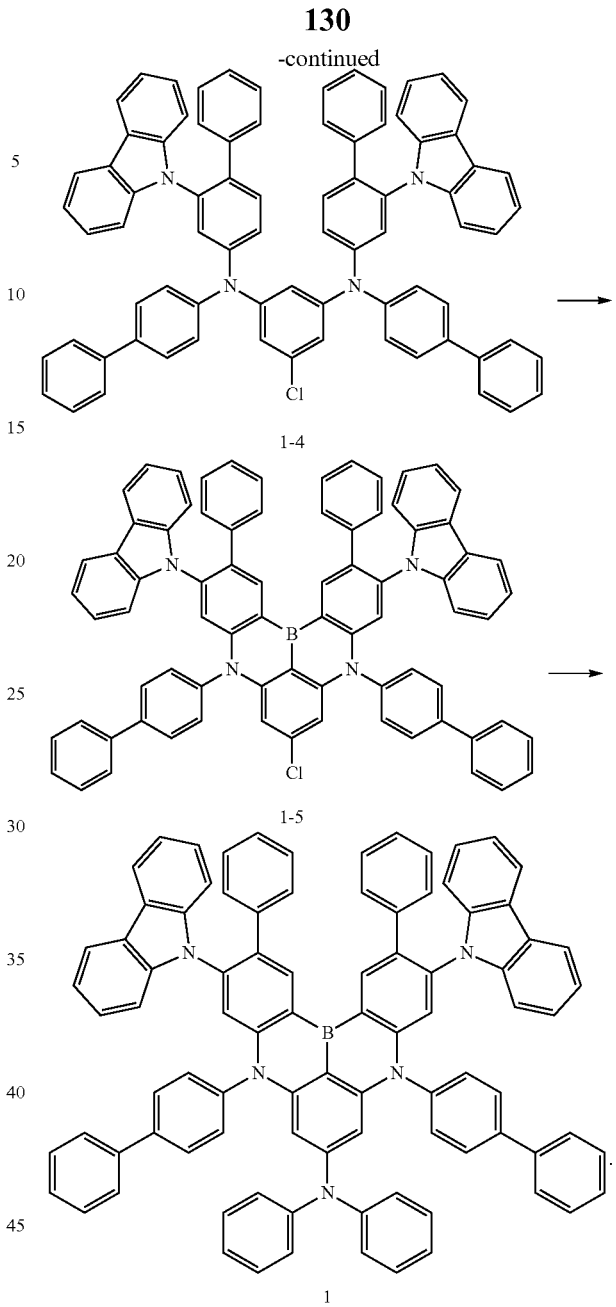

1) Synthesis of Intermediate 1-1

(4-chloro-2-fluorophenyl)boronic acid (1.2 eq), bromobenzene (1 eq), tetrakis(triphenylphosphine)palladium (0) (0.05 eq), and sodium carbonate (3 eq) were dissolved in toluene, ethanol and pure water (in a ratio of 1:1:3) and stirred under a nitrogen atmosphere at about 100 degrees centigrade for about 12 hours. After cooling, an organic layer obtained by washing with ethyl acetate and water three times was dried with magnesium sulfate and then, dried under a reduced pressure. A residue obtained by drying under a reduced pressure was separated and purified by column chromatography to obtain Intermediate 1-1 (yield: 70%).

2) Synthesis of Intermediate 1-2

Intermediate 1-1 (1 eq), [1,1'-biphenyl]-4-amine (1.3 eq), tris(dibenzylideneacetone)dipalladium(0) (0.05 eq), tri-tert-butylphosphine (0.1 eq), and sodium tert-butoxide (3 eq)

were dissolved in o-xylene and stirred under a nitrogen atmosphere at about 140 degrees centigrade for about 12 hours. An organic layer obtained by washing the mixture thus stirred with ethyl acetate and water three times was dried with magnesium sulfate (MgSO$_4$) and then, dried under a reduced pressure. A residue obtained by drying under a reduced pressure was separated and purified by column chromatography to obtain Intermediate 1-2 (yield: 65%).

3) Synthesis of Intermediate 1-3

1,3-dibromo-5-chlorobenzene (1 eq), Intermediate 1-2 (2.1 eq), tris(dibenzylideneacetone)dipalladium(0) (0.05 eq), tri-tert-butylphosphine (0.1 eq), and sodium tert-butoxide (3 eq) were dissolved in toluene and stirred under a nitrogen atmosphere at about 100 degrees centigrade for about 12 hours. An organic layer obtained by washing the mixture thus stirred with ethyl acetate and water three times was dried with magnesium sulfate and then, dried under a reduced pressure. A residue obtained by drying under a reduced pressure was separated and purified by column chromatography to obtain Intermediate 1-3 (yield: 60%).

4) Synthesis of Intermediate 1-4

Intermediate 1-3 (1 eq), carbazole (2.1 eq), 18-crown-ether (3 eq), potassium phosphate (5 eq), and potassium hydroxide (5 eq) were dissolved in dimethylformamide (DMF) and stirred under a nitrogen atmosphere at about 180 degrees centigrade for about 12 hours. An organic layer obtained by washing the mixture thus stirred with ethyl acetate and water three times was dried with magnesium sulfate and then, dried under a reduced pressure. A residue obtained by drying under a reduced pressure was separated and purified by column chromatography to obtain Intermediate 1-4 (yield: 30%).

5) Synthesis of Intermediate 1-5

Intermediate 1-4 (1 eq) and boron tribromide (1.5 eq) were dissolved in ortho dichlorobenzene. The temperature was raised to about 140 degrees centigrade and stirring was conducted under a nitrogen environment for about 12 hours. After cooling a mixture stirred, triethylamine was slowly added thereto dropwisely to the reaction product to quench the reaction, and then, methanol was added thereto dropwisely to obtain a precipitate, and filtering was conducted to obtain a reaction product. The reaction product thus obtained was separated and purified by column chromatography to obtain Intermediate 1-5 (yield: 17%).

6) Synthesis of Compound 1

Intermediate 1-5 (1 eq), diphenylamine (1.1 eq), tris (dibenzylideneacetone)dipalladium(0) (0.05 eq), tri-tert-butylphosphine (0.1 eq), and sodium tert-butoxide (3 eq) were dissolved in o-xylene and stirred under a nitrogen atmosphere at about 140 degrees centigrade for about 12 hours. An organic layer obtained by washing the mixture thus stirred with ethyl acetate and water three times was dried with magnesium sulfate and then, dried under a reduced pressure. A residue obtained by drying under a reduced pressure was separated and purified by column chromatography to obtain Compound 1 (yield: 70%).

Compound 5 according to one or more embodiments may be synthesized, for example, by Reaction 2 below.

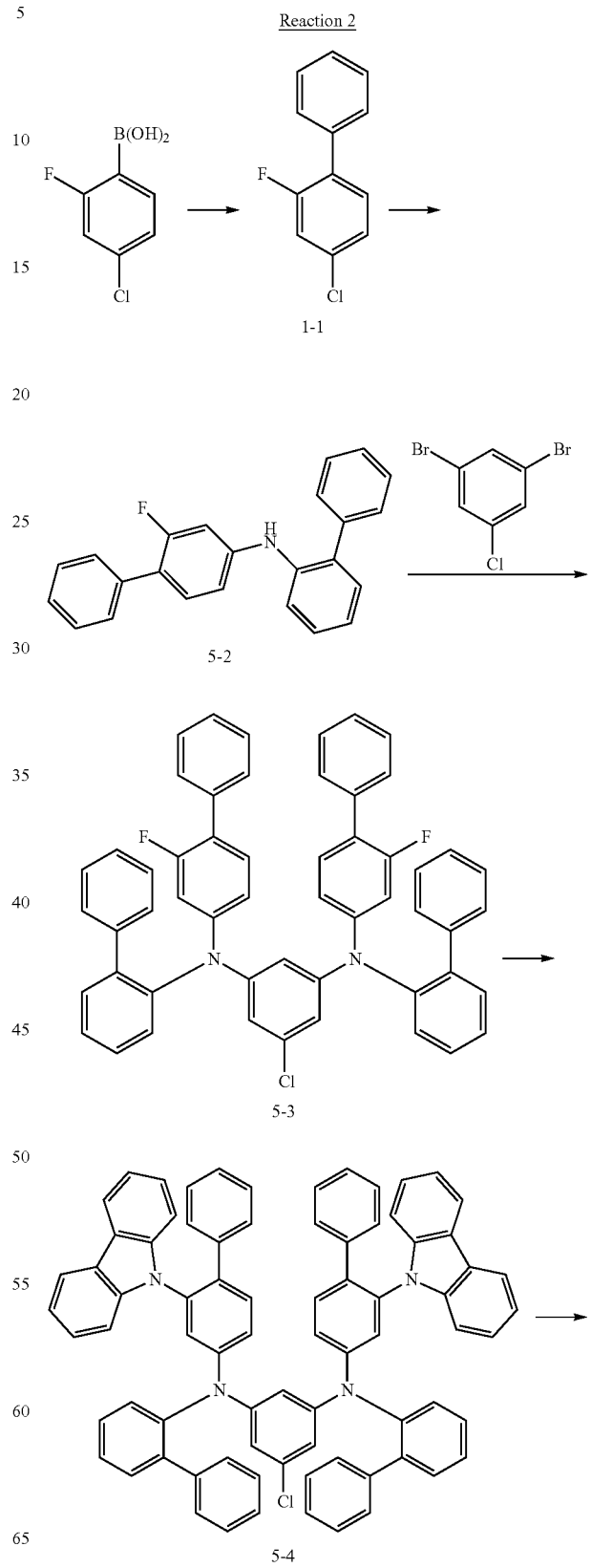

Reaction 2

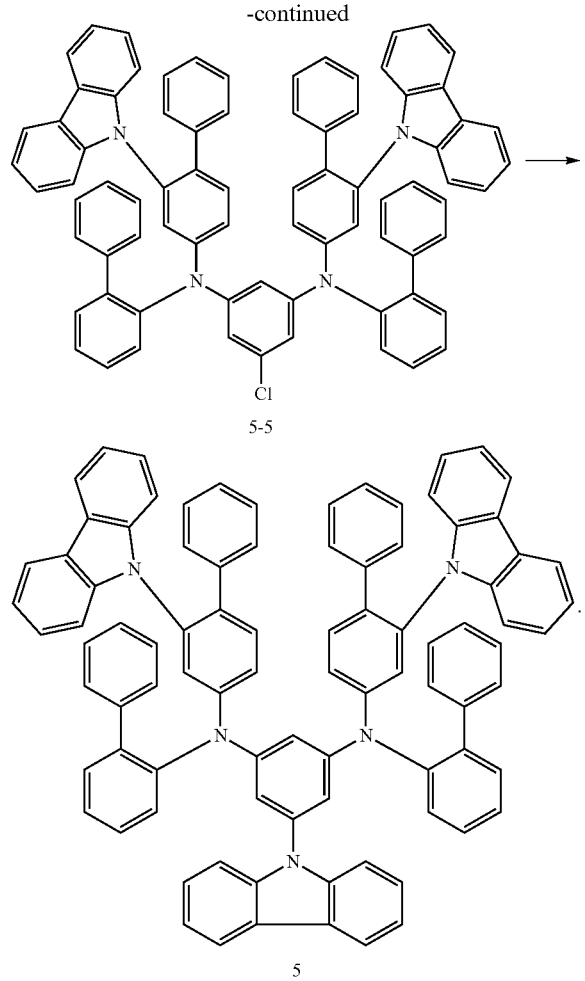

1) Synthesis of Intermediate 5-2

Intermediate 5-2 was synthesized by substantially the same method as the synthesis of Intermediate 1-2 except for using [1,1'-biphenyl]-2-amine instead of [1,1'-biphenyl]-4-amine used in the synthesis of Intermediate 1-2 (yield: 60%).

2) Synthesis of Intermediate 5-3

Intermediate 5-3 was synthesized by substantially the same method as the synthesis of Intermediate 1-3 except for using Intermediate 5-2 instead of Intermediate 1-2 used in the synthesis of Intermediate 1-3 (yield: 60%).

3) Synthesis of Intermediate 5-4

Intermediate 5-4 was synthesized by substantially the same method as the synthesis of Intermediate 1-4 except for using Intermediate 5-3 instead of Intermediate 1-3 used in the synthesis of Intermediate 1-4 (yield: 40%).

4) Synthesis of Intermediate 5-5

Intermediate 5-5 was synthesized by substantially the same method as the synthesis of Intermediate 1-5 except for using Intermediate 5-4 instead of Intermediate 1-4 used in the synthesis of Intermediate 1-5 (yield: 15%).

5) Synthesis of Compound 5

Compound 5 was synthesized by substantially the same method as the synthesis of Compound 1 except for using Intermediate 5-5 instead of Intermediate 1-5 used in the synthesis of Compound 1 (yield: 60%).

(3) Synthesis of Compound 8

Compound 8 according to one or more embodiments may be synthesized, for example, by Reaction 3 below.

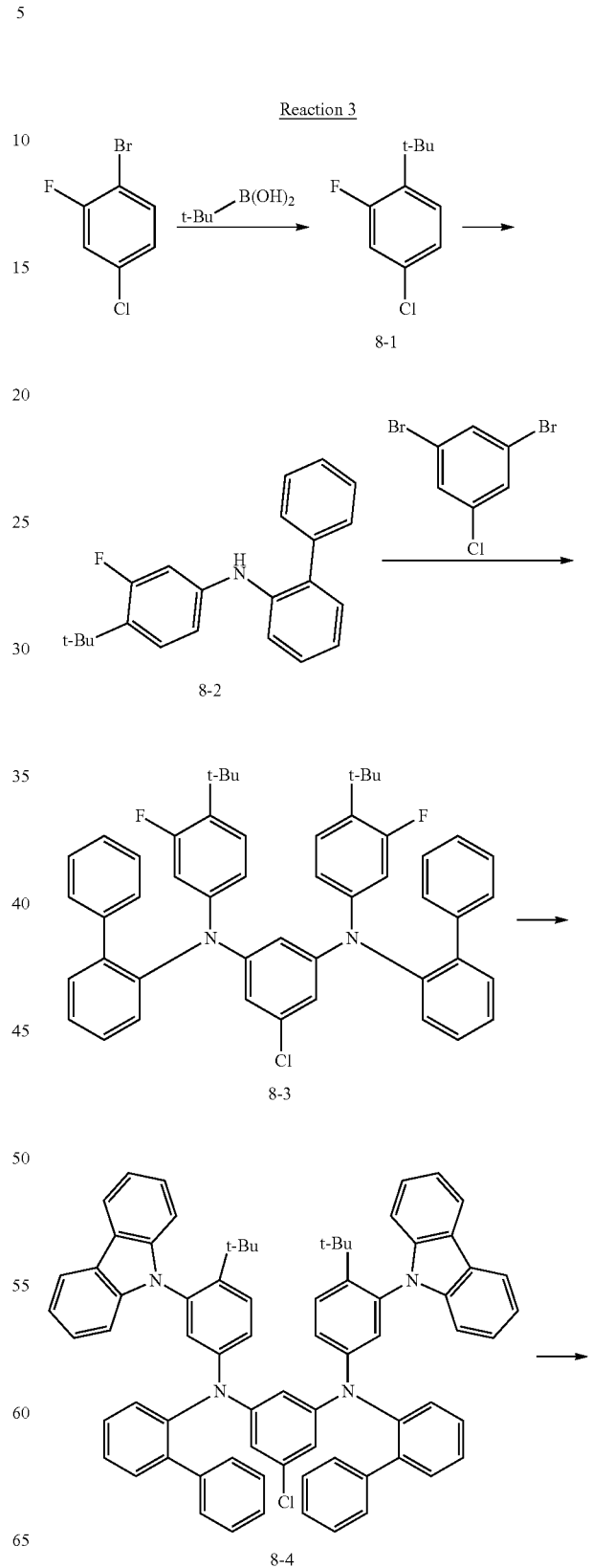

-continued

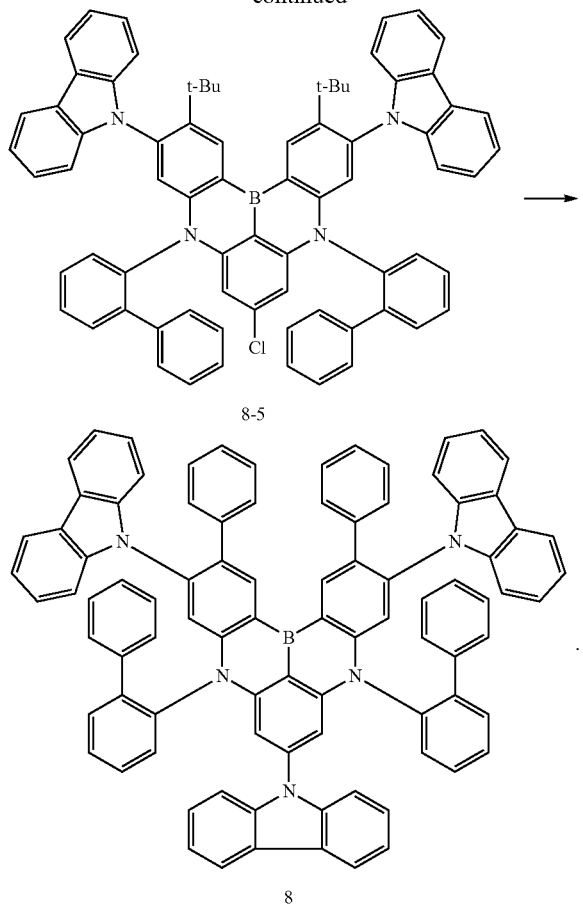

8-5

8

1) Synthesis of Intermediate 8-1

Tert-butylboronic acid (1.5 eq), 1-bromo-4-chloro-2-fluorobenzene (1 eq), tetrakis(triphenylphosphine)palladium(0) (0.05 eq), sodium carbonate (3 eq) were dissolved in toluene, ethanol and pure water (in a ratio of 1:1:3) and stirred under a nitrogen atmosphere at about 100 degrees centigrade for about 12 hours. After cooling, an organic layer obtained by washing with ethyl acetate and water three times was dried with magnesium sulfate and then, dried under a reduced pressure. A residue obtained by drying under a reduced pressure was separated and purified by column chromatography to obtain Intermediate 8-1 (yield: 60%).

2) Synthesis of Intermediate 8-2

Intermediate 8-2 was synthesized by substantially the same method as the synthesis of Intermediate 5-2 except for using Intermediate 8-1 instead of Intermediate 1-1 used in the synthesis of Intermediate 5-2 (yield: 70%).

3) Synthesis of Intermediate 8-3

Intermediate 8-3 was synthesized by substantially the same method as the synthesis of Intermediate 1-3 except for using Intermediate 8-2 instead of Intermediate 1-2 used in the synthesis of Intermediate 1-3 (yield: 70%).

4) Synthesis of Intermediate 8-4

Intermediate 8-4 was synthesized by substantially the same method as the synthesis of Intermediate 1-4 except for using Intermediate 8-3 instead of Intermediate 1-3 used in the synthesis of Intermediate 1-4 (yield: 40%).

5) Synthesis of Intermediate 8-5

Intermediate 8-5 was synthesized by substantially the same method as the synthesis of Intermediate 1-5 except for using Intermediate 8-4 instead of Intermediate 1-4 used in the synthesis of Intermediate 1-5 (yield: 12%).

6) Synthesis of Compound 8

Compound 8 was synthesized by substantially the same method as the synthesis of Compound 1 except for using Intermediate 8-5 instead of Intermediate 1-5 used in the synthesis of Compound 1 (yield: 50%).

(4) Synthesis of Compound 10

Compound 10 according to one or more embodiments may be synthesized, for example, by Reaction 4 below.

Reaction 4

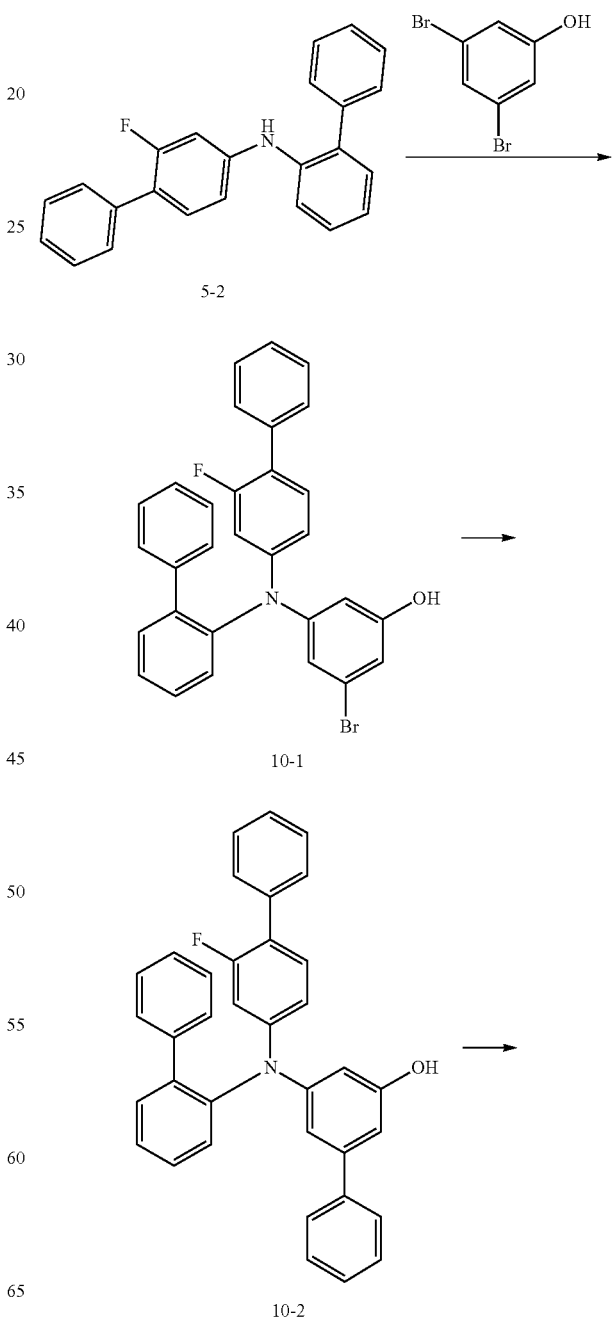

5-2

10-1

10-2

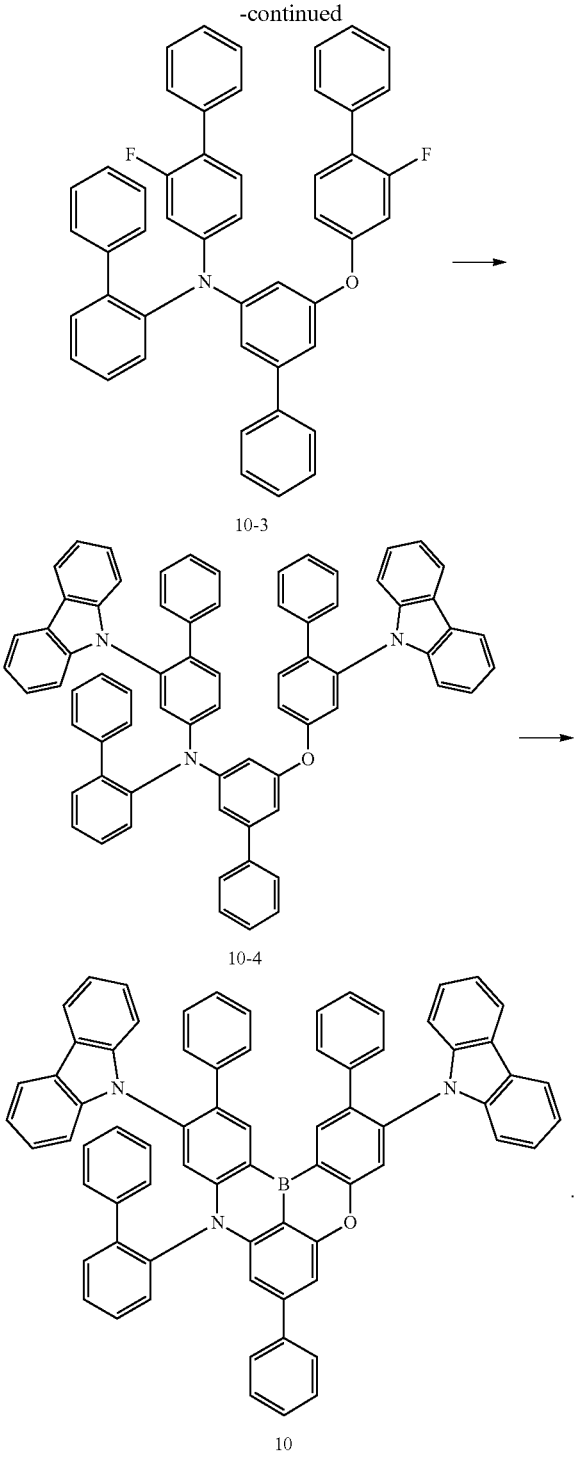

10-3

10-4

10

1) Synthesis of Intermediate 10-1

3,5-dibromophenol (1 eq), Intermediate 5-2 (1 eq), tris(dibenzylideneacetone)dipalladium(0) (0.03 eq), BINAP (0.1 eq), and sodium tert-butoxide (2 eq) were dissolved in toluene and stirred under a nitrogen atmosphere at about 100 degrees centigrade for about 12 hours. After cooling, the mixture thus stirred was washed with ethyl acetate and water three times, and an organic layer obtained was dried with magnesium sulfate and then, dried under a reduced pressure. A residue obtained by drying under a reduced pressure was separated and purified by column chromatography to obtain Intermediate 10-1 (yield: 60%).

2) Synthesis of Intermediate 10-2

Phenyl boronic acid (1.5 eq), Intermediate 10-1 (1 eq), Pd(PPh$_3$)$_4$ (0.05 eq), and K$_2$CO$_3$ (3 eq) were dissolved in a mixture solution of water and THF of 2:1 and stirred at about 80 degrees centigrade for about 12 hours. After cooling, an organic layer obtained by washing with ethyl acetate and water three times and then separating layers was dried with magnesium sulfate and then, dried under a reduced pressure. By separating by column chromatography using dichloro methane (MC) and n-hexane, Intermediate 10-2 was obtained (yield: 70%).

3) Synthesis of Intermediate 10-3

(4-chloro-2-fluorophenyl)boronic acid (1 eq), Intermediate 10-2 (1.5 eq), copper iodide (1 eq), 2-picolinic acid (0.1 eq), and potassium carbonate (5 eq) were dissolved in DMF and stirred under a nitrogen atmosphere at about 180 degrees centigrade for about 12 hours. After cooling, an organic layer obtained by washing with ethyl acetate and water three times, was dried with magnesium sulfate and then, dried under a reduced pressure. Then, by separating and purifying by column chromatography, Intermediate 10-3 was obtained (yield: 30%).

4) Synthesis of Intermediate 10-4

Intermediate 10-4 was synthesized by substantially the same method as the synthesis of Intermediate 1-4 except for using Intermediate 10-3 instead of Intermediate 1-3 used in the synthesis of Intermediate 1-4 (yield: 40%).

5) Synthesis of Compound 10

Compound 10 was synthesized by substantially the same method as the synthesis of Intermediate 1-5 except for using Intermediate 10-4 instead of Intermediate 1-4 used in the synthesis of Intermediate 1-5 (yield: 13%).

(5) Synthesis of Compound 12

Compound 12 according to one or more embodiments may be synthesized, for example, by Reaction 5 below.

Reaction 5

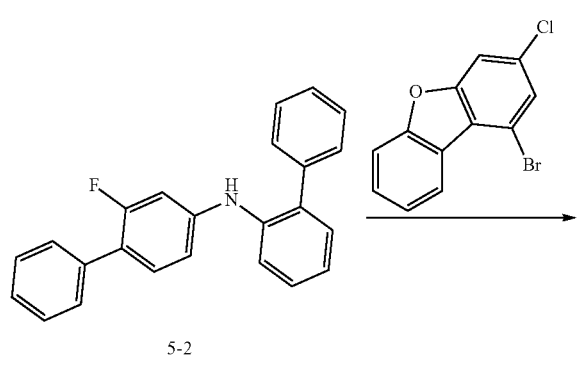

5-2

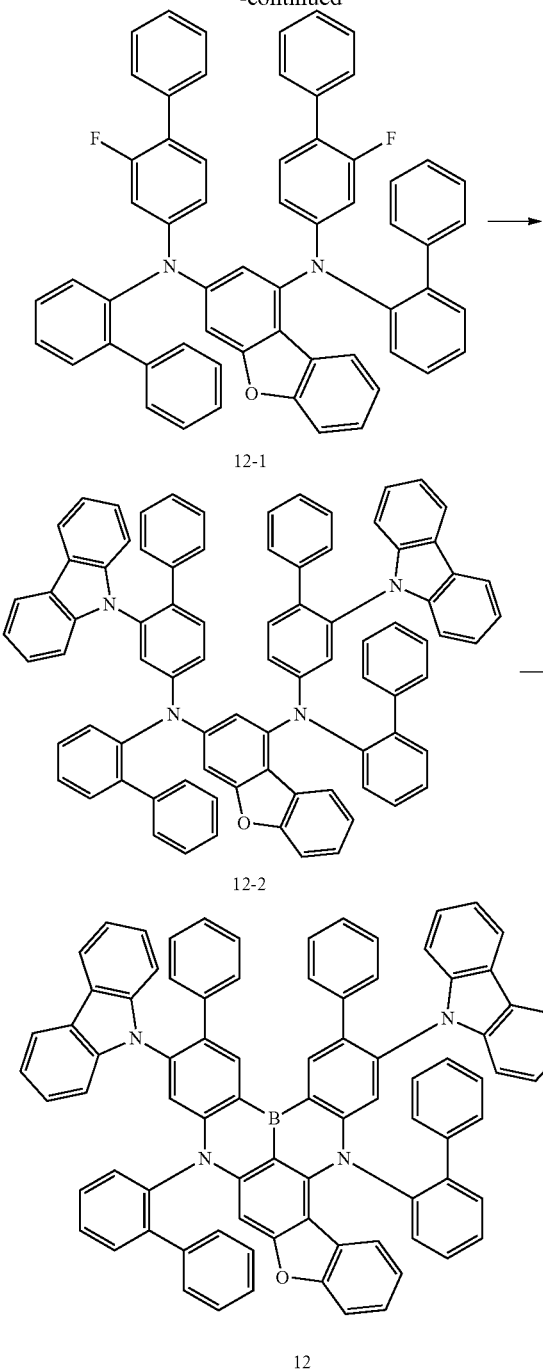

12-1

12-2

12

1) Synthesis of Intermediate 12-1

1-bromo-3-chlorodibenzo[b,d]furan (1 eq), Intermediate 5-2 (1 eq), tris(dibenzylideneacetone)dipalladium(0) (0.03 eq), tri-tert-butylphosphine (0.06 eq), and sodium tert-butoxide (2 eq) were dissolved in toluene and stirred under a nitrogen atmosphere at about 110 degrees centigrade for about 12 hours. After cooling, the mixture thus stirred was washed with ethyl acetate and water three times, and an organic layer obtained was dried with magnesium sulfate and then, dried under a reduced pressure. A residue obtained by drying under a reduced pressure was separated and purified by column chromatography to obtain Intermediate 12-1 (yield: 70%).

2) Synthesis of Intermediate 12-2

Intermediate 12-2 was synthesized by substantially the same method as the synthesis of Intermediate 1-4 except for using Intermediate 12-1 instead of Intermediate 1-3 used in the synthesis of Intermediate 1-4 (yield: 25%).

3) Synthesis of Compound 12

Compound 12 was synthesized by substantially the same method as the synthesis of Intermediate 1-5 except for using Intermediate 12-2 instead of Intermediate 1-4 used in the synthesis of Intermediate 1-5 (yield: 8%).

(6) Synthesis of Compound 14

Compound 14 according to one or more embodiments may be synthesized, for example, by Reaction 6 below.

Reaction 6

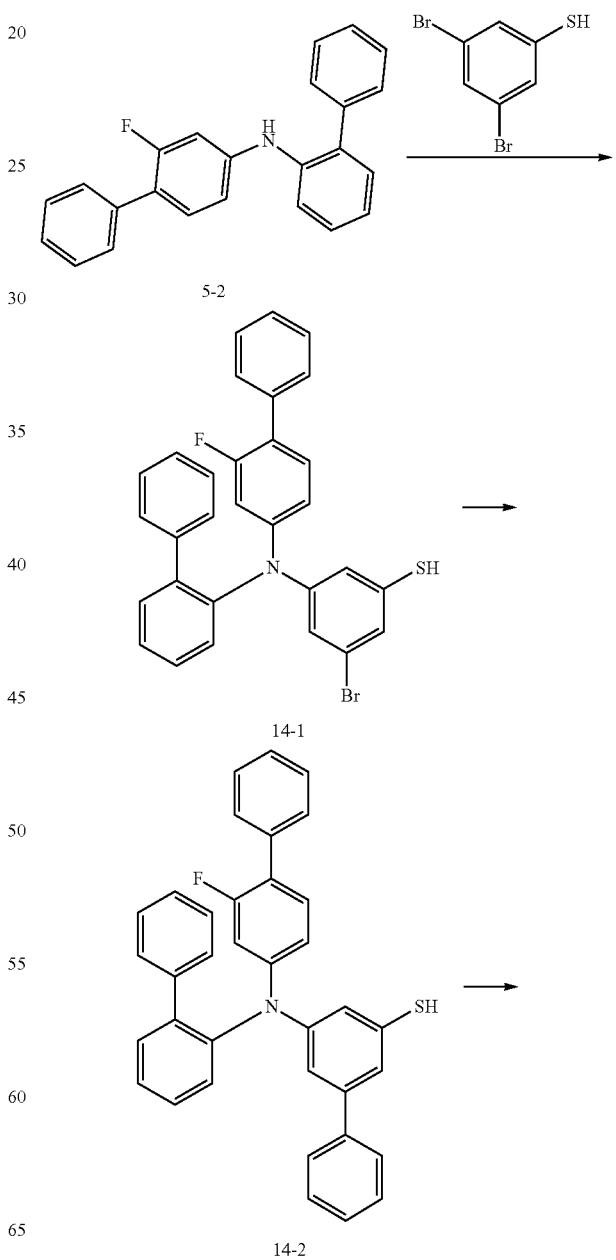

5-2

14-1

14-2

-continued

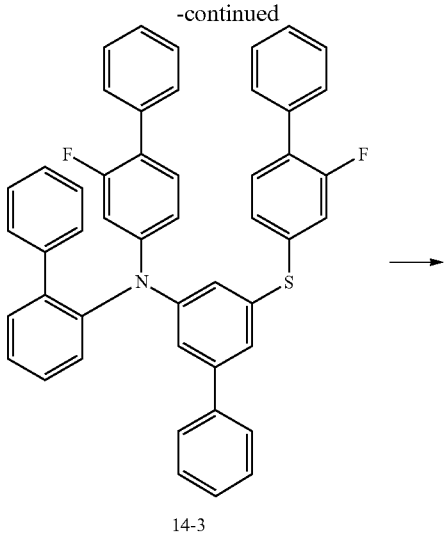

14-3

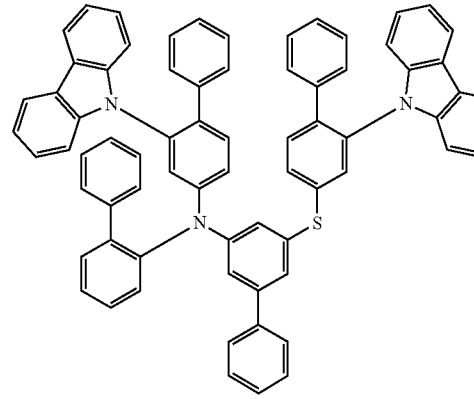

14-4

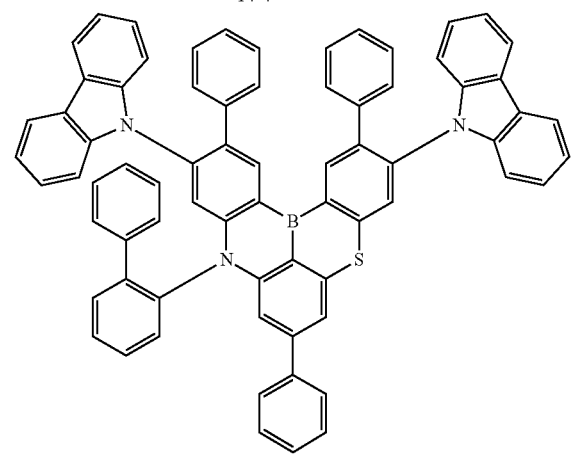

14

1) Synthesis of Intermediate 14-1

Intermediate 14-1 was synthesized by substantially the same method as the synthesis of Intermediate 10-1 except for using 3,5-dibromobenzenethiol instead of 3,5-dibromophenol used in the synthesis of Intermediate 10-1 (yield: 70%).

2) Synthesis of Intermediate 14-2

Intermediate 14-2 was synthesized by substantially the same method as the synthesis of Intermediate 10-2 except for using Intermediate 14-1 instead of Intermediate 10-1 used in the synthesis of Intermediate 10-2 (yield: 73%).

3) Synthesis of Intermediate 14-3

Intermediate 14-3 was synthesized by substantially the same method as the synthesis of Intermediate 10-3 except for using Intermediate 14-2 instead of Intermediate 10-2 used in the synthesis of Intermediate 10-3 (yield: 29%).

4) Synthesis of Intermediate 14-4

Intermediate 14-4 was synthesized by substantially the same method as the synthesis of Intermediate 1-4 except for using Intermediate 14-3 instead of Intermediate 1-3 used in the synthesis of Intermediate 1-4 (yield: 40%).

5) Synthesis of Compound 14

Compound 14 was synthesized by substantially the same method as the synthesis of Intermediate 1-5 except for using Intermediate 14-4 instead of Intermediate 1-4 used in the synthesis of Intermediate 1-5 (yield: 11%).

(7) Synthesis of Compound 16

Compound 16 according to one or more embodiments may be synthesized, for example, by Reaction 7 below.

Reaction 7

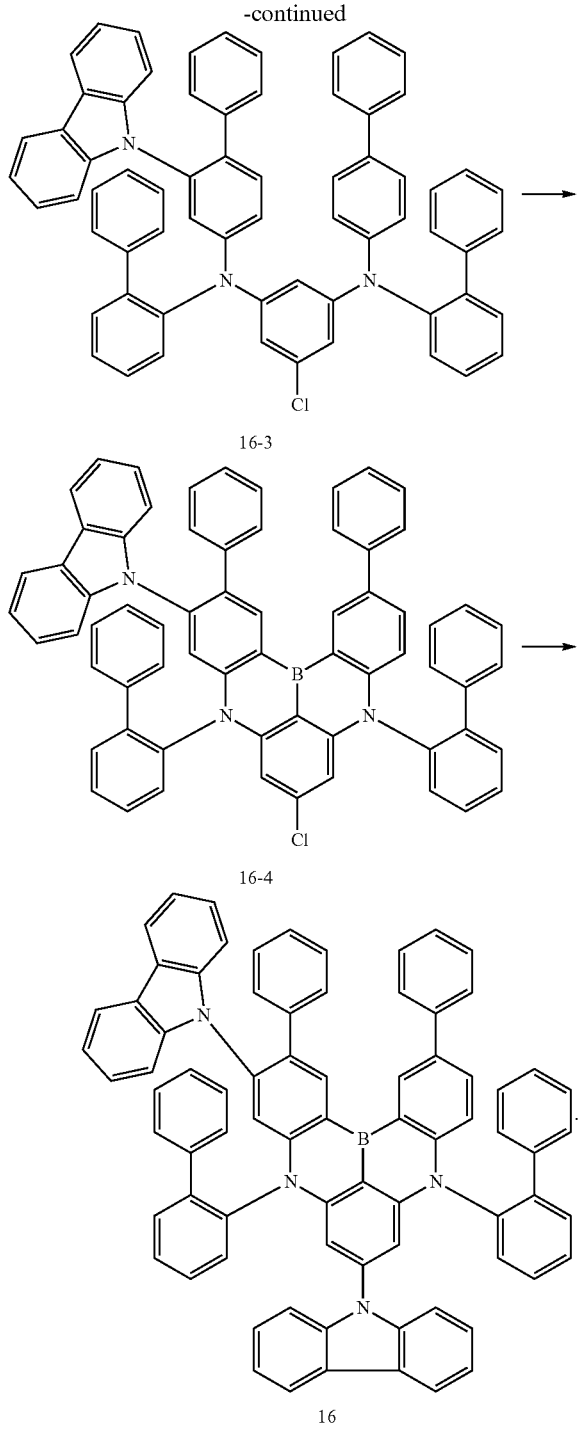

1) Synthesis of Intermediate 16-1

1,3-dibromo-5-chlorobenzene (1 eq), Intermediate 5-2 (1 eq), tris(dibenzylideneacetone)dipalladium(0) (0.03 eq), BINAP (0.1 eq), and sodium tert-butoxide (2 eq) were dissolved in toluene and stirred under a nitrogen atmosphere at about 100 degrees centigrade for about 12 hours. After cooling, the mixture thus stirred was washed with ethyl acetate and water three times, and an organic layer obtained was dried with magnesium sulfate and then, dried under a reduced pressure. A residue obtained by drying under a reduced pressure was separated and purified by column chromatography to obtain Intermediate 16-1 (yield: 60%).

2) Synthesis of Intermediate 16-2

Intermediate 16-1 (1 eq), N-([1,1'-biphenyl]-4-yl)-[1,1'-biphenyl]-2-amine (1 eq), tris(dibenzylideneacetone)dipalladium(0) (0.03 eq), tri-tert-butylphosphine (0.06 eq), and sodium tert-butoxide (2 eq) were dissolved in toluene and stirred under a nitrogen atmosphere at about 110 degrees centigrade for about 12 hours. After cooling, the mixture thus stirred was washed with ethyl acetate and water three times, and an organic layer obtained was dried with magnesium sulfate and then, dried under a reduced pressure. A residue obtained by drying under a reduced pressure was separated and purified by column chromatography to obtain Intermediate 16-2 (yield: 70%).

3) Synthesis of Intermediate 16-3

Intermediate 16-3 was synthesized by substantially the same method as the synthesis of Intermediate 1-4 except for using Intermediate 16-2 instead of Intermediate 1-3 used in the synthesis of Intermediate 1-4, and further adding carbazole (1.1 eq) (yield: 35%).

4) Synthesis of Intermediate 16-4

Intermediate 16-4 was synthesized by substantially the same method as the synthesis of Intermediate 1-5 except for using Intermediate 16-3 instead of Intermediate 1-4 used in the synthesis of Intermediate 1-5 (yield: 11%).

5) Synthesis of Compound 16

Compound 16 was synthesized by substantially the same method as the synthesis of Compound 1 except for using Intermediate 16-4 instead of Intermediate 1-5 used in the synthesis of Compound 1 (yield: 50%).

In Table 1 below, 1H NMR and MS/FAB of the compounds thus synthesized are shown. The synthetic methods of other compounds from the compounds shown in Table 1 may be easily recognized by persons skilled in this technical art referring to the synthetic methods and raw materials above.

TABLE 1

| Compound | H NMR (δ) | MS/FAB Calculated value | MS/FAB Measured value |
|---|---|---|---|
| 1 | 9.44-9.42 (2H, s), 8.55-8.50 (2H, m), 7.98-7.80 (2H, m), 7.71-7.62 (2H, m), 7.52-7.27 (42H, m), 7.24-7.07 (8H, m), 6.7-6.51 (2H, m) | 1222.32 | 1222.51 |
| 5 | 9.41-9.35 (2H, s), 8.68-8.51 (4H, m), 8.28-8.12 (4H, m), 8.01-7.81 (4H, m), 7.65-7.27 (38H, m), 7.24-7.09 (4H, m), 6.61-6.55(2H, m) | 1220.30 | 1220.47 |
| 8 | 9.40-9.35 (2H, s), 8.67-8.52 (4H, m), 8.32-8.25 (4H, m), 8.11-7.95 (4H, m), 7.71-7.27 (28H, m), 7.24-7.09 (4H, m), 6.61-6.55(2H, m), 1.78-1.54(18H, s) | 1180.32 | 1180.46 |
| 10 | 9.32-9.28 (2H, s), 8.61-8.58 (2H, m), 8.41-8.35 (2H, m), 8.15-8.11 (2H, m), 7.67-7.26 (30H, m), 7.24-7.05 (6H, m), 6.60-6.56(2H, m) | 979.99 | 980.01 |
| 12 | 9.48-9.43 (2H, s), 8.80-8.75 (2H, m), 8.58-8.50 (2H, m), 8.38-8.35 (2H, m), 7.84-7.26 (38H, m), 7.24-7.12 (5H, m), 7.01-6.95(2H, m) | 996.05 | 996.22 |
| 14 | 9.47-9.42 (2H, s), 8.67-8.61 (2H, m), 8.48-8.45 (2H, m), 8.30-8.25 (2H, m), 7.73-7.26 (30H, m), 7.24-7.11 (6H, m), 6.78-6.74(2H, m) | 1288.93 | 1289.21 |
| 16 | 9.38-9.34 (2H, s), 8.68-8.64 (2H, m), 8.28-8.24 (2H, m), 8.01-7.95 (2H, m), 7.64-7.27 (37H, m), 7.24-7.09 (4H, m), 6.59-6.55(2H, m) | 1055.10 | 1055.27 |

2. Manufacture and Evaluation of Light Emitting Element

Manufacture of Light Emitting Element

For the formation of a first electrode, an ITO glass substrate (15 Ω/cm², 1200 Å) of Corning Inc. was cut into a size of 50 mm×50 mm×0.7 mm, washed using isopropyl alcohol and pure water for about 5 minutes, respectively, washed by exposing to ultrasonic waves for about 30 minutes and ozone, and then this glass substrate was installed in a vacuum deposition apparatus.

On the first electrode thus formed, NPD was vacuum deposited to a thickness of about 300 Å to form a hole injection layer, and on the hole injection layer, H-1-1 was vacuum deposited to a thickness of about 200 Å to form a hole transport layer. On the hole transport layer thus formed, a hole transport compound CzSi was vacuum deposited to a thickness of about 100 Å to form an emission auxiliary layer. On the emission auxiliary layer thus formed, mCP and the Example Compound, or mCP and the Comparative Compound, were co-deposited in a weight ratio of 99:1 to form an emission layer with a thickness of about 200 Å.

Then, on the emission layer, TSPO1 was formed into a thickness of about 200 Å, and TBPI was deposited to a thickness of about 300 Å to form an electron transport layer. On the electron transport layer thus formed, alkali metal halide LiF was deposited to a thickness of about 10 Å, and aluminum (Al) was vacuum deposited to a thickness of about 3000 Å to form a second electrode and to manufacture a light emitting device.

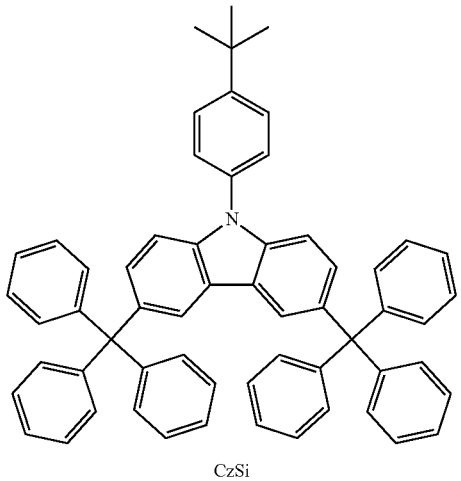

CzSi

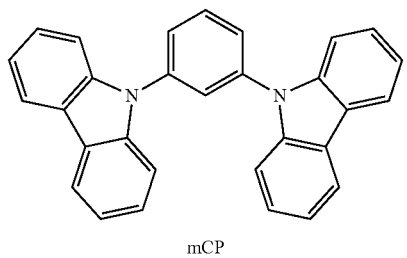

mCP

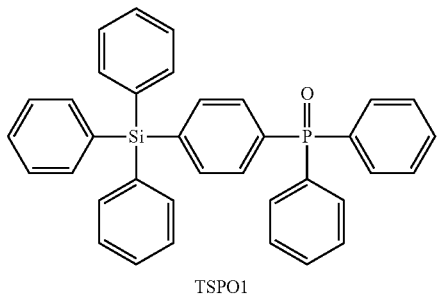

TSPO1

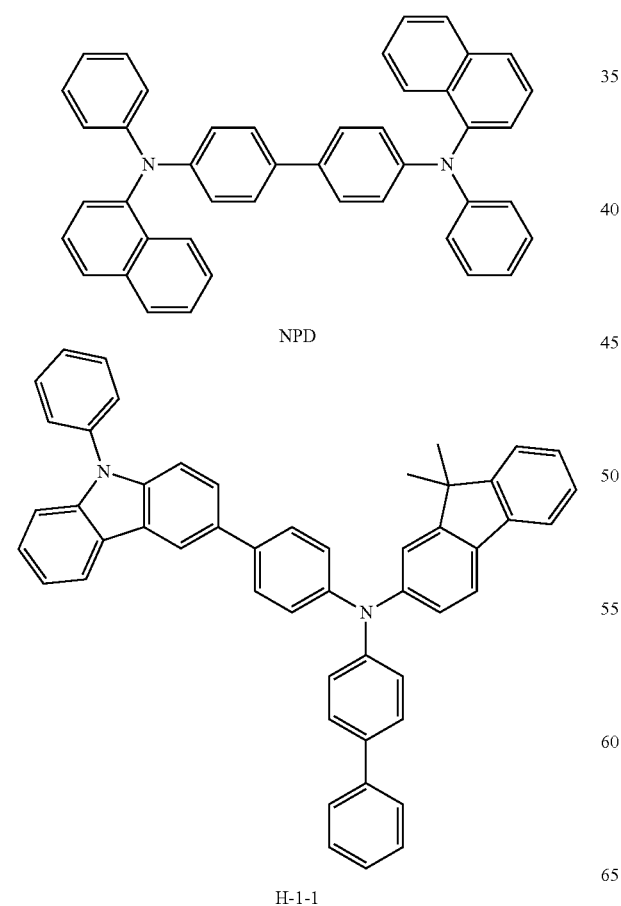

NPD

H-1-1

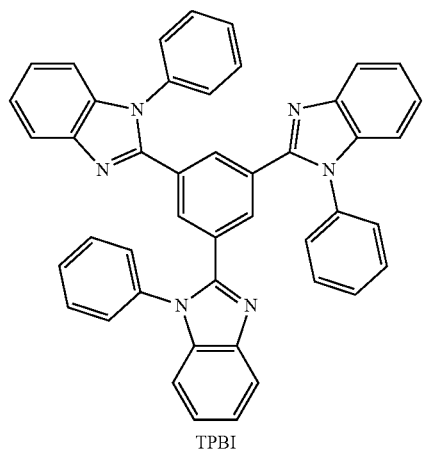

TPBI

-continued

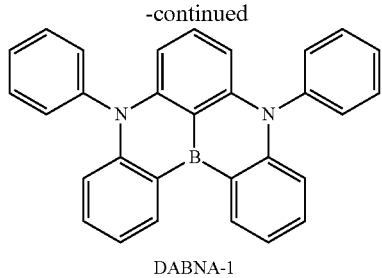

DABNA-1

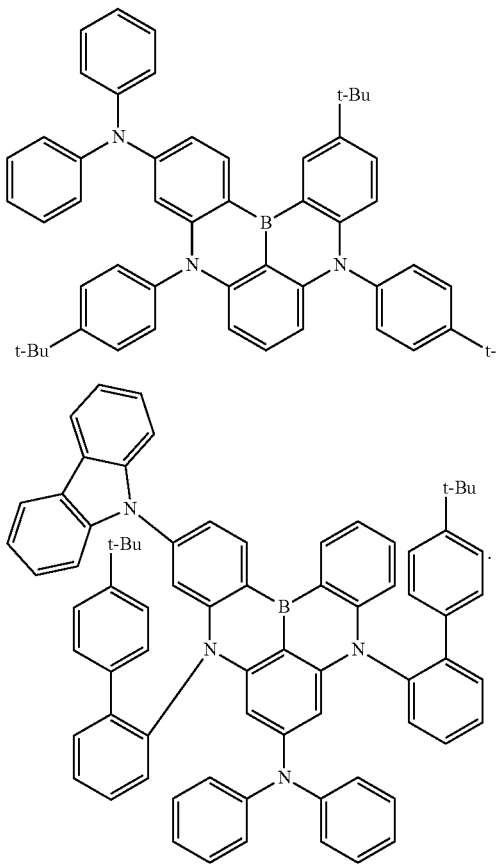

X-1

X-2

Evaluation of Properties of Light Emitting Element

In Table 2, the evaluation results of the light emitting elements of the Examples and Comparative Examples are shown. In Table 2, driving voltage (V), emission efficiency (Cd/A), maximum external quantum efficiency (%), and emission color in the light emitting elements thus manufactured are compared and shown.

TABLE 2

| | Hole transport layer material | Dopant in emission layer | Driving voltage (V) | Emission efficiency (Cd/A) | Maximum external quantum efficiency (%) | Emission color |
|---|---|---|---|---|---|---|
| Example 1 | H-1-1 | Compound 1 | 4.5 | 23.2 | 22.9 | Blue |
| Example 2 | H-1-1 | Compound 5 | 4.6 | 25.4 | 24.9 | Blue |
| Example 3 | H-1-1 | Compound 8 | 4.3 | 22.5 | 22.3 | Blue |
| Example 4 | H-1-1 | Compound 10 | 4.5 | 21.7 | 21.6 | Blue |
| Example 5 | H-1-1 | Compound 12 | 4.8 | 25.7 | 24.8 | Blue |
| Example 6 | H-1-1 | Compound 14 | 4.8 | 22.2 | 22.7 | Blue |
| Example 7 | H-1-1 | Compound 16 | 4.2 | 22.9 | 22.1 | Blue |
| Comparative Example 1 | H-1-1 | DABNA-1 | 5.7 | 15.6 | 16.1 | Blue |
| Comparative Example 2 | H-1-1 | Compound X-1 | 5.1 | 20.1 | 21.7 | Blue |
| Comparative Example 3 | H-1-1 | Compound X-2 | 5.6 | 20.5 | 20.9 | Blue |
| Comparative Example 4 | NPD | Compound 1 | 4.8 | 22.8 | 23.1 | Blue |
| Comparative Example 5 | NPD | Compound 5 | 5.0 | 24.1 | 23.2 | Blue |
| Comparative Example 6 | NPD | Compound 8 | 5.1 | 20.1 | 19.8 | Blue |

Referring to the results of Table 2, it could be found that the Examples of the light emitting elements using the polycyclic compounds of one or more embodiments of the present disclosure as the dopant materials of emission layers, each showed a low driving voltage, high emission efficiency, and excellent maximum external quantum efficiency.

Referring to Table 2, the elements of Examples 1 to 7, including Compounds 1, 5, 8, 10, 12, 14, and 16 each showed lower driving voltage, higher emission efficiency, and better maximum external quantum efficiency than the elements of Comparative Examples 1 to 3, including DABNA-1, Compound X-1 and Compound X-2.

Compared to DABNA-1, the Example Compounds each have a molecular structure in which at least one carbazole group is bonded to a para position to boron in the core of a DABNA structure, and at least one phenyl group or t-butyl group is substituted at a meta position to boron, and accordingly, electron density in the core may be increased. Due to the high electron density, the Example Compounds have improved multi resonance effects when compared to the Comparative Example (DABNA-1), and as a result, it is believed that the light emitting elements including the Example Compounds each showed lower driving voltage, higher emission efficiency, and better maximum external quantum efficiency than the light emitting element of Comparative Example 1.

In Compound X-1, a diphenyl amine group is substituted at a para position to the boron atom of the core of a DABNA structure, and one t-butyl group is substituted at a meta position to the boron atom. In Compound X-2, one carbazole group is substituted at a para position to the boron atom of the core of a DABNA structure, and no bulky substituent is substituted at a meta position to the boron atom of the DABNA structure. In the Example Compounds, at least one carbazole group is substituted at a para position to the boron atom of the core of a DABNA structure, and two substituted phenyl groups, or two t-butyl groups are substituted at meta positions to the boron atom. Different from Compound X-1 and Compound X-2, the Example Compounds are different in that two substituents having great steric hindrance are substituted at meta positions to the boron. As a result, it is believed that the Example Compounds have better effects of protecting the boron atom of the core of the DABNA structure than Compound X-1. Accordingly, it is believed that the light emitting elements including the Example Compounds each showed lower driving voltage, higher emission efficiency, and better maximum external quantum efficiency than the light emitting element including Compound X-1.

In addition, referring to Table 2, it could be found that the elements of Examples 1 to 7, including Compounds 1, 5, 8, 10, 12, 14 and 16, and including H-1-1 in a hole transport layer, each showed lower driving voltage, higher emission efficiency, and better maximum external quantum efficiency than the elements of Comparative Examples 4 to 6, each including NPD in a hole transport layer. It is believed, therefore, that although Compounds 1, 5, 8, 10, 12, 14 and 16 were included as the dopant materials of emission layers in Comparative Examples 4 to 6, the light emitting element using H-1-1 as the material of a hole transport layer showed better emission efficiency than the light emitting element using NPD.

As such, Examples 1 to 7 each showed improved results of all of the driving voltage, emission efficiency, and quantum efficiency when compared to Comparative Examples 1 to 6. For example, the driving voltage, emission efficiency, and quantum efficiency may be improved simultaneously (or concurrently) for the light emitting element of one or more embodiments, including the polycyclic compound of one or more embodiments having a structure in which at least one carbazole group is included at a para position to the boron atom of the core of the DABNA structure, and a substituent having great steric hindrance is included at a meta position to the boron atom.

In one or more embodiments, by including a polycyclic compound of a DABNA structure in which at least one heteroaryl group is substituted at a para position to boron, and two bulky substituents are substituted at meta positions to the boron, high electron density may be induced in a core, multi resonance may be promoted, and a light emitting element having improved emission efficiency may be provided.

The light emitting element of one or more embodiments includes the polycyclic compound of one or more embodiments in an emission layer and may show high efficiency.

Although the embodiments of the present disclosure have been described, it is understood that the present disclosure should not be limited to these embodiments, but various changes and modifications can be made by one ordinary skilled in the art within the spirit and scope of the present disclosure as hereinafter claimed by the following claims and their equivalents.

What is claimed is:

1. A light emitting element, comprising:
   a first electrode;
   a second electrode on the first electrode; and
   an emission layer between the first electrode and the second electrode, the emission layer comprising a polycyclic compound represented by Formula 1,
   wherein the first electrode and the second electrode each independently comprise at least one selected from among Ag, Mg, Cu, Al, Pt, Pd, Au, Ni, Nd, Ir, Cr, Li, Ca, LiF, Mo, Ti, W, In, Sn, Zn, compounds thereof, mixtures thereof, and oxides thereof:

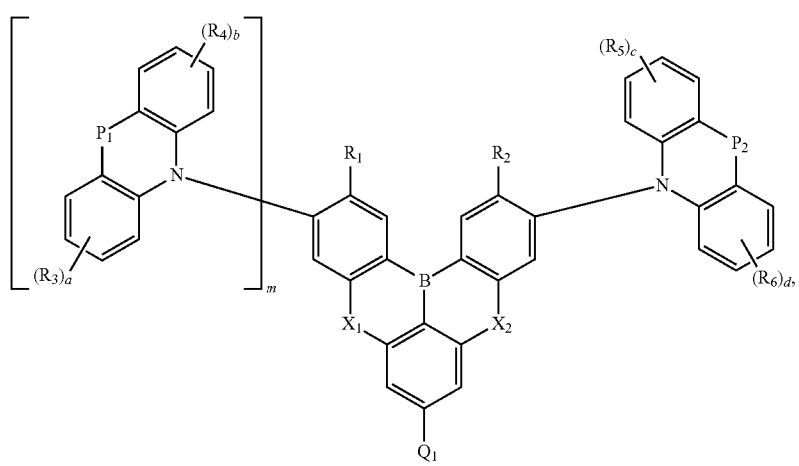

Formula 1 in Formula 1,
"a" to "d" are each independently an integer of 0 to 4,
"m" is 0 or 1,
$X_1$ and $X_2$ are each independently O, S, Se, or NRa,
$P_1$ and $P_2$ are each independently a direct linkage, O, S, Se, NRb, or CRcRd,
at least one selected from among $R_1$ and $R_2$ is a substituted or unsubstituted phenyl group, or a substituted or unsubstituted t-butyl group, and remainder of $R_1$ and $R_2$ is a substituted or unsubstituted alkyl group of 1 to 6 carbon atoms, a substituted or unsubstituted aryl group of 6 to 20 ring-forming carbon atoms, or a substituted or unsubstituted heteroaryl group of 2 to 15 ring-forming carbon atoms,
$R_3$ to $R_6$ and Ra to Rd are each independently a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring, and $Q_1$ is a hydrogen atom, a deuterium atom, a substituted or unsubstituted amine group, a substituted or unsubstituted oxy group, a substituted or unsubstituted alkyl group of 1 to 6 carbon atoms, or a substituted or unsubstituted alkenyl group of 2 to 6 ring-forming carbon atoms, and/or combined with an adjacent group to form a ring.

2. The light emitting element of claim 1, wherein Formula 1 is represented by Formula 2-1 or Formula 2-2:

in Formula 2-1, "a", "b", $P_1$, $R_1$ to $R_4$, $X_1$, $X_2$, and $Q_1$ are the same as defined in Formula 1, and in Formula 2-2, "a" to "d", $P_1$, $P_2$, $R_1$ to $R_6$, $X_1$, $X_2$, and $Q_1$ are the same as defined in Formula 1.

3. The light emitting element of claim 2, wherein Formula 2-2 is represented by any one selected from among Formula 2A-1 to Formula 2A-6:

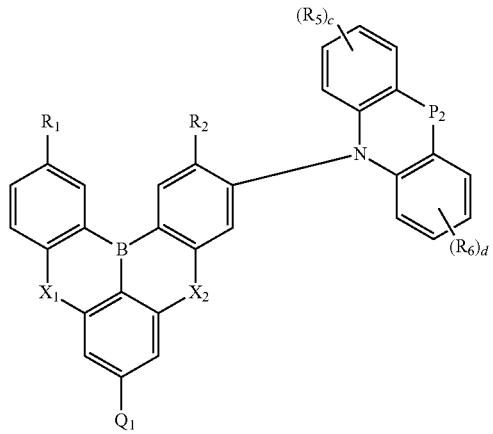

Formula 2-1

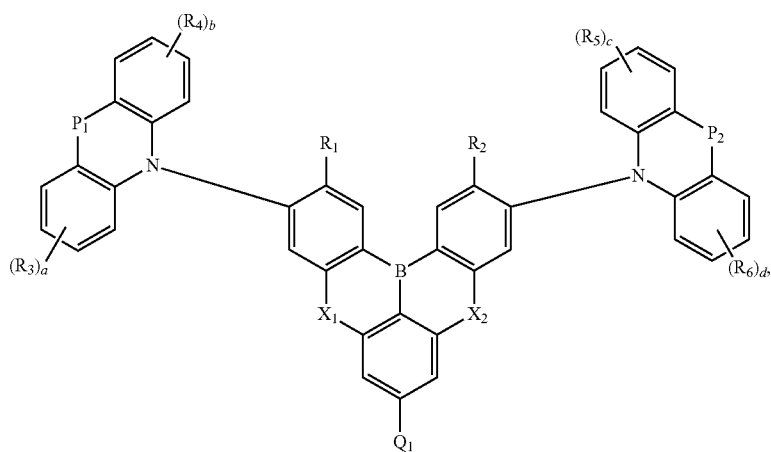

Formula 2-2

Formula 2A-1
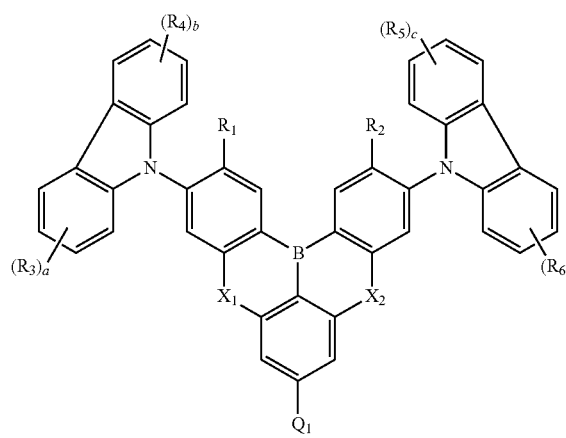
Formula 2A-2
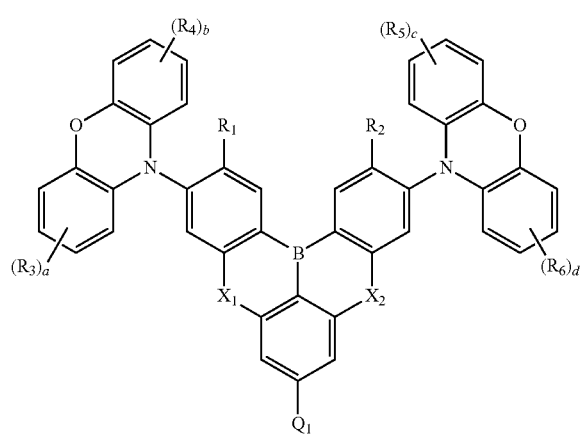
Formula 2A-3
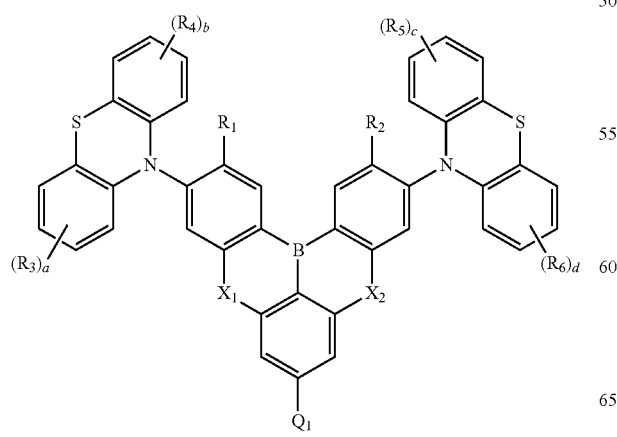
Formula 2A-4
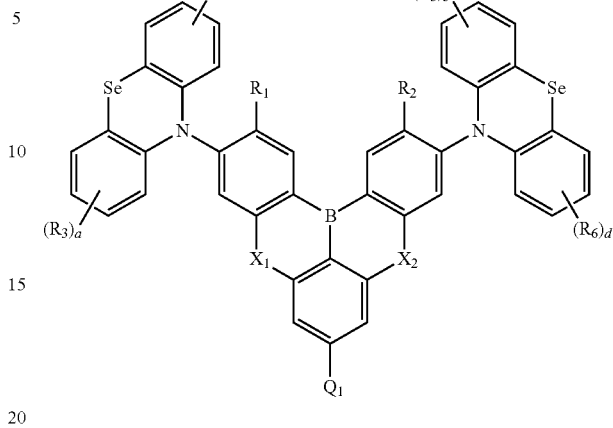
Formula 2A-5
Formula 2A-6
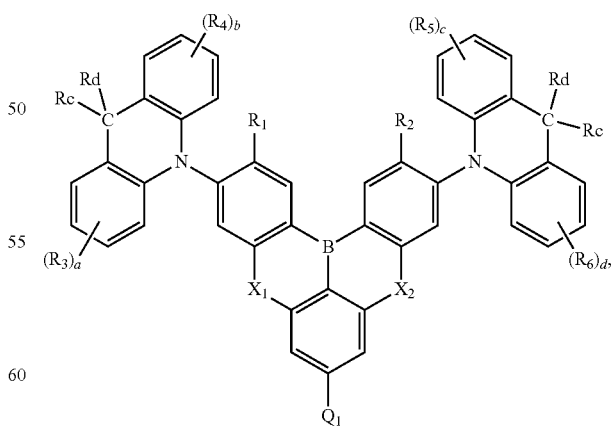
and
in Formulae 2A-1 to 2A-6, "a" to "d", $R_1$ to $R_6$, $X_1$, $X_2$, Rb to Rd, and $Q_1$ are the same as defined in Formula 1.

4. The light emitting element of claim 2, wherein Formula 2-2 is represented by any one selected from among Formula 2B-1 to Formula 2B-15:
Formula 2B-1
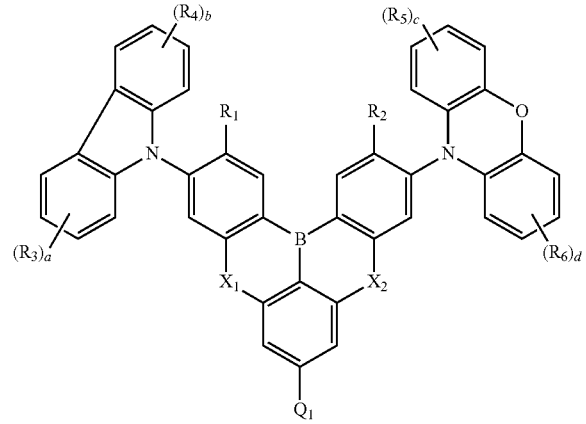
Formula 2B-2
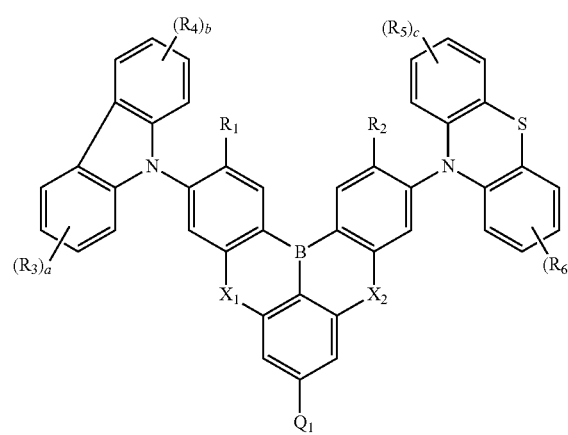
Formula 2B-3
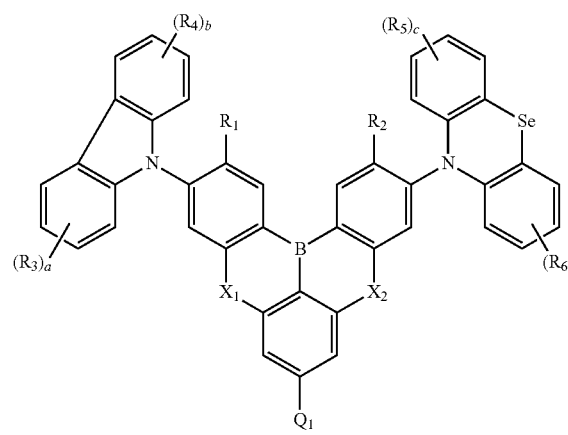
Formula 2B-4
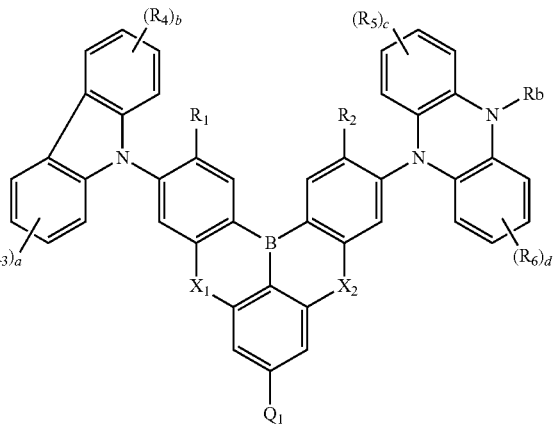
Formula 2B-5
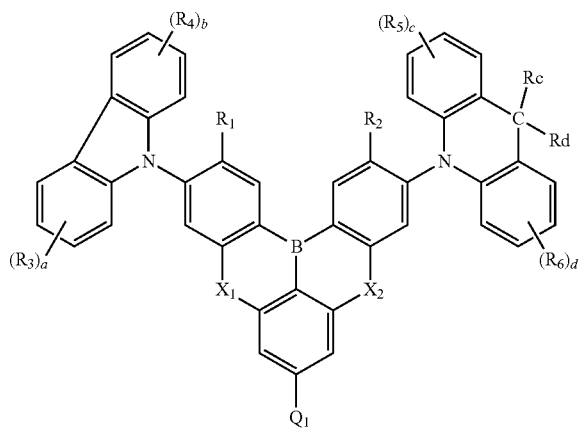
Formula 2B-6
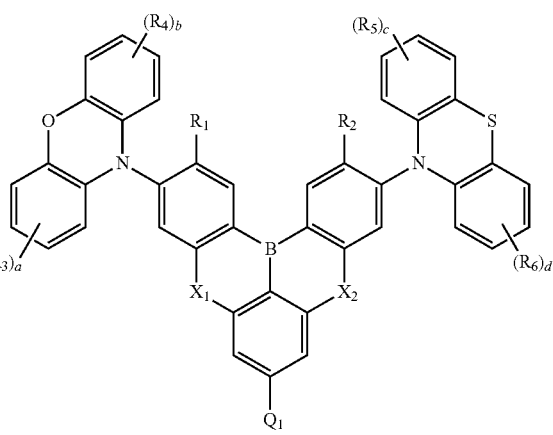

Formula 2B-7
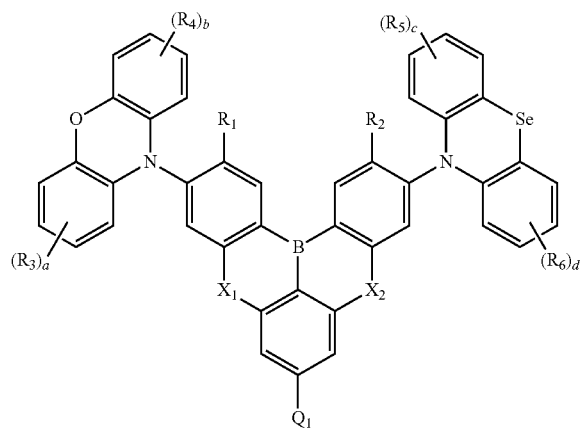
Formula 2B-8
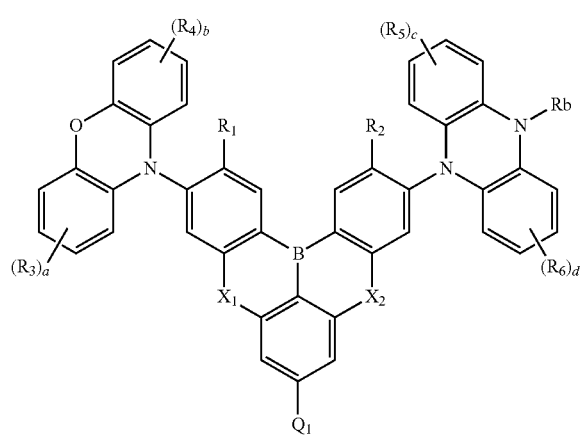
Formula 2B-9
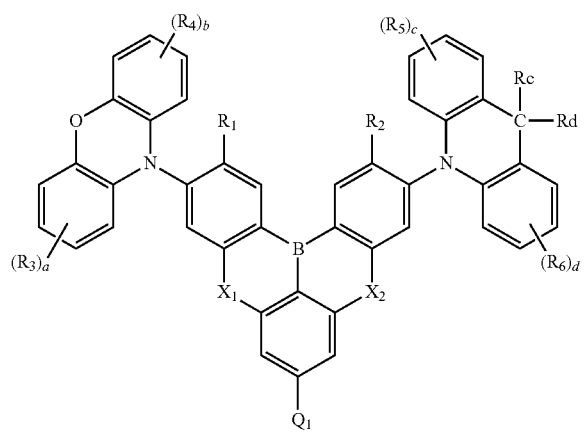
Formula 2B-10
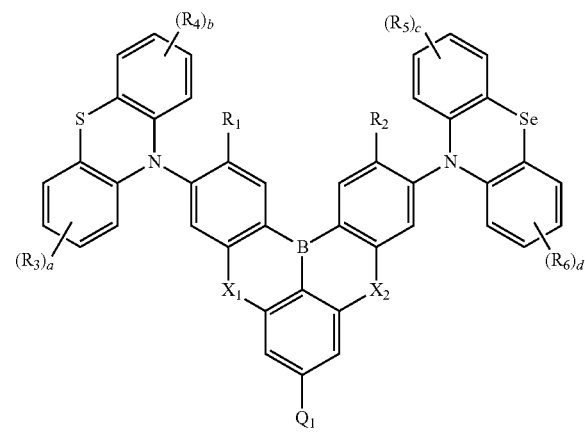
Formula 2B-11
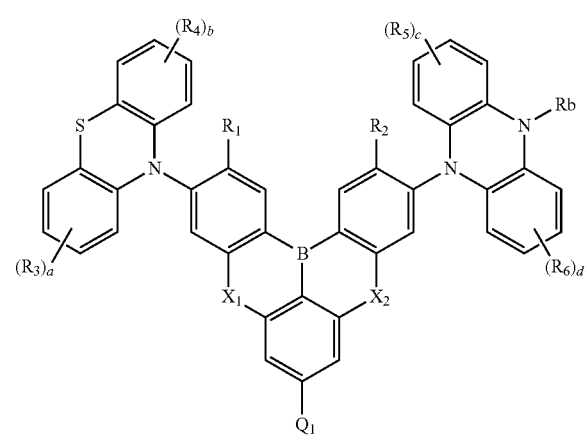
Formula 2B-12
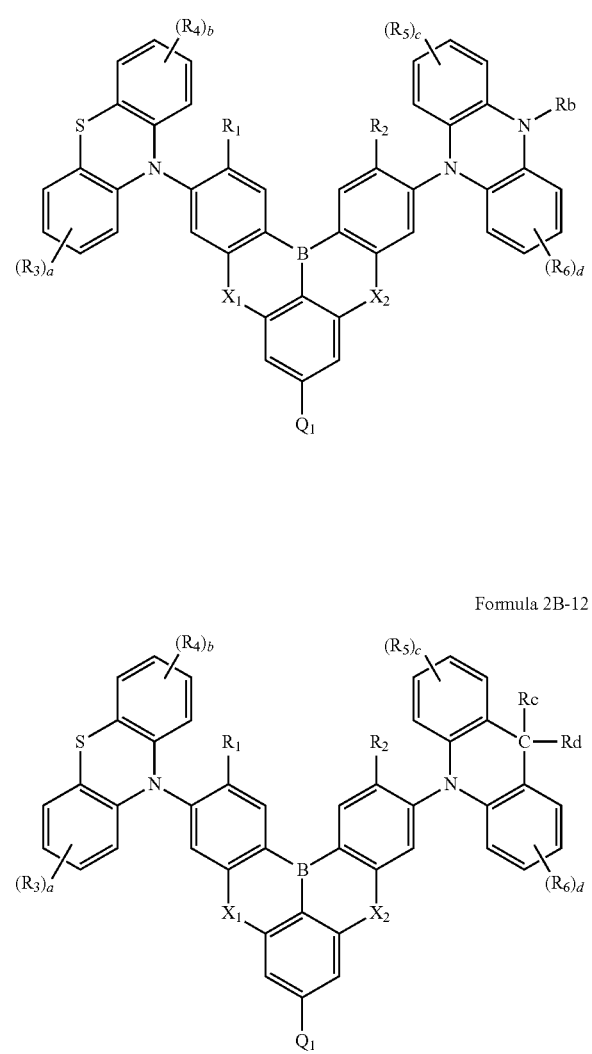

Formula 2B-13
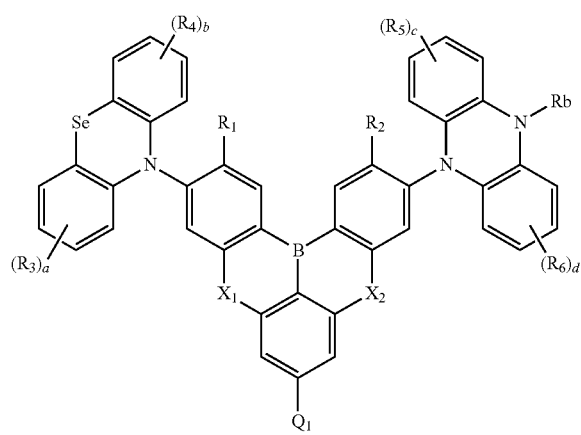
Formula 2B-14
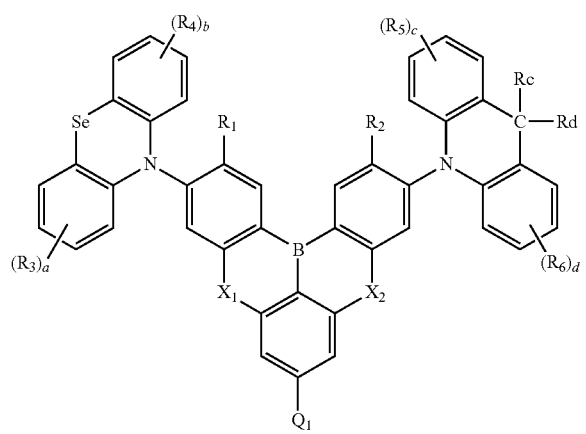
Formula 2B-15
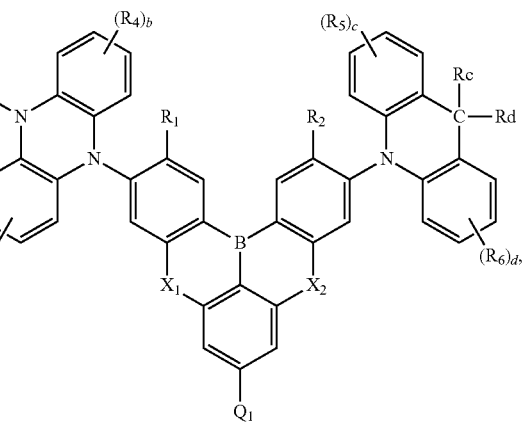
and
in Formulae 2B-1 to 2B-15, "a" to "d", $R_1$ to $R_6$, $X_1$, $X_2$, $Q_1$, and Rb to Rd are the same as defined in Formula 1.
5. The light emitting element of claim 2, wherein Formula 1 is represented by Formula 3-1 to Formula 3-4:
Formula 3-1
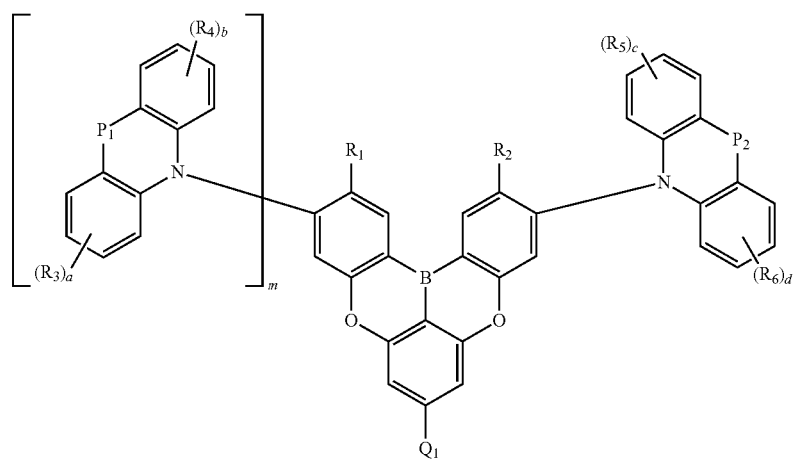

-continued

Formula 3-2

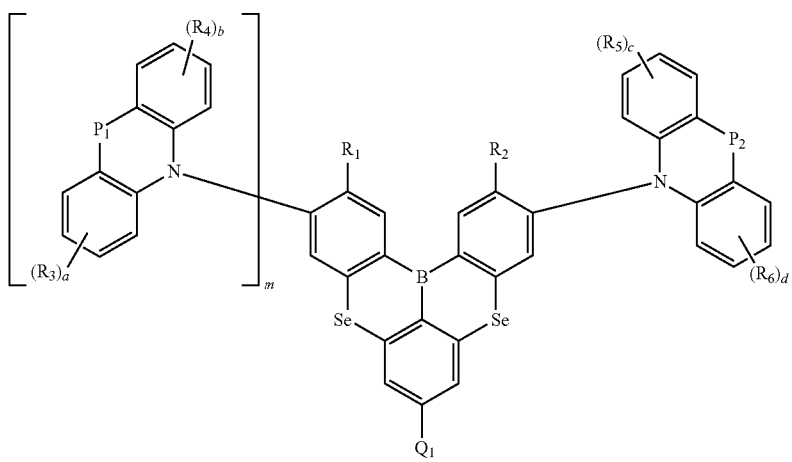

Formula 3-3

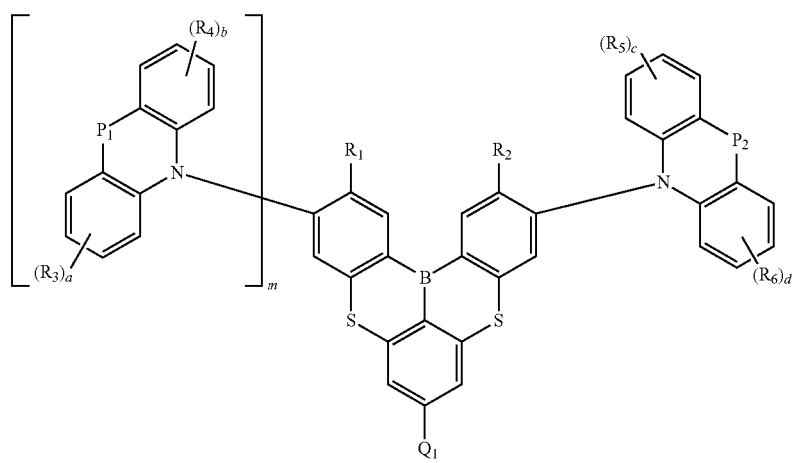

Formula 3-4

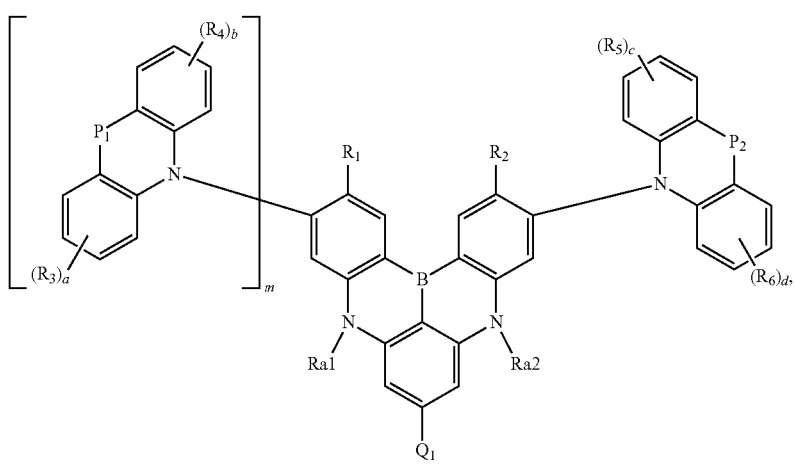

in Formula 3-4, Ra1 and Ra2 are a hydrogen atom, a deuterium atom, a cyano group, a substituted or unsubstituted alkyl group of 1 to 6 carbon atoms, a substituted or unsubstituted aryl group of 6 to 20 ring-forming carbon atoms, a substituted or unsubstituted alkenyl group of 2 to 6 carbon atoms, a substituted or unsubstituted heteroaryl group of 2 to 15 ring-forming carbon atoms, or a substituted or unsubstituted amine group, and/or combined with an adjacent group to form a ring, and in Formula 3-1 to Formula 3-4, "a" to "d", "m", $P_1$, $P_2$, $R_1$ to $R_6$, and $Q_1$ are the same as defined in Formula 1.

6. The light emitting element of claim 1, wherein Formula 1 is represented by any one selected from among Formula 4-1 to Formula 4-6:
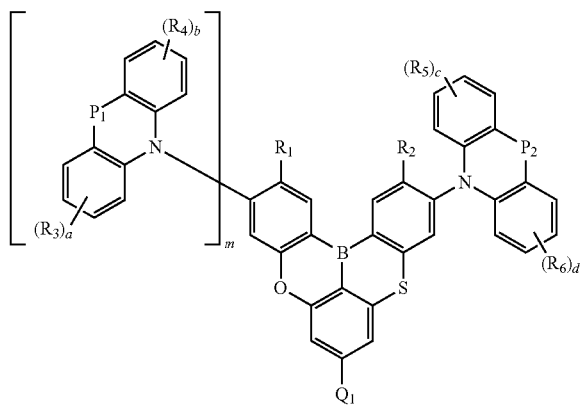
Formula 4-1
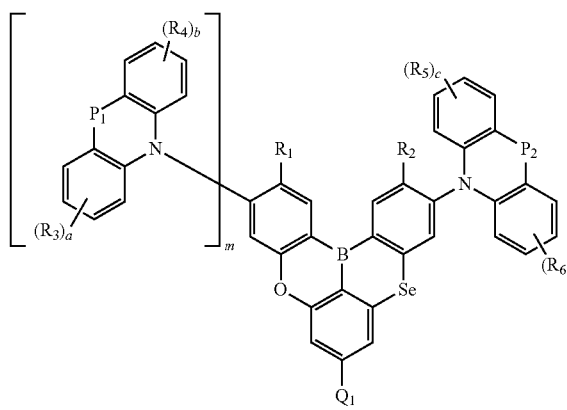
Formula 4-2
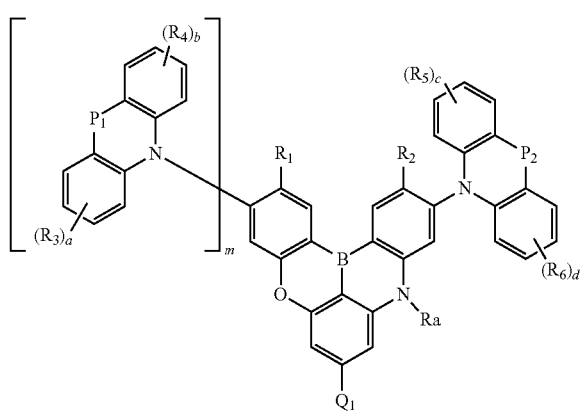
Formula 4-3
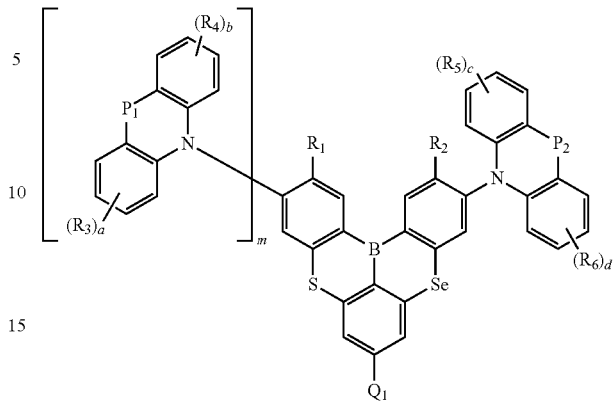
Formula 4-4
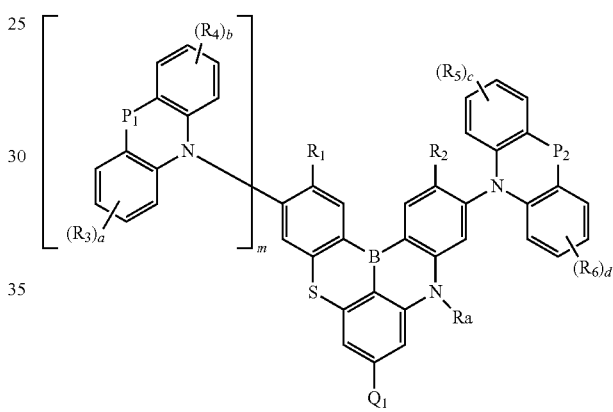
Formula 4-5
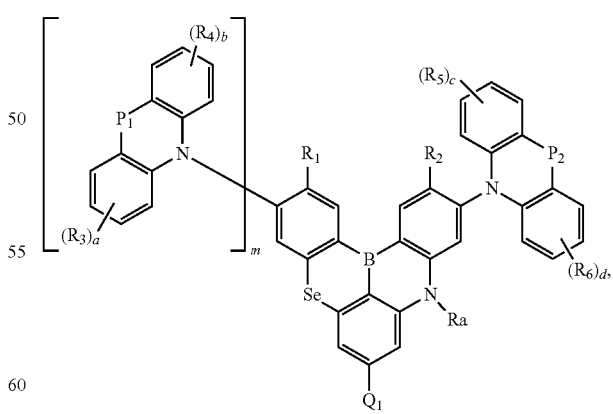
Formula 4-6
and
in Formula 4-1 to Formula 4-6, "a" to "d", "m", $P_1$, $P_2$, $R_1$ to $R_6$, $Q_1$, and Ra are the same as defined in Formula 1.

7. The light emitting element of claim 1, wherein Formula 1 is represented by any one selected from among Formula 5-1 to Formula 5-4:

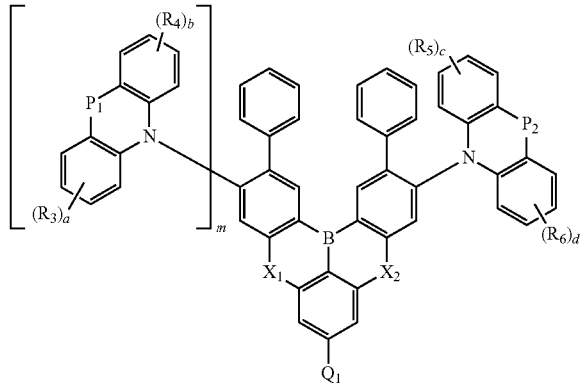

Formula 5-1

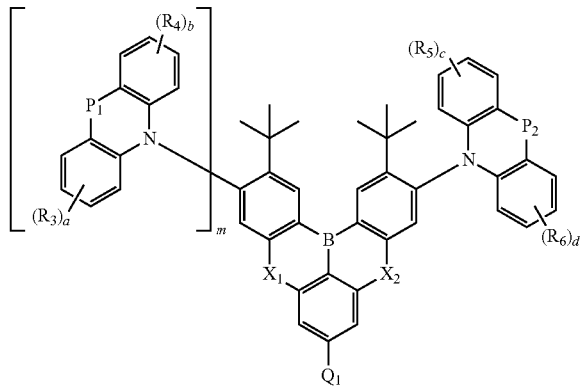

Formula 5-2

Formula 5-3

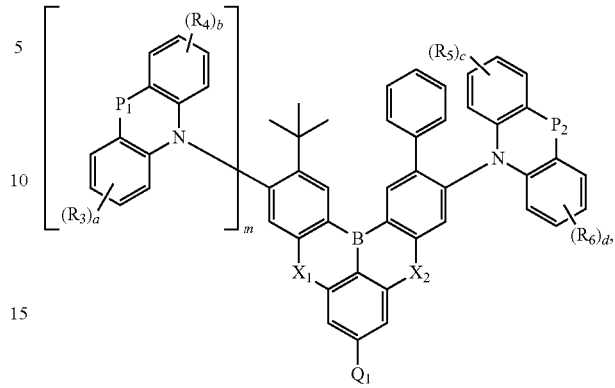

Formula 5-4 and in Formula 5-1 to Formula 5-4, "a" to "d", "m", $P_1$, $P_2$, $R_3$ to $R_6$, $X_1$, $X_2$, and $Q_1$ are the same as defined in Formula 1.

8. The light emitting element of claim 1, wherein Formula 1 is represented by any one selected from among Formula 6-1 to Formula 6-6:

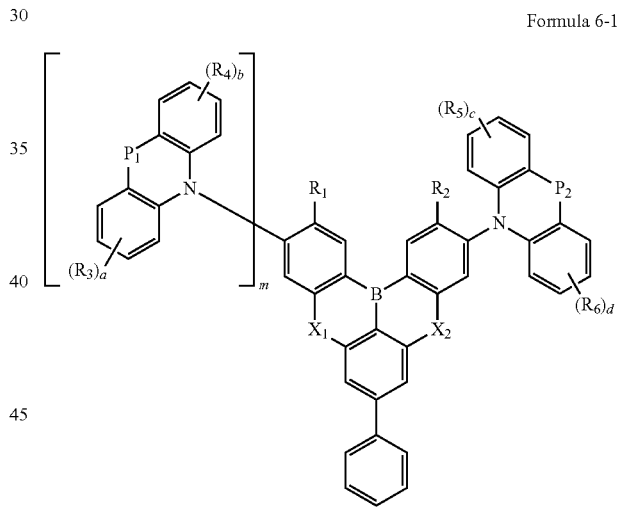

Formula 6-1

Formula 6-2

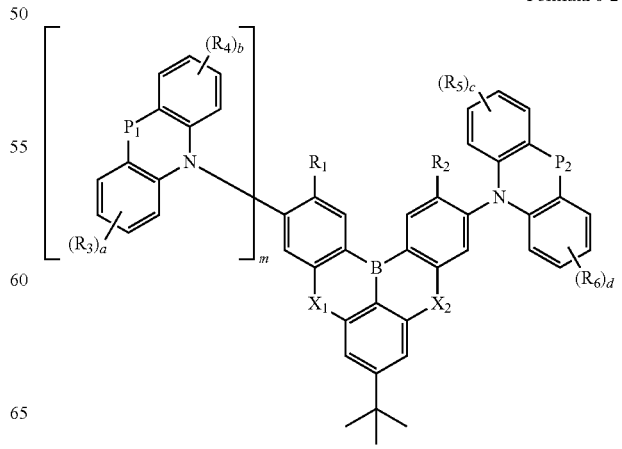

Formula 6-3

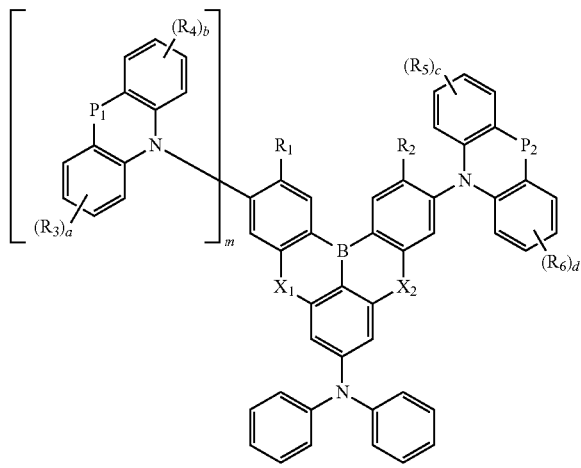

Formula 6-4

Formula 6-5

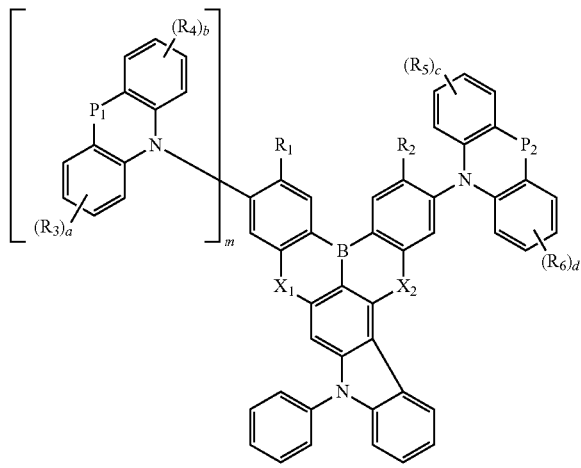

Formula 6-6

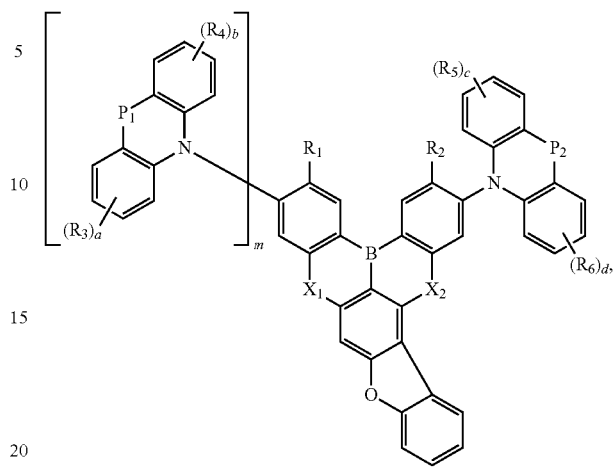

and in Formula 6-1 to Formula 6-6, "a" to "d", "m", $P_1$, $P_2$, $R_1$ to $R_6$, $X_1$, and $X_2$ are the same as defined in Formula 1.

9. The light emitting element of claim 1, wherein, in Formula 1, at least one selected from among $X_1$ and $X_2$ is NRa, and Ra is an unsubstituted biphenyl group, or an unsubstituted terphenyl group.

10. The light emitting element of claim 1, wherein the polycyclic compound is represented by any one selected from among polycyclic compounds in the following Compound Group 1:

Compound Group 1

2
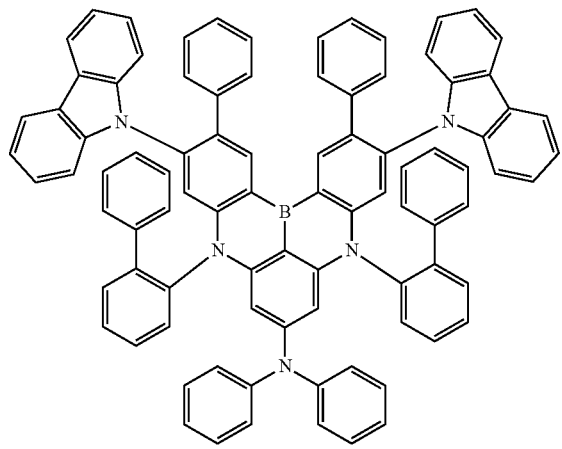
3
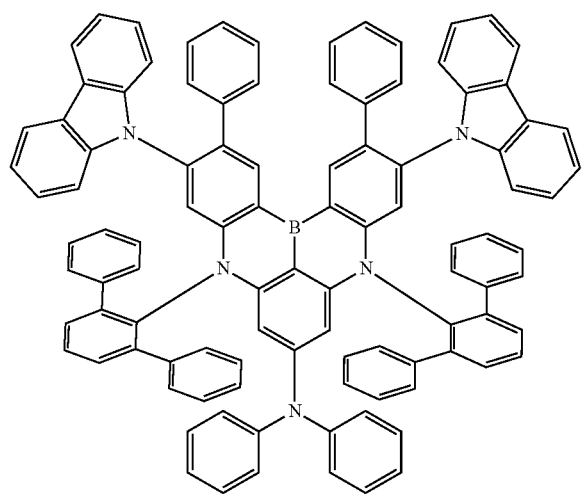
4
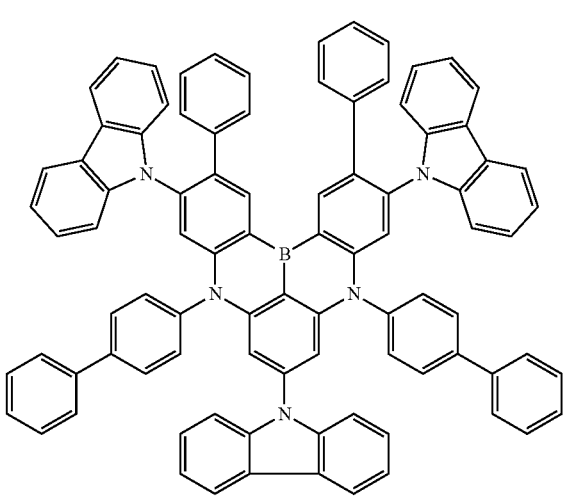
5
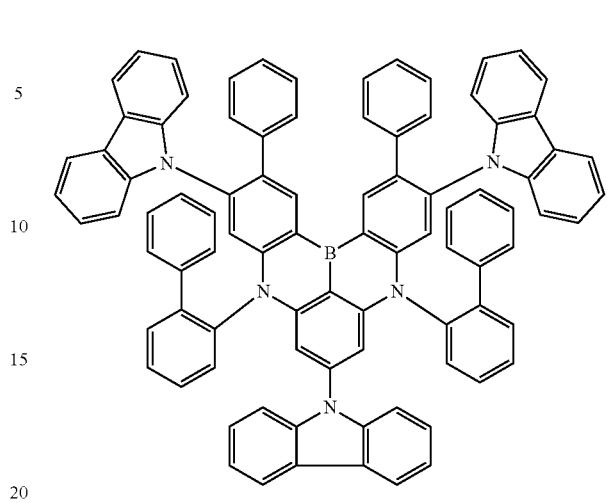
6
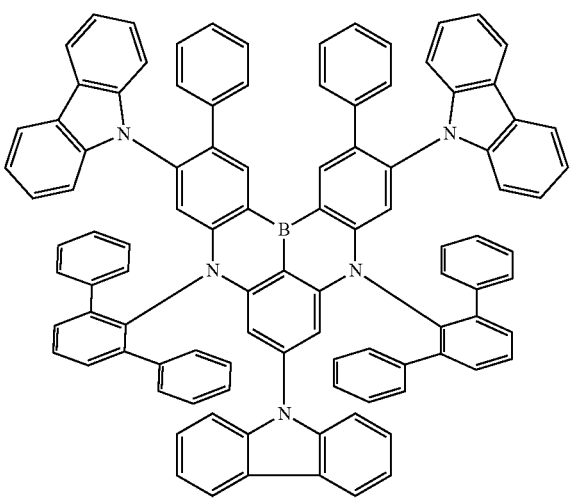
7

8
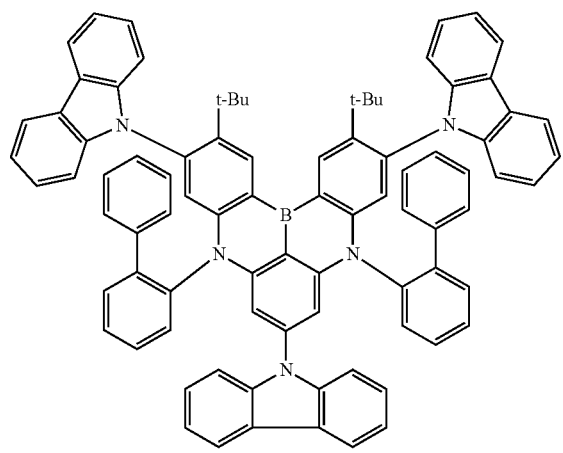
9
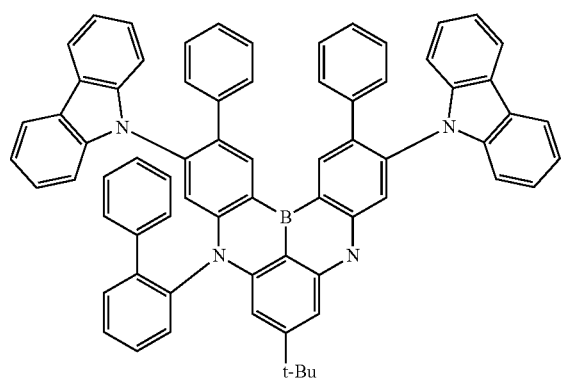
10
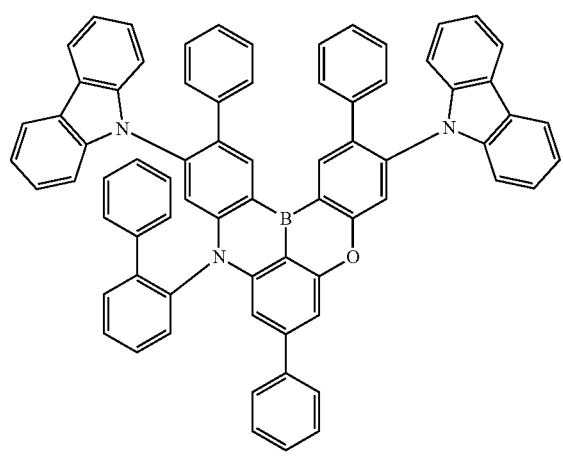
11
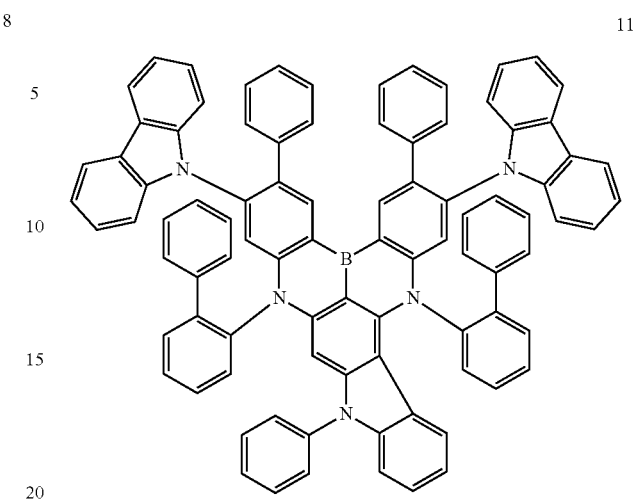
12
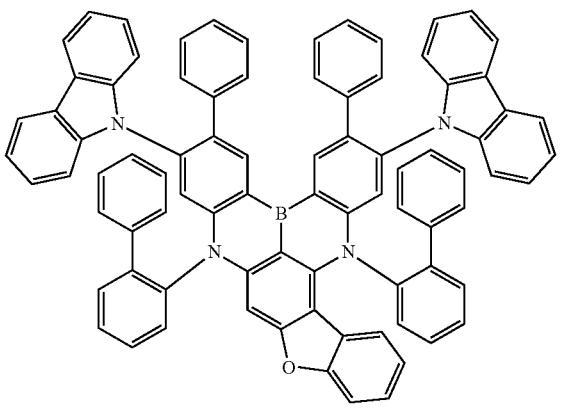
13
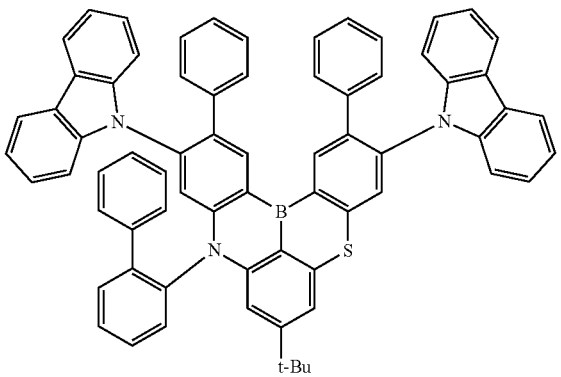

173
-continued
14
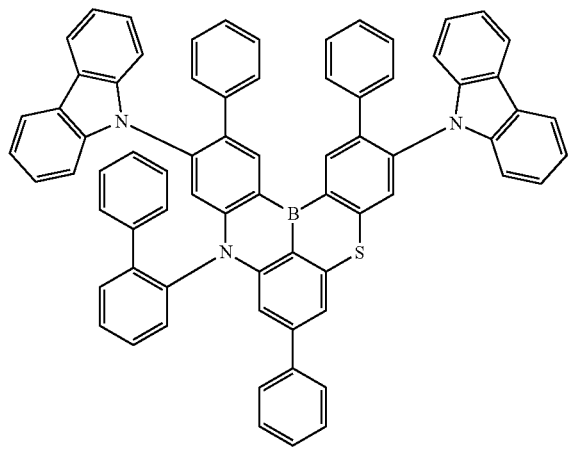
15
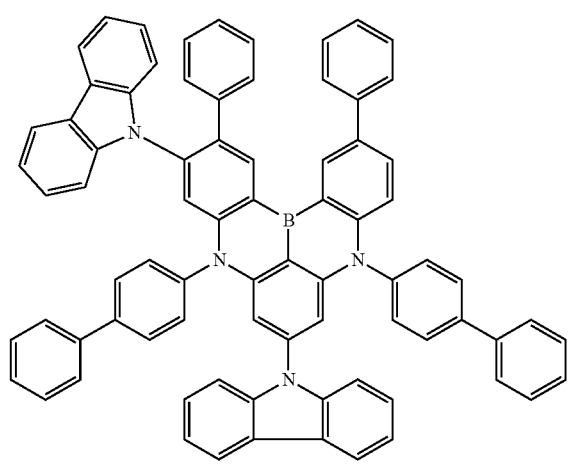
16
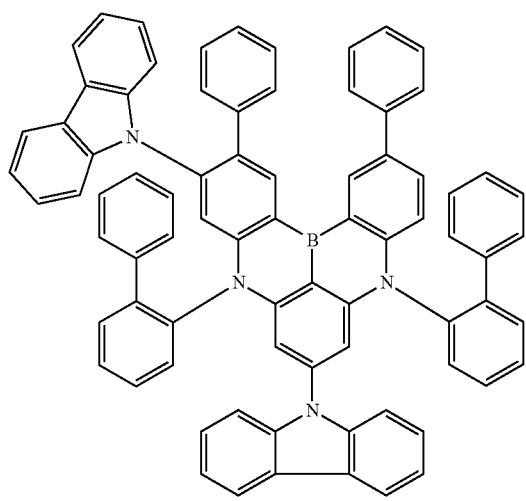
174
-continued
17
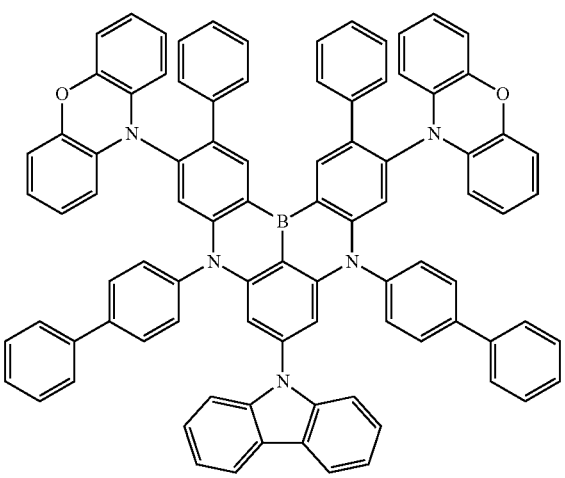
18
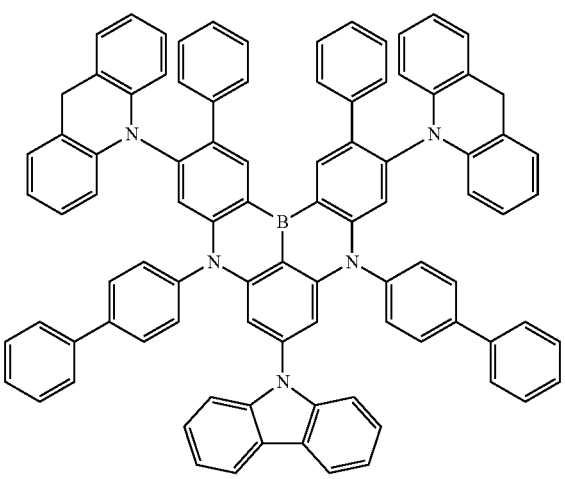
19
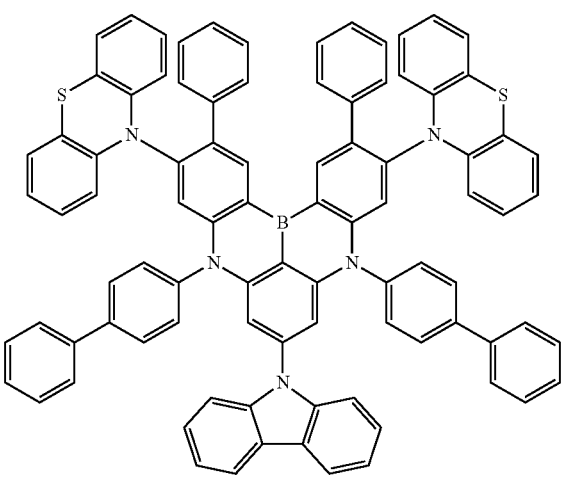

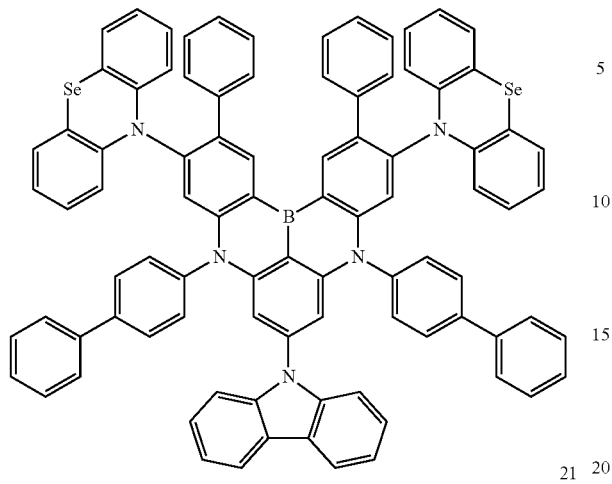

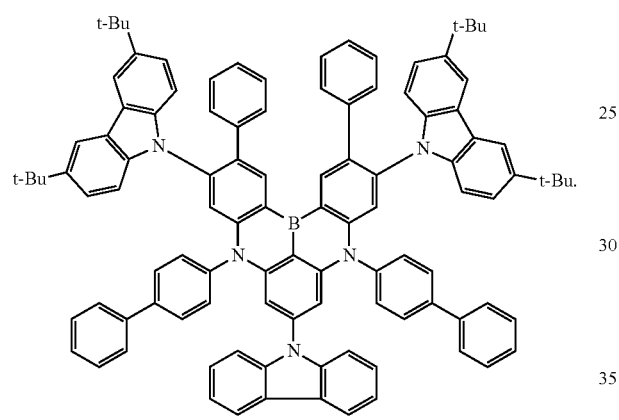

11. A light emitting element, comprising:
a first electrode;
a second electrode on the first electrode;
an emission layer between the first electrode and the second electrode, the emission layer comprising a polycyclic compound represented by Formula 1; and
a hole transport region between the first electrode and the emission layer, the hole transport region comprising the following Compound H-1-1:

Compound H-1-1

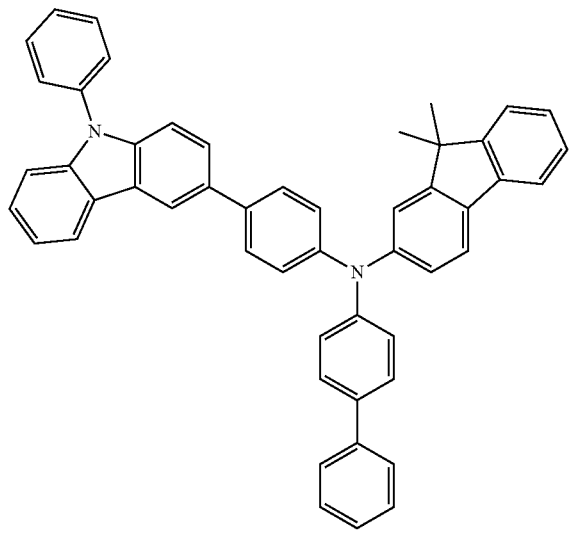

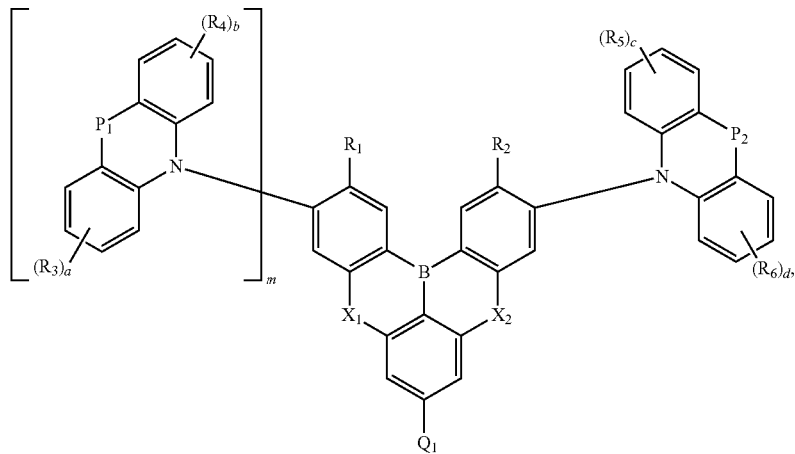

Formula 1 in Formula 1,
"a" to "d" are each independently an integer of 0 to 4,
"m" is 0 or 1,
$X_1$ and $X_2$ are each independently O, S, Se, or NRa,
$P_1$ and $P_2$ are each independently a direct linkage, O, S, Se, NRb, or CRcRd,
$R_1$ and $R_2$ are each independently a substituted or unsubstituted phenyl group, or a substituted or unsubstituted t-butyl group,
$R_3$ to $R_6$ and Ra to Rd are each independently a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring, and
$Q_1$ is a hydrogen atom, a deuterium atom, a substituted or unsubstituted amine group, a substituted or unsubstituted oxy group, a substituted or unsubstituted alkyl group of 1 to 6 carbon atoms, or a substituted or unsubstituted alkenyl group of 2 to 6 ring-forming carbon atoms, and/or combined with an adjacent group to form a ring.

12. The light emitting element of claim 11, wherein the hole transport region comprises:
a hole injection layer on the first electrode; and
a hole transport layer between the hole injection layer and the emission layer, the hole transport layer comprising Compound H-1-1.

13. The light emitting element of claim 11, wherein the emission layer is to emit blue light.

14. The light emitting element of claim 11, wherein the emission layer is to emit thermally activated delayed fluorescence.

15. The light emitting element of claim 11, wherein the emission layer comprises a dopant and a host, and the dopant comprises the polycyclic compound.

16. The light emitting element of claim 11, wherein the polycyclic compound is represented by any one selected from among polycyclic compounds in Compound Group 1:

Compound Group 1

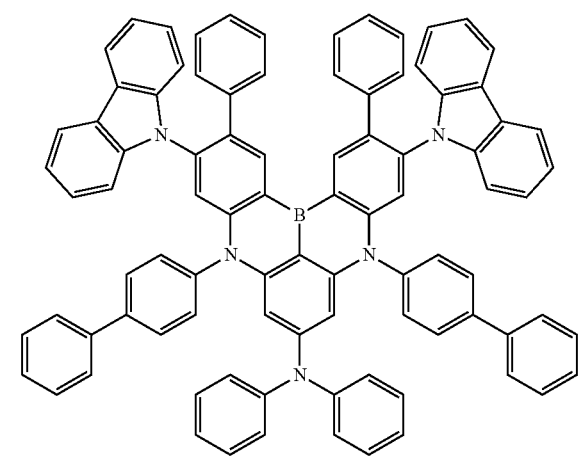

1

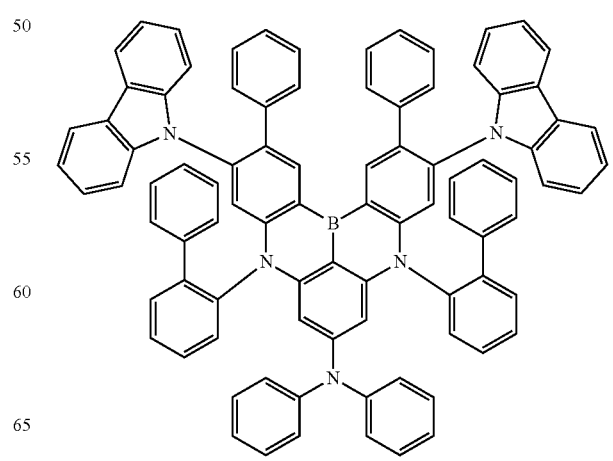

2

3
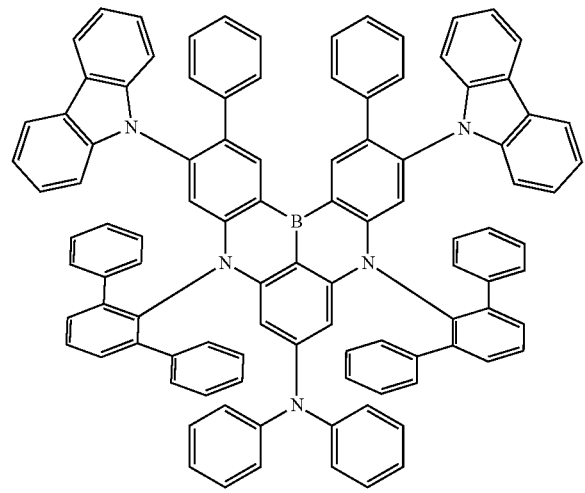
4
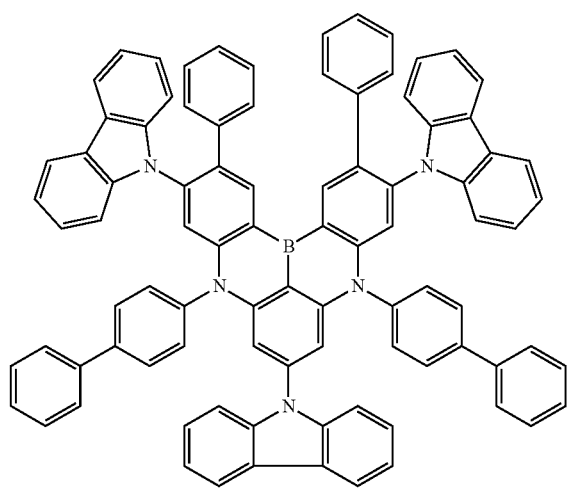
5
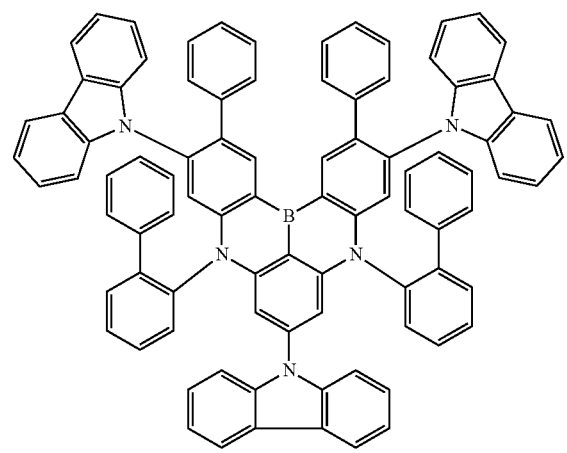
6
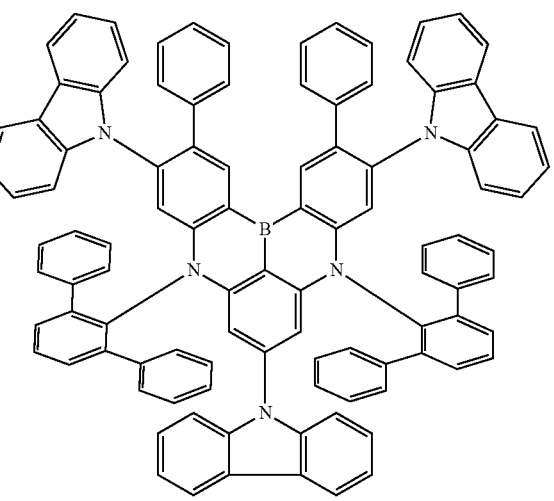
7
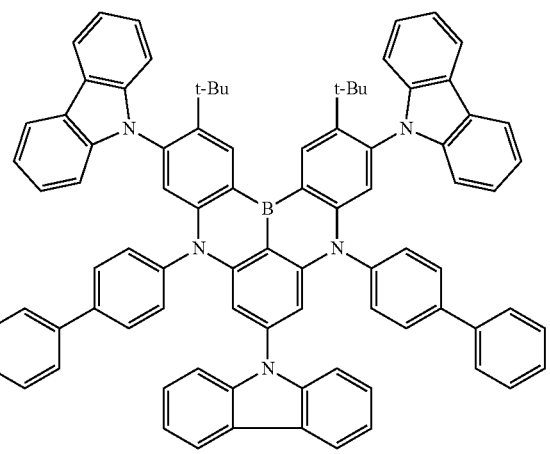
8
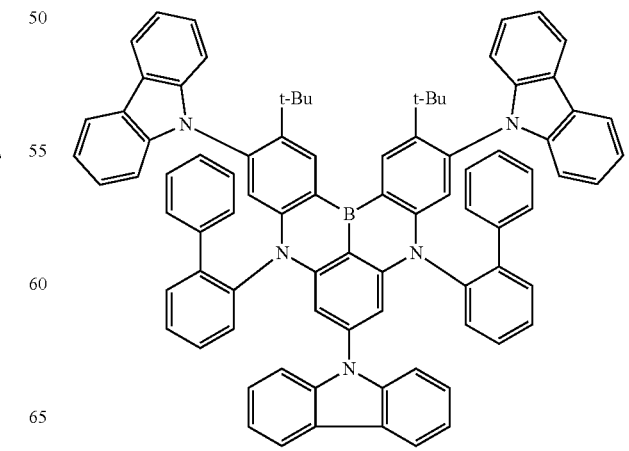

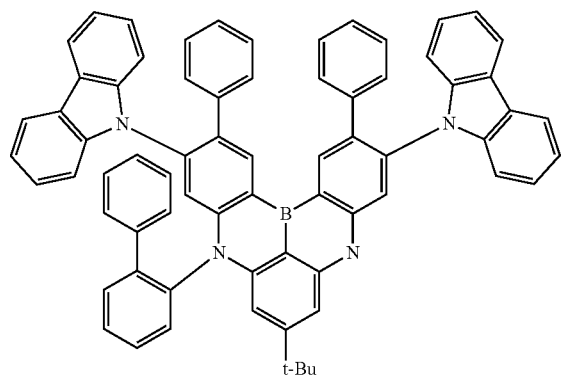
9
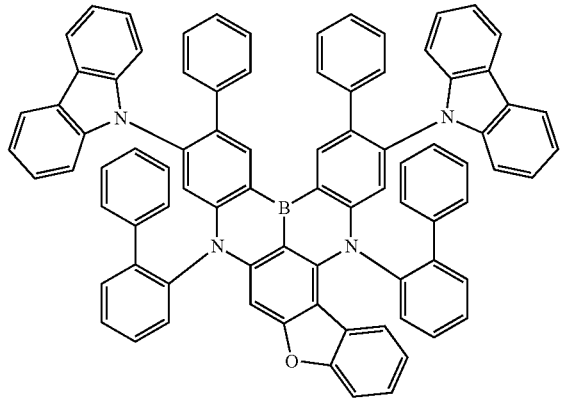
12
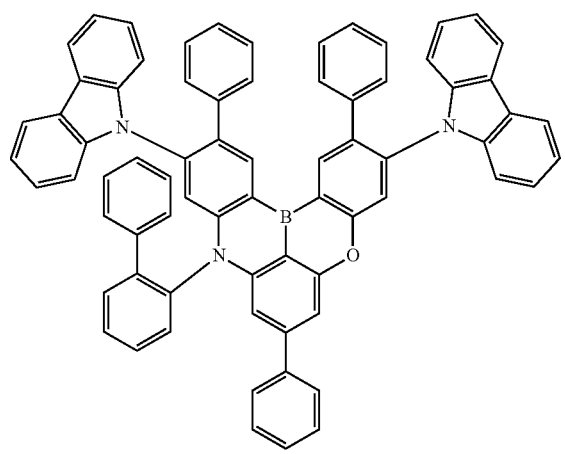
10
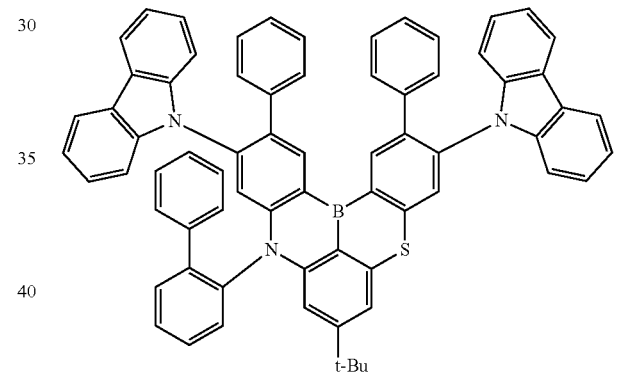
13
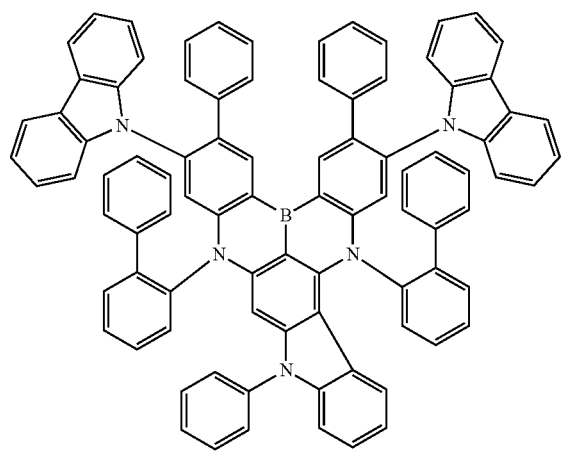
11
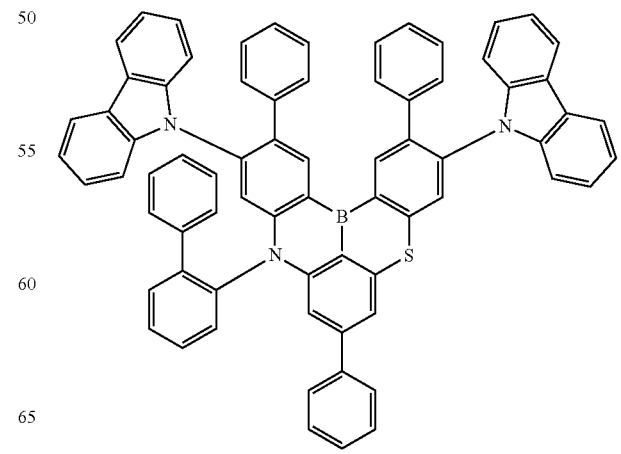
14

15
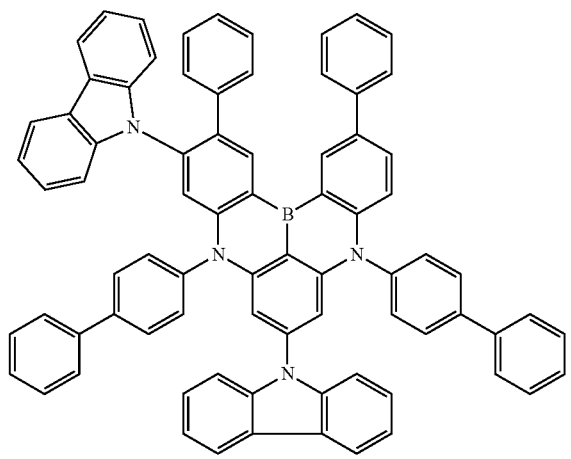
16
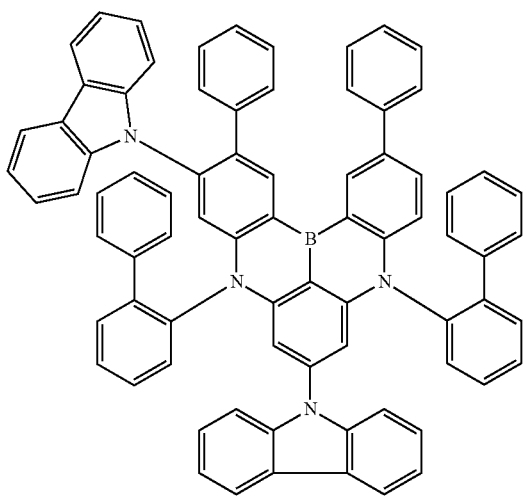
17
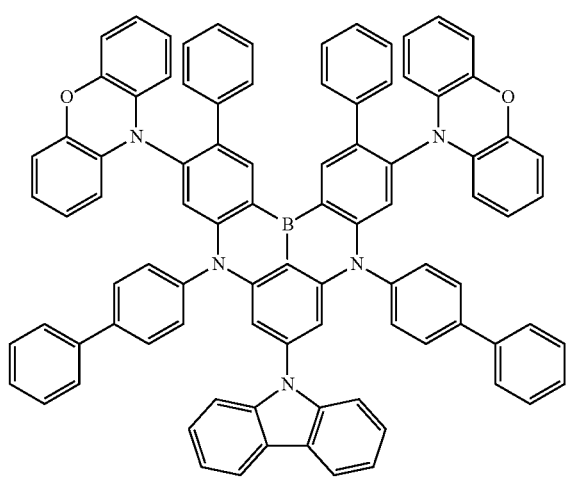
18
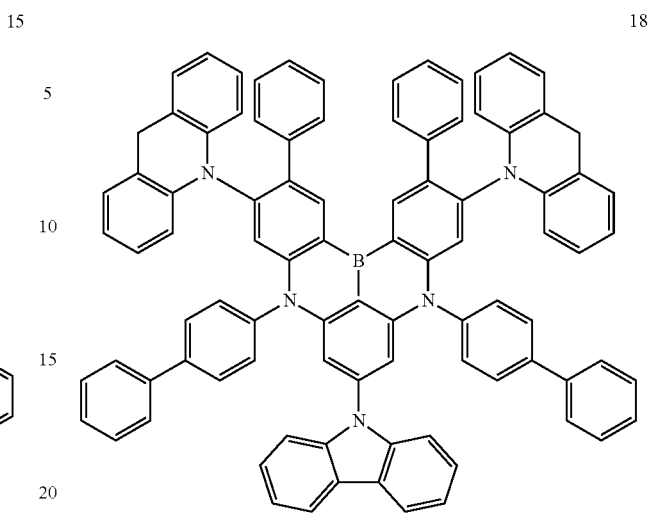
19
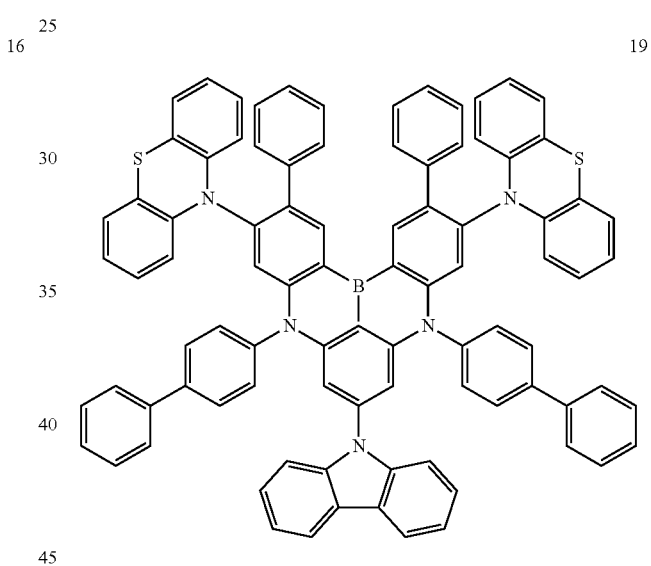
20
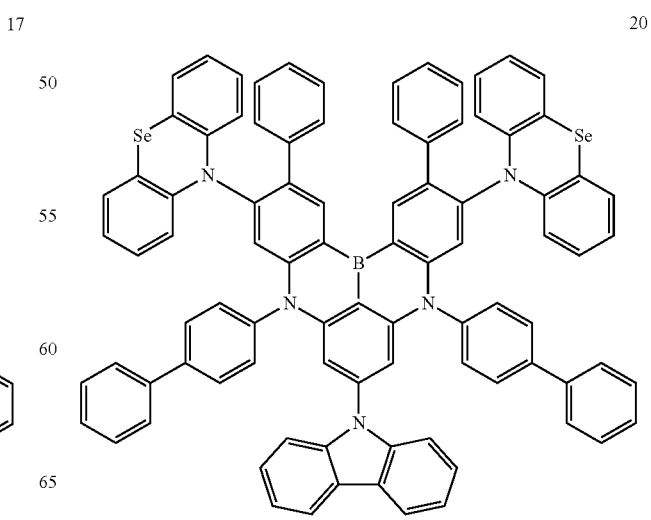

-continued

21

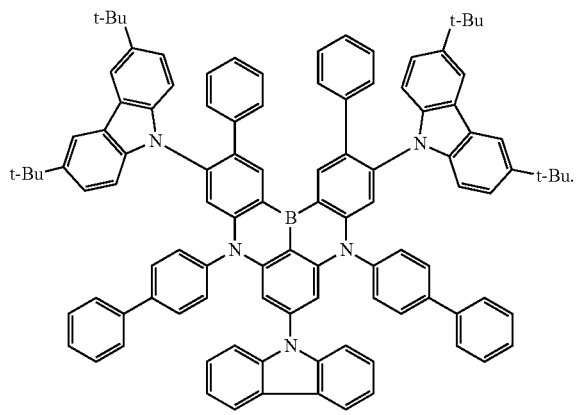

17. A light emitting element, comprising:
a first electrode;
a second electrode on the first electrode; and
an emission layer between the first electrode and the second electrode, the emission layer comprising a polycyclic compound represented by Formula 1,
wherein the first electrode and the second electrode each independently comprise at least one selected from among Ag, Mg, Cu, Al, Pt, Pd, Au, Ni, Nd, Ir, Cr, Li, Ca, LiF, Mo, Ti, W, In, Sn, Zn, compounds thereof, mixtures thereof, and oxides thereof:

Formula 1

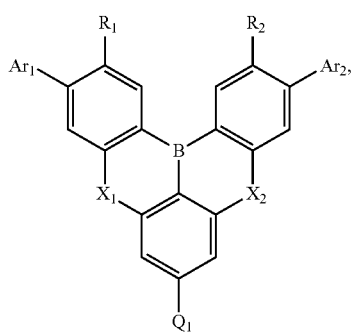

in Formula 1,
$X_1$ and $X_2$ are each independently O, S, Se, or NRa,
at least one selected from among $R_1$ and $R_2$ is a substituted or unsubstituted phenyl group, or a substituted or unsubstituted t-butyl group, and the remainder is a substituted or unsubstituted alkyl group of 1 to 6 carbon atoms, a substituted or unsubstituted aryl group of 6 to 20 ring-forming carbon atoms, or a substituted or unsubstituted heteroaryl group of 2 to 15 ring-forming carbon atoms,
Ra is a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring, $Q_1$ is a hydrogen atom, a deuterium atom, a substituted or unsubstituted amine group, a substituted or unsubstituted oxy group, a substituted or unsubstituted alkyl group of 1 to 6 carbon atoms, or a substituted or unsubstituted alkenyl group of 2 to 6 ring-forming carbon atoms, and/or combined with an adjacent group to form a ring, and at least one selected from among $Ar_1$ and $Ar_2$ is represented by the following Formula A, and remainder of $Ar_1$ and $Ar_2$ is a hydrogen atom, a deuterium atom, a substituted or unsubstituted amine group, a substituted or unsubstituted oxy group, or a substituted or unsubstituted alkyl group of 1 to 6 carbon atoms:

Formula A

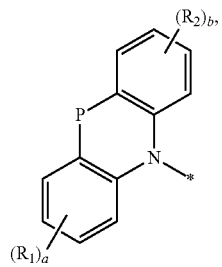

and
in Formula A,
"a" and "b" are each independently an integer of 0 to 4,
P is a direct linkage, O, S, Se, NRb, or CReRd, and
$R_1$ to $R_2$, and Rb to Rd are each independently a hydrogen atom, a deuterium atom, a cyano group, a substituted or unsubstituted alkyl group of 1 to 6 carbon atoms, a substituted or unsubstituted alkenyl group of 2 to 6 carbon atoms, a substituted or unsubstituted aryl group of 6 to 20 ring-forming carbon atoms, a substituted or unsubstituted heteroaryl group of 2 to 15 ring-forming carbon atoms, or a substituted or unsubstituted amine group, and/or combined with an adjacent group to form a ring.

18. The light emitting element of claim 17, wherein, in Formula 1, $Ar_1$ and $Ar_2$ are different from each other.

19. The light emitting element of claim 17, wherein, in Formula 1, $Ar_1$ and $Ar_2$ are the same.

20. The light emitting element of claim 17, wherein the polycyclic compound is represented by any one selected from among polycyclic compounds in Compound Group 1:
Compound Group 1
1
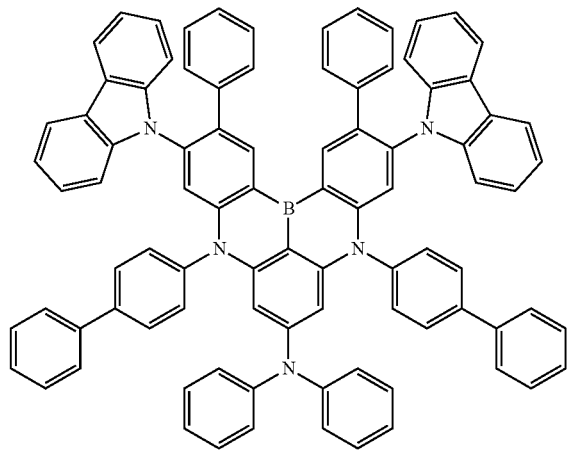
2
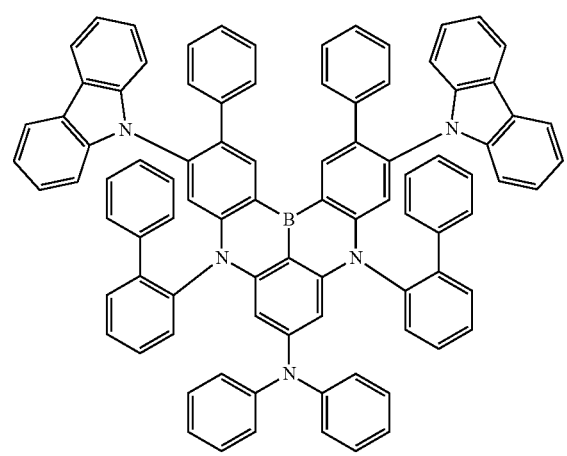
3
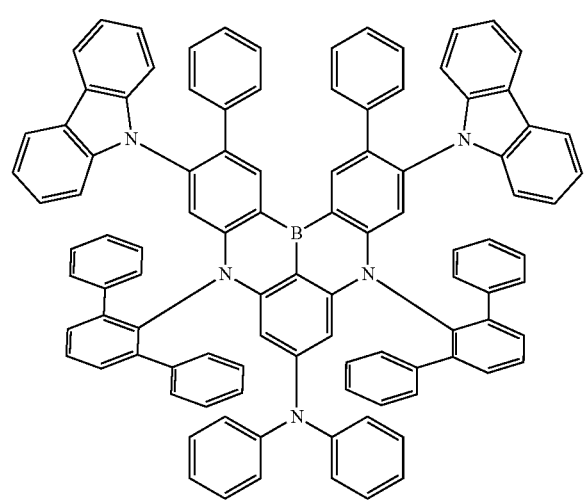
4
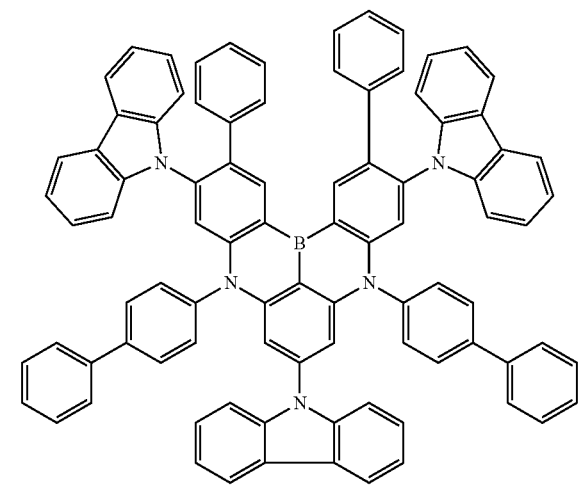
5
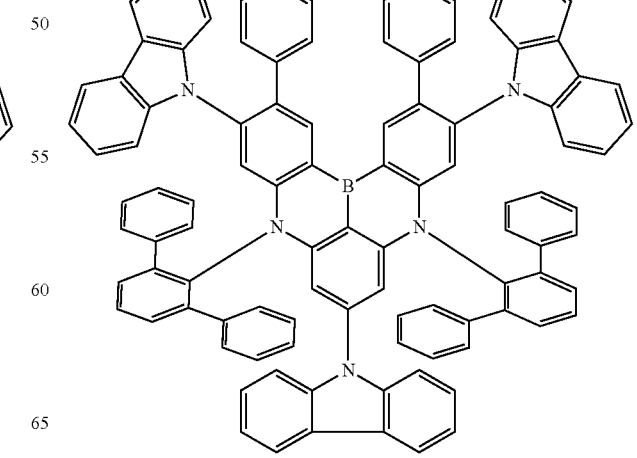
6

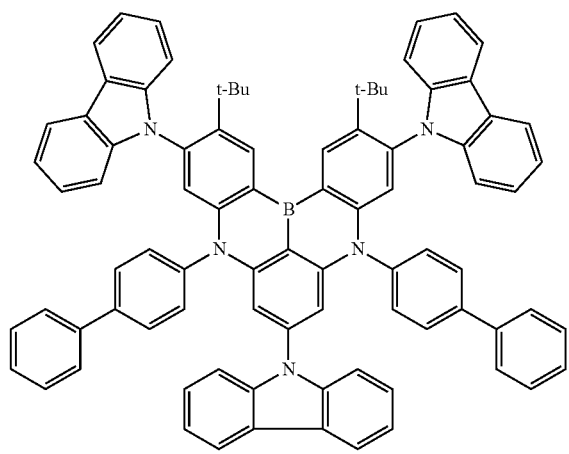
7
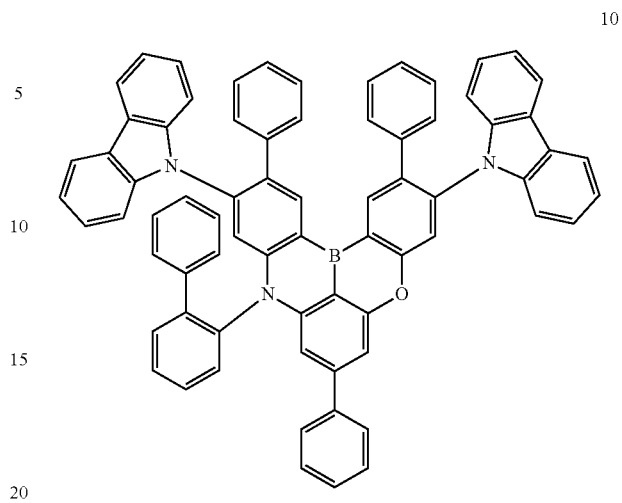
10
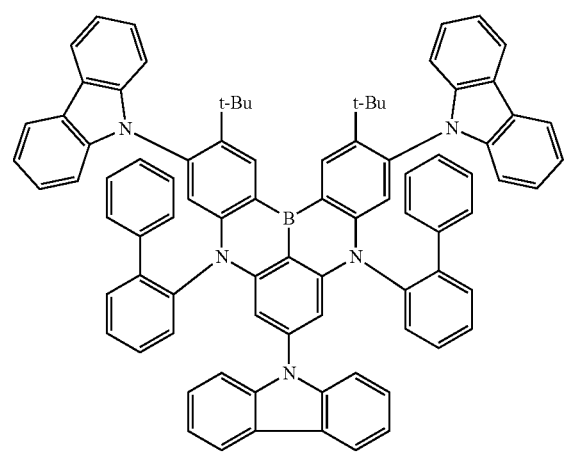
8
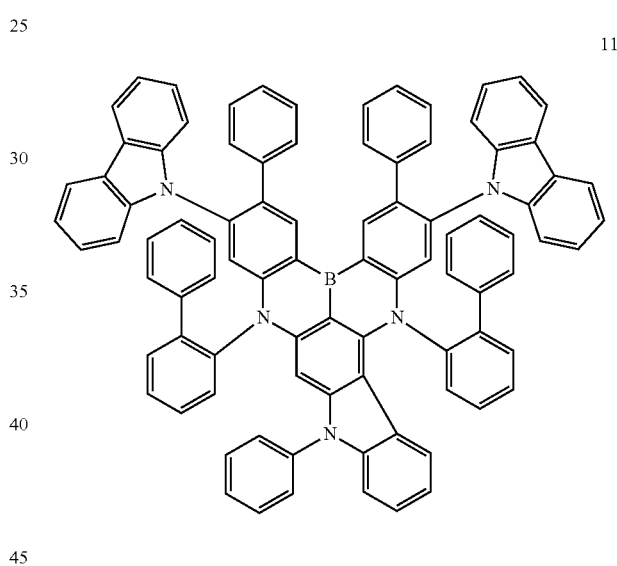
11
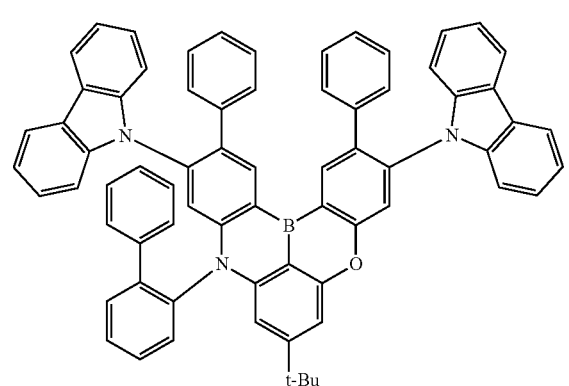
9
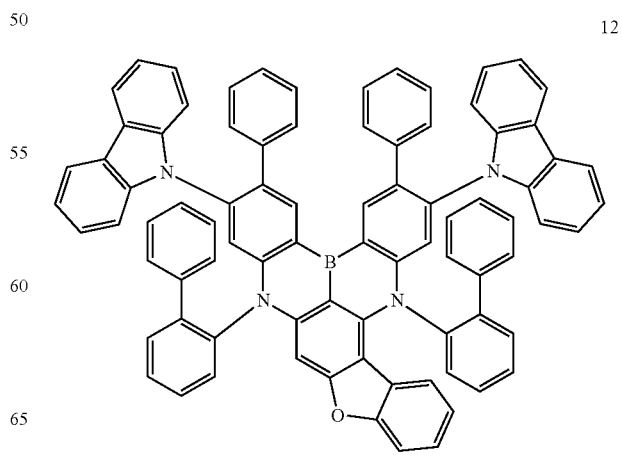
12

13
-continued
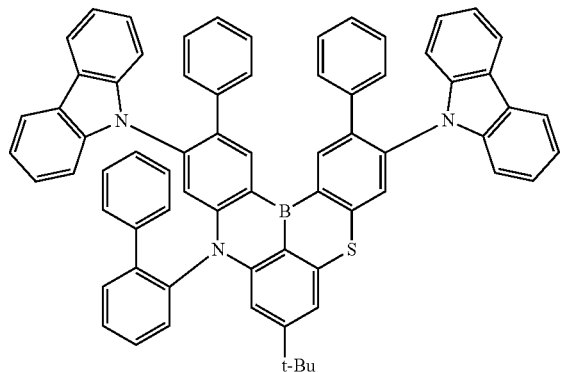
14
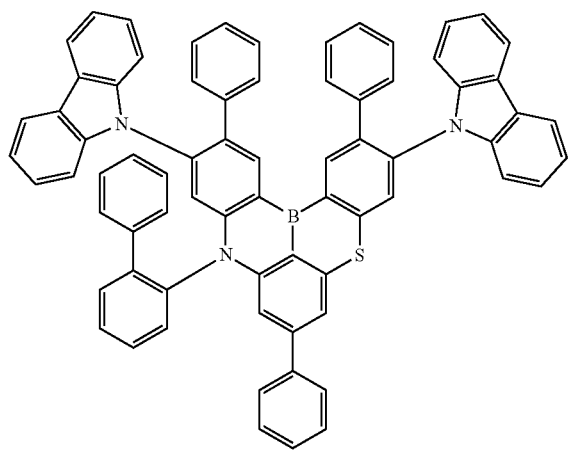
15
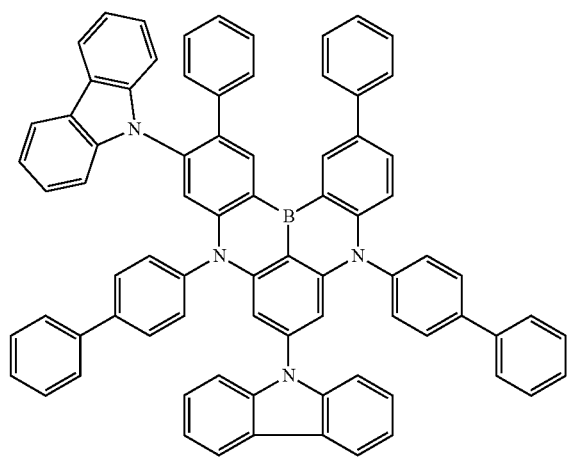
16
-continued
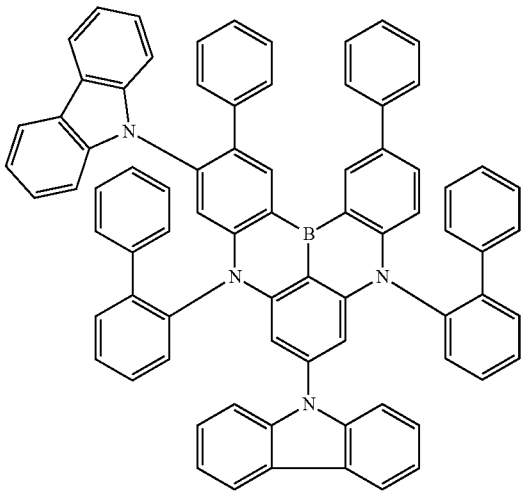
17
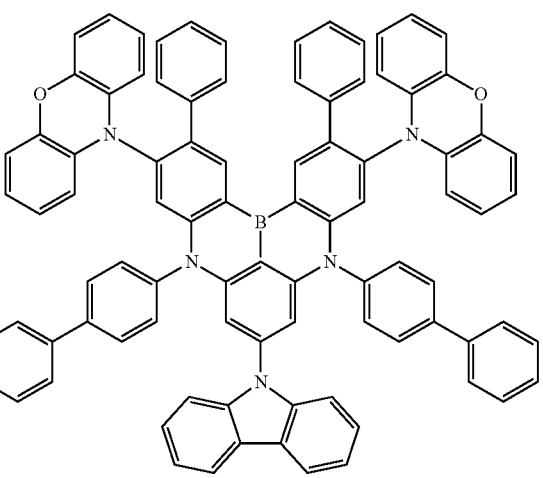

18
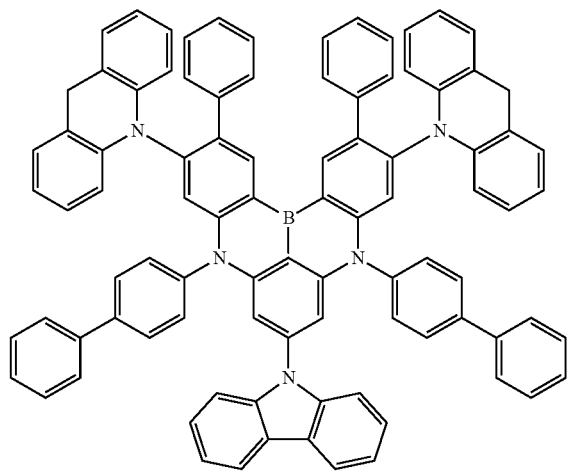
19
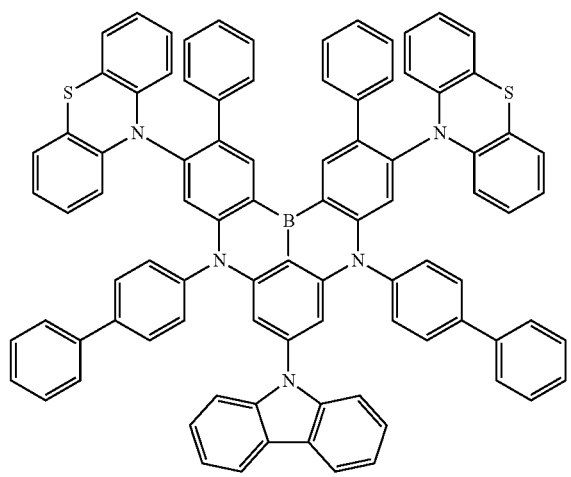
20
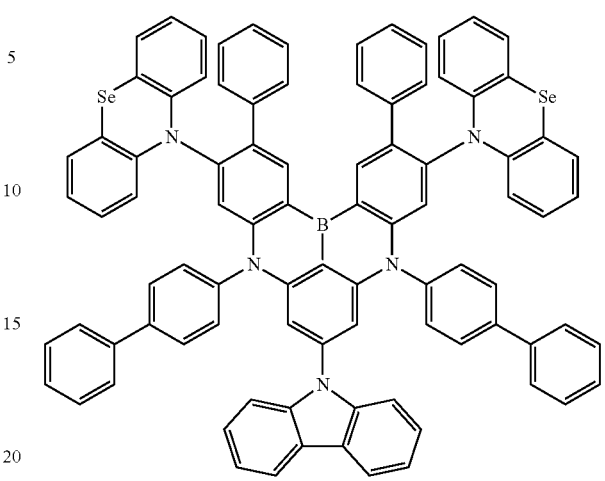
21
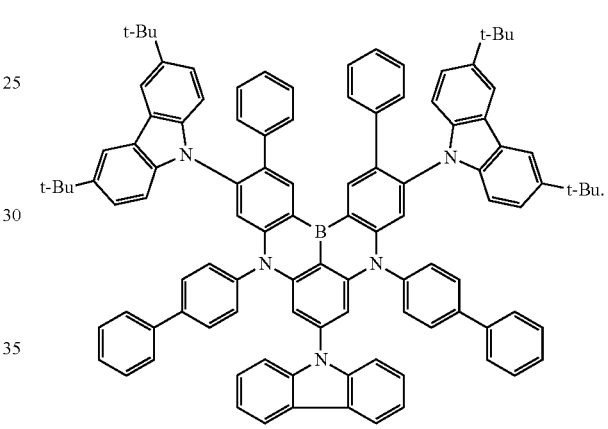
* * * * *